United States Patent
Nagata et al.

(10) Patent No.: US 9,470,974 B2
(45) Date of Patent: Oct. 18, 2016

(54) COLORING COMPOSITION, COLORING RADIATION-SENSITIVE COMPOSITION, COLOR FILTER AND SOLID-STATE IMAGING DEVICE

(71) Applicant: FUJIFILM Corporation, Minato-ku, Tokyo (JP)

(72) Inventors: Yuzo Nagata, Haibara-gun (JP); Hiroaki Idei, Haibara-gun (JP); Atsuyasu Nozaki, Haibara-gun (JP); Kenta Ushijima, Haibara-gun (JP); Yushi Kaneko, Haibara-gun (JP); Yousuke Murakami, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/176,787

(22) Filed: Feb. 10, 2014

(65) Prior Publication Data

US 2014/0154616 A1 Jun. 5, 2014

Related U.S. Application Data

(63) Continuation of application No. PCT/JP2012/069271, filed on Jul. 24, 2012.

(30) Foreign Application Priority Data

Aug. 15, 2011 (JP) .................................. 2011-177711

(51) Int. Cl.
*G02B 5/20* (2006.01)
*G03F 7/028* (2006.01)
*G03F 7/031* (2006.01)
*G03F 7/038* (2006.01)
*G03F 7/00* (2006.01)
*G02B 5/22* (2006.01)
*C09B 69/10* (2006.01)
*C09D 143/04* (2006.01)
*C08F 220/34* (2006.01)
*C08F 220/38* (2006.01)

(52) U.S. Cl.
CPC ........... *G03F 7/0007* (2013.01); *C08F 220/34* (2013.01); *C08F 220/38* (2013.01); *C09B 69/109* (2013.01); *C09D 143/04* (2013.01); *G02B 5/223* (2013.01); *G03F 7/028* (2013.01); *G03F 7/031* (2013.01); *G03F 7/0388* (2013.01); *C08L 2312/00* (2013.01); *G02B 5/22* (2013.01)

(58) Field of Classification Search
CPC ...... G03F 7/0007; G03F 7/028; G03F 7/031; G03F 7/0388; G02B 5/223; C09B 69/10; C09B 69/109
USPC ...................... 430/7, 281.1, 287.1
See application file for complete search history.

(56) References Cited

U.S. PATENT DOCUMENTS

| 6,509,125 B1 * | 1/2003 | Ito et al. ............................ 430/7 |
| 2001/0012870 A1 | 8/2001 | Nishikawa et al. |
| 2004/0138338 A1 | 7/2004 | Wakabayashi |
| 2007/0117031 A1 | 5/2007 | Mizukawa et al. |
| 2010/0154376 A1 * | 6/2010 | Nadkarni et al. ............... 57/243 |

FOREIGN PATENT DOCUMENTS

| CN | 101445670 A | 6/2009 |
| EP | 2 383 317 A1 | 11/2011 |
| JP | 63-220878 A | 9/1988 |
| JP | 2001-288405 A | 10/2001 |
| JP | 2003-161823 A | 6/2003 |
| JP | 2004-217906 A | 8/2004 |
| JP | 2004-286810 A | 10/2004 |
| JP | 2007-138051 A | 6/2007 |
| JP | 2007-147784 A * | 6/2007 |
| JP | 2010-168539 A | 8/2010 |
| JP | 2010-229264 A | 10/2010 |
| JP | 2011-95732 A | 5/2011 |
| WO | 2011/040628 A1 | 4/2011 |
| WO | WO 2011/040628 A1 * | 4/2011 |
| WO | WO 2011/122707 A1 * | 10/2011 |

OTHER PUBLICATIONS

Computer-generated transaltion of JP 2007-147784 (Jun. 2007).*
Notice of Reasons for Rejection, dated Sep. 2, 2014, issued in corresponding JP Application No. 2011-177711, 6 pages in English and Japanese.
International Search Report in PCT/JP2012/069271 dated Aug. 21, 2012, 3 pages.
Written Opinion in PCT/JP2012/069271 dated Aug. 21, 2012, 5 pages.
Office Action dated Jun. 26, 2015 from the Taiwanese Patent Office in counterpart Taiwanese Application No. 101126716.
Office Action dated Feb. 3, 2016 from the State Intellectual Property Office of the P.R.C. in counterpart Chinese Application No. 201280037139.2.
Office Action dated Dec. 18, 2015 from the Korean Intellectual Property Office in counterpart Korean Application No. 10-2014-7002247.
Office Action dated Oct. 26, 2015 from the Taiwan Intellectual Property Office in counterpart Taiwan Application No. 101126716.
Office Action dated Aug. 25, 2016 in Korean Application No. 10-2014-7002247.
Office Action dated Aug. 9, 2016 in Chinese Application No. 201280037139.2.

* cited by examiner

*Primary Examiner* — John A McPherson
(74) *Attorney, Agent, or Firm* — Sughrue Mion, PLLC

(57) ABSTRACT

Disclosed is a coloring composition with satisfactory heat resistance, no discoloration, excellent developability, and no development residues on a substrate and pixels of other colors, providing, a coloring composition for a color filter including (A) a polymer having a dye skeleton and (B) an organic solvent, wherein the content of an unreacted monomer component having the dye skeleton which is capable of forming (A) the polymer having the dye skeleton is less than or equal to 1 mass % with regard to (A) the polymer having the dye skeleton.

22 Claims, No Drawings

COLORING COMPOSITION, COLORING RADIATION-SENSITIVE COMPOSITION, COLOR FILTER AND SOLID-STATE IMAGING DEVICE

BACKGROUND OF THE INVENTION

1. Technical Field

The present invention relates to a coloring composition, a coloring radiation-sensitive composition, a production method of a polymer, a pattern forming method, a color filter and a production method thereof, and a solid-state imaging device.

2. Background Art

As production methods of color filters used in liquid crystal displays or solid-state imaging devices, a dyeing method, a printing method, an electrodeposition method, and a pigment dispersion method are known.

Of these, the pigment dispersion method is a method in which a color filter is produced by photolithography using a coloring radiation-sensitive composition in which a pigment is dispersed in various radiation-sensitive compositions, and has an advantage of being stable to light, heat or the like since pigments are used. Positional accuracy is also high since patterning is carried out by photolithography, therefore, the method is widely used as a suitable method in producing color filters for large-screen and high-definition color display.

However, in recent years, high definition has become more required in color filters for solid-state imaging devices, and there have been problems with conventional pigment dispersion methods such that resolution is not improved and color irregularity occurs due to coarse particles of the pigments. Therefore, conventional pigment methods are not suitable for applications in which color filters having fine patterns such as a solid-state imaging device are required.

In order to solve such problems, the use of dyes has been proposed, however, radiation-sensitive compositions containing dyes have new problems (see, for example, Patent Document 1). That is, (1) Common dyes have low solubility in either an aqueous alkali solution or an organic solution, therefore, it is difficult to obtain a liquid radiation-sensitive composition of a target spectrum. (2) Dyes are often shown to interact with other components in a radiation-sensitive composition, therefore, it is difficult to adjust solubility (developability) of the cured area and non-cured area. (3) When a molar extinction coefficient ($\epsilon$) of a dye is low, a large amount of dye needs to be added, resulting in problems such as lowering a curing property of the composition, heat resistance after curing, developability of a non-cured area or the like since the amount of other components such as a polymerizable compound, a binder, or a photopolymerization initiator in the radiation-sensitive composition has to be reduced. (4) Dyes are generally inferior in light resistance and heat resistance compared to pigments.

For this reason, several technologies have been proposed to improve stability of the dye by making the dye a dye polymer by polymerizing the dye with a monomer component having a dye skeleton. By polymerizing the dyes, stability is improved and reduction in color irregularity becomes possible compared to the case using pigments, however, regarding developability when this coloring composition is applied to a radiation-sensitive composition, there is still room for further improvement.

Meanwhile, a method has been proposed in which an alkali soluble binder having an acidic group and of which a glass transition temperature is 100° C. to 350° C. is used and also, the content of an unreacted monomer included in the binder is less than or equal to 3 mass % in order to improve developability and reduce the residues (For example, see JP2004-286810A).

DISCLOSURE OF INVENTION

Technical Problem

However, in the related art described above, developability was insufficient when a color filter realizing high resolution for a solid-state imaging device of fine size was formed. In addition, by using dyes, development residues easily occur on a substrate and pixels of other colors even when a fine coloring pattern of a thin film with no color irregularity is attempted to be formed, therefore, it is difficult to obtain a color filter of high resolution.

That is, there has been a strong demand for the development of a coloring composition and a coloring radiation-sensitive composition which have satisfactory heat resistance, no discoloration, no color irregularities in coloring images, excellent developability when applied to a radiation-sensitive composition, and in which fine patterns with no development residues on a substrate and pixels of other colors are obtained.

The present invention has been made in view of the above described problems and an object of the invention is to provide a coloring composition with satisfactory heat resistance and no discoloration, and also, to provide a coloring radiation-sensitive composition with excellent developability and with no development residues on a substrate and pixels of other colors.

In addition, an object of the invention is to provide a production method of a polymer having a dye skeleton, a pattern formation method using the coloring radiation-sensitive composition, a color filter, a production method of the color filter, and a solid-state imaging device.

Technical Solution

Means for accomplishing the above objects are as follows.

<1> A coloring composition for a color filter including (A) a polymer having a dye skeleton and (B) an organic solvent, wherein the content of an unreacted monomer component having the dye skeleton which is capable of forming (A) the polymer having the dye skeleton is less than or equal to 1 mass % with regard to (A) the polymer having the dye skeleton.

<2> The coloring composition for a color filter according to <1>, wherein (A) the polymer having the dye skeleton is prepared by carrying out heat re-precipitation after polymerization.

<3> The coloring composition for a color filter according to <1> or <2>, wherein (A) the polymer having the dye skeleton is prepared by adjusting the polymerization concentration to greater than or equal to 30 mass % in the polymerization.

<4> A coloring radiation-sensitive composition for a color filter including the coloring composition according to any one of <1> to <3>, (C) a polymerizable compound, and (D) a polymerization initiator.

<5> A production method of a polymer, wherein (A) the polymer having the dye skeleton according to any one of <1> to <3> is prepared by carrying out heat re-precipitation after polymerization.

<6> A production method of a polymer, wherein (A) the polymer having the dye skeleton according to any one of <1> to <3> is prepared by adjusting the polymerization concentration to greater than or equal to 30 mass % in the polymerization.

<7> A pattern forming method including a step in which the coloring radiation-sensitive composition according to <4> is applied on a substrate and a coloring radiation-sensitive composition layer is formed, a step in which the coloring radiation-sensitive composition layer is exposed in a pattern shape, and a step in which the coloring radiation-sensitive composition layer after the exposure is developed.

<8> A color filter including a colored film formed using the coloring radiation-sensitive composition according to <4>.

<9> A production method of a color filter including a step in which the coloring radiation-sensitive composition according to <4> is applied on a substrate and a coloring radiation-sensitive composition layer is formed, a step in which the coloring radiation-sensitive composition layer is exposed in a pattern shape, and a step in which the coloring radiation-sensitive composition layer after the exposure is developed and a coloring pattern is formed.

<10> A solid-state imaging device including the color filter according to <8>

In the present invention, in (A) the polymer having the dye skeleton, the content of the unreacted monomer component having the dye skeleton is less than or equal to 1 mass %, however, since it is considered that the unreacted monomer having the dye skeleton has a low molecular weight, thermal motion is easy and thermal decomposition is expedited compared to the polymer component and as a result, discoloration occurs by heating, color purity of the coloring layer obtained is reduced, and obtaining a target color becomes difficult. It is speculated that this discoloration by heating may be prevented by suppressing the content of the unreacted monomer component having the dye skeleton to be less than or equal to 1 mass %.

Also, for the coloring radiation-sensitive composition containing the polymerizable compound or the polymerization initiator, development residues may occur on a substrate and pixels of other colors in the development when the unreacted monomer component having the dye skeleton included in the polymer having the dye skeleton is greater than 1 mass %. It is speculated that since the unreacted monomer having the dye skeleton has a low molecular weight, movement to the substrate (or the pixel of other colors) is easy, and being adsorbed is easy, therefore formation of residues is easy. In the present invention, the coloring radiation-sensitive composition with satisfactory developability may be obtained by suppressing the occurrence of residues by maintaining the content of the unreacted monomer component having the dye skeleton to be less than or equal to 1 mass %.

Advantageous Effects

According to the present invention, the coloring composition with satisfactory heat resistance and no discoloration can be provided and the coloring radiation-sensitive composition with excellent developability and with no development residues on a substrate and pixels of other colors can be provided.

The production method of the polymer having the dye skeleton, the pattern forming method using the coloring radiation-sensitive composition, the color filter, the production method of the color filter, and the solid-state imaging device can also be provided.

BEST MODE FOR CARRYING OUT THE INVENTION

Hereinafter, the coloring composition of the present invention will be described in detail.

The coloring composition of the present invention includes (A) the polymer having the dye skeleton and (B) the organic solvent, wherein the content of an unreacted monomer component having the dye skeleton which is capable of forming (A) the polymer having the dye skeleton is less than or equal to 1 mass % with regard to (A) the polymer having the dye skeleton.

(A) The polymer having the dye skeleton and (B) the organic solvent which compose the coloring composition of the present invention will be described.

In addition, in the coloring composition and the coloring radiation-sensitive composition of the present invention, the term "total solids" means total mass of the components in a total composition of each coloring composition and coloring radiation-sensitive composition except solvent.

<(A) Polymer Having Dye Skeleton>

(A) The Polymer having the dye skeleton used in the coloring composition of the present invention (hereinafter, referred to as "dye polymer") is a polymer of the monomer unit having the dye skeleton and includes a dimeric, trimeric, polymeric or the like structure. (A) The polymer having the dye skeleton of the present invention has a content of the unreacted monomer unit having the dye skeleton (hereinafter, refer appropriately to "the unreacted monomer component") of less than or equal to 1 mass % with regard to (A) the polymer having the dye skeleton. As the content of the unreacted monomer component, less than or equal to 0.8 mass % with regard to the polymer having the dye skeleton is preferable, and less than or equal to 0.4 mass % is particularly preferable. By maintaining the content in this range, storage stability when the polymer having the dye skeleton is stored becomes more satisfactory. The lower limit of the content of the unreacted monomer component is not particularly limited and no unreacted monomer component being contained (the content 0 mass %) is the most preferable, however, the lower limit of 0.001 mass % is preferable and 0.005 mass % is more preferable considering the cost in this coloring composition preparation.

The unreacted monomer component in the present invention means a monomer having the dye skeleton and a monomer having the partial structure derived from the dye, and (A) the polymer having the dye skeleton may be obtained by polymerizing the monomer.

The remaining unreacted monomer component when the polymer having the dye skeleton is synthesized is controlled to be less than or equal to 1 mass % with regard to (A) the polymer having the dye skeleton and (A) the polymer having the dye skeleton is used in the present invention.

Control of the content of the unreacted monomer component in the synthesis of (A) the polymer having the dye skeleton may be by selecting not only temperature, concentration and stirring conditions but also types of a polymerization initiator, a chain transfer agent and the like or condition of an addition amount, or by applying a heat re-precipitation method described later to the polymerized solution obtained, or by selecting and combining a plurality of these methods.

As the method for controlling the content of the unreacted monomer component in the polymer having the dye skeleton to be less than or equal to 1 mass %, a method in which the polymer having the dye skeleton is heated with an organic solvent, the solubility of the unreacted monomer component is improved through heating, and therefore the unreacted monomer component is made to remain in the organic solvent, the polymer obtained is filtered since the polymer is less soluble in the organic solvent and the content of the unreacted monomer component in the polymer is reduced, or as necessary, a method in which after the polymer having the dye skeleton is heated with an organic solvent, a mixture of the polymer and the organic solvent (the unreacted monomer component is dissolved) is cooled, the polymer is precipitated, and the content of the unreacted monomer component in the polymer is reduced, or as necessary, a method in which after the polymer having the dye skeleton is heated with an organic solvent, a mixture of the polymer and the organic solvent (the unreacted monomer component is solubilized) is added dropwise to a poor solvent in which solubility of the polymer is low and solubility of the unreacted monomer component is relatively high, and the content of the unreacted monomer component in the polymer is reduced (these methods are collectively referred as heat re-precipitation method), a method in which the polymer having the dye skeleton is dissolved in an organic solvent in which the polymer is soluble, and the solution is added dropwise to a poor solvent in which solubility of the polymer is low and solubility of the unreacted monomer component is relatively high and the polymer is precipitated (precipitation purification method by a poor solvent), a method in which the content of the unreacted monomer component is reduced by liquid-liquid extraction from the polymerization reaction product, a method in which the content of the unreacted monomer component is reduced after the polymerization by distillation, steam distillation, distillation under reduced pressure, thin-film distillation or the like, and a method in which the content of the unreacted monomer component is reduced using column chromatography, a method in which the unreacted monomer component is extracted using a supercritical fluid or the like are used. Among these, a heat re-precipitation method is preferable.

The temperature at which the dye polymer is precipitated when the heat re-precipitation method by a poor solvent or the precipitation purification method is used is preferably 20 to 80° C. and more preferably 40 to 60° C. In addition, the amount of poor solvent is preferably a 5 to 40 fold amount and more preferably a 10 to 20 fold amount with regard to the polymerizable solution based on mass. The stirring time when heating is preferably 0.5 to 4 hours and more preferably 1 to 2 hours.

In selecting a solvent type for the poor solvent, any solvent is possible as long as the polymer obtained is insoluble and the unreacted monomer component is soluble, however, selecting a solvent type with high affinity for the polymer solution is preferable.

These steps may be repeated several times or used as a combination of two or more in order to maintain the content of the unreacted monomer component in the polymer having the dye skeleton at a target content.

In the heat re-precipitation method, the polymer obtained may be dissolved in the heated organic solvent, however, if the polymer solution becomes uniform by heating the polymer solution, the solution may be used as it is.

Also, as the organic solvent used, any organic solvent may be used as long as the polymer is uniformly dissolved at a target temperature.

As the heating temperature, a temperature less than or equal to boiling point of the organic solvent is acceptable.

As a polymerization condition of the polymer having the dye skeleton, it is preferable that the polymerization progress sufficiently such that the unreacted monomer component is reduced.

The polymerization concentration in this polymerization condition is preferably greater than or equal to 20 mass % with regard to the total amount of the polymerization solution and more preferably greater than or equal to 30 mass % and less than or equal to 50 mass %.

In this specification, the term polymerization concentration means a concentration (mass-based) of the polymer component (meaning a component capable of forming a polymer and also including a chain transfer agent as long as the formation of a polymer is possible) in a polymerization reaction system (total volume of the reaction solution including solvent and the like).

The amount of the polymerization initiator when the dye polymer is synthesized is preferably 5 to 40 mmol % with regard to the total molar amount of the total monomer components and more preferably 10 to 20 mmol %.

The dropwise addition time of the polymerization solution is preferably 1 to 4 hours and more preferably in the range of 1 to 2 hours.

As a method to evaluate the content of the unreacted monomer component, high performance liquid chromatography (HPLC) or gas chromatography (GC) may be used to determine the content of the unreacted monomer component in the polymer.

Evaluation is also possible by a method in which the content of a low molecular weight portion is determined by gel permeation chromatography (GPC).

Evaluation is also possible by a method in which the unreacted monomer component is isolated and the polymer is directly quantified using gel permeation chromatography (GPC) or column chromatography or the like.

In addition, a method in which the unreacted monomer component is isolated from the polymer and the content of the unreacted monomer component is directly quantified may be used.

In the present invention, a method in which a calibration curve of the monomer component is created using high performance liquid chromatography and the content of the unreacted monomer component is quantified using the calibration curve is used.

In the method by gel permeation chromatography (GPC), if the content of the low molecular weight portion measured (component with a weight-average molecular weight range of 1,500 to 250 using polystyrene conversion) is less than or equal to 1.0 mass %, it is within the scope of the present invention.

Hereinafter, a partial structure derived from dye, a preferred structure of the dye polymer, a functional group the dye polymer may have, and preferred physical properties of the dye polymer will be described in detail.

Here, the term "partial structure derived from dye" represents a structure which can connect to a connecting unit of the dye polymer (a polymer chain, core of a dendrimer or the like) with a hydrogen atom removed from the dye skeleton described later. Also, in a notation of a group (atomic group) in this specification, a notation in which substituted or unsubstituted is not written includes not only groups (atomic groups) having no substituents but also groups (atomic groups) having substituents. For example, "an alkyl group" includes not only an alkyl group having no substituent (an unsubstituted alkyl group) but also an alkyl group having a substituent (a substituted alkyl group).

(Partial Structure Derived from Dye)

(A) The polymer having the dye skeleton (hereinafter, appropriately referred to as "dye structure") used in the coloring composition of the present invention is not particularly limited and various types including well-known dye structures may be applied.

As well-known dye structures, for example, dye structures derived from azo dyes, azomethine dyes (indoaniline dyes, indophenol dyes or the like), dipyrromethene dyes, quinone-based dyes (benzoquinone dyes, naphthoquinone dyes, anthraquinone dyes, anthrapyridone dyes or the like), carbonium dyes (diphenylmethane dyes, triphenylmethane dyes, xanthene dyes, acridine dyes or the like), quinoneimine dyes (oxazine dyes, thiazine dyes or the like), azine dyes, polymethine dyes (oxonol dyes, merocyanine dyes, arylidene dyes, styryl dyes, cyanine dyes, squarylium dyes, croconium dyes or the like), quinophthalone dyes, phthalocyanine dyes, sub-phthalocyanine dyes, perinone dyes, indigo dyes, thioindigo dyes, quinoline dyes, nitro dyes, nitroso dyes, and metal complex dyes may be used. Among these dye structures, azo dyes, dipyrromethene dyes, anthraquinone dyes, triphenylmethane dyes, xanthene dyes, cyanine dyes, squarylium dyes, quinophthalone dyes, phthalocyanine dyes, and sub-phthalocyanine dyes are particularly preferable.

Specific dye compounds which can form dye structures are described in "A Dye Handbook, new edition" (The Society of Synthetic Organic Chemistry, Japan; Maruzen Company, Limited, 1970), "Color Index" (The Society of Dyers and Colorists), "A Pigment Handbook (Okawara et al.; Kodansha Ltd.) and the like.

In the dye polymers in the present invention, hydrogen atoms in the dye structures may be substituted with the following substituents.

<Substituents Dye Polymers May have>

As the substituents the dye polymers may have, a halogen atom, an alkyl group, a cycloalkyl group, an alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy groups, an amino group (including an alkylamino group and an anilino group), an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclic thio group, a sulfamoyl group, a sulfo group, an alkyl- or arylsulfinyl group, an alkyl- or arylsulfonyl group, an acyl group, an aryloxycarbonyl group, an alkoxycarbonyl group, a carbamoyl group, an aryl- or heterocyclic azo group, an imido group, a phosphino group, a phosphinyl group, a phosphinyloxy group, a phosphinylamino group, a silyl group or the like may be included.

For those having a hydrogen atom among the substituents, the hydrogen atom among the substituents may be substituted with any of the groups described above. Examples of the groups which can be introduced as the substituents, an alkylcarbonylaminosulfonyl group, an arylcarbonylaminosulfonyl group, an alkylsulfonylaminocarbonyl group, or an arylsulfonylaminocarbonyl group may be included and specifically, a methylsulfonylaminocarbonyl, a p-methylsulfonylaminocarbonyl, an acetylaminosulfonyl, or a benzoylaminosulfonyl group may be included.

Particularly preferable dye skeletons will be described in detail.

<Dipyrromethene>

As the dye skeleton structure of (A) the polymer having the dye skeleton of the present invention, a structure including a dipyrromethene compound or a dipyrromethene metal complex obtained from a dipyrromethene compound and a metal or a metal compound is preferable.

As the structure including the dipyrromethene metal complex, a structure including dipyrromethene metal complex obtained from a dipyrromethene compound represented by following General Formula (M) and a metal or a metal compound and a tautomer thereof are preferable and among these, a structure including the dipyrromethene metal complex represented by following General Formula (7) or a dye structure derived from the dipyrromethene metal complex compound represented by following General Formula (8) may be included as the preferable aspect, and a dye structure represented by following General Formula (8) is the most preferable.

[Structure Including Dipyrromethene Metal Complex Obtained from Dipyrromethene Compound Represented by Following General Formula (M) and Metal or Metal Compound and Tautomer thereof]

One of the preferable aspect of the dye structure of the present invention is a dye structure including a complex in which the compound (the dipyrromethene compound) represented by following General Formula (M) or the tautomer thereof is coordinated to a metal or a metal compound (hereinafter, appropriately referred to as "a specific complex") as a dye portion.

Also, in the present invention, a compound including a dipyrromethene structure is referred to as a dipyrromethene compound and a complex in which the compound including a dipyrromethene structure is coordinated to a metal or a metal complex is referred to as a dipyrromethene metal complex compound.

[Chem. 1]

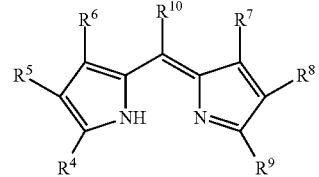

(M)

In General Formula (M), $R^4$ to $R^{10}$, each independently, represent a hydrogen atom or a monovalent substituent. However, there are no cases in which $R^4$ and $R^9$ are bonded to each other to form a ring.

When the dipyrromethene metal complex compound represented by General Formula (M) is introduced to a structural unit represented by General Formula (A) to General Formula (C), a polymer represented by General Formula (D), or a monomer represented by General Formula (1), which are described later, the introduction site is not particularly limited, however, introducing at any one site of $R^4$ to $R^9$ is preferable in terms of synthesis suitability, introducing at any one of $R^4$, $R^6$, $R^7$ and $R^9$ is more preferable, and introducing at any one of $R^4$ and $R^9$ is even more preferable.

As the monovalent substituent in a case in which $R^4$ to $R^9$ in General Formula (M) represent monovalent substituents, substituents described in the above section of the substituents may be included.

If the monovalent substituent represented as $R^4$ to $R^9$ in General Formula (M) is a group which can be further substituted, it may have further substituents described in $R^4$ to $R^9$ and when there are two or more substituents, those substituents may be the same as or different from each other.

$R^4$ and $R^5$, $R^5$ and $R^6$, $R^7$ and $R^8$, and, $R^8$ and $R^9$ in General Formula (M), each independently, are bonded to each other and may form a five-membered, a six-membered, or a seven-membered saturated ring or unsaturated ring. However, there are no cases in which $R^4$ and $R^9$ are bonded to each other to form a ring. If the five-membered, the six-membered, or the seven-membered ring formed can be further substituted, it may be substituted with substituents described in $R^4$ to $R^9$ and when there are two or more substituents, those substituents may be the same as or different from each other.

When $R^4$ and $R^5$, $R^5$ and $R^6$, $R^7$ and $R^8$, and, $R^8$ and $R^9$ in General Formula (M), each independently, are bonded to each other and form a five-membered, a six-membered, or a seven-membered saturated ring or unsaturated ring with no substituents, as the five-membered, the six-membered, or the seven-membered saturated ring or unsaturated ring with no substituents, for example, a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, a pyridazine ring or the like may be included, and preferably, a benzene ring or a pyridine ring may be included.

In General Formula (M), $R^{10}$ represents, preferably, a hydrogen atom, a halogen atom, an alkyl group, an aryl group, or a heterocyclic group, and the halogen atom, the alkyl group, the aryl group, or the heterocyclic group is the same as the description with substituents of $R^4$ to $R^9$ and so are the preferable ranges.

If the alkyl group, the aryl group, or the heterocyclic group in a case in which $R^{10}$ represents an alkyl group, an aryl group, or a heterocyclic group can be further substituted, it may be substituted with substituents described as monovalent substituents in $R^4$ to $R^9$ and when there are two or more substituents, those substituents may be the same as or different from each other.

~Metal or Metal Compound~

The specific complex in the present invention is a complex in which the compound represented by General Formula (M) described above or the tautomer thereof is coordinated to a metal or a metal compound.

Here, as the metal or the metal compound, any metal or metal complex which can form a complex can be used and a divalent metal atom, a divalent metal oxide, a divalent metal hydroxide, or a divalent metal chloride is included. As the metal or the metal compound, for example, in addition to Zn, Mg, Si, Sn, Rh, Pt, Pd, Mo, Mn, Pb, Cu, Ni, Co, Fe or the like, a metal chloride such as AlCl, InCl, FeCl, $TiCl_2$, $SnCl_2$, $SiCl_2$ or $GeCl_2$, a metal oxide such as TiO or VO, or a metal hydroxide such as $Si(OH)_2$ is included.

Among these, from the viewpoint of a complex stability, spectral characteristics, heat resistance, light resistance, preparation suitability and the like, Fe, Zn, Mg, Si, Pt, Pd, Mo, Mn, Cu, Ni, Co, TiO or VO is preferable, Zn, Mg, Si, Pt, Pd, Cu, Ni, Co, or VO is more preferable, and Zn is the most preferable.

Next, more preferable ranges of the specific complex of the compound represented by General Formula (M) in the present invention will be described.

As preferable ranges of the specific complex in the present invention, in General Formula (M), $R^4$ and $R^9$, each independently, represent as a hydrogen atom, an alkyl group, alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an amino group, an anilino group, a heterocyclic amino group, a carbonamide group, a ureide group, an imide group, an alkoxycarbonylamino group, an aryloxycarbonylamino group, a sulfonamide group, an azo group, an alkylthio group, an arylthio group, a heterocyclic thio group, an alkylsulfonyl group, an arylsulfonyl group or a phosphinoylamino group, $R^5$ and $R^8$, each independently, represent as a hydrogen atom, a halogen atom, an alkyl group, alkenyl group, an aryl group, a heterocyclic group, a hydroxyl group, a cyano group, nitro group, an alkoxy group, an aryloxy group, a heterocyclic oxy group, an acyl group, an alkoxycarbonyl group, an aryloxycarbonyl group, a carbamoyl group, an imide group, an alkoxycarbonylamino group, a sulfonamide group, an azo group, an alkylthio group, an arylthio group, a heterocyclic thio group, an alkylsulfonyl group, an arylsulfonyl group or a sulfamoyl group, $R^6$ and $R^7$, each independently, represent as a hydrogen atom, a halogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an anilino group, a carbonamide group, a ureide group, an imide group, a alkoxycarbonylamino group, a sulfonamide group, an azo group, an alkylthio group, an arylthio group, a heterocyclic thio group, an alkylsulfonyl group, an arylsulfonyl group, a sulfamoyl group or a phosphinoylamino group, $R^{10}$ represents as a hydrogen atom, a halogen atom, an alkyl group, an aryl group or a heterocyclic group and the metal or the metal compound is in the range of Zn, Mg, Si, Pt, Pd, Mo, Mn, Cu, Ni, Co, TiO or V=O.

As more preferable ranges of the specific complex in the present invention, in General Formula (M), $R^4$ to $R^9$, each independently, represent as a hydrogen atom, an alkyl group, alkenyl group, an aryl group, a heterocyclic group, a cyano group, an acyl group, an alkoxycarbonyl group, a carbamoyl group, an amino group, a heterocyclic amino group, a carbonamide group, a ureide group, an imide group, an alkoxycarbonylamino group, an aryloxycarbonylamino group, a sulfonamide group, an azo group, an alkylsulfonyl group, an arylsulfonyl group or a phosphinoylamino group, $R^5$ and $R^8$, each independently, represent as an alkyl group, alkenyl group, an aryl group, a heterocyclic group, a cyano group, nitro group, an acyl group, an alkoxycarbonyl group, an aryloxycarbonyl group, a carbamoyl group, an imide group, an alkylsulfonyl group, an arylsulfonyl group or a sulfamoyl group, $R^6$ and $R^7$, each independently, represent as a hydrogen atom, an alkyl group, an alkenyl group, an aryl group, a heterocyclic group, a cyano group, an acyl group, an alkoxycarbonyl group, a carbamoyl group, a carbonamide group, a ureide group, an imide group, a alkoxycarbonylamino group, a sulfonamide group, an alkylthio group, an arylthio group, a heterocyclic thio group, an alkylsulfonyl group, an arylsulfonyl group or a sulfamoyl group, $R^{10}$ represents as a hydrogen atom, a halogen atom, an alkyl group, an aryl group or a heterocyclic group, and the metal or the metal compound is in the range of Zn, Mg, Si, Pt, Pd, Cu, Ni, Co or V=O.

As particularly preferable ranges of the specific complex in the present invention, in General Formula (M), $R^4$ to $R^9$, each independently, represent as a hydrogen atom, an alkyl group, an aryl group, a heterocyclic group, an amino group, a heterocyclic amino group, a carbonamide group, a ureide group, an imide group, an alkoxycarbonylamino group, a sulfonamide group, an azo group, an alkylsulfonyl group, an arylsulfonyl group or a phosphinoylamino group, $R^5$ and $R^8$, each independently, represent as an alkyl group, an aryl group, a heterocyclic group, a cyano group, an acyl group, an alkoxycarbonyl group, a carbamoyl group, an alkylsulfonyl group or an arylsulfonyl group, $R^6$ and $R^7$, each independently, represent as a hydrogen atom, an alkyl group, an aryl group or a heterocyclic group, $R^{10}$ represents as a hydrogen atom, an alkyl group, an aryl group or a heterocyclic group, and the metal or the metal compound is in the range of Zn, Cu, Co or V=O.

In addition, an aspect represented by General Formula (7) or General Formula (8) described below in detail is also particularly preferable aspect.

[Structure Including Dipyrromethene Metal Complex Represented by General Formula (7)]

One of the aspects of the dye structure of the present invention is a structure including the dipyrromethene metal complex represented by following General Formula (7).

[Chem. 2]

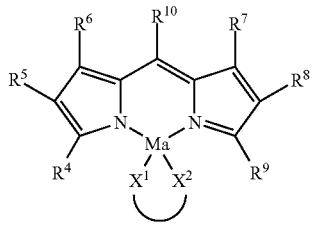

(7)

In General Formula (7), $R^4$ to $R^9$, each independently, represent a hydrogen atom or a substituent and $R^{10}$ represents a hydrogen atom, a halogen atom, an alkyl group, an aryl group or a heterocyclic group. Ma represents a metal atom or a metal complex. $X^1$ represents a group which can bind to Ma, $X^2$ represents a group which neutralizes the charge of Ma, and $X^1$ and $X^2$ are bonded to each other and may form a five-membered, a six-membered, or a seven-membered ring with Ma. However, there are no cases in which $R^4$ and $R^9$ are bonded to each other to form a ring.

The structure including the dipyrromethene metal complex represented by following General Formula (7) also includes a tautomer.

When the structure including the dipyrromethene metal complex represented by General Formula (7) is introduced to a structural unit represented by General Formula (A) to General Formula (C), a polymer represented by General Formula (D), or a monomer represented by General Formula (1), which are described later, the introduction site is not particularly limited, however, introducing at any one site of $R^4$ to $R^9$ is preferable in terms of synthesis suitability, introducing at any one of $R^4$, $R^6$, $R^7$ and $R^9$ is more preferable, and introducing at any one of $R^4$ and $R^9$ is even more preferable.

As a method to introduce an alkaline-soluble group to the dye structure of the present invention, any one, or two or more substituents among $R^4$ to $R^{10}$, $X^1$, and $X^2$ in the dipyrromethene metal complex represented by General Formula (7) may have the alkaline-soluble group. Among these substituents, any of $R^4$ to $R^9$ and $X^1$ is preferable, any of $R^4$, $R^6$, $R^7$ and $R^9$ is more preferable, and any of $R^4$ and $R^9$ is even more preferable.

The structure including the dipyrromethene metal complex represented by General Formula (7) may have other function groups in addition to the alkaline-soluble group as long as the effects of the present invention are not impaired.

$R^4$ to $R^9$ in General Formula (7) are the same as $R^4$ to $R^9$ in General Formula (M) and so are the preferable aspects.

In General Formula (7), Ma represents a metal atom or a metal compound. As the metal atom or the metal compound, any metal atom or metal complex which can form a complex can be used and a divalent metal atom, a divalent metal oxide, a divalent metal hydroxide, or a divalent metal chloride is included.

For example, Zn, Mg, Si, Sn, Rh, Pt, Pd, Mo, Mn, Pb, Cu, Ni, Co, Fe or the like, a metal chloride such as AlCl, InCl, FeCl, TiCl$_2$, SnCl$_2$, SiCl$_2$ or GeCl$_2$, a metal oxide such as TiO or V=O, or a metal hydroxide such as Si(OH)$_2$ is included.

Among these, from the viewpoint of a complex stability, spectral characteristics, heat resistance, light resistance, preparation suitability and the like, Fe, Zn, Mg, Si, Pt, Pd, Mo, Mn, Cu, Ni, Co, TiO or V=O is preferable, Zn, Mg, Si, Pt, Pd, Cu, Ni, Co, or VO is more preferable, Zn, Co, V=O and Cu is particularly preferable, and Zn is the most preferable.

Also, in General Formula (7), $R^{10}$ represents a hydrogen atom, a halogen atom, an alkyl group, an aryl group or a heterocyclic group and preferably a hydrogen atom.

In General Formula (7), $X^1$ may be any group which can bind to Ma and specifically, water, alcohols, (for example, methanol, ethanol or propanol), or the like, moreover, compounds described in "Metal Chelates" ([1] Sakaguchi Takeichi, Ueno Keihei (1995, Nankodo Co., Ltd.), [2] (1996), [3](1997) and the like) may be included. Among these, from the viewpoint of preparation, water, a carboxylic acid compound or alcohols is preferable and water or carboxylic acid compound is more preferable.

In General Formula (7), as the "group which neutralizes the charge of Ma" represented by $X^2$, for example, a halogen atom, a hydroxyl group, a carboxylic acid group, a phosphoric acid group, a sulfonic acid group or the like may be included and among these, from the viewpoint of preparation, a halogen atom, a hydroxyl group, a carboxylic acid group, or a sulfonic acid group is preferable, and a hydroxyl group, or a carboxylic acid group is more preferable.

In General Formula (7), $X^1$ and $X^2$ are bonded to each other and may form a five-membered, a six-membered, or a seven-membered ring with Ma. The five-membered, the six-membered, or the seven-membered ring formed may be a saturated ring or an unsaturated ring. In addition, the five-membered, the six-membered, or the seven-membered ring may be composed of only carbon atoms, or may form a heterocyclic ring having at least one atom selected from a nitrogen atom, an oxygen atom, or/and a sulfur atom.

As the preferable aspect of the compound represented by General Formula (7), an aspect in which $R^4$ to $R^9$, each independently, are as described in the description of $R^4$ to $R^9$ is preferable, an aspect in which $R^{10}$ is as described in the description of $R^{10}$ is preferable, Ma is Zn, Cu, Co or V=O, $X^1$ is water or a carboxylic acid compound, $X^2$ is a hydroxyl group or a carboxylic acid group, and $X^1$ and $X^2$ are bonded to each other and may form a five-membered or a six-membered ring.

[Structure Including Dipyrromethene Metal Complex Represented by General Formula (8)]

One of the aspects of the dye structure used in the coloring radiation-sensitive composition of the present invention is a structure including the dipyrromethene metal complex represented by following General Formula (8).

[Chem. 3]

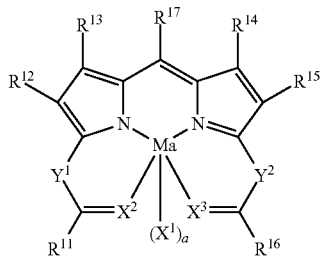

(8)

In General Formula (8), $R^{11}$ and $R^{16}$, each independently, represent an alkyl group, an alkenyl group, an aryl group, a heterocyclic group, an alkoxy group, an aryloxy group, an alkylamino group, an arylamino group or a heterocyclic amino group. $R^{12}$ to $R^{15}$, each independently, represent a hydrogen atom or a substituent. $R^{17}$ represents a hydrogen atom, a halogen atom, an alkyl group, an aryl group or a heterocyclic group. Ma represents a metal atom or a metal compound. $X^2$ and $X^3$, each independently, represent NR(R represents a hydrogen atom, an alkyl group, an alkenyl group, an aryl group, a heterocyclic group, an acyl group, an alkylsulfonyl group or an arylsulfonyl group), a nitrogen atom, an oxygen atom or a sulfur atom. $Y^1$ and $Y^2$, each independently, represent $NR^c$ ($R^c$ represents a hydrogen atom, an alkyl group, an alkenyl group, an aryl group, a heterocyclic group, an acyl group, an alkylsulfonyl group or a arylsulfonyl group), a nitrogen atom or a carbon atom. $R^{11}$ and $Y^1$ are bonded to each other and may form a five-membered, a six-membered, or a seven-membered ring and $R^{16}$ and $Y^2$ are bonded to each other and may form a five-membered, a six-membered, or a seven-membered ring. $X^1$ is a group which can bind to Ma and a represents 0, 1, or 2.

The structure including the dipyrromethene metal complex represented by following General Formula (8) also includes a tautomer When the structure including the dipyrromethene metal complex represented by General Formula (8) is introduced to a structural unit represented by General Formula (A) to General Formula (C), a polymer represented by General Formula (D), or a monomer represented by General Formula (1), which are described later, the introduction site is not particularly limited as long as the effects of the present invention are not impaired, however, introducing at any one of $R^{11}$ to $R^{17}$, $X^1$, $Y^1$ to $Y^2$ is preferable. Among these, in terms of synthesis suitability, introducing at any one of $R^{11}$ to $R^{16}$ and $X^1$ is preferable, an aspect inserting at any one of $R^{11}$, $R^{13}$, $R^{14}$ and $R^{16}$ is more preferable, and an aspect inserting at any one of $R^{11}$ and $R^{16}$ is even more preferable.

As a method to introduce an alkaline-soluble group to the dye structure of the present invention, when a dye monomer or a structure unit having an alkaline-soluble group is used, any one, or two or more substituents among $R^{11}$ to $R^{17}$, $X^1$, and $Y^1$ to $Y^2$ in the dipyrromethene metal complex represented by General Formula (8) may have the alkaline-soluble group. Among these substituents, any of $R^{11}$ to $R^{16}$ and $X^1$ is preferable, any of $R^{11}$, $R^{13}$, $R^{14}$ and $R^{16}$ is more preferable, and any of $R^{11}$ and $R^{16}$ is even more preferable.

The structure including the dipyrromethene metal complex represented by General Formula (8) may have other function groups in addition to the alkaline-soluble group as long as the effects of the present invention are not impaired.

The $R^{12}$ to $R^{15}$ are the same as $R^5$ to $R^8$ in General Formula (M) and so are the preferable aspects. The $R^{17}$ is the same as $R^{10}$ in General Formula (M) and so are the preferable aspects. The Ma is the same as Ma in General Formula (7) and so are the preferable ranges.

More specifically, as the $R^{12}$ and $R^{15}$ among $R^{12}$ to $R^{15}$ in General Formula (8), an alkoxycarbonyl group, an aryloxycarbonyl group, a carbamoyl group, an alkylsulfonyl group, an arylsulfonyl group, a nitrile group, an imide group, or a carbamoylsulfonyl group is preferable, an alkoxycarbonyl group, an aryloxycarbonyl group, a carbamoyl group, an alkylsulfonyl group, a nitrile group, an imide group, or a carbamoylsulfonyl group is more preferable, an alkoxycarbonyl group, an aryloxycarbonyl group, a carbamoyl group, a nitrile group, an imide group, or a carbamoylsulfonyl group is even more preferable, and an alkoxycarbonyl group, an aryloxycarbonyl group, a carbamoyl group is particularly preferable.

As the $R^{13}$ and $R^{14}$, a substituted or unsubstituted alkyl group, a substituted or unsubstituted aryl group, or a substituted or unsubstituted heterocyclic group is preferable and a substituted or unsubstituted alkyl group or a substituted or unsubstituted aryl group is more preferable. Here, specific examples of more preferable an alkyl group, an aryl group, and a heterocyclic group are the same as the specific examples listed for the $R^6$ and $R^7$ in General Formula (M).

In General Formula (8), $R^{11}$ and $R^{16}$ represent an alkyl group (an alkyl group with straight chain, branched chain, or a ring structure preferably having 1 to 36 carbon atoms, more preferably having 1 to 12 carbon atoms, and, for example, a methyl group, an ethyl group, a propyl group, an isopropyl group, a butyl group, an isobutyl group, a t-butyl group, a hexyl group, an 2-ethylhexyl group, a dodecyl group, a cyclopropyl group, a cyclopentyl group, a cyclohexyl group, or an 1-adamantyl group), an alkenyl group (an alkenyl group preferably having 2 to 24 carbon atoms, more preferably having 2 to 12 carbon atoms, and, for example, a vinyl group, an allyl group, or a 3-buten-1-yl group), an aryl group (an aryl group preferably having 6 to 36 carbon atoms, more preferably having 6 to 18 carbon atoms, and, for example, a phenyl group or a naphthyl group), a heterocyclic group (a heterocyclic group preferably having 1 to 24 carbon atoms, more preferably having 1 to 12 carbon atoms, and for example, a 2-thienyl group, a 4-pyridyl group, a 2-furyl group, a 2-pyrimidinyl group, a 2-pyridyl group, a 2-benzothiazolyl group, an 1-imidazolyl group, a 1-pyrazolyl group, or a benzotriazol-1-yl group), an alkoxy group (an alkoxy group preferably having 1 to 36 carbon atoms, more preferably having 1 to 18 carbon atoms, and, for example, a methoxy group, an ethoxy group, a propyloxy group, a butoxy group, a hexyloxy group, an 2-ethylhexyloxy group, a dodecyloxy group, or a cyclohexyloxy group), an aryloxy group (an aryloxy group preferably having 6 to 24 carbon atoms, more preferably having 6 to 18 carbon atoms, and, for example, a phenoxy group or a naphthyloxy group), an alkylamino group (an alkylamino group preferably having 1 to 36 carbon atoms, more preferably having 1 to 18 carbon atoms, and, for example, a methylamino group, an ethylamino group, a propylamino group, a butylamino group, a hexylamino group, an 2-ethylhexylamino group, an isopropylamino group, a t-butylamino group, a t-octylamino group, a cyclohexylamino group, an N,N-diethylamino group, an N,N-dipropylamino group, an N,N-dibutylamino group, or an N-methyl-N-ethylamino group), an arylamino group (an arylamino group preferably having 6 to 36 carbon atoms, more preferably having 6 to 18 carbon atoms, and, for example, a phenylamino group, a naphthylamino group, an N,N-diphenylamino group, or an N-ethyl-N-phenylamino group), or a heterocyclic amino group (a heterocyclic amino group preferably having 1 to 24 carbon atoms, more preferably having 1 to 12 carbon atoms, and, for example, a 2-aminopyrrole group, a 3-aminopyrazole group, a 2-aminopyridine group, or a 3-aminopyridine group).

As the $R^{11}$ and $R^{16}$, among the above, an alkyl group, an alkenyl group, an aryl group, a heterocyclic group, an alkylamino group, an arylamino group, or a heterocyclic amino group is preferable, an alkyl group, an alkenyl group, an aryl group, or a heterocyclic group is more preferable, an alkyl group, an alkenyl group, or an aryl group is more preferable, and an alkyl group is particularly preferable.

If an alkyl group, an alkenyl group, an aryl group, a heterocyclic group, an alkoxy group, an aryloxy group, an alkylamino group, an arylamino group, or a heterocyclic amino group of $R^{11}$ and $R^{16}$ in General Formula (8) is a group which can be further substituted, it may be substituted with substituents described as the substituents of $R^1$ in the General Formula (1) described later and when there are two or more substituents, those substituents may be the same as or different from each other.

In General Formula (8), $X^2$ and $X^3$, each independently, represent NR, a nitrogen atom, an oxygen atom or a sulfur atom. Here, R represents a hydrogen atom, an alkyl group (an alkyl group with straight chain, branched chain, or a ring structure preferably having 1 to 36 carbon atoms, more preferably having 1 to 12 carbon atoms, and, for example, a methyl group, an ethyl group, a propyl group, an isopropyl group, a butyl group, an isobutyl group, a t-butyl group, a hexyl group, an 2-ethylhexyl group, a dodecyl group, a cyclopropyl group, a cyclopentyl group, a cyclohexyl group, or an 1-adamantyl group), an alkenyl group (an alkenyl group preferably having 2 to 24 carbon atoms, more preferably having 2 to 12 carbon atoms, and, for example, a vinyl group, an allyl group, or a 3-buten-1-yl group), an aryl group (an aryl group preferably having 6 to 36 carbon atoms, more preferably having 6 to 18 carbon atoms, and, for example, a phenyl group or a naphthyl group), a heterocyclic group (a heterocyclic group preferably having 1 to 24 carbon atoms, more preferably having 1 to 12 carbon atoms, and, for example, a 2-thienyl group, a 4-pyridyl group, a 2-furyl group, a 2-pyrimidinyl group, a 1-pyridyl group, a 2-benzothiazolyl group, an 1-imidazolyl group, a 1-pyrazolyl group, or a benzotriazol-1-yl group), an acyl group (an acyl group preferably having 1 to 24 carbon atoms, more preferably having 2 to 18 carbon atoms, and, for example, an acetyl group, a pivaloyl group, an 2-ethylhexyl group, a benzoyl group, or a cyclohexanoyl group), an alkylsulfonyl group (an alkylsulfonyl group preferably having 1 to 24 carbon atoms, more preferably having 1 to 18 carbon atoms, and, for example, a methylsulfonyl group, an ethylsulfonyl group, an isopropylsulfonyl group, or a cyclohexylsulfonyl group), or an arylsulfonyl group (an arylsulfonyl group preferably having 6 to 24 carbon atoms, more preferably having 6 to 18 carbon atoms, and, for example, a phenylsulfonyl group or a naphthylsulfonyl group).

In General Formula (8), $Y^1$ and $Y^2$, each independently, represent $NR^c$, a nitrogen atom or a carbon atom, $R^c$ is the same as R of $X^2$ and $X^3$ and so are the preferable aspects.

In General Formula (8), $R^{11}$ and $Y^1$ are bonded to each other and a five-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, or a benzothiophene ring), a six-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a piperidine ring, a piperazine ring, a pyridazine ring, a quinoline ring, or a quinazoline ring) or a seven-membered ring (for example, a cycloheptane ring or a hexamethylene imine ring) may be formed with carbon atoms.

In General Formula (8), $R^{16}$ and $Y^2$ are bonded to each other and a five-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, or a benzothiophene ring), a six-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a piperidine ring, a piperazine ring, a pyridazine ring, a quinoline ring, or a quinazoline ring) or a seven-membered ring (for example, a cycloheptane ring or a hexamethylene imine ring) may be formed with carbon atoms.

If a five-membered, a six-membered, and a seven-membered ring formed from $R^{11}$ and $Y^1$, and $R^{16}$ and $Y^2$ bonding in General Formula (8) are groups which can be further substituted, they may be substituted with substituents described as the substituents of $R^1$ in the General Formula (1) described later and when there are two or more substituents, those substituents may be the same as or different from each other.

In General Formula (8), $R^{11}$ and $R^{16}$, each independently, is a monovalent substituent with -Es value which is a steric parameter of preferably 1.5 or more, more preferably 2.0 or more, even more preferably 3.5 or more, and particularly preferably 5.0 or more.

Here, the term steric parameter -Es' value is a parameter which represents a steric bulkiness of a substituent and -Es' value described in literatures (J. A. Macphee, et al., Tetrahedron, Vol. 34, pp 3553-3562, Chemistry Special Edition 107, Chemical Structure-Activity Correlation and Drug Design, Edited by Fujita Minorubu, Published on Feb. 20, 1986 (Kagaku Dojin)) is used.

In General Formula (8), $X^1$ is a group which can bind to Ma and specifically, is the same group as $X^1$ in General Formula (7) and so are the preferable aspects. a represents 0, 1, or 2.

As the preferable aspect of the structure including the dipyrromethene metal complex represented by General Formula (8), an aspect in which $R^{12}$ to $R^{15}$, each independently, are as described in the description of $R^5$ to $R^8$ in General Formula (M) is preferable, an aspect in which $R^{17}$ is as described in the description or $R^{10}$ in General Formula (M) is preferable, Ma is Zn, Cu, Co or V=O, $X^2$ is NR(R is a hydrogen atom or an alkyl group), a nitrogen atom, or an oxygen atom, $X^3$ is NR(R is a hydrogen atom or an alkyl group) or an oxygen atom, $Y^1$ is $NR^c$ ($R^c$ represents a hydrogen atom or an alkyl group), a nitrogen atom or a carbon atom, $Y^2$ is a nitrogen atom or a carbon atom, $R^{11}$ and $R^{16}$, each independently, represent an alkyl group, an aryl group, a heterocyclic group, an alkoxy group, or an alkylamino group, $X^1$ is a group bonding through an oxygen atom, a is 0 or 1, and $R^{11}$ and $Y^1$ are bonded to each other and may form a five-membered or a six-membered ring or $R^{16}$ and $Y^2$ are bonded to each other and may form a five-membered or a six-membered ring.

As the more preferable aspect of the structure including the dipyrromethene metal complex represented by General Formula (8), an aspect in which $R^{12}$ to $R^{15}$, each independently, are as described in the description of $R^5$ to $R^8$ in the compound represented by General Formula (M) is preferable, an aspect in which $R^{17}$ is as described in the description or $R^{10}$ in General Formula (M) is preferable, Ma is Zn, $X^2$ and $X^3$ are oxygen atoms, $Y^1$ is NH, $Y^2$ is a nitrogen atom, $R^{11}$ and $R^{16}$, each independently, represent an alkyl group, an aryl group, a heterocyclic group, an alkoxy group, or an alkylamino group, $X^1$ is a group bonding through an oxygen atom, a is 0 or 1, and $R^{11}$ and $Y^1$ are bonded to each other and may form a five-membered or a six-membered ring or $R^{16}$ and $Y^2$ are bonded to each other and may form a five-membered or a six-membered ring.

A molar extinction coefficient of the structure including the dipyrromethene metal complex represented by General Formula (7) and General Formula (8) is preferably as high as possible from the viewpoint of coloring power. Also, λmax which is a maximum absorption wavelength is preferably 520 nm to 580 nm and more preferably 530 nm to 570 nm from the viewpoint of color purity improvements. When the structure in this range is applied to a coloring composition and the like, a color filter with satisfactory color reproducibility may be produced. In addition, with regard to the absorbance at 450 nm of the dye polymer of the present invention, a maximum absorption wavelength (λmax) of greater than or equal to 1,000 times is preferable, greater than or equal to 10,000 times is more preferable, greater than or equal to 100,000 times is even more preferable. By maintaining the ratio in this range, when the dye polymer in the present invention is applied to the coloring composition or the like and particularly when a blue color filter is produced, a color filter with higher transmittance may be formed. A maximum absorption wavelength and a molar extinction coefficient are also measured using a spectrophotometer Cary 5 (manufactured by Varian, Inc.).

Melting point of the structure including the dipyrromethene metal complex represented by General Formula (7) and General Formula (8) is better not too high from the viewpoint of solubility.

The dipyrromethene metal complex compound represented by General Formula (7) and General Formula (8) may be synthesized by a method disclosed in U.S. Pat. Nos. 4,774,339A, 5,433,896A, JP2001-240761A, JP2002-155052A, JP3614586B, Aust. J. Chem., 1965, 11, 1835-1845, J. H. Boger et al., Heteroatom Chemistry, Vol. 1, No. 5, 389 (1990) or the like. Specifically, a method disclosed in paragraphs 0131 to 0157 of JP2008-292970A may be applied.

Specific examples of the dipyrromethene dyes are shown below, however, the present invention is not limited to these.

[Chem. 4]

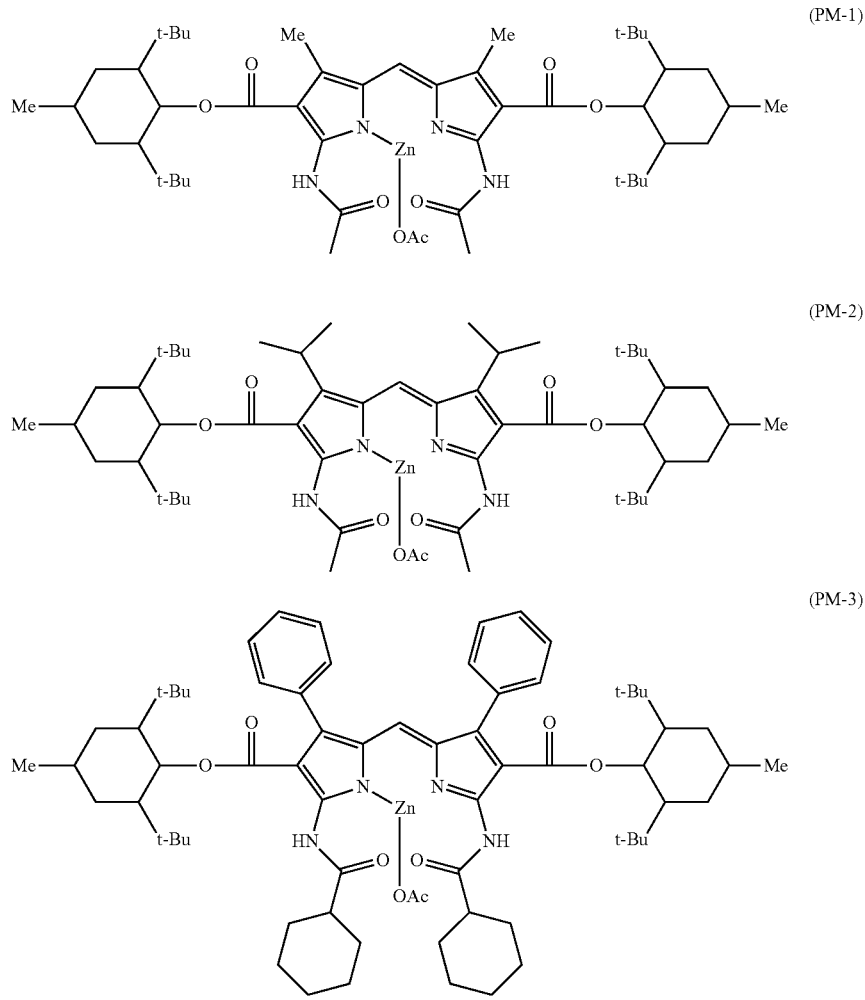

-continued
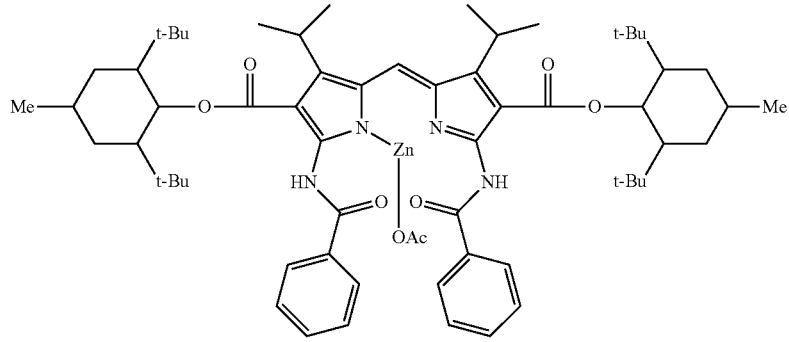
(PM-4)
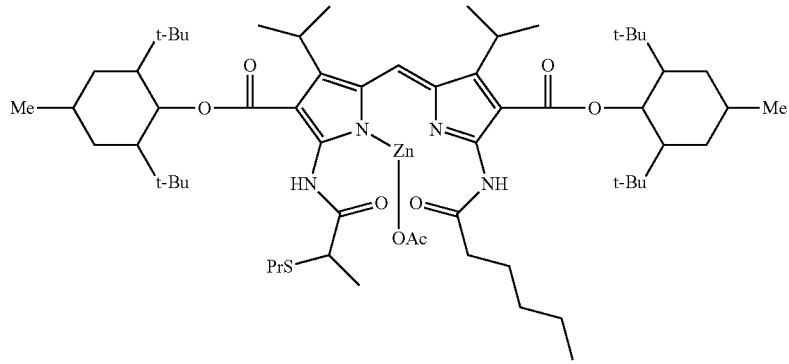
(PM-5)
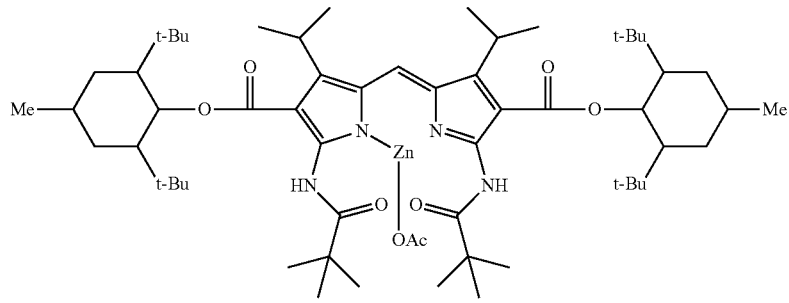
(PM-6)
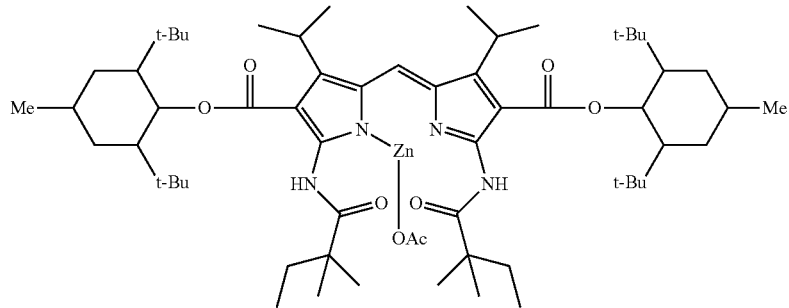
(PM-7)

-continued
(PM-8)
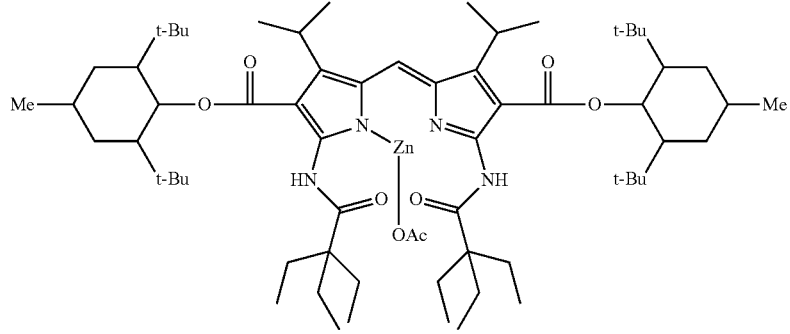
(PM-9)
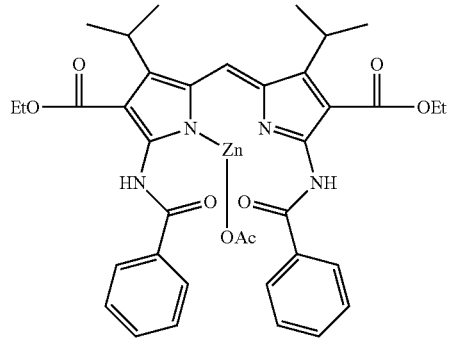
(PM-10)
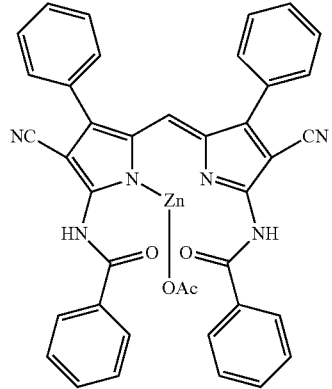
[Chem. 5]
(PM-11)
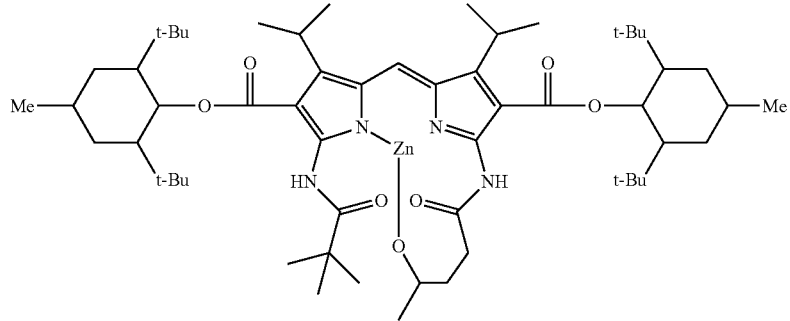

-continued
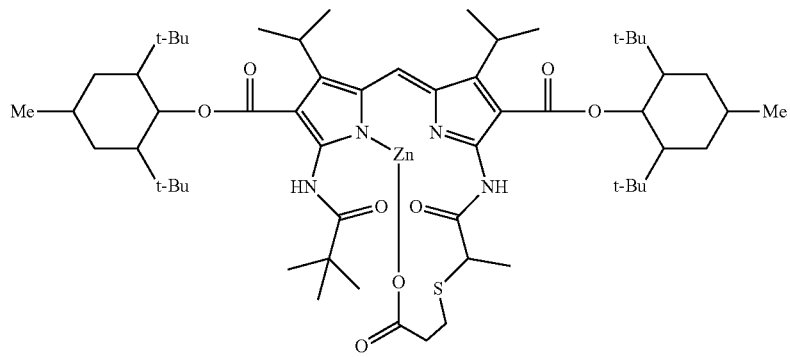
(PM-12)
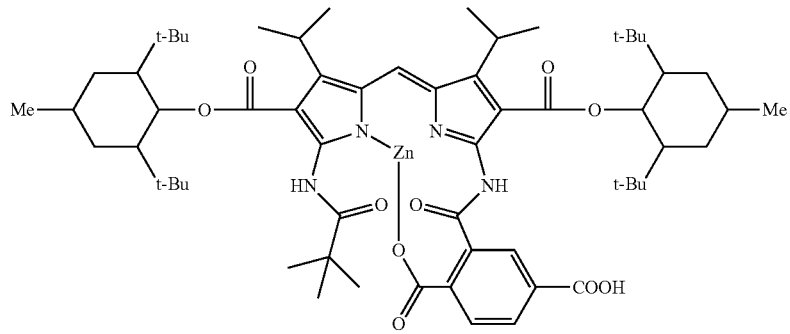
(PM-13)
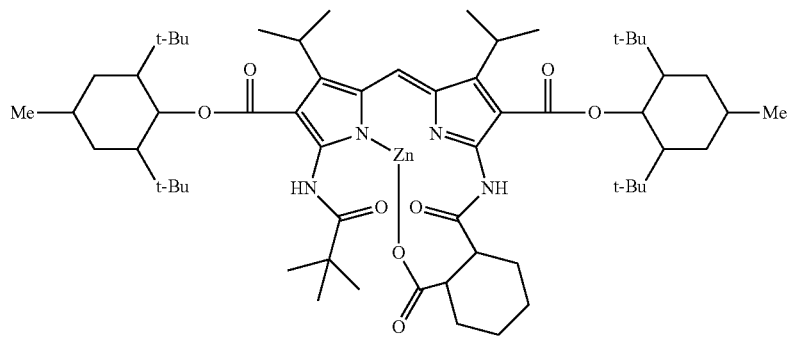
(PM-14)
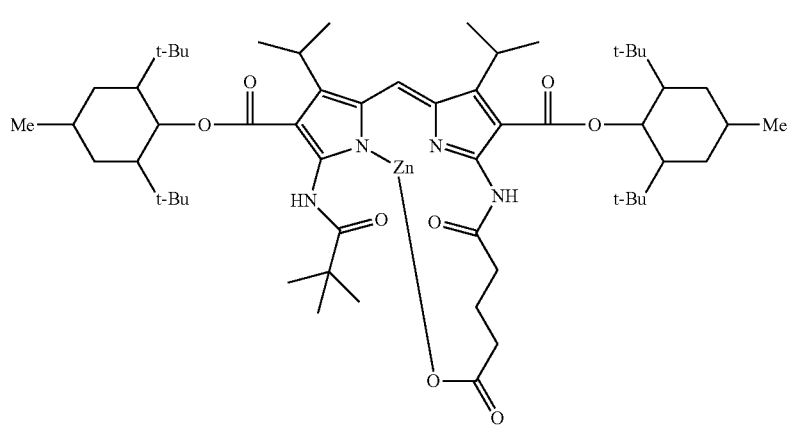
(PM-15)

-continued

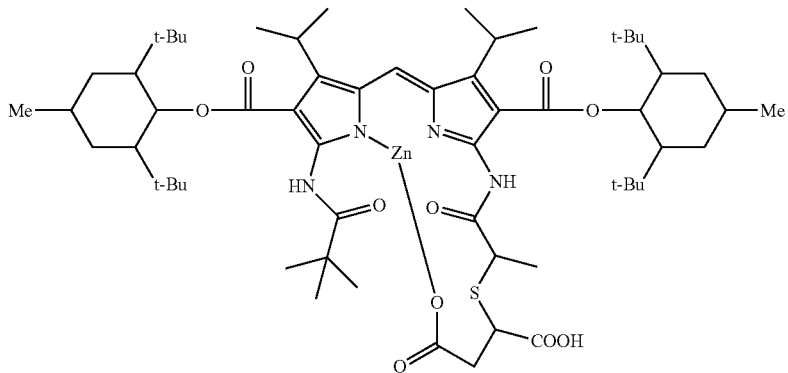

(PM-16)

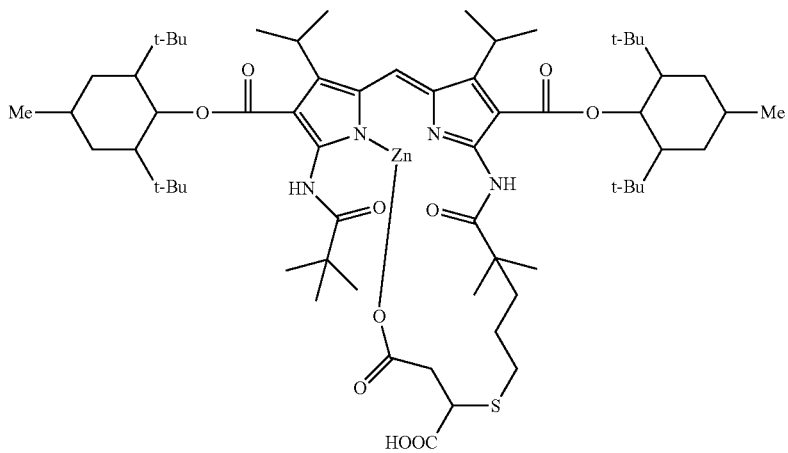

(PM-17)

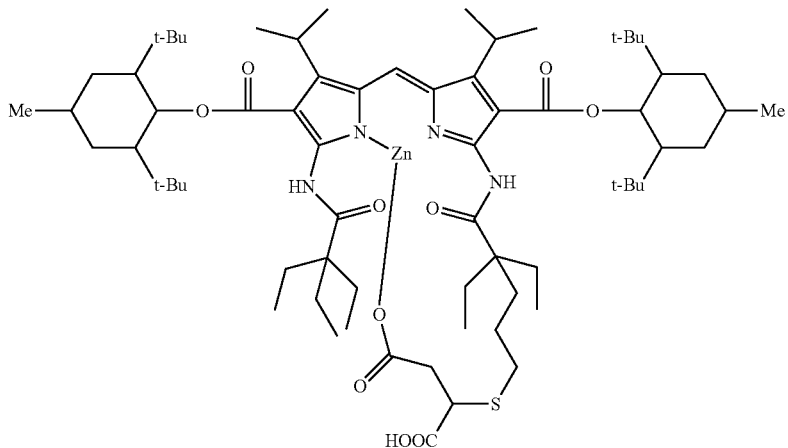

(PM-18)

<Azo Dyes>

One of the aspects of the dye polymer relating to the present invention is a dye polymer including the structure derived from the following azo compounds as a partial structure of the dye portion. The azo compound in the present invention is a collective term of compounds having a dye portion including N=N within the molecule. As an azo dye, well-known azo dyes (for example, a substituted azobenzene (as specific examples, (AZ-4) to (AZ-6) or the like described later) may be appropriately used, however, General Formulae (D), (E), (F), (G), (I) and (V) are particularly preferable.

—Magenta Dye—

As the magenta dye, azo dyes represented by following General Formula (9) are suitably used.

[Chem. 6]

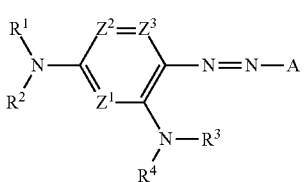

(9)

In General Formula (9), $R^1$ to $R^4$, each independently, represent a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group, A represents an aryl group or an aromatic heterocyclic group, $Z^1$ to $Z^3$, each independently, represent —C($R^5$)=, or —N=, and $R^5$ represents a hydrogen atom or a substituent.

Each substituent of General Formula (9) is described in detail.

In General Formula (9), $R^1$ to $R^4$, each independently, represent a hydrogen atom, an alkyl group (an alkyl group with straight chain, branched chain, or a ring structure preferably having 1 to 36 carbon atoms, more preferably having 1 to 12 carbon atoms, and, for example, methyl, ethyl, propyl, isopropyl, butyl, isobutyl, t-butyl, hexyl, 2-ethylhexyl, dodecyl, cyclopropyl, cyclopentyl, cyclohexyl, or 1-adamantyl), an alkenyl group (an alkenyl group preferably having 2 to 24 carbon atoms, more preferably having 2 to 12 carbon atoms, and, for example, vinyl, allyl, or 3-buten-1-yl), an aryl group (an aryl group preferably having 6 to 36 carbon atoms, more preferably having 6 to 18 carbon atoms, and, for example, phenyl or naphthyl), a heterocyclic group (a heterocyclic group preferably having 1 to 24 carbon atoms, more preferably having 1 to 12 carbon atoms, and, for example, 2-thienyl, 4-pyridyl, 2-furyl, 2-pyrimidinyl, 1-pyridyl, 2-benzothiazolyl, 1-imidazolyl, 1-pyrazolyl, or benzotriazol-1-yl), an acyl group (an acyl group preferably having 1 to 24 carbon atoms, more preferably having 2 to 18 carbon atoms, and, for example, acetyl, pivaloyl, 2-ethylhexyl, benzoyl, or cyclohexanoyl), an alkoxycarbonyl group (an alkoxycarbonyl group preferably having 1 to 10 carbon atoms, more preferably having 1 to 6 carbon atoms, and, for example, methoxycarbonyl or ethoxycarbonyl), an aryloxycarbonyl group (an aryloxycarbonyl group preferably having 6 to 15 carbon atoms, more preferably having 6 to 10 carbon atoms, and, for example, phenoxycarbonyl), a carbamoyl group (a carbamoyl group preferably having 1 to 8 carbon atoms, more preferably having 2 to 6 carbon atoms, and, for example, dimethylcarbamoyl), an alkylsulfonyl group (an alkylsulfonyl group preferably having 1 to 24 carbon atoms, more preferably having 1 to 18 carbon atoms, and, for example, methylsulfonyl, ethylsulfonyl, isopropylsulfonyl, or cyclohexylsulfonyl), or an arylsulfonyl group (an arylsulfonyl group preferably having 6 to 24 carbon atoms, more preferably having 6 to 18 carbon atoms, and, for example, phenylsulfonyl or naphthylsulfonyl).

$R^1$ and $R^3$, preferably, each independently, represent an alkyl group, an alkenyl group, an aryl group, or a heterocyclic group. $R^2$ and $R^4$, preferably, each independently, represent a hydrogen atom or an alkyl group.

If $R^1$ to $R^4$ are groups which can be substituted, for example, they may be substituted with substituents described in the above section of the substituents and when there are two or more substituents, those substituents may be the same as or different from each other.

$R^1$ and $R^2$, $R^1$ and $R^5$ (when $Z^1$ or $Z^2$ is —C(R)=), $R^3$ and $R^4$, and $R^3$ and $R^5$ (when $Z^1$ is —C($R^5$)=) are bonded to each other and may form a five-membered or a six-membered ring.

$Z^1$ to $Z^3$, each independently, represent —C($R^5$)=, or —N=, and $R^5$ represents a hydrogen atom or a substituent. As the substituents of $R^5$, for example, substituents described in the above section of the substituents may be included. If the substituents of $R^5$ are groups which can be further substituted, they may be substituted with substituents described in the above section of the substituents and when there are two or more substituents, those substituents may be the same as or different from each other As $Z^1$ to $Z^3$, it is preferable that $Z^1$ is —N=, $Z^2$ is —C($R^5$)= or —N=, and $Z^3$ is —C($R^5$)=. More preferably, $Z^1$ is —N=, and $Z^2$ and $Z^3$ are —C($R^5$)=.

A represents an aryl group or an aromatic heterocyclic group. The aryl group and the aromatic heterocyclic group of A may also have, for example, substituents described in the above section of the substituents and when there are two or more substituents, those substituents may be the same as or different from each other.

A is preferably an aromatic heterocyclic group. More preferably, an imidazole ring, a pyrazole ring, a triazole ring, a thiazole ring, an oxazole ring, a 1,2,4-thiadiazole ring, a 1,3,4-thiadiazole ring, a pyridine ring, a pyrimidine ring, a pyrazine ring, a benzopyrazole ring, a benzothiazole ring or the like may be included.

In General Formula (9), the introduction site of a polymerizable group involved in a polymerization (synthesis of a dye polymer) is not particularly limited, however, introducing at any one, two or more sites of $R^1$, $R^2$, and A is preferable in terms of synthesis suitability, and introducing at $R^1$ and/or A is more preferable.

The azo dye represented by General Formula (9) is more preferably represented by General Formula (10).

[Chem. 7]

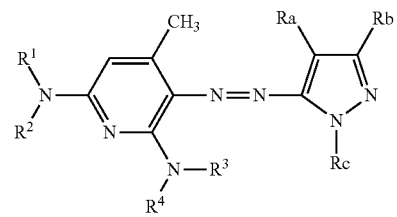

(10)

In General Formula (10), $R^1$ to $R^4$ is the same as those in General Formula (9) and so are the preferable ranges. Ra represents an electron withdrawing group with σp value which is a Hammett substituent constant of 0.2 or more and Rb represents a hydrogen atom or a substituent. Rc represents an alkyl group, an alkenyl group, an aryl group, a heterocyclic group, an acyl group, an alkoxycarbonyl group, a carbamoyl group, an alkylsulfonyl group or an arylsulfonyl group.

As the substituents of Rb, for example, substituents described in the above section of the substituents may be included.

Azo dyes represented by following General Formula (E) are suitably used as magenta dyes.

General Formula (E)

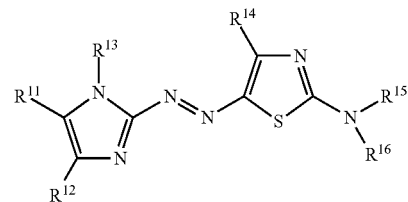

In General Formula (E), $R^{11}$ to $R^{16}$, each independently, represent a hydrogen atom or a monovalent substituent. $R^{11}$ and $R^{12}$, and $R^{15}$ and $R^{16}$, each independently, are bonded to each other and may form a ring.

Each substituent in General Formula (E) is described in detail.

$R^{11}$ to $R^{16}$, each independently, represent a hydrogen atom or a monovalent substituent. The monovalent substituent may include, for example, a halogen atom, an alkyl group having 1 to 30 carbon atoms (here, meaning a saturated aliphatic group including a cycloalkyl group and a bicycloalkyl group), an alkenyl group having 2 to 30 carbon atoms (here, meaning an unsaturated aliphatic group having a double bond including a cycloalkenyl group and a bicycloalkenyl group), an alkynyl group having 2 to 30 carbon atoms, an aryl group having 6 to 30 carbon atoms, a heterocyclic group having 3 to 30 carbon atoms, a cyano group, an aliphatic oxy group having 1 to 30 carbon atoms, an aryloxy group having 6 to 30 carbon atoms, an acyloxy group having 2 to 30 carbon atoms, a carbamoyloxy group having 1 to 30 carbon atoms, an aliphatic oxycarbonyloxy group having 2 to 30 carbon atoms, an aryloxycarbonyloxy group having 7 to 30 carbon atoms, an amino group having 0 to 30 carbon atoms (including an alkylamino group, an aniline group, and a heterocyclic amino group), an acylamino group having 2 to 30 carbon atoms, an aminocarbonylamino group having 1 to 30 carbon atoms, an aliphatic oxycarbonylamino group having 2 to 30 carbon atoms, an aryloxycarboxylamino group having 7 to 30 carbon atoms, a sulfamoylamino group having 0 to 30 carbon atoms, an alkyl- or arylaminosulfonylamino group having 1 to 30 carbon atoms, an alkylthio group having 1 to 30 carbon atoms, an arylthio group having 6 to 30 carbon atoms, a sulfamoyl group having 0 to 30 carbon atoms, an alkyl- or an arylsulfinyl group having 1 to 30 carbon atoms, an alkyl- or arylsulfonyl group having 1 to 30 carbon atoms, an acyl group having 2 to 30 carbon atoms, an aryloxycarbonyl group having 6 to 30 carbon atoms, an aliphatic oxycarbonyl group having 2 to 30 carbon atoms, a carbamoyl group having 1 to 30 carbon atoms, an aryl- or heterocyclic azo group having 3 to 30 carbon atoms, or an amide group, and each group may have further substituents.

$R^{11}$ and $R^{12}$, preferably, each independently, are a hydrogen atom, a heterocyclic ring, a cyano group, and more preferably a cyano group.

$R^{13}$ and $R^{14}$, preferably, each independently, are a hydrogen atom, a substituted or unsubstituted alkyl group, a substituted or unsubstituted aryl group, and more preferably a substituted or unsubstituted alkyl group.

$R^{15}$ and $R^{16}$, preferably, each independently, are a hydrogen atom, a substituted or unsubstituted alkyl group, a substituted or unsubstituted aryl group, and more preferably a substituted or unsubstituted alkyl group.

In General Formula (E), the introduction site of a polymerizable group involved in a polymerization (synthesis of a dye polymer) is not particularly limited, however, introducing at any one, two or more sites of $R^{13}$, $R^{15}$, and $R^{16}$ is preferable in terms of synthesis suitability, introducing at $R^{13}$ and/or $R^{15}$ is more preferable, and introducing at $R^{13}$ is even more preferable.

—Yellow Dye—

As the yellow dye, azo dyes represented by following General Formulae (G), (I-1), (I-2), and (V) are suitable (the tautomers thereof are also included).

[Chem. 9]

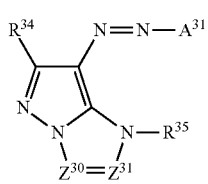

General Formula (G)

In General Formula (G), $R^{34}$ represents a hydrogen atom or a substituent, $R^{35}$ represents a hydrogen atom, an alkyl group, an alkenyl group, an aryl group, a heterocyclic group, an acyl group, an alkoxycarbonyl group, or a carbamoyl group. $Z^{30}$ and $Z^{31}$, each independently, represent —C($R^{36}$)=, or —N=, and $R^{36}$ represents a hydrogen atom or a substituent. $A^{31}$ represents an aryl group or an aromatic heterocyclic group.

Each substituent of General Formula (G) is described in detail.

$R^{34}$ represents a hydrogen atom or a substituent and is the same as $R^{30}$ in General Formula (F) and so are the preferable aspects.

$R^{35}$ represents a hydrogen atom, an alkyl group (an alkyl group with straight chain, branched chain, or a ring structure preferably having the number of carbon atom 1 to 36, more preferably having 1 to 12 carbon atoms, and, for example, methyl, ethyl, propyl, isopropyl, butyl, isobutyl, t-butyl, hexyl, 2-ethylhexyl, dodecyl, cyclopropyl, cyclopentyl, cyclohexyl, or 1-adamantyl), an alkenyl group (an alkenyl group preferably having 2 to 24 carbon atoms, more preferably having 2 to 12 carbon atoms, and, for example, vinyl, allyl, or 3-buten-1-yl), an aryl group (an aryl group preferably having 6 to 36 carbon atoms, more preferably having 6 to 18 carbon atoms, and for example, phenyl or naphthyl), a heterocyclic group (a heterocyclic group preferably having 1 to 24 carbon atoms, more preferably having 1 to 12 carbon atoms, and, for example, 2-thienyl, 4-pyridyl, 2-furyl, 2-pyrimidinyl, 1-pyridyl, 2-benzothiazolyl, 1-imidazolyl, 1-pyrazolyl, or benzotriazol-1-yl), an acyl group (an acyl group preferably having 1 to 24 carbon atoms, more preferably having 2 to 18 carbon atoms, and, for example, acetyl, pivaloyl, 2-ethylhexyl, benzoyl, or cyclohexanoyl), an alkoxycarbonyl group (an alkoxycarbonyl group preferably having 1 to 10 carbon atoms, more preferably having 1 to 6 carbon atoms, and, for example, methoxycarbonyl group or ethoxycarbonyl group), or a carbamoyl group (a carbamoyl group preferably having 1 to 10 carbon atoms, more preferably having 1 to 6 carbon atoms, and for example, N,N-dimethylcarbamoyl).

$Z^{30}$ and $Z^{31}$, each independently, represent —C($R^{36}$)= or —N=, and $R^{36}$ represents a hydrogen atom or a substituent. As the substituent of $R^{36}$, for example, substituents described in the above section of the substituents may be included. If the substituents of $R^{36}$ are groups which can be further substituted, they may be substituted with substituents described in the above section of the substituents and when there are two or more substituents, those substituents may be the same as or different from each other.

As $Z^{30}$ and $Z^{31}$, preferably, $Z^{30}$ is —N= and $Z^{31}$ is —C($R^{36}$)=.

$A^{31}$ is the same as A in General Formula (9) and so are the preferable aspects.

In General Formula (G), the introduction site of a polymerizable group involved in a polymerization (synthesis of a dye polymer) is not particularly limited, however, introducing at $R^{34}$ and/or $A^{31}$ is preferable in terms of synthesis suitability.

[Chem. 10]

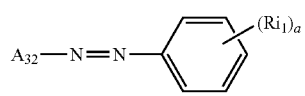

General Formula (I-1)

-continued

General Formula (I-2)

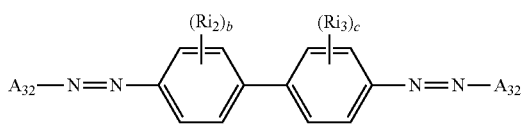

$R_{i1}$, $R_{i2}$, and $R_{i3}$ in General Formula (I-1) and General Formula (I-2), each independently, represent a substituent. a represents an integer of 0 to 5. If a is greater than or equal to 2, the adjacent two $R_{i1}$s are bonded and may form a condensed ring. b and c, each independently, represent an integer of 0 to 4. If b and c are greater than or equal to 1, the adjacent two $R_{i1}$s are bonded and may form a condensed ring.

$A_{32}$ represents General Formula (IA), General Formula (IB), and General Formula (IC).

[Chem. 11]

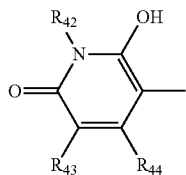

General Formula (IA)

In General Formula (IA), $R_{42}$ represents a hydrogen atom, an alkyl group or an aryl group. $R_{43}$ represents a substituent. $R_{44}$ represents a hydrogen atom, an alkyl group or an aryl group.

[Chem. 12]

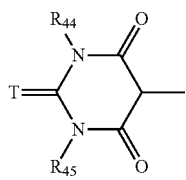

General Formula (IB)

In General Formula (IB), $R_{44}$ and $R_{45}$, each independently, represent a hydrogen atom, an alkyl group or an aryl group. T represents an oxygen atom or a sulfur atom.

[Chem. 13]

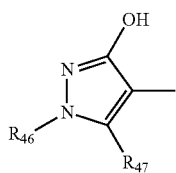

General Formula (IC)

In General Formula (IC), $R_{46}$ represents a hydrogen atom, an alkyl group or an aryl group. $R_{47}$ represents a substituent.

As the substituents $R_{i1}$, $R_{i2}$, and $R_{i3}$ of General Formula (I-1) and General Formula (I-2), represent, substituents described in the above section of the substituents may be included, and particularly, an alkyl group (an alkyl group with straight chain, branched chain, or a ring structure preferably having 1 to 10 carbon atoms, more preferably having 1 to 5 carbon atoms, and, for example, methyl, ethyl, propyl, isopropyl, butyl, isobutyl, t-butyl, hexyl, 2-ethylhexyl, dodecyl, cyclopropyl, cyclopentyl, cyclohexyl, or 1-adamantyl), an aryl group (an aryl group preferably having 6 to 36 carbon atoms, more preferably having 6 to 18 carbon atoms, and, for example, phenyl or naphthyl), an alkenyl group (an alkenyl group with straight chain, branched chain, or a ring structure preferably having 1 to 10 carbon atoms, more preferably having 1 to 5 carbon atoms, and, for example, vinyl, allyl, prenyl, geranyl, or oleyl), a sulfo group, a sulfamoyl group (an alkylsulfamoyl group having preferably 1 to 10 carbon atoms) may be included, however, particularly, an alkyl group having 1 to 5 carbon atoms and an alkylsulfamoyl group having 1 to 10 carbon atoms are preferable. a is preferably 1 to 3. b and c are preferably 1 to 3.

In General Formula (IA), $R_{44}$ represents a hydrogen atom, an alkyl group or an aryl group, however, particularly, an alkyl group having 1 to 5 carbon atoms and a phenyl group are preferable. $R_{44}$ represents a substituent described in the above section of the substituents, however, particularly, a cyano group or a carbamoyl group is preferable. $R_{44}$ and $R_{42}$ represent a hydrogen atom, an alkyl group or an aryl group, however, particularly, an alkyl group having 1 to 5 carbon atoms and a phenyl group are preferable.

In General Formula (IB), T represents an oxygen atom or a sulfur atom, however, an oxygen atom is preferable. $R_{44}$ and $R_{46}$ each independently, represent a hydrogen atom, an alkyl group or an aryl group, however, particularly, an alkyl group having 1 to 5 carbon atoms and a phenyl group are preferable.

In General Formula (IC), $R_{46}$ represents a hydrogen atom, an alkyl group or an aryl group, however, particularly, an alkyl group having 1 to 5 carbon atoms and a phenyl group are preferable. The substituent $R_{47}$ represents is a substituent described in the above section of the substituents, however, particularly, a hydrogen atom, an alkyl group, or an aryl group is preferable, and particularly, an alkyl group having 1 to 5 carbon atoms and a phenyl group are preferable.

[Chem. 14]

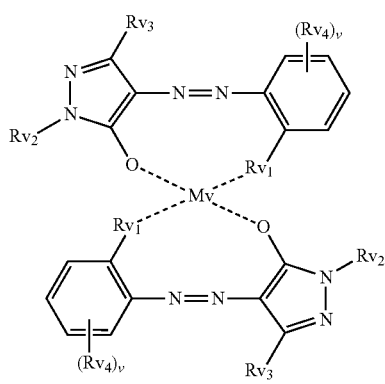

General Formula (V)

In General Formula (V), My represents Cr or Co. $R_{v1}$ represents an oxygen atom or COO. $R_{v2}$ and $R_{v3}$, each independently, represent a hydrogen atom, an alkyl group or an aryl group. v represents an integer of 0 to 4. $R_{v4}$ represents a substituent. If v is greater than or equal to 2, the adjacent two $R_{v4}$s are bonded and may form a ring.

$R_{v2}$ and $R_{v3}$ are particularly preferably an alkyl group having 1 to 5 carbon atoms and a phenyl group. The substituent $R_{44}$ represents is a substituent described in the above section of the substituents, however, particularly, an alkyl group, or an aryl group, a nitro group, a sulfamoyl group, and a sulfo group are preferable, and an alkyl group having 1 to 5 carbon atoms, a phenyl group, and a nitro group is the most preferable.

Among the azo dyes, azo dyes represented by General Formula (I-1), General Formula (I-2), and General Formula (V) are preferable as yellow dyes.

Specific examples of the azo dyes are shown below, however, the present invention is not limited to these.

[Chem. 15]

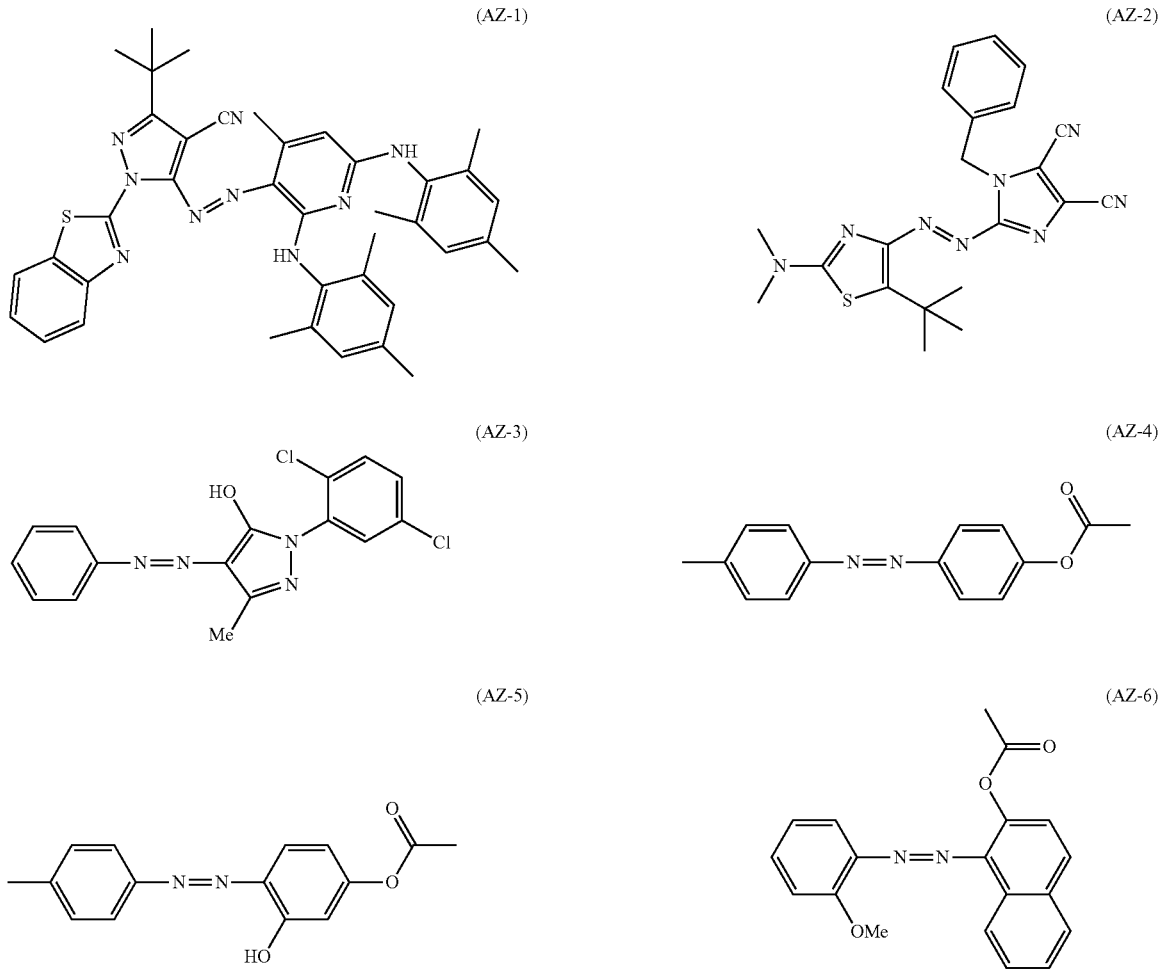

[Chem. 16]

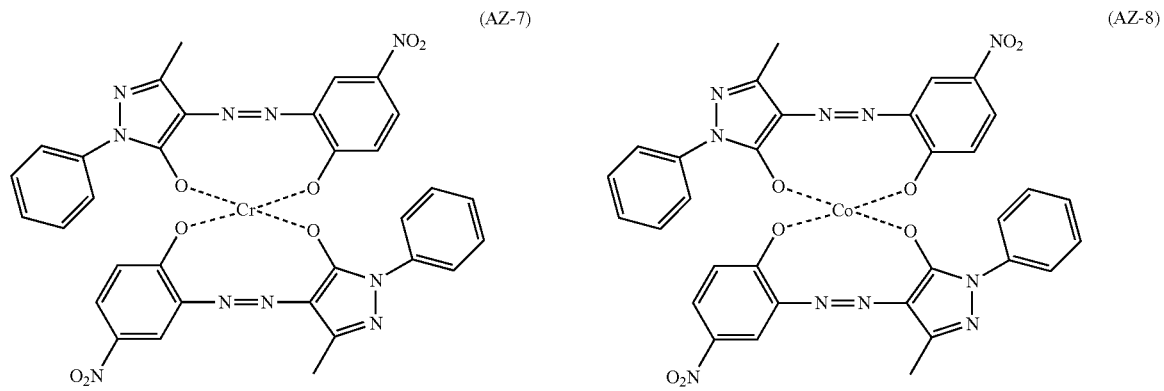

-continued
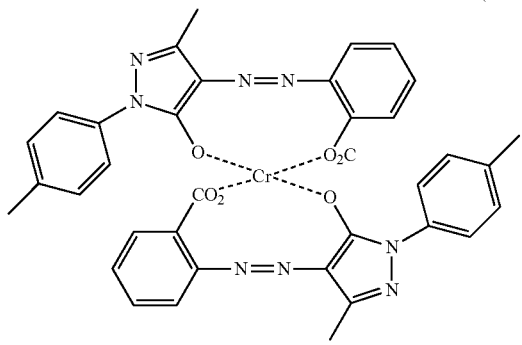
(AZ-9)
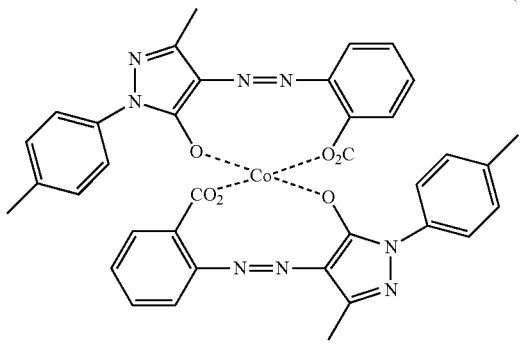
(AZ-10)
[Chem. 17]
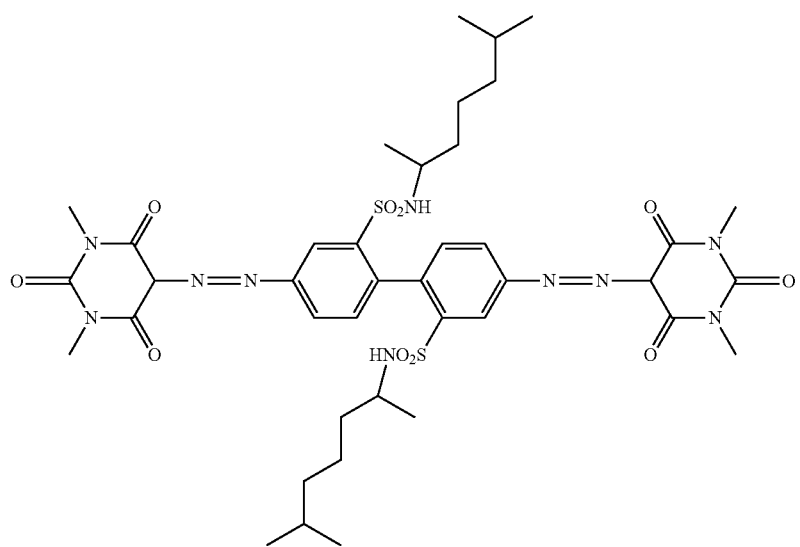
(2-1)
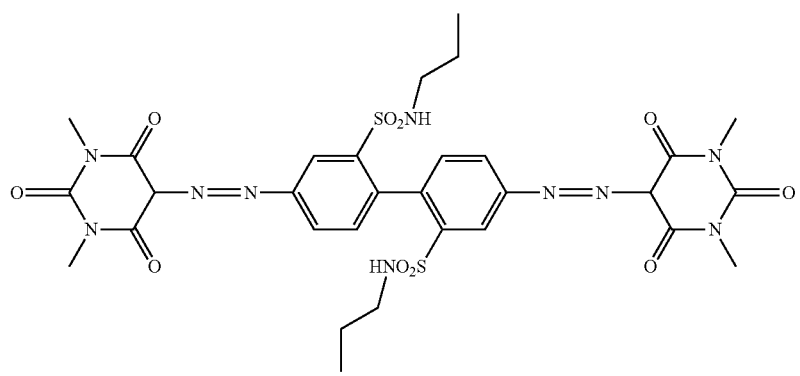
(2-2)

-continued
(2-3)
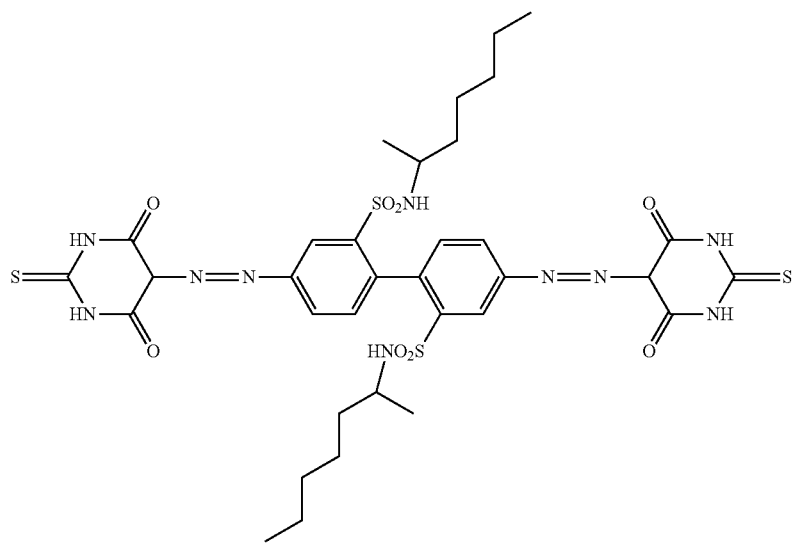
(2-4)
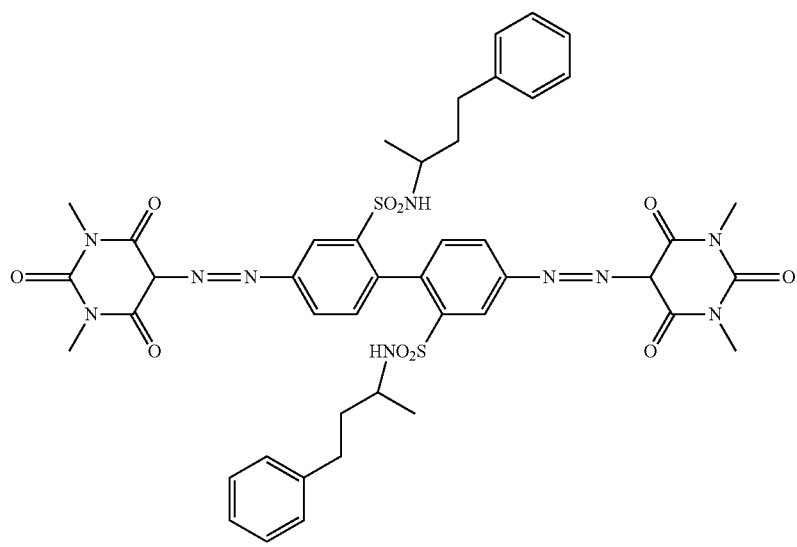
[Chem. 18]
(3-1)
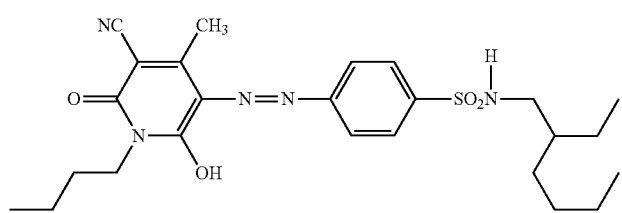
(3-2)
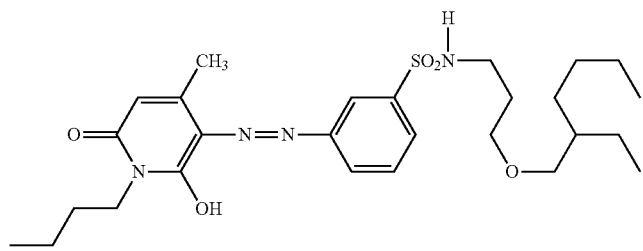

-continued
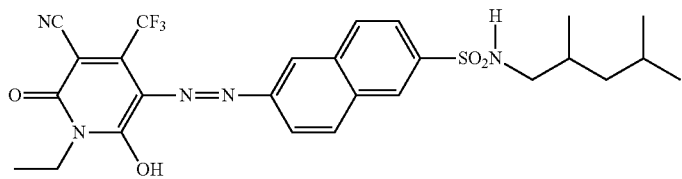
(3-3)
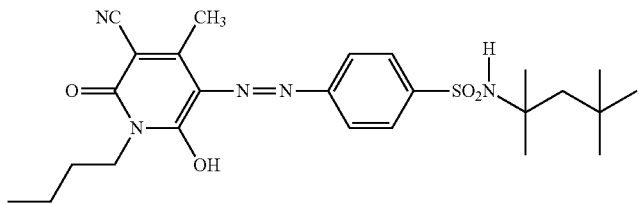
(3-4)
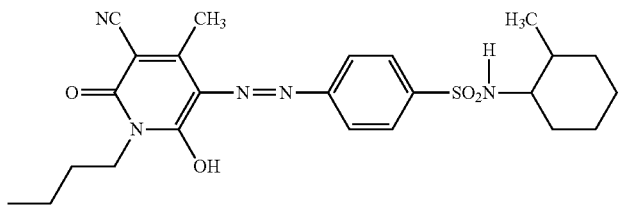
(3-5)
[Chem. 19]
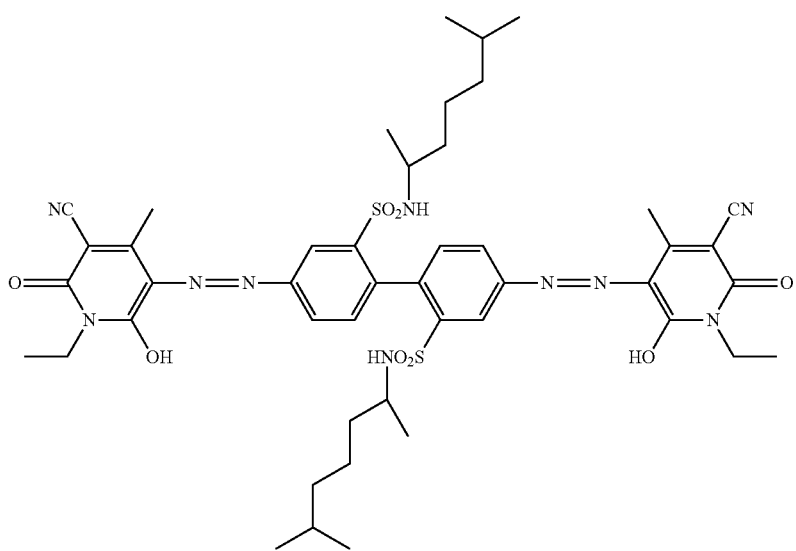
(3-12)

(3-13)
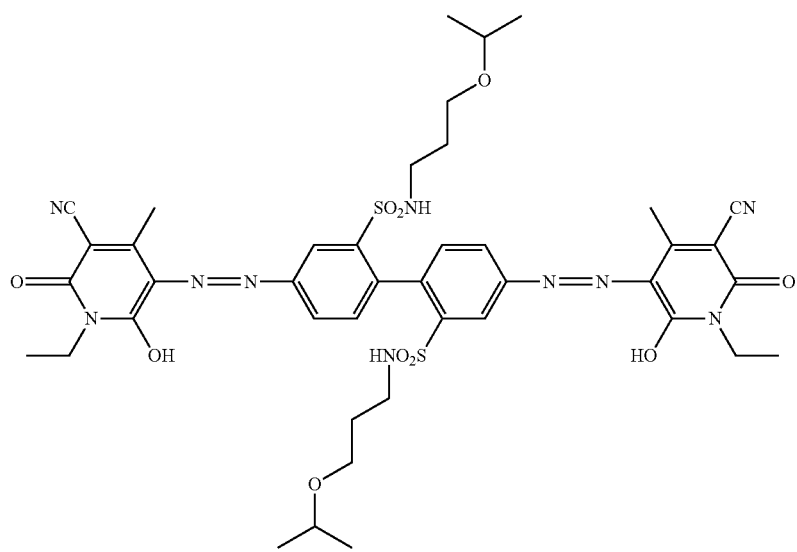
(3-14)
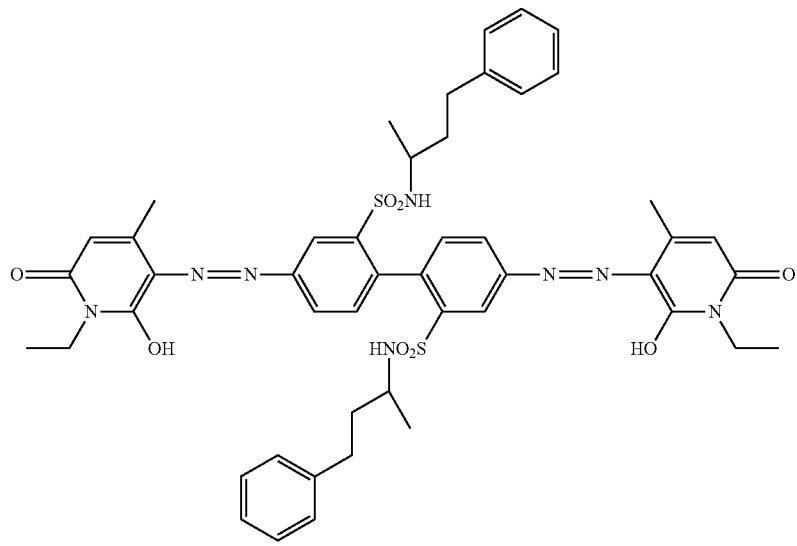
[Chem. 20]
(3-15)
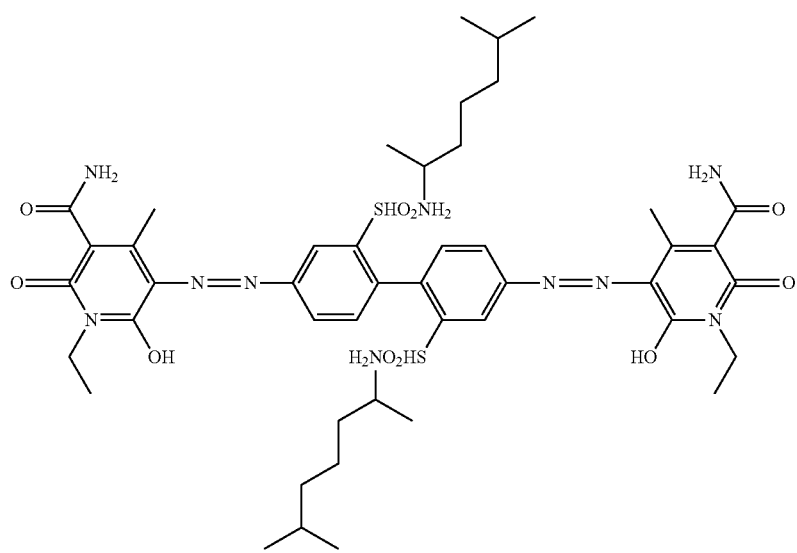

<Anthraquinone Dyes>

One of the aspects of the dye polymer relating to the present invention is a dye polymer including the structure derived from the compounds represented by following General Formulae (AQ-4) to (AQ-3) (anthraquinone compounds) as a partial structure of the dye portion. The anthraquinone compound in the present invention is a collective term of compounds having a dye portion including an anthraquinone skeleton within the molecule.

[Chem. 21]

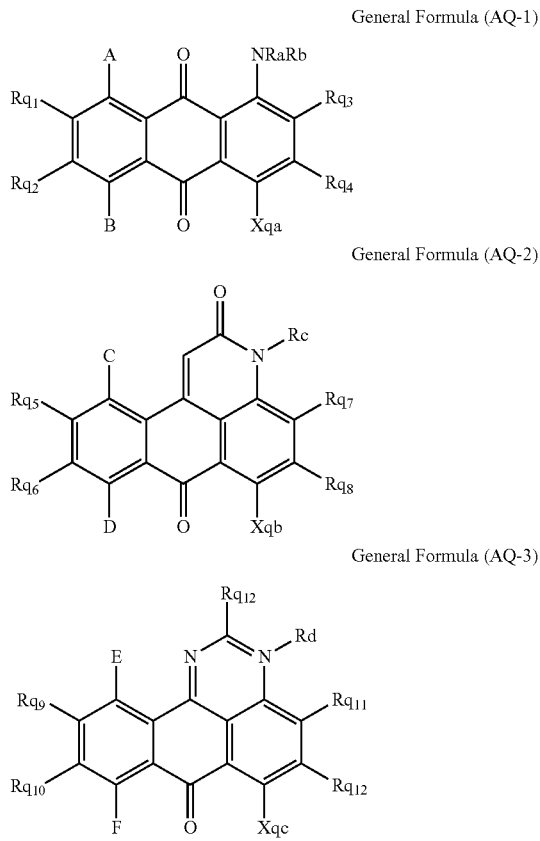

In General Formula (AQ-1), A and B, each independently, represent an amino group, a hydroxyl group, an alkoxy group, and a hydrogen atom. Xqa represents $ORqa_1$ or $NRqa_2Rqa_3$. $Rqa_1$ to $Rqa_3$, each independently, represent a hydrogen atom, an alkyl group, or an aryl group. $Rq_1$ to $Rq_4$ represent substituents. The substituents $Rq_1$ to $Rq_4$ represent is the same as the substituents described in the above section of the substituents. Ra and Rb represent a hydrogen atom, an alkyl group, or an aryl group.

In General Formula (AQ-2), C and D are the same as A and B in General Formula (AQ-1), respectively. Xqb represents $ORqb_1$ or $NRqb_2Rqb_3$. $Rqb_1$ to $Rqb_3$, each independently, represent a hydrogen atom, an alkyl group, or an aryl group. $Rq_5$ to $Rq_8$ are the same as the $Rq_1$ to $Rq_4$, respectively. Rc is the same as the Ra or Rb.

In General Formula (AQ-3), E and F are the same as A and B in General Formula (AQ-1), respectively. Xqc represents $ORqc_1$ or $NRqc_2Rqc_3$. $Rqc_1$ to $Rqc_3$, each independently, represent a hydrogen atom, an alkyl group, or an aryl group. $Rq_9$ to $Rq_{12}$ are the same as the $Rq_1$ to $Rq_4$, respectively. Rd is the same as the Ra or Rb.

In General Formula (AQ-1), A and B are preferably hydrogen atoms. Xqa is preferably $ORqa_1$ ($Rqa_1$ is a hydrogen atom, an alkyl group having 1 to 5 carbon atoms, or a phenyl group), or $NRqa_2Rqa_3$ ($Rqa_2$ is a hydrogen atom, $Rqa_3$ is an alkyl group having 1 to 5 carbon atoms, or a phenyl group). $Rq_1$ to $Rq_4$ are preferably a hydrogen atom, a halogen atom or an alkoxy group. Ra is preferably a hydrogen atom, Rb is preferably a hydrogen atom, an alkyl group having 1 to 5 carbon atoms, or a phenyl group.

In General Formula (AQ-2), C and D are preferably hydrogen atoms. Xqb is preferably $ORqb_1$ ($Rqb_1$ is a hydrogen atom, an alkyl group having 1 to 5 carbon atoms, or a phenyl group), or $NRqb_2Rqb_3$ ($Rqb_2$ is a hydrogen atom, $Rqb_3$ is an alkyl group having 1 to 5 carbon atoms, or a phenyl group). $Rq_5$ to $Rq_8$ are preferably a hydrogen atom, a halogen atom or an alkoxy group. Rc is preferably a hydrogen atom, an alkyl group having 1 to 5 carbon atoms, or a phenyl group.

In General Formula (AQ-3), E and F are preferably hydrogen atoms. Xqc is preferably $ORqc_1$ ($Rqc_1$ is a hydrogen atom, an alkyl group having 1 to 5 carbon atoms, or a phenyl group), or $NRqc_2Rqc_3$ ($Rqc_2$ is a hydrogen atom, $Rqc_3$ is an alkyl group having 1 to 5 carbon atoms, or a phenyl group). $Rq_9$ to $Rq_{12}$ are preferably a hydrogen atom, a halogen atom or an alkoxy group. Rd is preferably a hydrogen atom, an alkyl group having 1 to 5 carbon atoms, or a phenyl group.

Specific examples of the anthraquinone dyes are shown below, however, the present invention is not limited to these.

[Chem. 22]

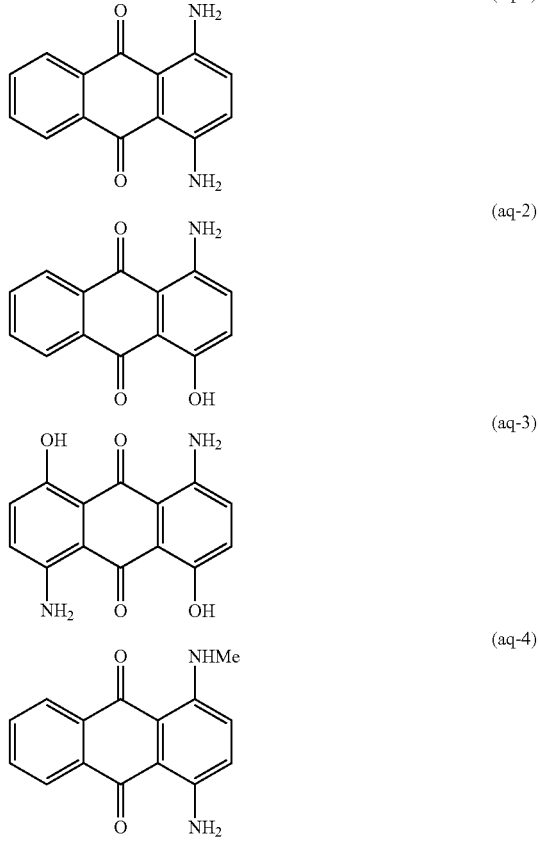

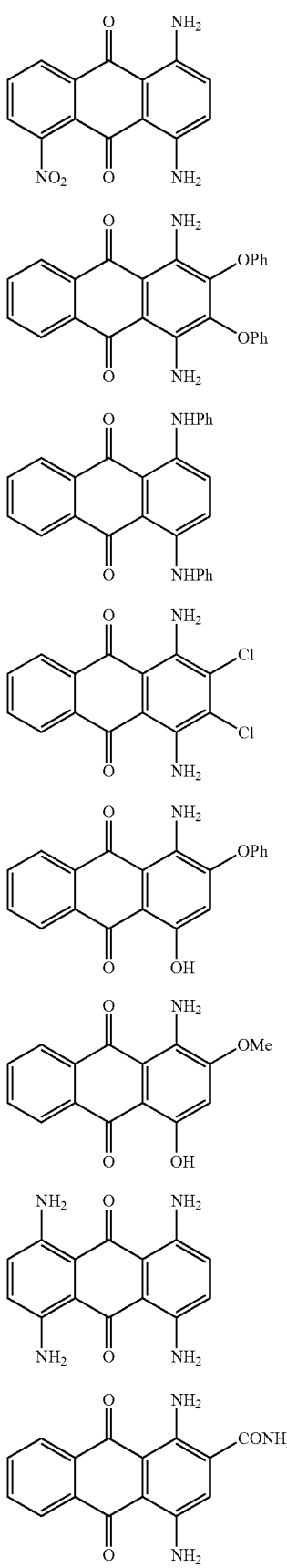

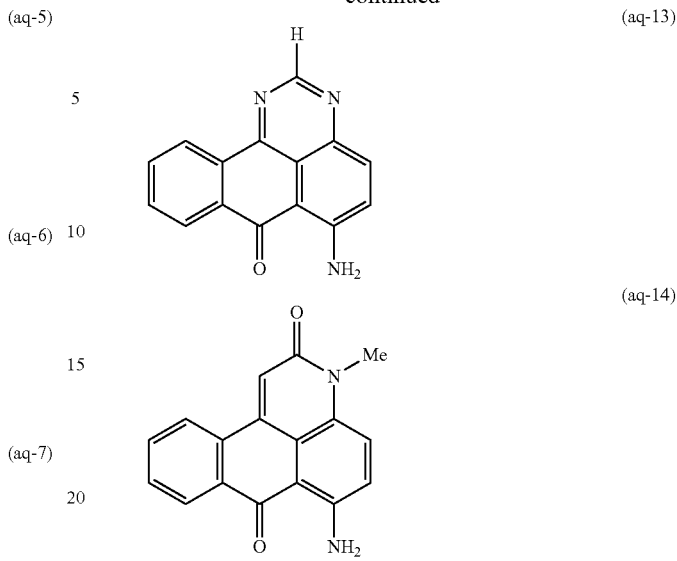

<Triarylmethane Dyes>

One of the aspects of the dye polymer relating to the present invention is a dye polymer including the structure derived from the compounds represented by following General Formula (TP) (triarylmethane compounds) as a partial structure of the dye portion.

The triarylmethane compound in the present invention is a collective term of compounds having a dye portion including a triarylmethane skeleton within the molecule.

[Chem. 23]

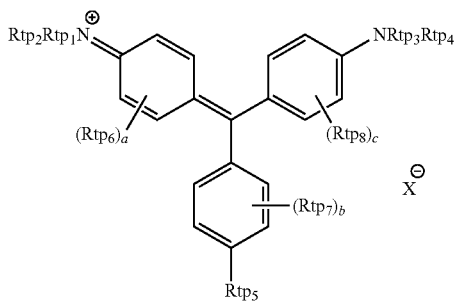

General Formula (TP)

In General Formula (TP), $Rtp_1$ to $Rtp_4$, each independently, represent a hydrogen atom, an alkyl group, or an aryl group. $Rtp_5$ represents a hydrogen atom, an alkyl group, an aryl group, or $NRtp_9Rtp_{10}$ ($Rtp_9$ and $Rtp_{10}$ represent a hydrogen atom, an alkyl group, or an aryl group). $Rtp_6$, $Rtp_7$, and $Rtp_8$ represent substituents. a, b, and c represent integers of 0 to 4. If a, b, and c are greater than or equal to 2, $Rtp_6$, $Rtp_7$, and $Rtp_8$ may be bonded to each other and may form a ring. X represents an anion.

As $Rtp_1$ to $Rtp_6$, a hydrogen atom, an alkyl group with straight chain or branched chain having 1 to 5 carbon atoms, and a phenyl group are preferable. $Rtp_5$ is preferably a hydrogen atom or $NRtp_9Rtp_{10}$, $NRtp_9Rtp_{10}$ is the most preferable. $Rtp_9$ and $Rtp_{10}$ are preferably a hydrogen atom, an alkyl group with straight chain or branched chain having 1 to 5 carbon atoms, and a phenyl group. As the substituents $Rtp_6$, $Rtp_7$ and $Rtp_8$ represent, substituents described in the above section of the substituents may be used, however, particularly, an alkyl group with straight chain or branched chain having 1 to 5 carbon atoms, an alkenyl group having 1 to 5 carbon atoms, an aryl group having 6 to 15 carbon atoms, a carboxyl group, and a sulfo group are preferable, and an alkyl group with straight chain or branched chain having 1 to 5 carbon atoms, an alkenyl group having 1 to 5 carbon atoms, a phenyl group, and a carboxylic group are more preferable. Particularly, as $Rtp_6$ and $Rtp_8$, an alkyl group having 1 to 5 carbon atoms is preferable and as $Rtp_7$, an alkenyl group (particularly, a phenyl group in which adjacent two alkenyl groups are bonded is preferable), a phenyl group, and a carboxyl group are preferable.

a, b, and c represent integers of 0 to 4 and particularly, it is preferable that a and b be 0 to 1, and c be 0 to 2.

$X^-$ represents an anion, but specifically, an inorganic anion such as a fluorine anion, a chlorine anion, a bromine anion, an iodine anion, a perchlorate anion, a thiocyanate anion, a hexafluoride phosphate anion, a hexafluoride antimonate anion, or a tetrafluoride borate anion, a carboxylate anion such as an acetate anion or a benzoate anion, an organic sulfonate anion such as a benzene sulfonate anion, a toluene sulfonate anion, a trifluoromethane sulfonate anion, an organic phosphate anion such as an octylphosphate anion, a dodecylphosphate anion, an octadecylphosphate anion, a phenylphosphate anion, or a nonylphenyl phosphate anion or the like may be included. $X^-$ may be bonded to the dye skeleton or to part of the dye polymer (a polymer chain and the like).

$X^-$ is preferably a fluorine anion, a chlorine anion, a bromine anion, an iodine anion, a perchlorate anion, or a carboxylate anion and a perchlorate anion, or a carboxylate anion is the most preferable.

Specific examples of General Formula (TP) are shown below, however, the present invention is not limited to these.

[Chem. 24]

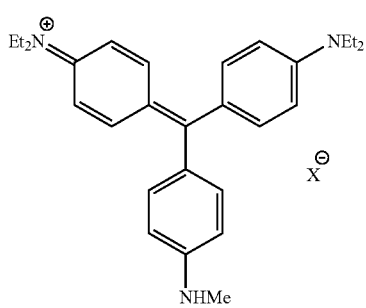

(tp-1)

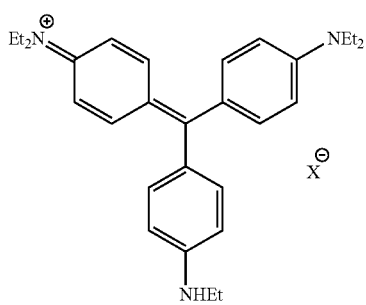

(tp-2)

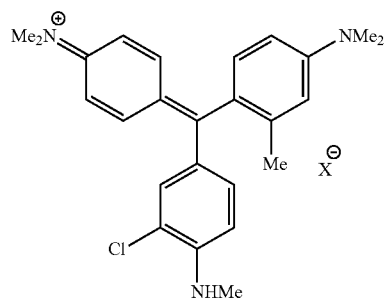

(tp-3)

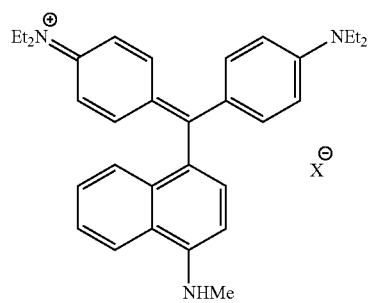

(tp-4)

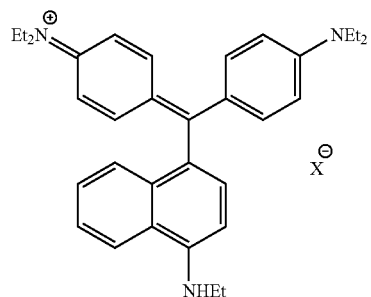

(tp-5)

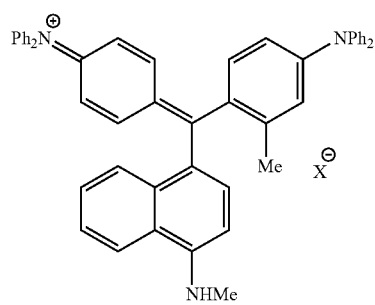

(tp-6)

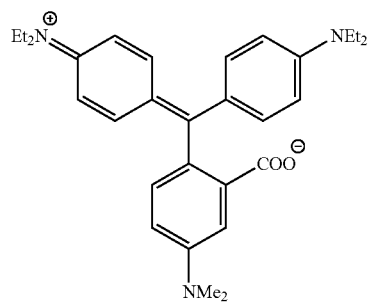

(tp-7)

(tp-8)
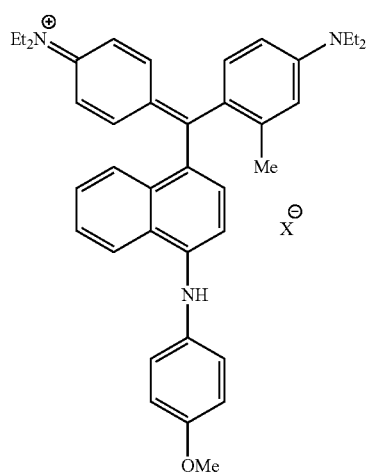
(tp-9)
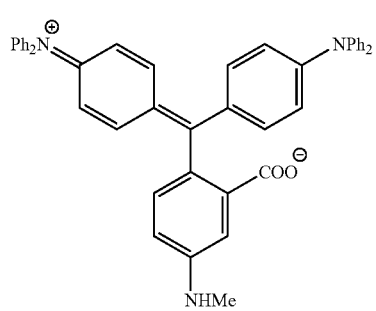
[Chem. 25]
(tp-10)
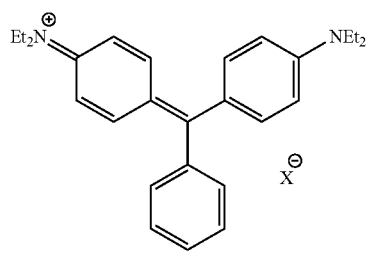
(tp-11)
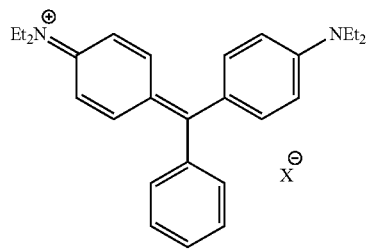
(tp-12)
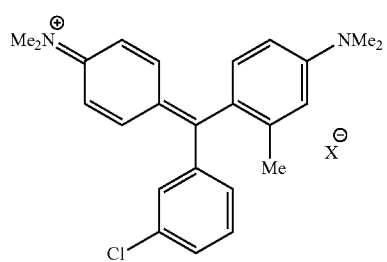
(tp-13)
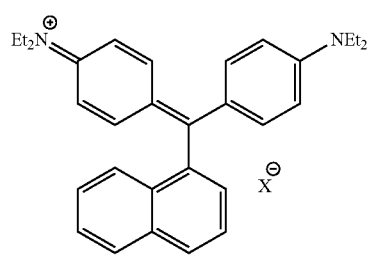
(tp-14)
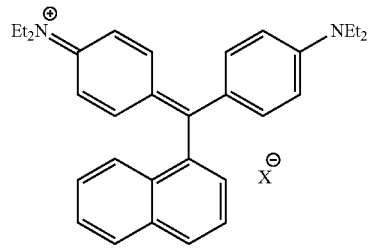
(tp-15)
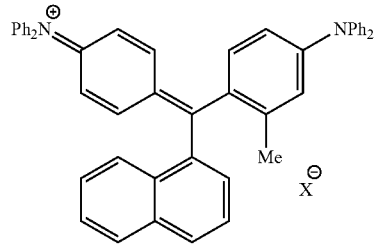
(tp-16)
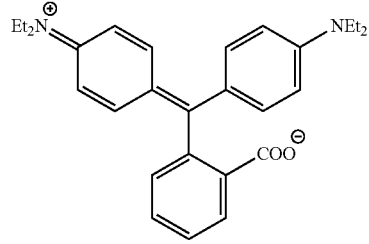
(tp-17)
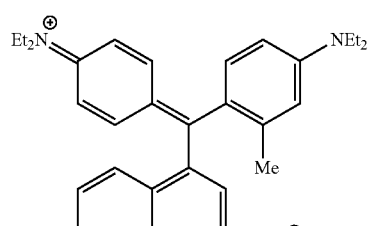
(tp-18)
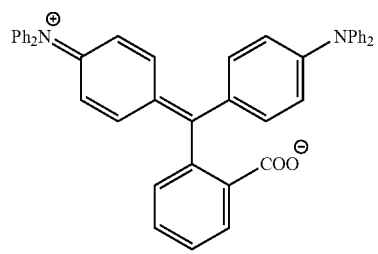
<Xanthene Dyes>
The preferable aspects of the dye polymer relating to the present invention is a dye polymer including the structure derived from the xanthene compounds represented by following General Formula (J) as a partial structure of the dye portion.

[Chem. 26]

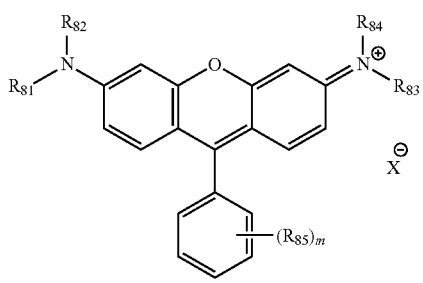

General Formula (J)

In General Formula (J), $R_{81}$, $R_{82}$, $R_{83}$, and $R_{84}$, each independently, represent a hydrogen atom or a monovalent substituent. $R_{85}$s, each independently, represent a monovalent substituent and m represents an integer of 0 to 5. $X^-$ represents an anion.

The substituents $R_{81}$ to $R_{84}$ and $R_{85}$ may select are the same as the substituents described in the above section of the substituents.

$R_{81}$ and $R_{82}$, $R_{83}$ and $R_{84}$, and $R_{85}$ when m greater than or equal to 2, each independently, are bonded to each other and may form a five-membered, a six-membered or a seven-membered saturated ring, or an unsaturated ring. If the five-membered, the six-membered, or the seven-membered ring formed are groups which can be further substituted, it may be substituted with substituents described in $R_{81}$ to $R_{85}$ and when there are two or more substituents, those substituents may be the same as or different from each other.

In a case in which $R_{81}$ and $R_{82}$, $R_{83}$ and $R_{84}$, and $R_{85}$ when m greater than or equal to 2, each independently, are bonded to each other and form a five-membered, a six-membered or a seven-membered saturated ring, or an unsaturated ring, for example, a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, a pyridazine ring or the like may be included, and preferably, a benzene ring or a pyridine ring may be included as the five-membered, the six-membered, or the seven-membered saturated ring, or the unsaturated ring.

Particularly, $R_{82}$ and $R_{83}$ are hydrogen atoms and $R_{81}$ and $R_{84}$ are preferably substituted or unsubstituted phenyl groups. Also, $R_{85}$ is preferably a halogen atom, an alkyl group with straight chain or branched chain having 1 to 5 carbon atoms, a sulfo group, a sulfonamide group, or a carboxyl group. As the substituents phenyl groups of $R_{81}$ and $R_{84}$ have, a hydrogen atom, a halogen atom, an alkyl group with straight chain or branched chain having 1 to 5 carbon atoms, a sulfo group, a sulfonamide group, or a carboxyl group is the most preferable.

$X^-$ represents an anion, and specifically, an inorganic anion such as a fluorine anion, a chlorine anion, a bromine anion, an iodine anion, a perchlorate anion, a thiocyanate anion, a hexafluoride phosphate anion, a hexafluoride antimonate anion, or a tetrafluoride borate anion, a carboxylate anion such as an acetate anion or a benzoate anion, an organic sulfonate anion such as a benzene sulfonate anion, a toluene sulfonate anion, a trifluoromethane sulfonate anion, an organic phosphate anion such as an octylphosphate anion, a dodecylphosphate anion, an octadecylphosphate anion, a phenylphosphate anion, or a nonylphenyl phosphate anion or the like may be included. $X^-$ may be bonded to the dye skeleton or to part of the dye polymer (a polymer chain and the like).

$X^-$ is preferably a fluorine anion, a chlorine anion, a bromine anion, an iodine anion, a perchlorate anion, or a carboxylate anion and a perchlorate anion, or a carboxylate anion is the most preferable.

Compounds having xanthene skeletons represented by General Formula (J) may be synthesized using methods disclosed in literatures. Specifically, methods disclosed in Tetrahedron Letters, 2003, vol. 44, No. 23, pp 4355 to 4360 and Tetrahedron Letters, 2005, vol. 61, No. 12, pp 3097 to 3106 may be applied.

Specific examples of the xanthene compounds are shown below, however, the present invention is not limited to these.

[Chem. 27]

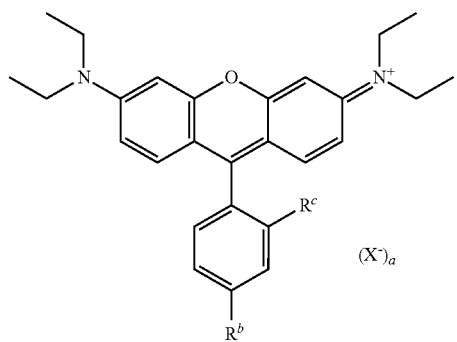

(1a)

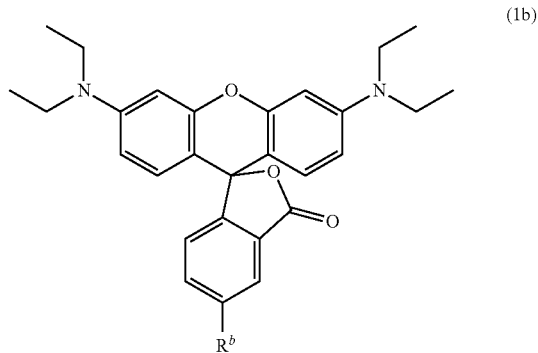

(1b)

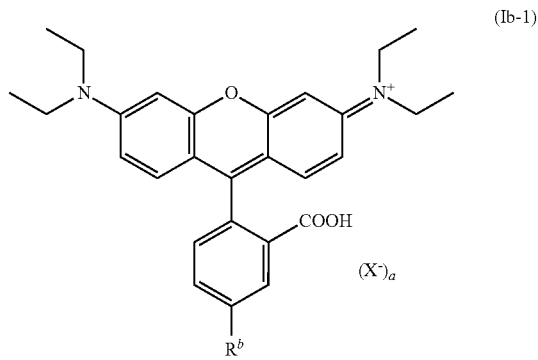

(1b-1)

-continued (1c)
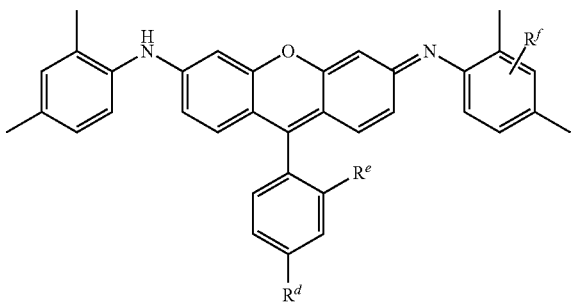

(1d)
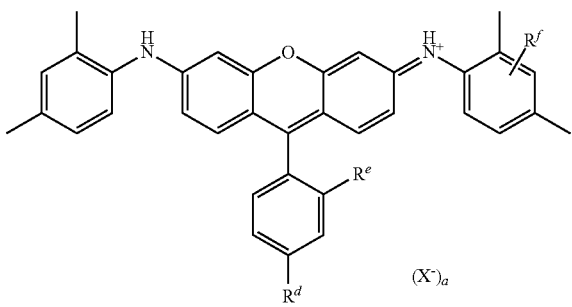

(1e)
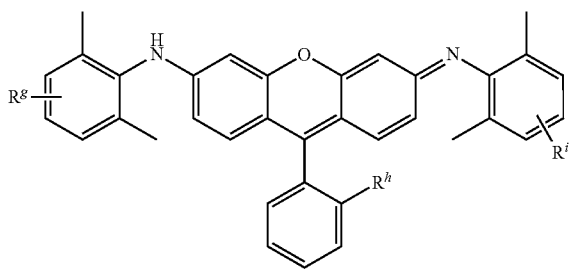

(1f)
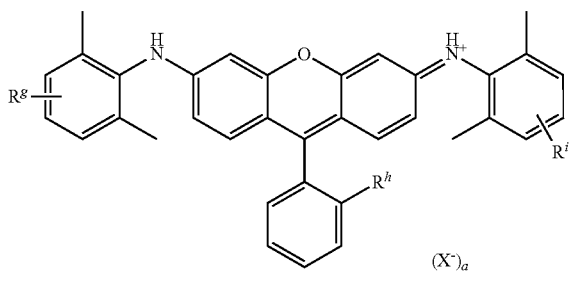

(In the Formula, $R^b$ and $R^c$, each independently, represent a hydrogen atom, —$SO_3$—, $CO_2H$ or —$SO_2NHR^a$. $R^d$, $R^e$, and $R^f$, each independently, represent —$SO_3$—, $SO_3Na$ or —$SO_2NHR^a$. $R^g$, $R^h$, and $R^i$, each independently, represent a hydrogen atom, —$SO_3$—, $SO_3H$— or —$SO_2NHR^a$. $R^a$ represents an alkyl group having 1 to 10 carbon atoms and preferably represents a 2-ethylhexyl group. X and a represent the same meaning as above.)

Compounds represented by Formula (1b) are tautomers of the compounds represented by Formula (1b-1). Among these, Formula (1e) and Formula (1f) are preferable.

<Cyanine Dyes>

One of the aspects of the dye polymer relating to the present invention is a dye polymer including the structure derived from the compounds represented by following General Formula (PM) (cyanine compounds) as a partial structure of the dye portion. The cyanine compound in the present invention is a collective term of compounds having a dye portion including a cyanine skeleton within the molecule.

[Chem. 28]

General Formula (PM)

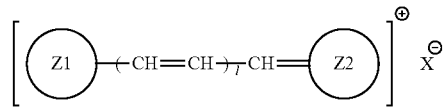

In General Formula (PM), Ring Z1 and Ring Z2, each independently, represent a heterocyclic ring which may have substituents. I represents an integer of greater than or equal to 0 and less than or equal to 3. $X^-$ represents an anion.

Ring Z1 and Ring Z2, each independently, include oxazole, benzoxazole, oxazoline, thiazole, thiazoline, benzothiazole, indolenine, benzoindolenine, or 1,3-thiadiazine. The substituents Ring Z1 and Ring Z2 may select are the same as the substituents described in the above section of the substituents. $X^-$ represents an inorganic anion such as a fluorine anion, a chlorine anion, a bromine anion, an iodine anion, a perchlorate anion, a thiocyanate anion, a hexafluoride phosphate anion, a hexafluoride antimonate anion, or a tetrafluoride borate anion, a carboxylate anion such as an acetate anion or a benzoate anion, an organic sulfonate anion such as a benzene sulfonate anion, a toluene sulfonate anion, a trifluoromethane sulfonate anion, an organic phosphate anion such as an octylphosphate anion, a dodecylphosphate anion, an octadecylphosphate anion, a phenylphosphate anion, or a nonylphenyl phosphate anion or the like may be included. X may be bonded to the dye skeleton or to part of the dye polymer (a polymer chain and the like).

General Formula (PM) preferably represents as General Formula (PM-2).

[Chem. 29]

General Formula (PM-2)

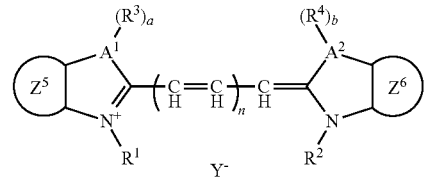

In the Formula, Ring $Z^5$ and Ring $Z^1$, each independently, represent a benzene ring which may have substituents or a naphthalene ring which may have substituents.

$Y^-$ represents $Cl^-$, $Br^-$, $I^-$, $ClO_4^-$, $OH^-$, a monovalent organic carboxylate anion, a monovalent organic sulfonate anion, a monovalent borate anion, or a monovalent organic metal complex anion. $Y^-$ may be bonded to the dye skeleton or to part of the dye polymer (a polymer chain and the like).

n represents an integer of greater than or equal to 0 and less than or equal to 3. $A^1$ and $A^2$, each independently, represent an oxygen atom, a sulfur atom, a selenium atom, a carbon atom, or a nitrogen atom.

$R^1$ and $R^2$, each independently, represent a monovalent aliphatic hydrocarbon group having 1 to 20 carbon atoms which may have substituents.

$R^3$ and $R^4$, each independently, either represent a hydrogen atom or monovalent aliphatic hydrocarbon group having 1 to 6 carbon atoms which may have substituents, or represent a divalent aliphatic hydrocarbon group having 2 to 6 carbon atoms formed from the joint of one $R^3$ and one $R^4$.

a and b, each independently, represent an integer of greater or equal to 0 and less than or equal to 2.

In General Formula (PM-2), $Y^-$ is preferably a fluorine anion, a chlorine anion, a bromine anion, an iodine anion, a perchlorate anion, or a carboxylate anion and the most preferably a chlorine anion, a perchlorate anion, or a carboxylate anion. n is preferably 1. $A^1$ and $A^2$ are preferably an oxygen atom, a sulfur atom and a carbon atom and the most preferably a carbon atom.

Specific examples of the cyanine compounds are shown below, however, the present invention is not limited to these.

[Chem. 30]

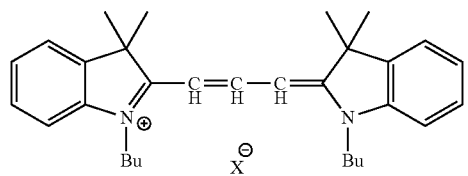
(pm-1)

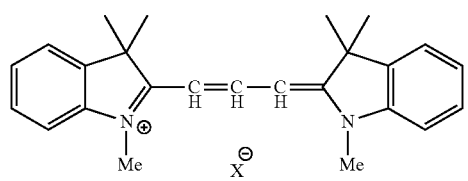
(pm-2)

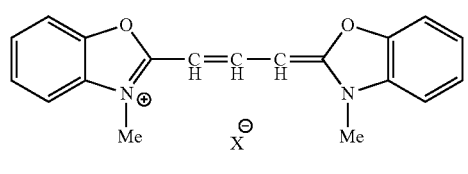
(pm-3)

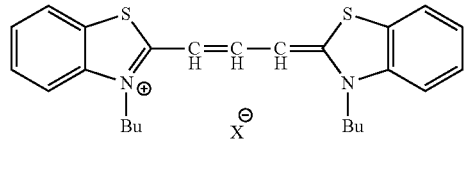
(pm-4)

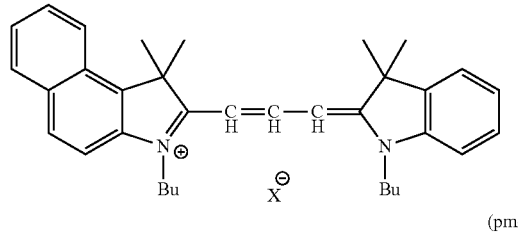
(pm5)

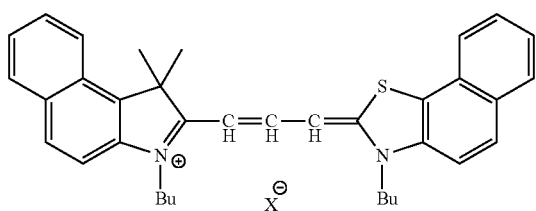
(pm-6)

-continued

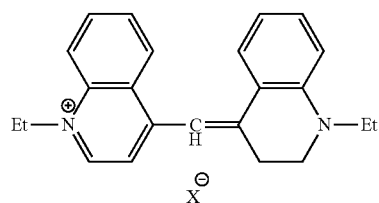
(pm-7)

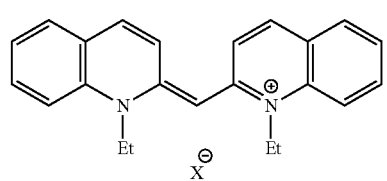
(pm-8)

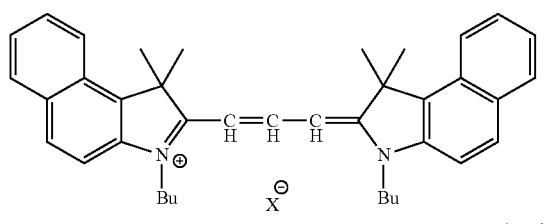
(pm-9)

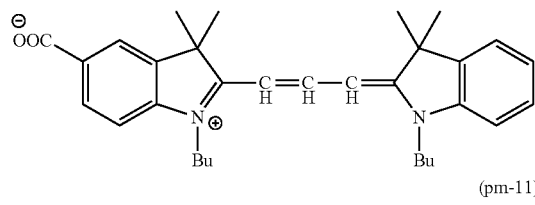
(pm-10)

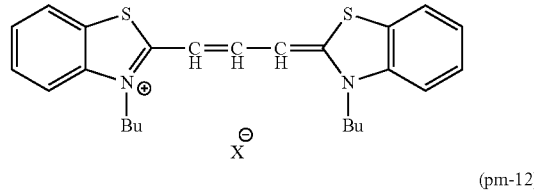
(pm-11)

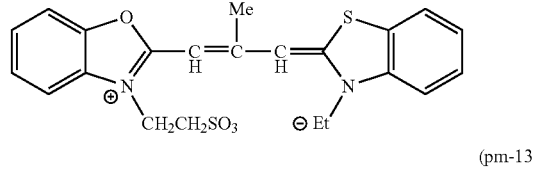
(pm-12)

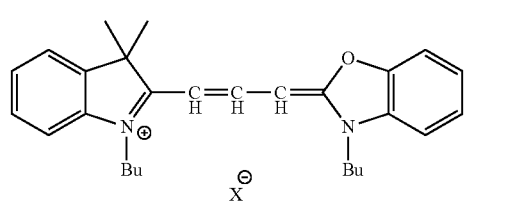
(pm-13)

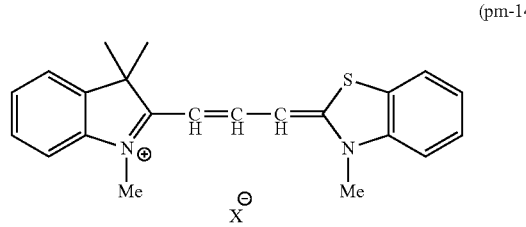
(pm-14)

(pm-15)

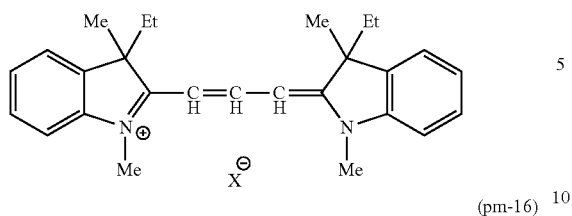

(pm-16)

(pm-17)

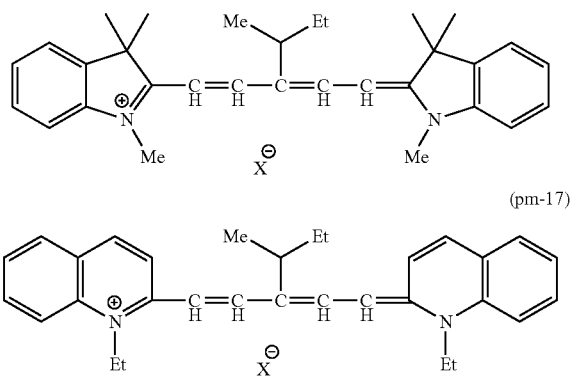

Among the specific examples, structures represented by (pm-1) to (pm-6), (pm-9) and (pm-10) are preferable and structures represented by (pm-1), (pm-2) and (pm-10) are particularly preferable.

<Squarylium Dyes>

One of the aspects of the dye polymer relating to the present invention is a dye polymer including the structure derived from the compounds represented by following General Formula (K) (squatylium compounds) as a partial structure of the dye portion. The squarylium compound in the present invention is a collective term of compounds having a dye portion including a squarylium skeleton within the molecule.

[Chem. 31]

General Formula (K)

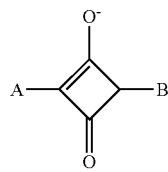

In General Formula (K), A and B, each independently, represent an aryl group or a heterocyclic group. As the aryl group, an aryl group preferably having 6 to 48 carbon atoms, more preferably having 6 to 24 carbon atoms, and, for example, phenyl or naphthyl may be included. As the heterocyclic ring group, a heterocyclic group of five-membered ring or six-membered ring and, for example, pyrrolyl, imidazolyl, pyrazolyl, thienyl, pyridyl, pyrimidyl, pyridazyl, triazol-1-yl, furyl, thiadiazolyl or the like may be included.

As the compounds represented by General Formula (K), particularly, compounds represented by General Formula (K-1), General Formula (K-2), General Formula (K-3), or General Formula (K-1) are preferable.

[Chem. 32]

General Formula (K-1)

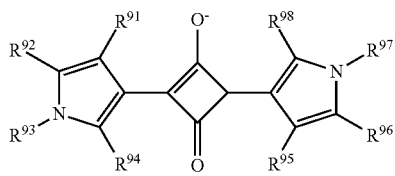

In General Formula (K-1), $R^{91}$, $R^{92}$, $R^{94}$, $R^{95}$, $R^{96}$, and $R^{98}$, each independently, represent a hydrogen atom, a halogen atom, an alkyl group with straight chain or branched chain, a cycloalkyl group, an alkenyl group with straight chain or branched chain, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclic thio group, a sulfamoyl group, a sulfo group, an alkyl- or arylsulfinyl group, an alkyl or arylsulfonyl group, an acyl group, an aryloxycarbonyl group, an alkoxycarbonyl group, a carbamoyl group, an aryl- or heterocyclic azo group, an imide group, a phosphino group, a phosphinyl groups, a phosphinyloxy group, a phosphinylamino group, or a silyl group.

$R^{93}$ and $R^{97}$, each independently, represent a hydrogen atom, an alkyl group with straight chain or branched chain, a cycloalkyl group, a cycloalkenyl group, an alkynyl group, an aryl group or a heterocyclic group.

$R^{91}$ and $R^{92}$, and $R^{95}$ and $R^{96}$, respectively, are bonded to each other and may form a ring.

In General Formula (K-1), the substituents $R^{91}$, $R^{92}$, $R^{94}$, $R^{95}$, $R^{96}$, and $R^{98}$ may select are the same as the substituents described in the above section of the substituents.

It is preferable that $R^{91}$ to $R^{98}$, each independently, be a hydrogen atom, an alkyl group, a hydroxyl group, an amino group, an aryl group, or a heterocyclic ring, it is more preferable that $R^{93}$, $R^{94}$, $R^{97}$ and $R^{98}$ be alkyl groups, or, $R^{91}$ and $R^{92}$, and $R^{95}$ and $R^{96}$ be bonded to each other and form an aryl ring, it is the most preferable that $R^{93}$, $R^{94}$, $R^{97}$ and $R^{98}$ be alkyl groups having 1 to 20 carbon atoms, or, $R^{91}$ and $R^{92}$, and $R^{95}$ and $R^{96}$ be bonded to each other and form a benzene ring.

[Chem. 33]

General Formula (K-2)

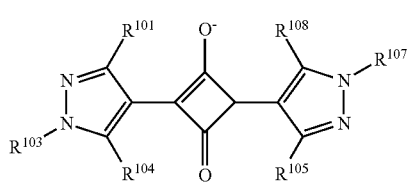

In General Formula (K-2), $R^{101}$, $R^{103}$, $R^{104}$, $R^{105}$, $R^{107}$, and $R^{108}$ are the same as $R^{91}$, $R^{93}$, $R^{94}$, $R^{95}$, $R^{97}$, and $R^{98}$ in General Formula (K-1). $R^{103}$ and $R^{107}$ are the same as $R^{93}$ and $R^{97}$ in General Formula (K-1).

In General Formula (K-2), it is preferable that $R^{101}$, $R^{103}$, $R^{104}$, $R^{105}$, $R^{107}$ and $R^{108}$ be a hydrogen atom, an alkyl group, a hydroxyl group, an amino group, an aryl group, or a heterocyclic group, it is more preferable that $R^{101}$, $R^{103}$, $R^{105}$ and $R^{107}$ be an alkyl group or an aryl group, or, $R^{104}$ and $R^{108}$ be a hydroxyl group or an amino group, and it is even more preferable that $R^{101}$, $R^{103}$, $R^{105}$ and $R^{107}$ be an alkyl group having 1 to 20 carbon atoms, or, $R^{104}$ and $R^{108}$ be a hydroxyl group. It is preferable that $R^{103}$ and $R^{107}$ be a hydrogen atom, an alkyl group with straight chain or branched chain, and an aryl group and it is more preferable that $R^{103}$ and $R^{107}$ be an alkyl group having 1 to 5 carbon atoms and a phenyl group.

[Chem. 34]

General Formula (K-3)

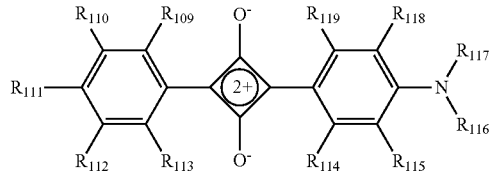

In General Formula (K-3), $R_{109}$, $R_{110}$, $R_{112}$, $R_{113}$, $R_{114}$, $R_{115}$, $R_{118}$, and $R_{119}$ are the same as $R^{91}$, $R^{93}$, $R^{94}$, $R^{95}$, $R^{97}$, and $R^{98}$ in General Formula (K-1). $R_{116}$ and $R_{117}$ are the same as $R^{93}$ and $R^{97}$ in General Formula (K-1).

In General Formula (K-3), it is preferable that $R_{109}$, $R_{110}$, $R_{111}$, $R_{112}$, $R_{113}$, $R_{114}$, $R_{115}$, $R_{118}$, and $R_{119}$ be a hydrogen atom, a halogen atom, an alkyl group with straight chain or branched chain, a hydroxyl group, or an alkoxy group. Particularly, it is the most preferable that $R_{109}$, $R_{113}$, $R_{115}$, $R_{118}$, and $R_{119}$ be hydrogen atoms, $R_{110}$, $R_{111}$, and $R_{112}$ be a hydrogen atom or an alkoxy group, $R_{114}$ be a hydrogen atom, a halogen atom, a hydroxyl group, an alkyl group having 1 to 5 carbon atoms, an alkoxy group having 1 to 5 carbon atoms.

[Chem. 35]

General Formula (K-4)

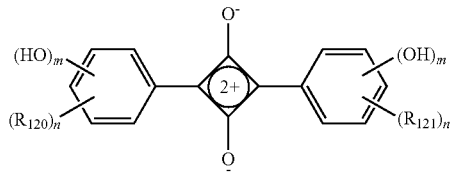

In General Formula (K-4), $R_{120}$ and $R_{121}$ represent a halogen atom, an alkyl group, an alkoxy group, and an alkenyl group. m represents an integer of 1 to 4. n represents an integer of 0 to 4.

As $R_{120}$, particularly, an alkyl group having 1 to 5 carbon atoms or an alkoxy group having 1 to 5 carbon atoms is preferable. As m, 1 to 3 is preferable, and 3 is the most preferable. As n, 0 to 3 is preferable, and 0 or 1 is more preferable.

As the dye compounds which may be included in the dye structure in the present invention, a structure derived from the squarylium compound represented by General Formula (K-1) is preferable from the viewpoint of color.

The squarylium compounds represented by General Formula (K-1) to General Formula (K-4) may be synthesized applying methods disclosed in J. Chem. Soc., Perkin Trans. 1, 2000, 599.

Specific examples of General Formula (K-1) to General Formula (K-4) are shown below, however, the present invention is not limited to these.

[Chem. 36]

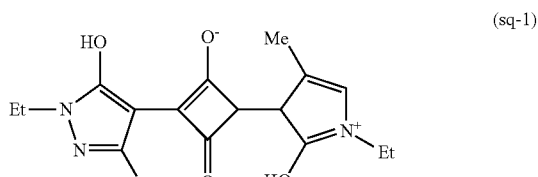
(sq-1)

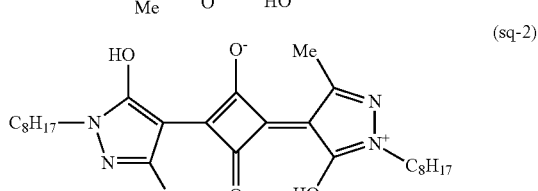
(sq-2)

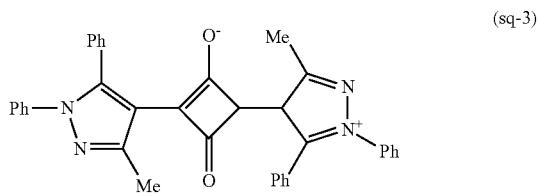
(sq-3)

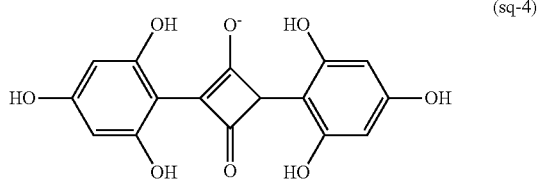
(sq-4)

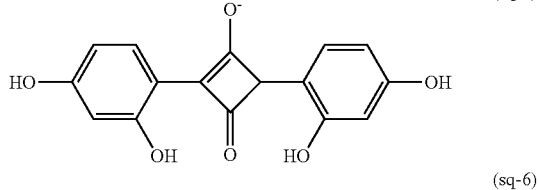
(sq-5)

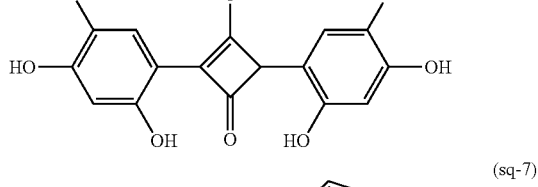
(sq-6)

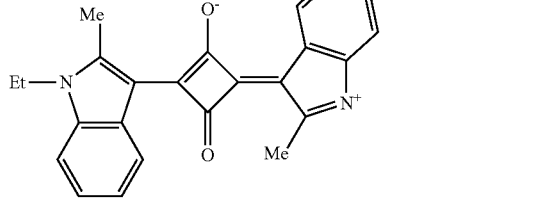
(sq-7)

(sq-8)
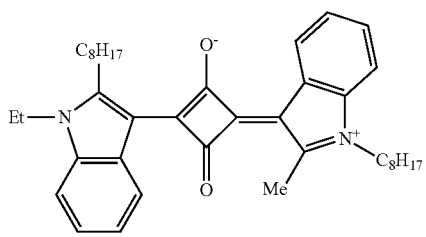

(sq-9)
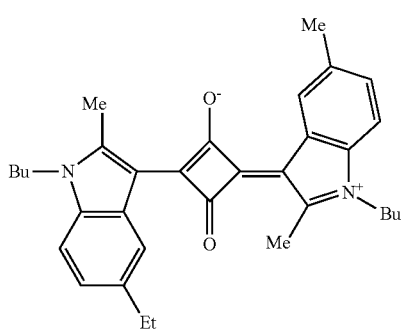

(sq-10)
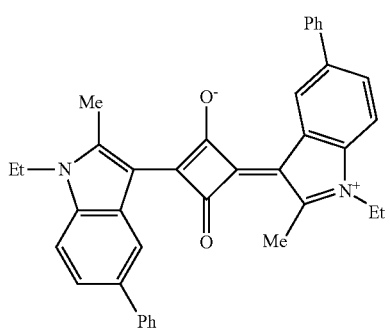

(sq-11)
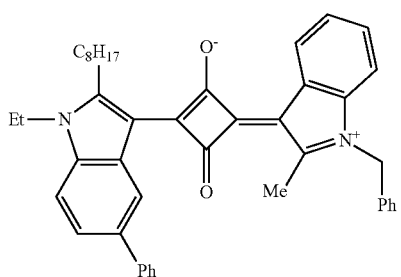

(sq-12)
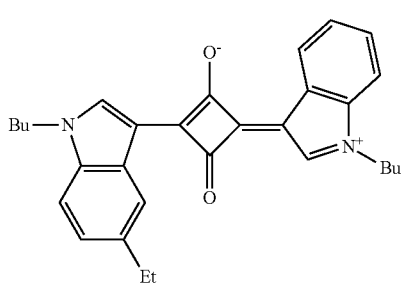

(sq-13)
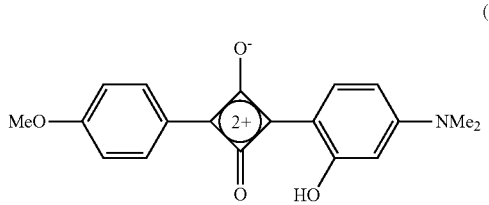

(sq-14)
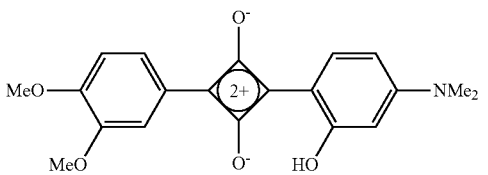

(sq-15)
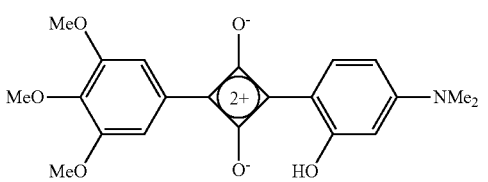

(sq-16)
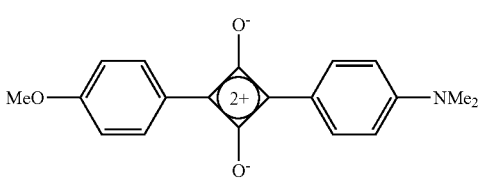

<Quinophthalone Dyes>

One of the aspects of the dye polymer relating to the present invention is a dye polymer including the structure derived from the compounds represented by following General Formula (QP) (quinophthalone compounds) as a partial structure of the dye portion. The quinophthalone compound in the present invention is a collective term of compounds having a dye portion including a quinophthalone skeleton within the molecule.

[Chem. 37]

General Formula (QP)

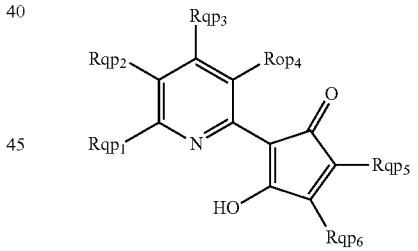

In General Formula (QP), $Rqp_1$ to $Rqp_6$, each independently, represent a hydrogen atom or a substituent. When at least two of $Rqp_1$ to $Rqp_6$ are adjacent, they are bonded to each other and may form a ring, and the ring may have further substituents.

The substituents $Rqp_1$ to $Rqp_6$ represent are substituents described in the above section of the substituents. As the substituents $Rqp_1$ to $Rqp_6$ represent, a halogen atom, an alkyl group, an alkenyl group, and an aryl group are preferable. Particularly, it is preferable that $Rqp_1$ and $Rqp_2$, and $Rqp_5$ and $Rqp_6$ be bonded to each other and form a substituted or unsubstituted phenyl group. $Rqp_3$ and $Rqp_4$ are preferably a hydrogen atom, a chlorine atom, or a bromine atom.

As the substituents the phenyl group formed by $Rqp_1$ and $Rqp_2$, and $Rqp_5$ and $Rqp_6$ bonded to each other, substituents described in the above section of the substituents may be included, however, a halogen atom, a carbamoyl group, an amino group, an alkoxy group, an aryloxy group, an alkylthio group, an arylthio group and an alkoxycarbonyl group are preferable.

Specific examples of General Formula (QP) are shown below, however, the present invention is not limited to these.

[Chem. 38]

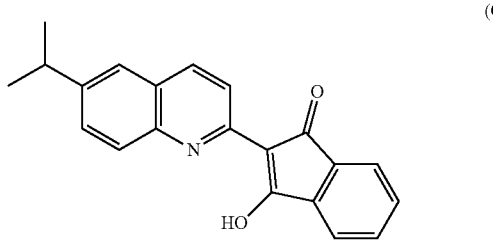
(QP-1)

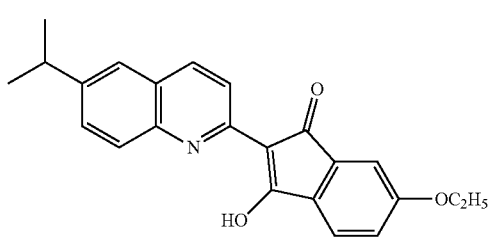
(QP-2)

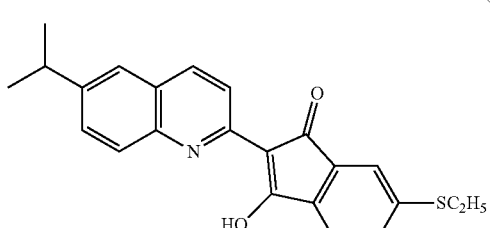
(QP-3)

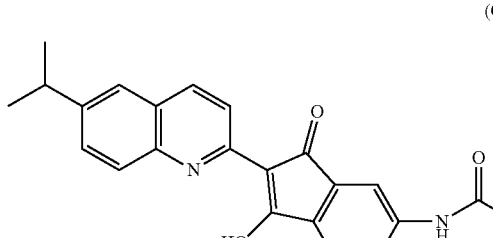
(QP-4)

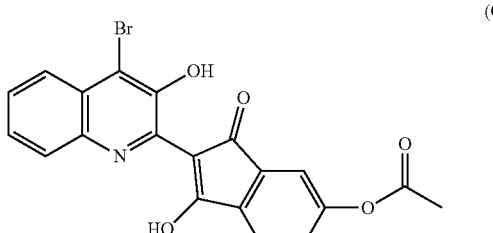
(QP-5)

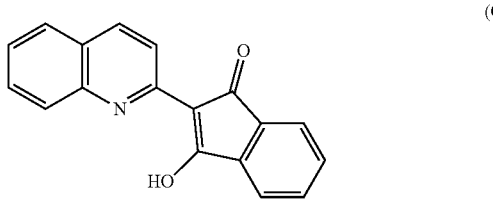
(QP-6)

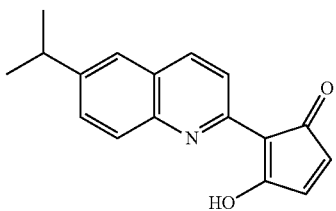
(QP-7)

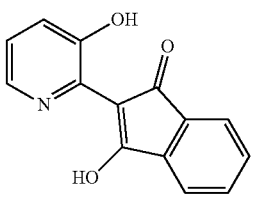
(QP-8)

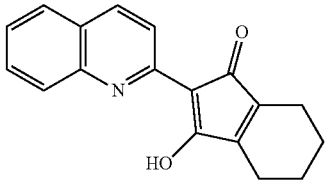
(QP-9)

<Phthalocyanine Compound>

One of the aspects of the dye polymer relating to the present invention is a dye polymer including the structure derived from the compounds represented by following General Formula (Ph) (phthalocyanine compounds) as a partial structure of the dye portion. The phthalocyanine compound in the present invention is a collective term of compounds having a dye portion including a phthalocyanine skeleton within the molecule.

[Chem. 39]

General Formula (Ph)

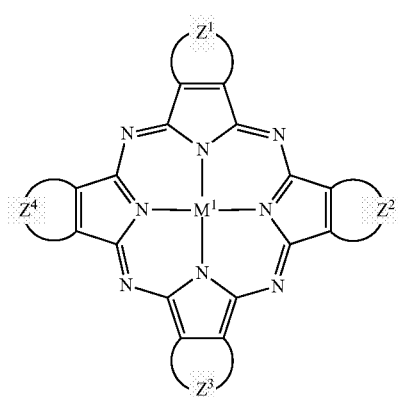

In General Formula (Ph), $M^1$ represents a type of metal, $Z^1$, $Z^2$ $Z^3$, and $Z^4$, each independently, represent an atomic group required to form a six-membered ring consisting of atoms selected from a carbon atom and a nitrogen atom.

General Formula (Ph) is described in detail.

In General Formula (Ph), as the type of metal represented by $M^1$, for example, a metal atom such as Zn, Mg, Si, Sn, Rh, Pt, Pd, Mo, Mn, Pb, Cu, Ni, Co, and Fe, a metal chloride such as AlCl, InCl, FeCl, $TiCl_2$, $SnCl_2$, $SiCl_2$, and $GeCl_2$, a metal oxide such as TiO and VO, and a metal hydroxide such as $Si(OH)_2$ may be included, however, Cu and Zn are particularly preferable.

In General Formula (Ph), $Z^1$, $Z^2$ $Z^3$, and $Z^4$, each independently, represent an atomic group required to form a six-membered ring consisting of atoms selected from a carbon atom and a nitrogen atom. The six-membered ring may be a saturated ring or an unsaturated ring, and may be unsubstituted or have a substituent. As the substituents, substituents described in the above section of the substituents may be included. In addition, when the six-membered ring has two or more substituents, those substituents may be the same as or different from each other. Moreover, the six-membered ring may be condensed with other five-membered or six-membered rings.

The six-membered ring includes a benzene ring, a cyclohexane ring and the like.

Among the phthalocyanine-based dye remaining group represented by General Formula (Ph), the remaining group derived from the phthalocyanine-based dye represented by General Formula (Ph-1) is particularly preferable.

[Chem. 40]

General Formula (Ph-1)

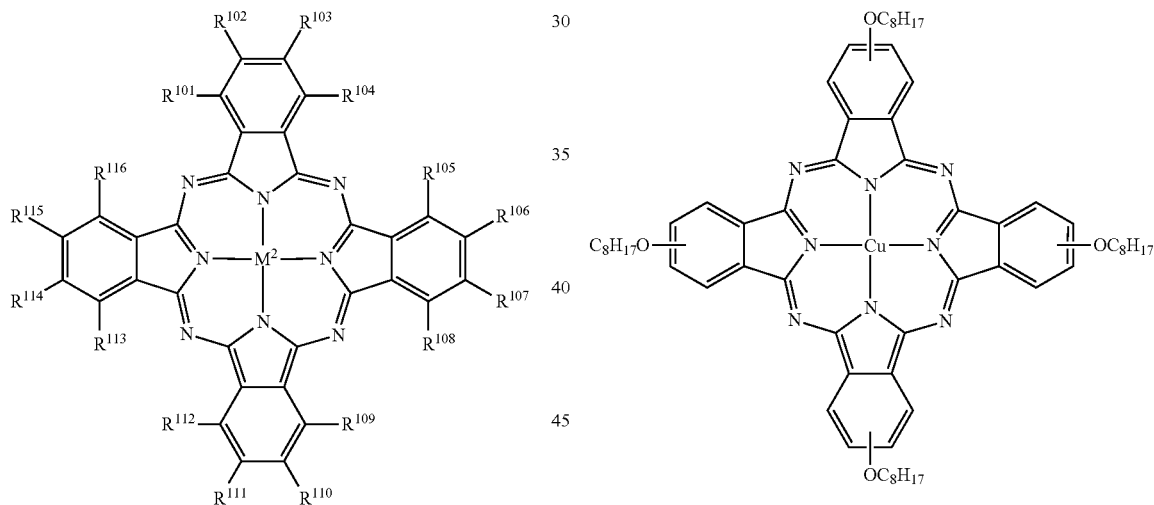

In General Formula (Ph-1), $M^2$ is the same as $M^1$ in General Formula (Ph) and so are the preferable aspects.

In General Formula (Ph-1), $R^{101}$ to $R^{116}$, each independently, represent a hydrogen atom or a substituent, and if the substituents represented by $R^{101}$ to $R^{116}$ are groups which can be further substituted, it may be substituted with groups described as the substituents above and when there are two or more substituents, those substituents may be the same as or different from each other.

Among these, the substituents represented by $R^{101}$ to $R^{116}$ are preferably a hydrogen atom, $SO_2NR^{117}R^{118}$ ($R^{117}$ and $R^{118}$ are a hydrogen atom or an alkyl group with straight chain or branched chain which may have substituents having 3 to 20 carbon atoms), or $SR^{119}$ ($R^{119}$ is an alkyl group with straight chain or branched chain which may have substituents having 3 to 20 carbon atoms).

Specific examples of General Formula (Ph) are shown below, however, the present invention is not limited to these.

[Chem. 41]

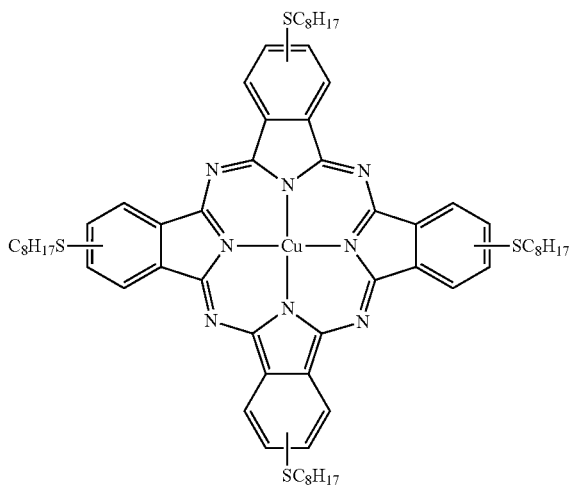

(ph-1)

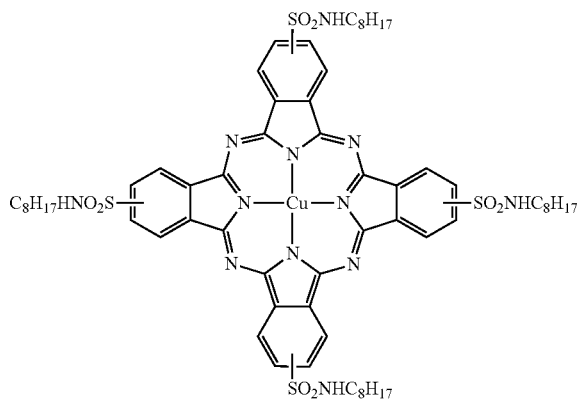

(ph-3)

(ph-4)

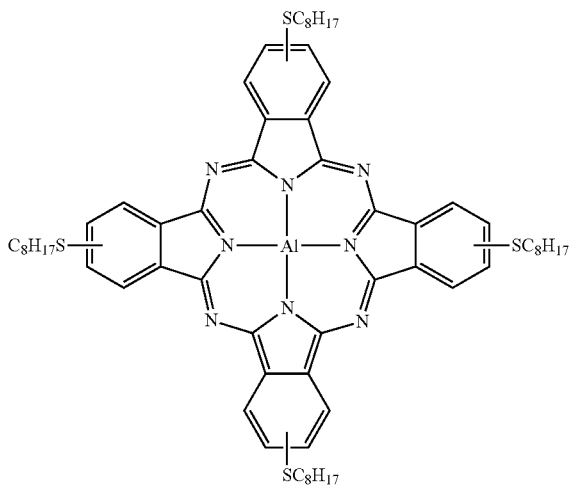

(ph-5)

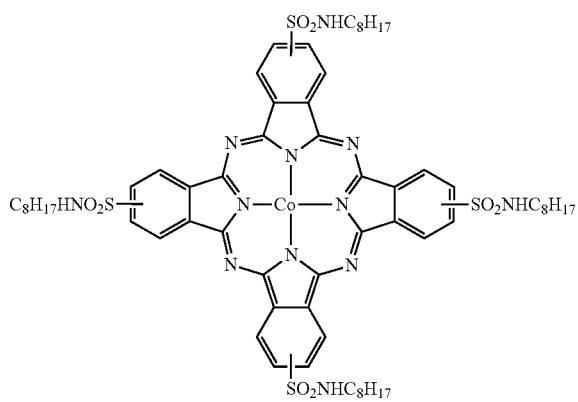

<Su-Phthalocyanine Compound>

One of the aspects of the dye polymer relating to the present invention is a dye polymer including the structure derived from the compounds represented by following General Formula (SP) (sub-phthalocyanine compounds) as a partial structure of the dye portion. The sub-phthalocyanine compound in the present invention is a collective term of compounds having a dye portion including a sub-phthalocyanine skeleton within the molecule.

In General Formula (SP), $Z_1$ to $Z_{12}$, each independently, represent a hydrogen atom, an alkyl group, an aryl group, a hydroxyl group, a mercapto group, an amino group, an alkoxy group, an aryloxy group, or a thioether group. X represents an anion.

General Formula (SP) is described in detail.

The alkyl groups $Z_1$ to $Z_{12}$ may have in General Formula (SP) represent a substituted or unsubstituted alkyl group with straight chain or branched chain. Particularly, having 1 to 20 carbon atoms is preferable and having 1 to 10 carbon atoms is more preferable. As the substituents $Z_1$ to $Z_{12}$ may have, substituents described in the above section of the substituents may be included, however, particularly, a fluorine atom, a hydroxyl group, and a mercapto group are preferable.

X in General Formula (SP) represents an anion. Specifically, an inorganic anion such as a fluorine anion, a chlorine anion, a bromine anion, an iodine anion, a perchlorate anion, a thiocyanate anion, a hexafluoride phosphate anion, a hexafluoride antimonate anion, or a tetrafluoride borate anion, a carboxylate anion such as an acetate anion or a benzoate anion, an organic sulfonate anion such as a benzene sulfonate anion, a toluene sulfonate anion, a trifluoromethane sulfonate anion, an organic phosphate anion such as an octylphosphate anion, a dodecylphosphate anion, an octadecylphosphate anion, a phenylphosphate anion, or a nonylphenyl phosphate anion or the like may be included. X may be bonded to the dye skeleton or to part of the dye polymer (a polymer chain and the like).

X is preferably a fluorine anion, a chlorine anion, a bromine anion, an iodine anion, a perchlorate anion, a carboxylate anion, or a phosphate anion, and a perchlorate anion, or a carboxylate anion is the most preferable.

Specific examples of the sub-phthalocyanine compounds are shown below, however, the present invention is not limited to these.

Among the following example compounds, X represents a ligand to the boron atom. Specifically, a halogen atom, a hydroxyl group, a carboxylic acid group, a phosphoric acid group, a sulfonic acid group or the like may be include, and from the viewpoint of preparation, a halogen atom, a hydroxyl group, a carboxylic acid group, or a sulfonic acid group is preferable and a halogen atom or a carboxylic acid group is more preferable.

[Chem. 42]

General Formula (SP)

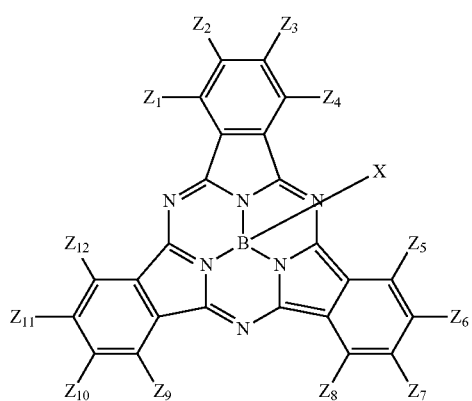

[Chem. 43]

(SP-1)

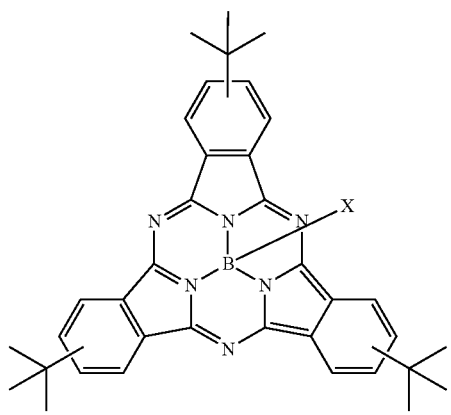

-continued
(SP-2)
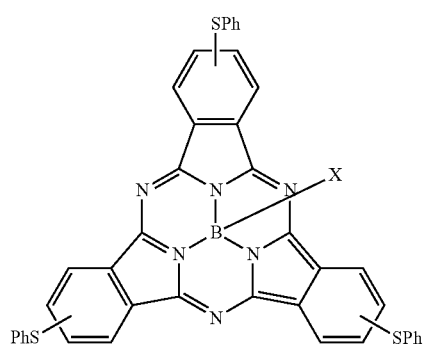
(SP-3)
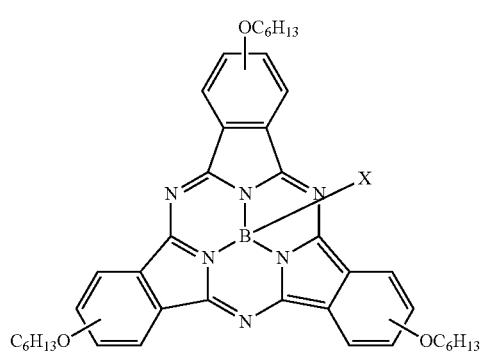
(SP-4)
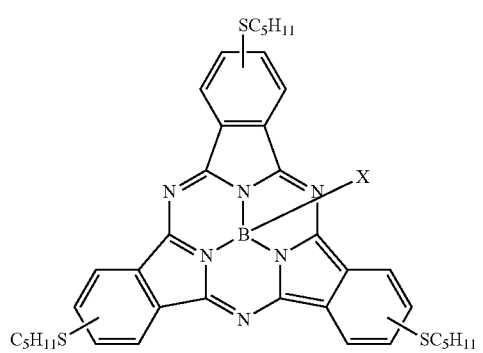
(SP-5)
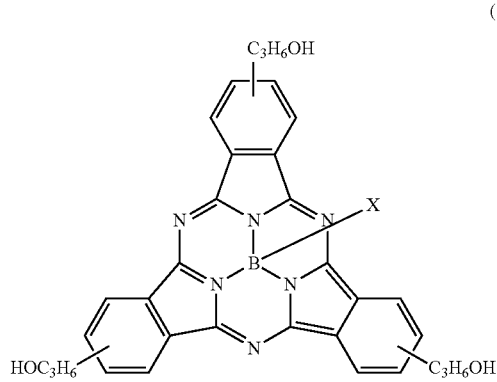
-continued
(SP-6)
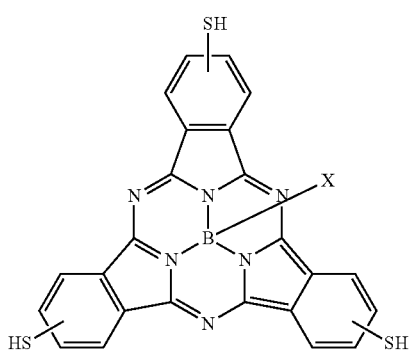
(SP-7)
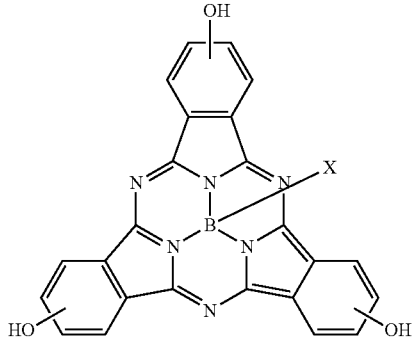
(SP-8)
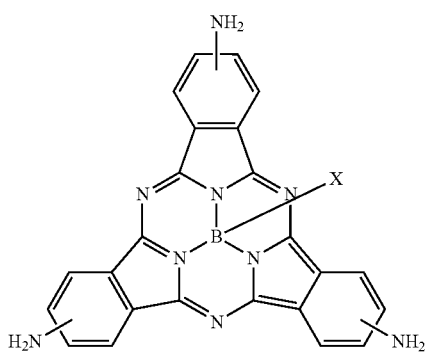
(SP-9)
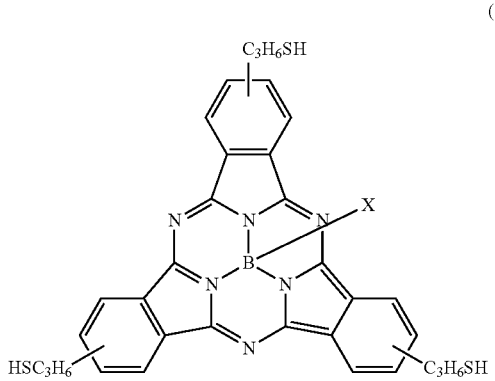

(SP-10)

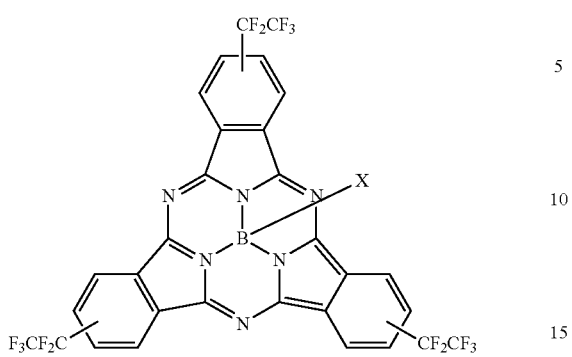

(Structure of Dye Polymer Used in Coloring Composition of Present Invention)

The dye polymers used in the coloring composition of the present invention preferably either includes at least one of the structure units represented by following General Formula (A), General Formula (B), and General Formula (C), or represents as the dye polymer represented by General Formula (D). These will be described sequentially.

<Unit Structure Represented by General Formula (A)>

[Chem. 44]

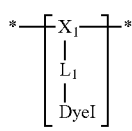

General Formula (A)

In General Formula (A), $X_1$ represents a linking group formed by polymerization, $L_1$ represents a single bonding or a divalent linking group. Dye I represents a dye structure. Hereinafter, they will be described in detail.

In General Formula (A), $X_1$ represents a linking group formed by polymerization. That is, $X_1$ represents a part in which a repeating unit corresponding to a main chain formed from a polymerization reaction is formed. Also, a portion represented by two *s becomes the repeating unit. $X_1$ is not particularly limited as long as it is a linking group formed from conventional monomers capable of polymerization, however, particularly, linking groups represented by following (XX-1) to (XX-24) are preferable, (meth)acryl-based linking chains represented by (XX-1) and (XX-2), styrene-based linking chains represented by (XX-10) to (XX-17) and a vinyl-based linking chain represented by (XX-24) are the most preferable. In (XX-1) to (XX-24), the site represented by * represents a linking site to $L_1$. Also, R in (XX-18) and (XX-19) represents a hydrogen atom, an alkyl group having 1 to 5 carbon atoms and a phenyl group.

[Chem. 45]

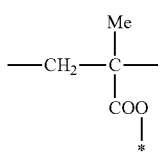
(XX-1)

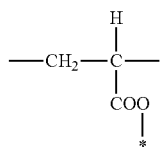
(XX-2)

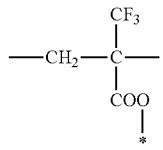
(XX-3)

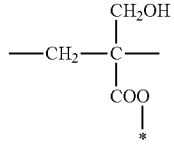
(XX-4)

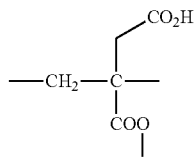
(XX-5)

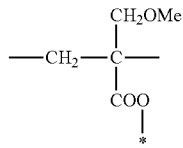
(XX-6)

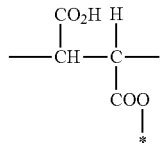
(XX-7)

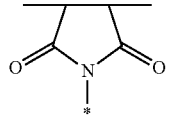
(XX-8)

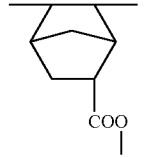
(XX-9)

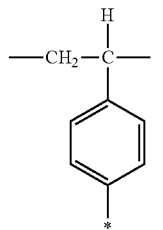
(XX-10)

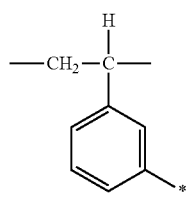 (XX-11)
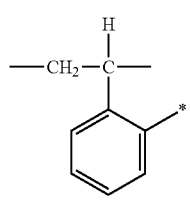 (XX-12)
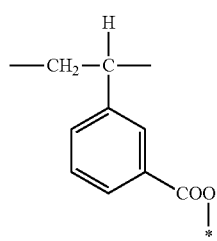 (XX-13)
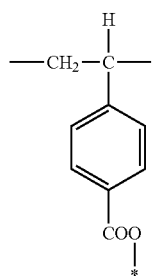 (XX-14)
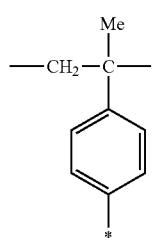 (XX-15)
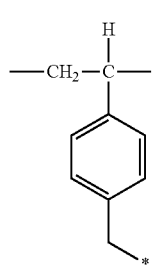 (XX-16)
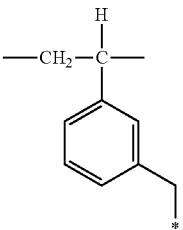 (XX-17)
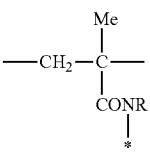 (XX-18)
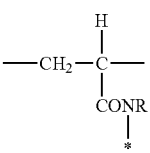 (XX-19)
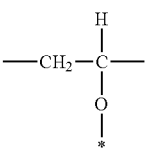 (XX-20)
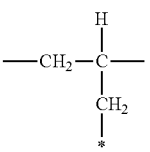 (XX-21)
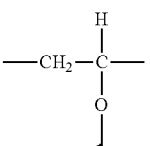 (XX-22)
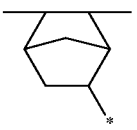 (XX-23)

(XX-24)

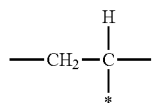

In General Formula (A), $L_1$ represents a single bond or a divalent linking group. As the divalent linking group when $L_1$ represents the divalent linking group, a substituted or unsubstituted alkylene group having 1 to 30 carbon atoms (for example, a methylene group, an ethylene group, a trimethylene group, a propylene group, a butylene group or the like), a substituted or unsubstituted arylene group having 6 to 30 carbon atoms (for example, a phenylene group, a naphthalene group or the like), a substituted or unsubstituted heterocyclic group, —CH=CH—, —O—, —S—, —C(=O)—, —CO$_2$—, —NR— (here, Rs, each independently, represent a hydrogen atom, an alkyl group, an aryl group, or a heterocyclic group), —CONR—, —O$_2$C—, —SO—, —SO$_2$— and a linking group formed by linking two or more of these are represented.

In General Formula (A), Dye I represents the dye skeleton described above.

The dye polymer having the repeating unit represented by General Formula (A) may be synthesized by (1) a method in which a monomer having a dye remaining group is synthesized by an addition polymerization, (2) a method in which a polymer having a highly reactive group such as an isocyanate group, an acidic anhydride group or an epoxy group is reacted with a dye having a functional group capable of reacting with the highly reactive group (a hydroxyl group, a primary or secondary amino group, a carboxyl group or the like). As the addition polymerization, well-known addition polymerizations (a radical polymerization, an anionic polymerization, a cationic polymerization) may be applied, however, among these, synthesizing by the radical polymerization is particularly preferable since a mild reaction condition may be applied. As the radical polymerization, well-known reaction conditions may be applied.

Specific examples of the repeating unit of the dye polymer (corresponding to a monomer compound) represented by General Formula (A) are shown below, however, the present invention is not limited to these.

[Chem. 46]

(A-dp-1)

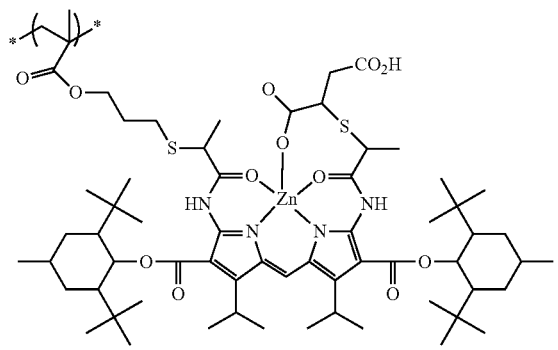

(A-dp-2)

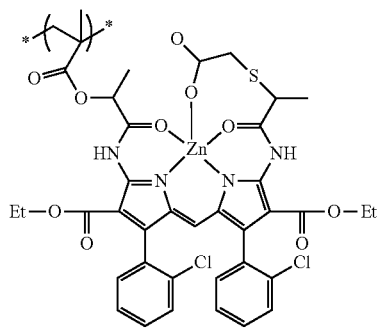

(A-dp-3)

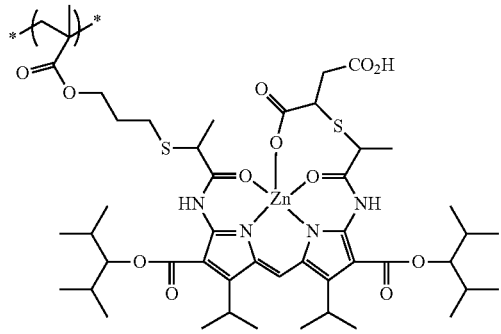

(A-dp-4)

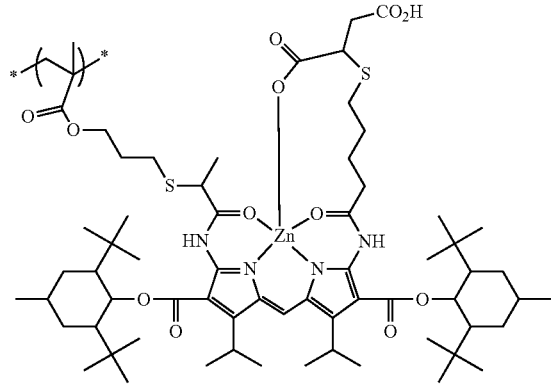

-continued
(A-dp-5)
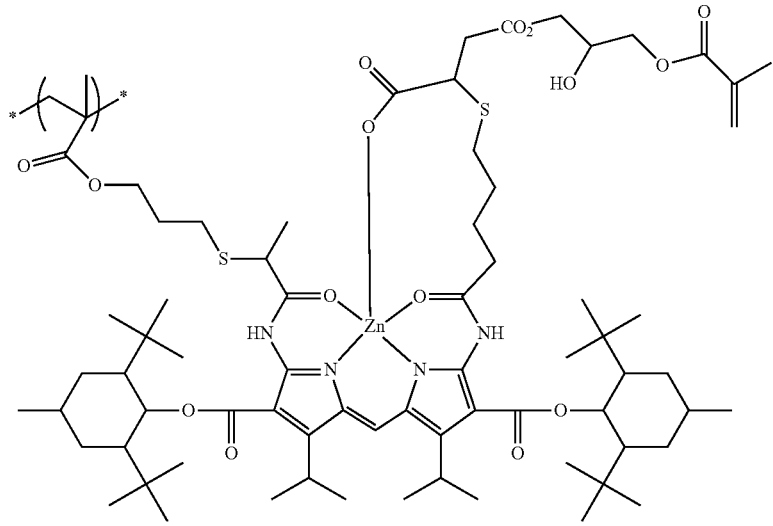
(A-dp-6)
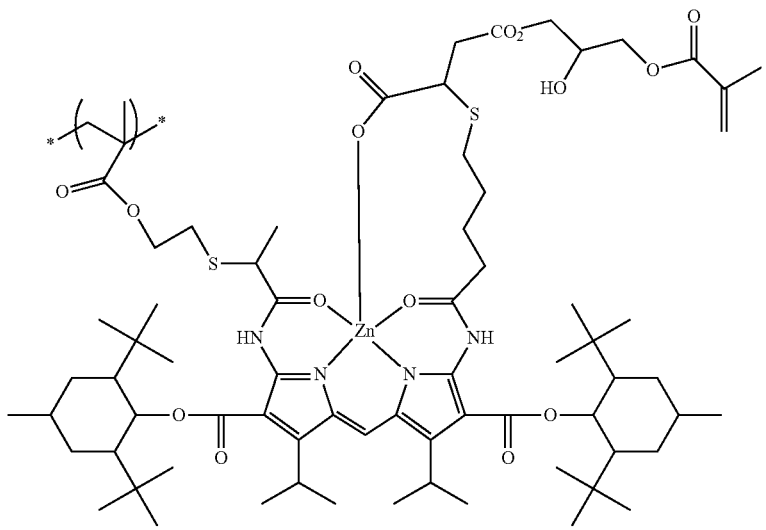
(A-dp-7)
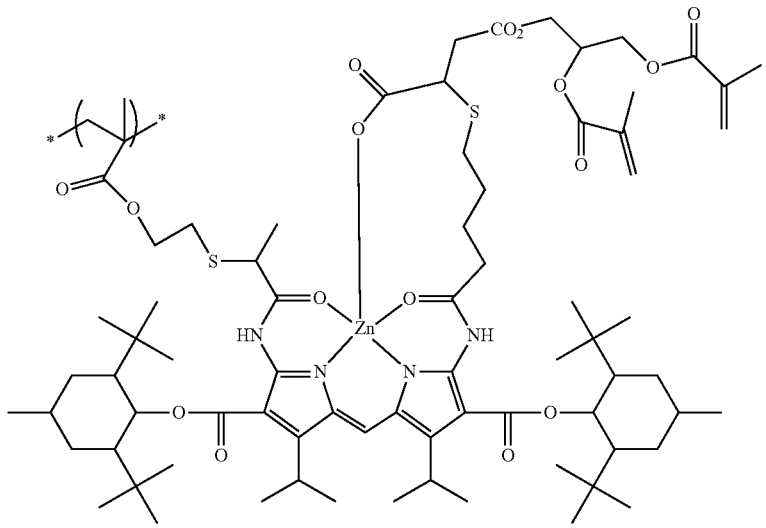

-continued
(A-dp-8)
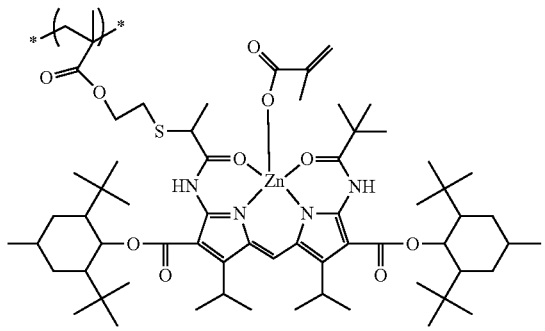
(a-dp-9)
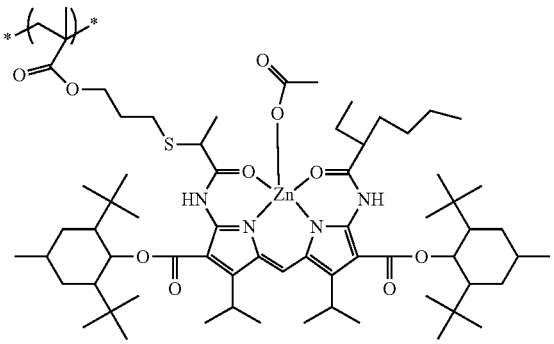
(A-dp-10)
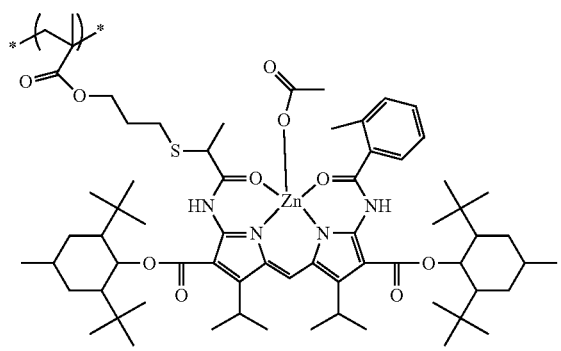
(A-dp-11)
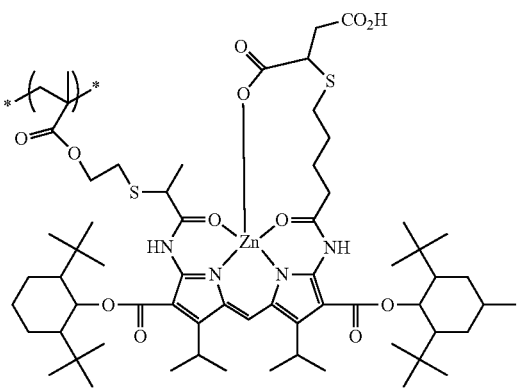
(A-dp-12)
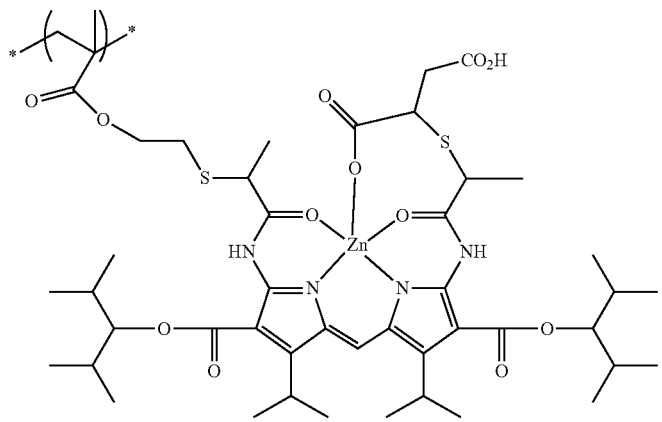
[Chem. 48]
(A-dp-13)
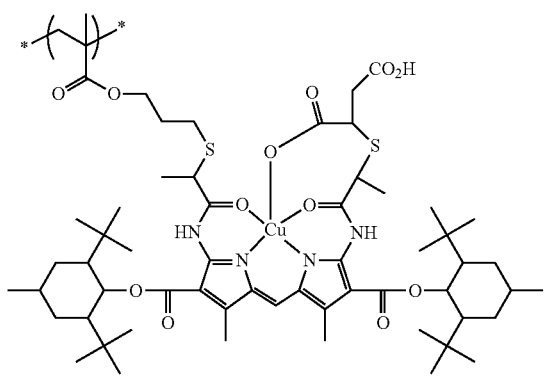
(A-dp-14)
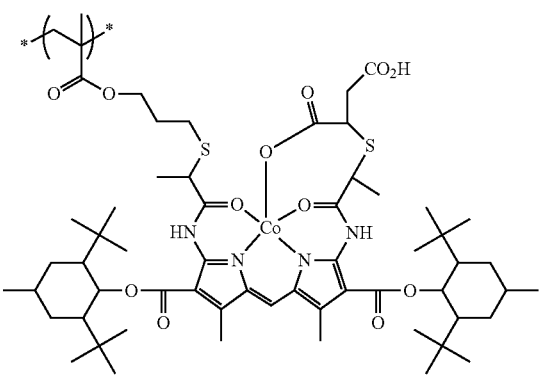

[Chem. 49]
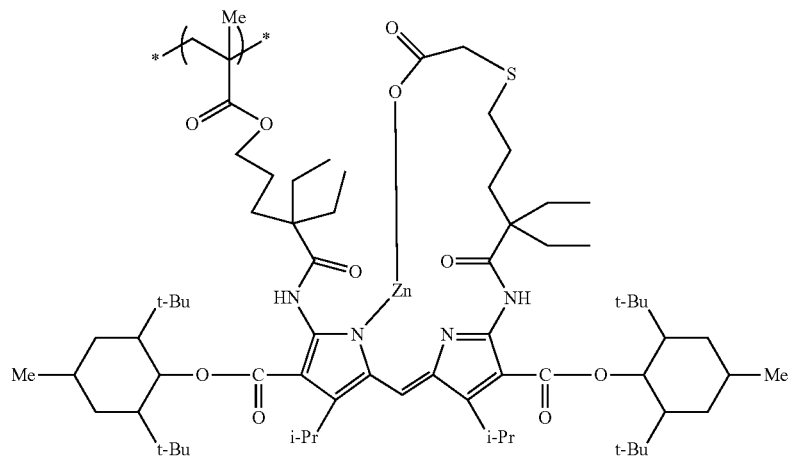
(A-dp-15)
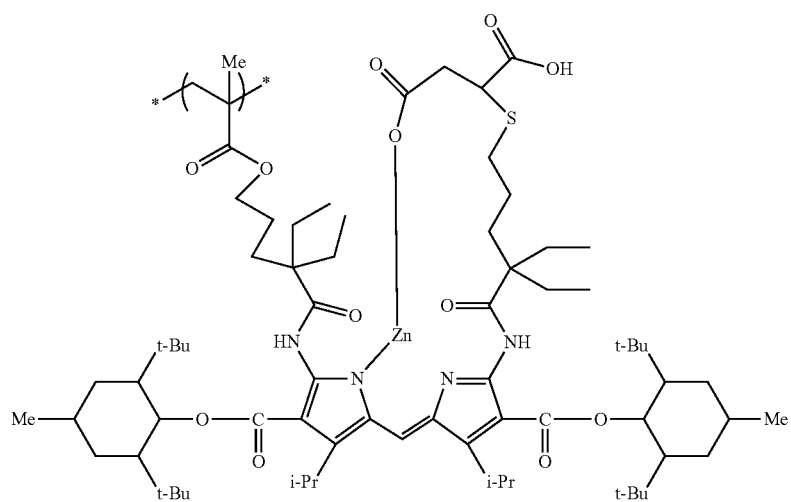
(A-dp-16)
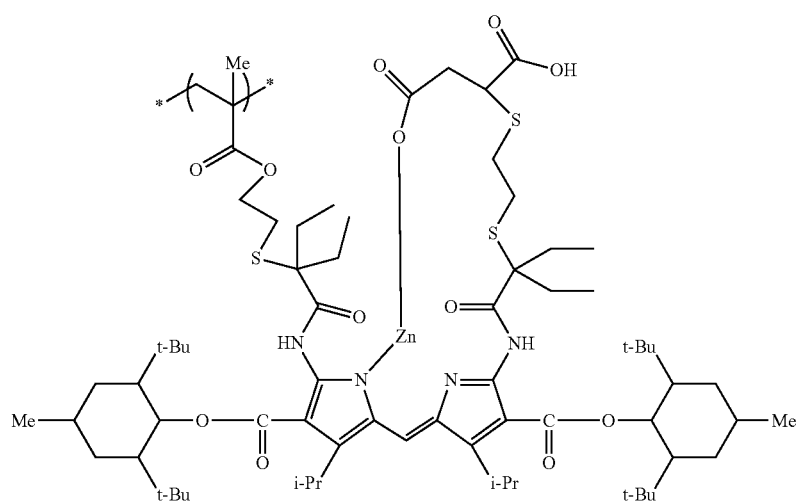
(A-dp-17)

-continued
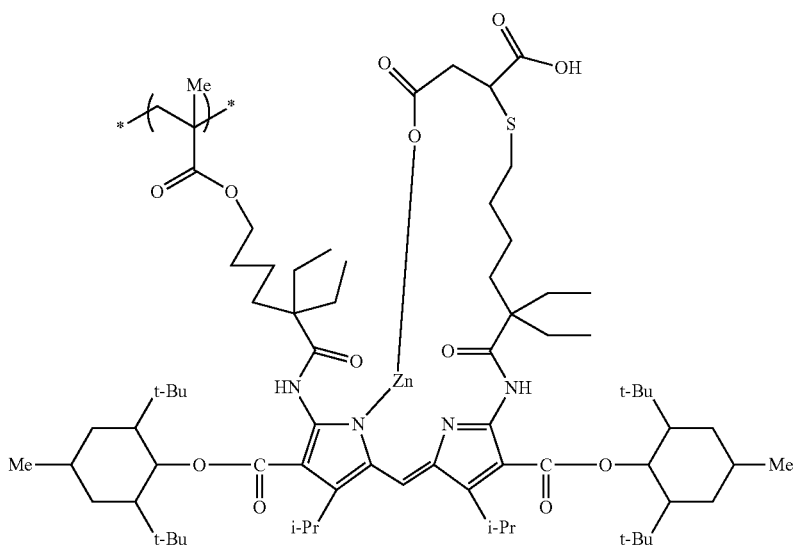
(A-dp-18)
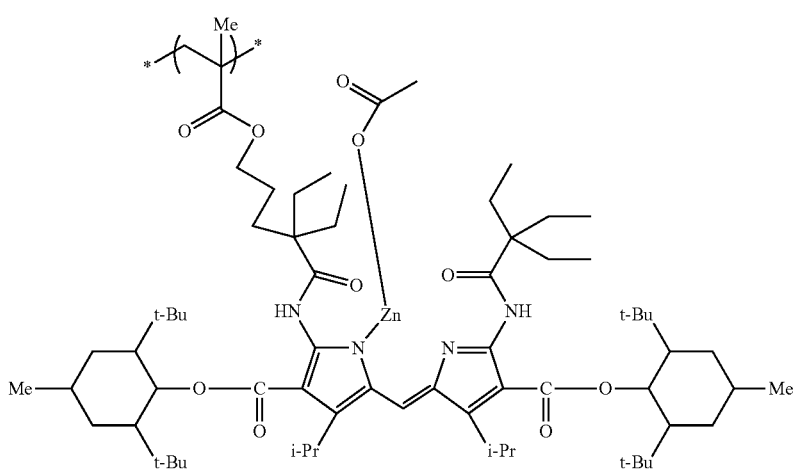
(A-dp-19)
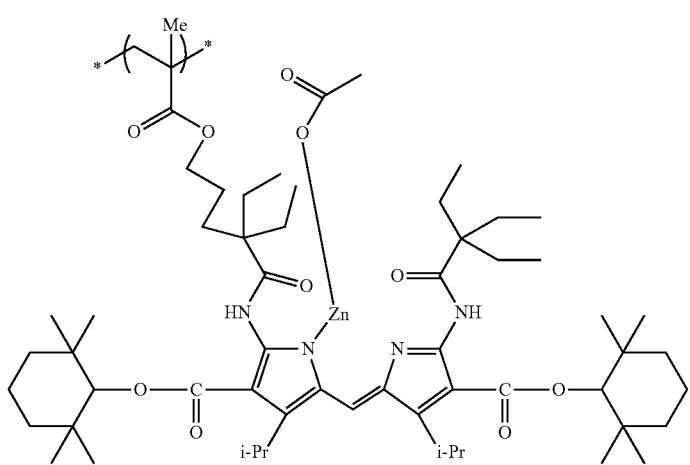
(A-dp-20)

-continued
[Chem. 50]
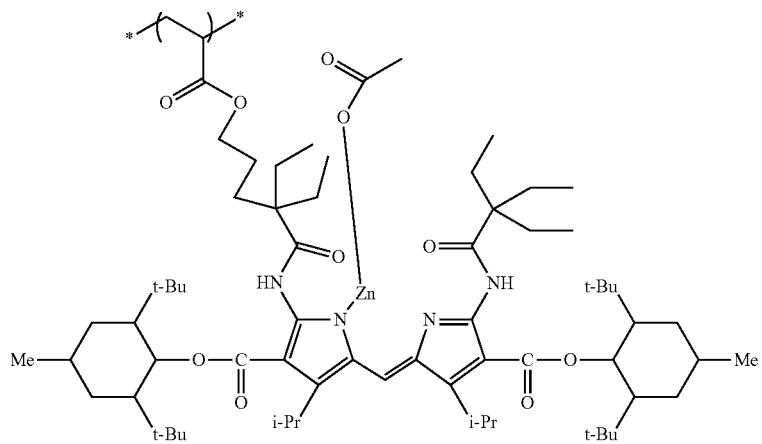
(A-dp-21)
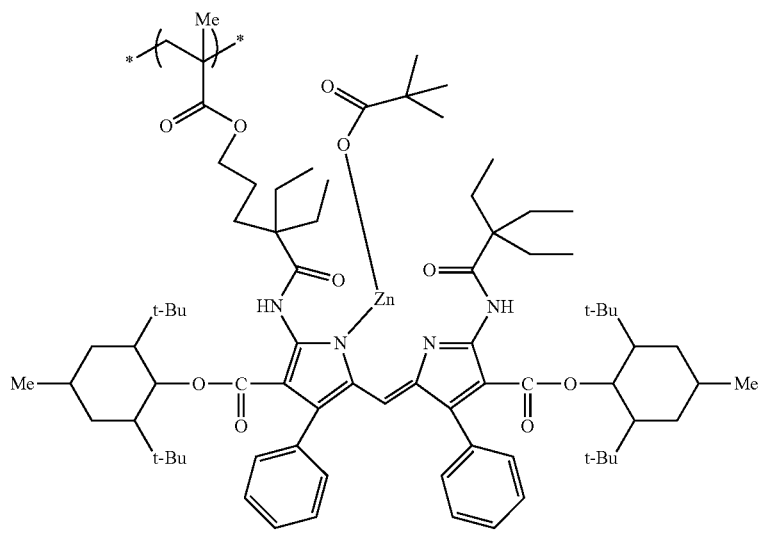
(A-dp-22)
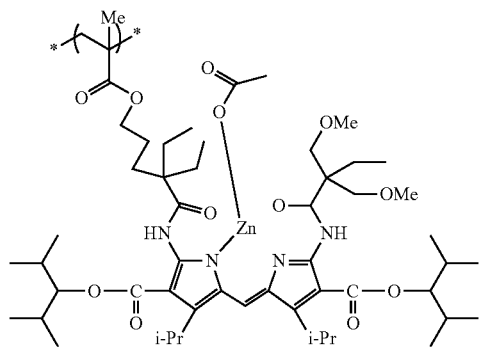
(A-dp-23)
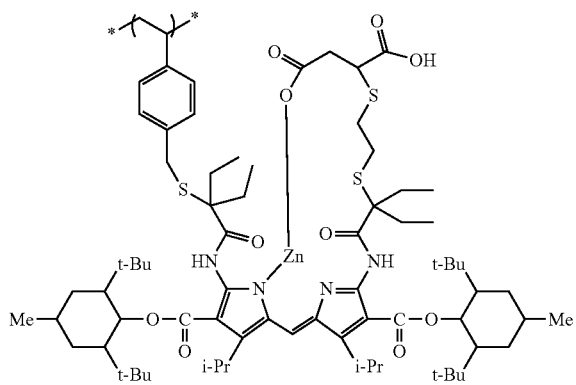
(A-dp-24)

-continued
(A-dp-25)
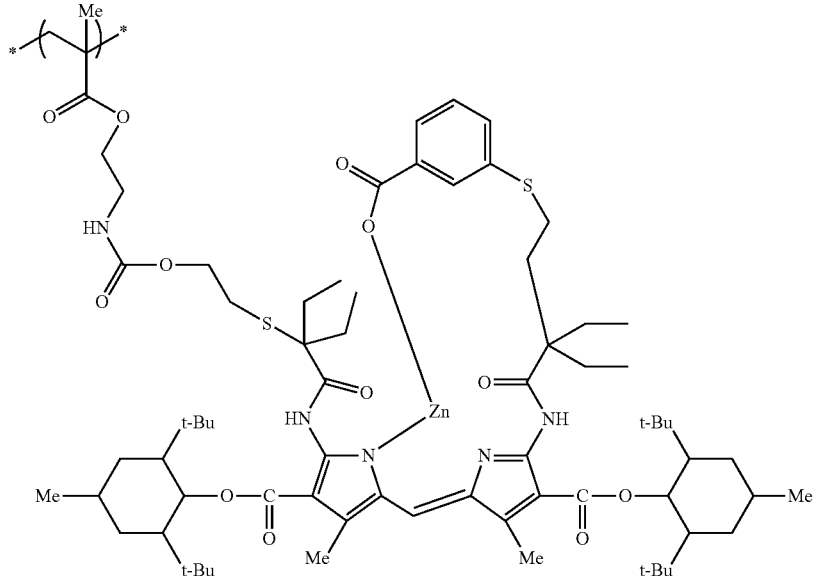
(A-dp-26)
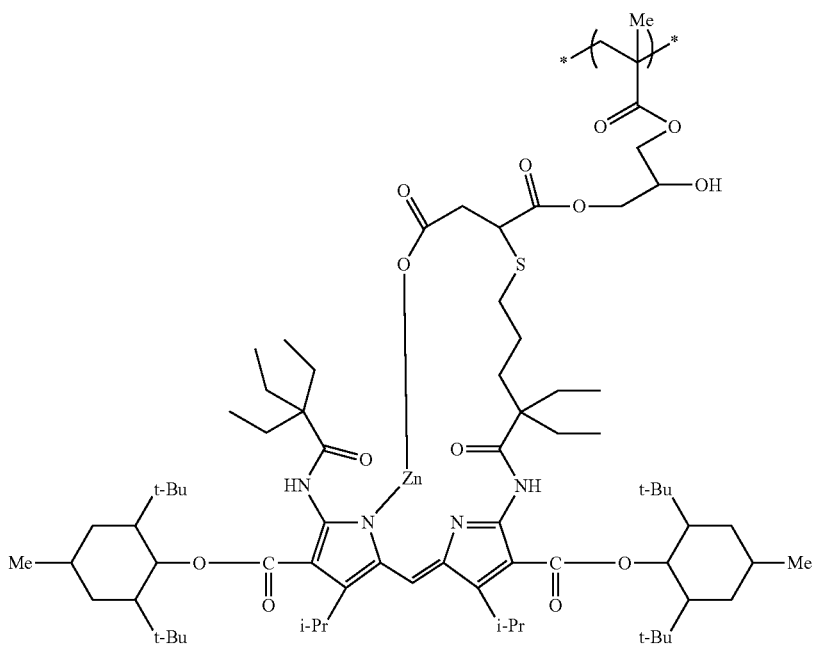
[Chem. 51]
(A-az-1)
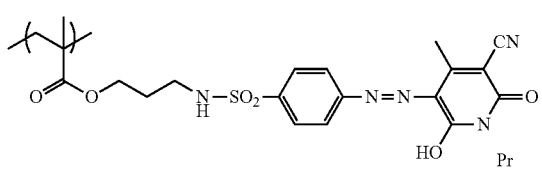
(A-az-2)
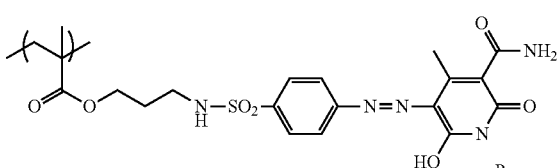
(A-az-3)
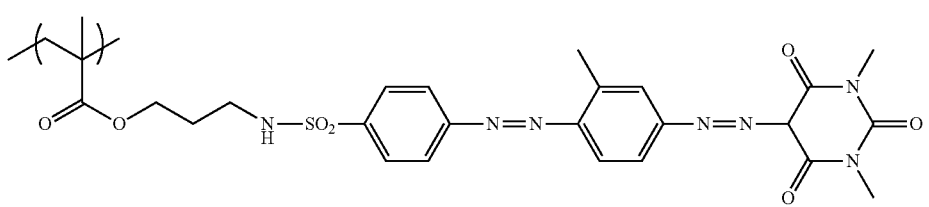

-continued
(A-az-4)
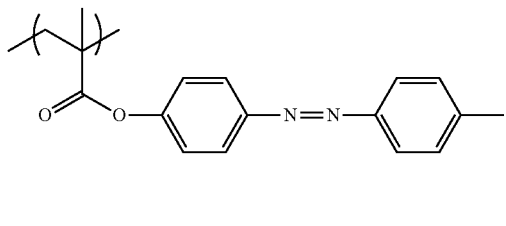
(A-az-5)
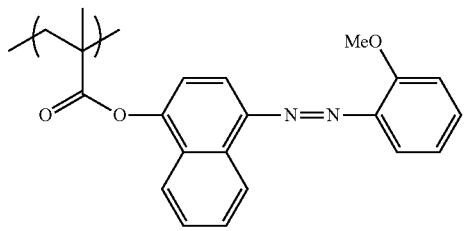
(A-az-6)
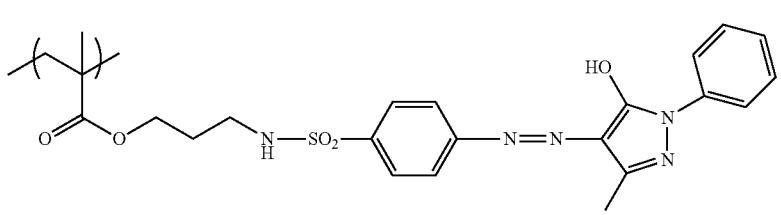
[Chem. 52]
[Chem. 53]
(A-az-7) (A-az-8)
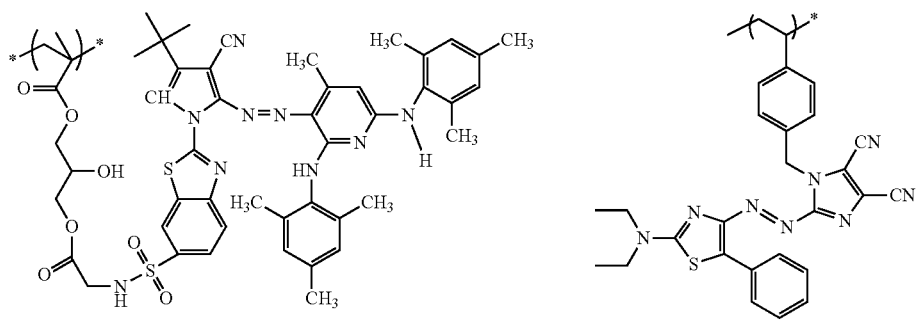
(A-az-9) (A-az-10)
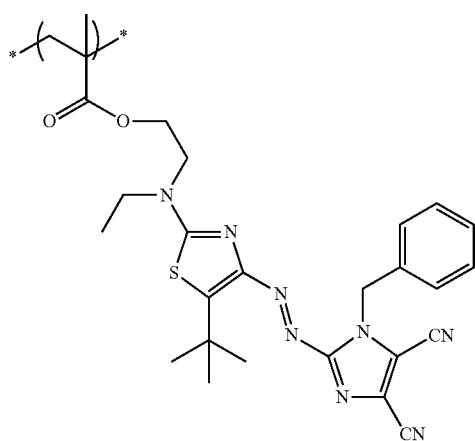
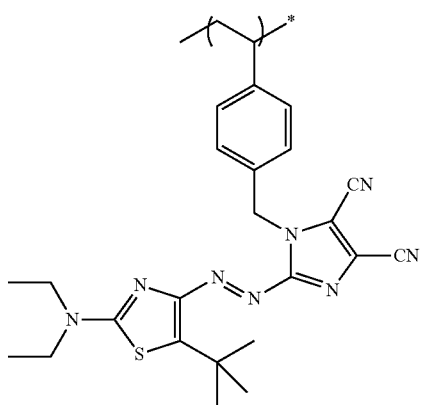

[Chem. 54]
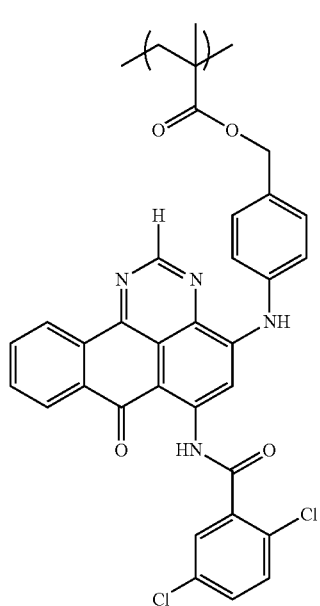 (A-aq-1)
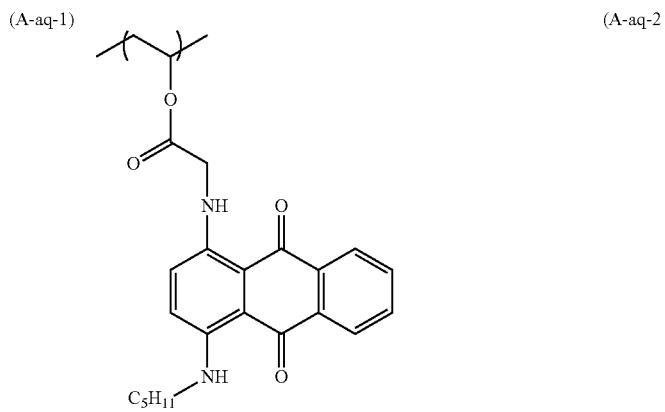 (A-aq-2)
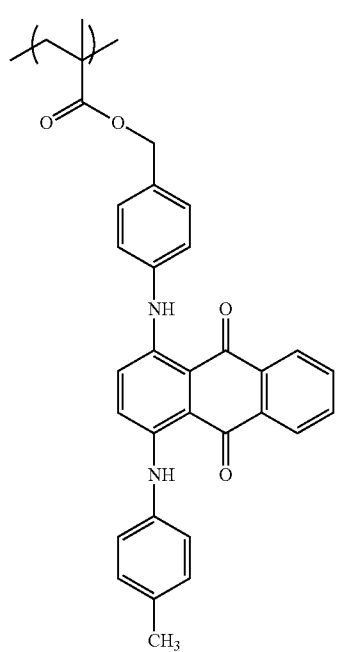 (A-aq-3)
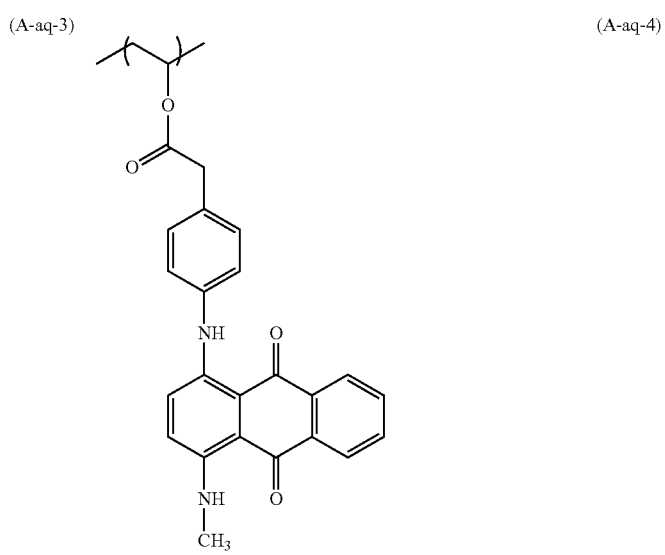 (A-aq-4)

-continued
(A-aq-5)
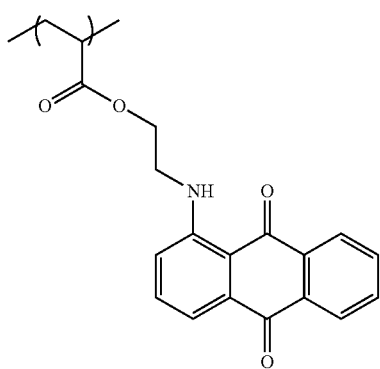
(A-aq-6)
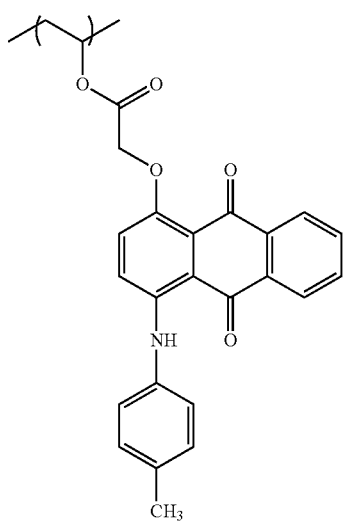
(A-aq-7)
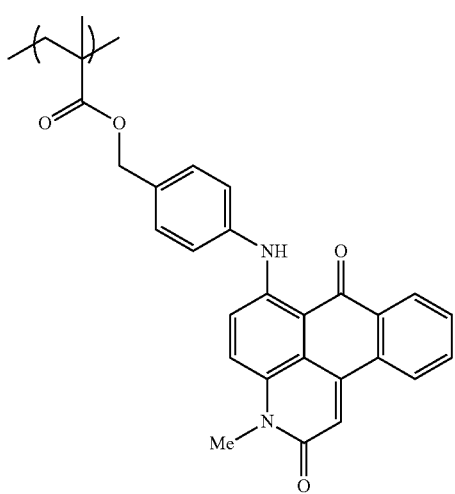
(A-aq-8)
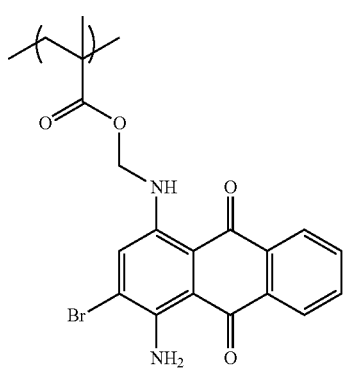
(A-aq-9)
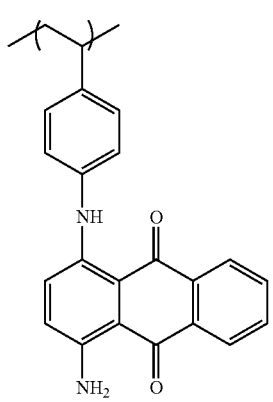
(A-aq-10)
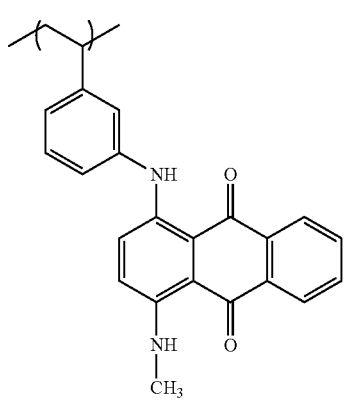

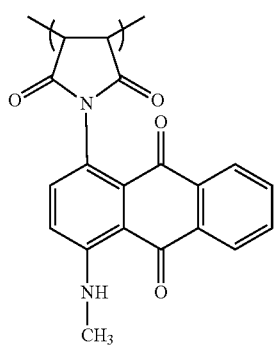
(A-aq-11)
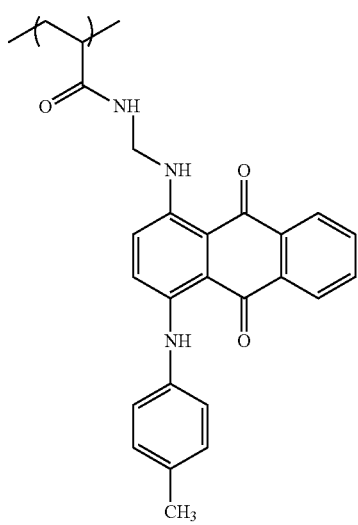
(A-aq-12)
[Chem. 55]
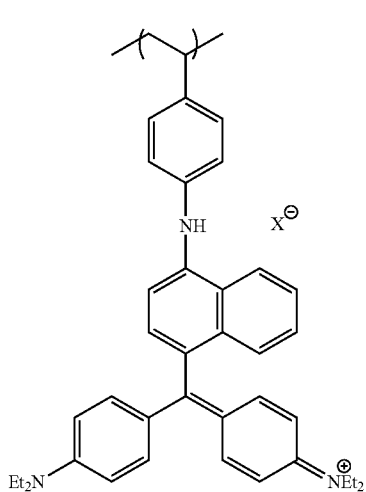
(A-tp-1)
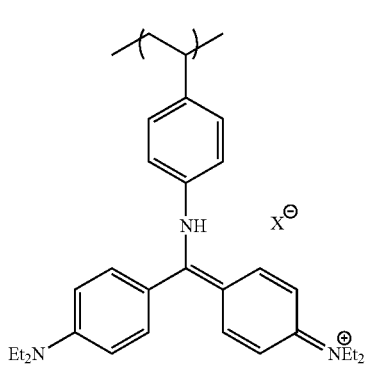
(A-tp-2)
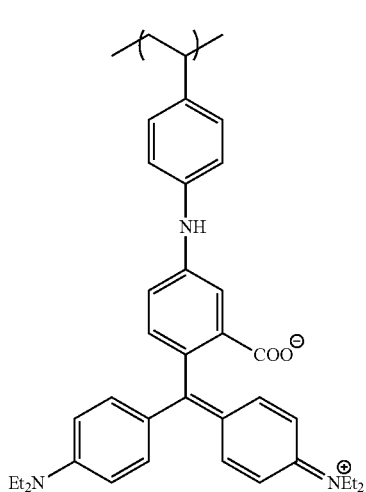
(A-tp-3)

-continued
[Chem. 56]
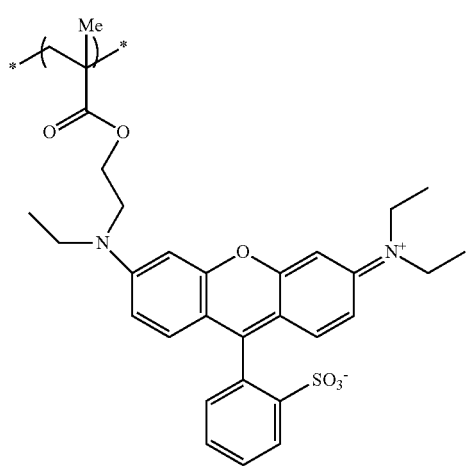 (A-xt-1)
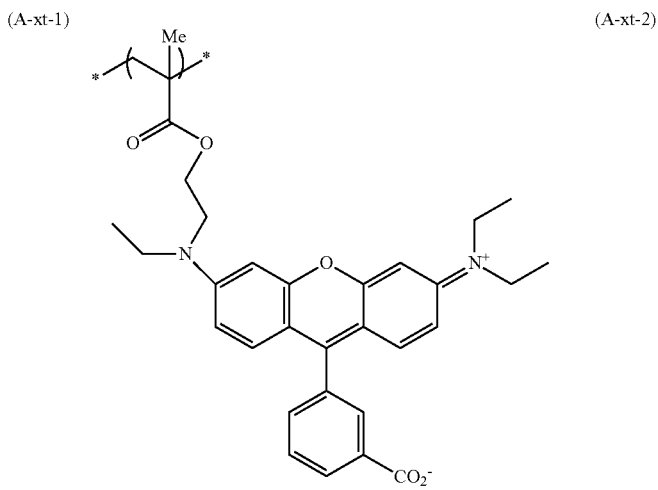 (A-xt-2)
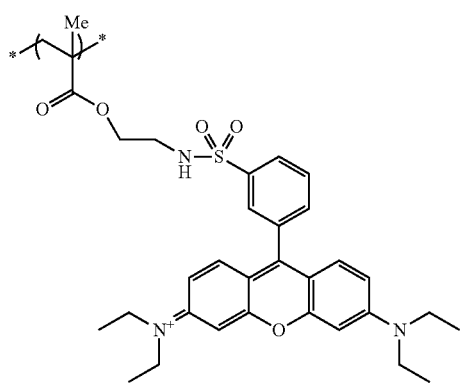 (A-xt-3)
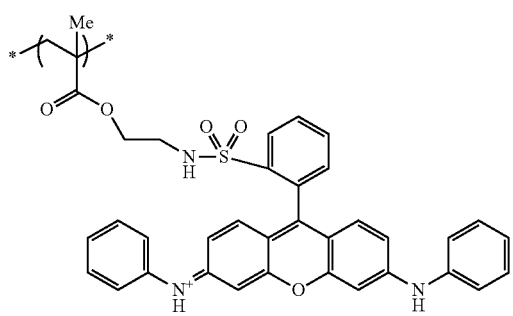 (A-xt-4)
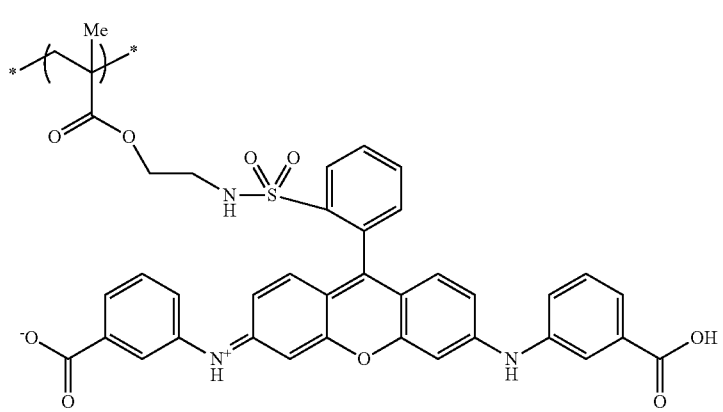 (A-xt-5)

-continued
[Chem. 57]
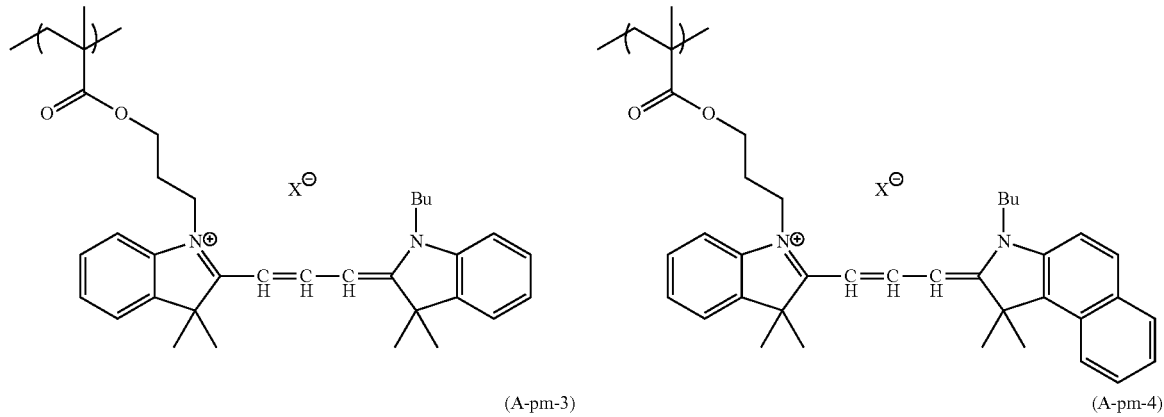
(A-pm-1) (A-pm-2)
(A-pm-3) (A-pm-4)
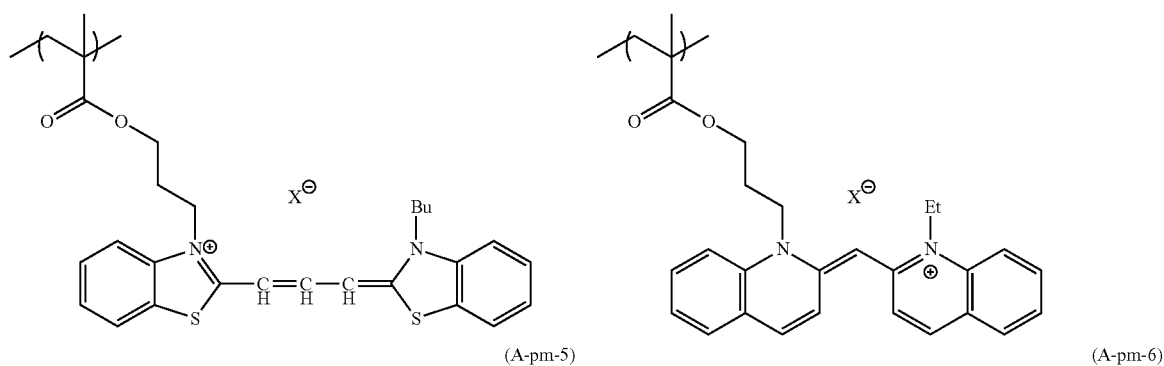
(A-pm-5) (A-pm-6)
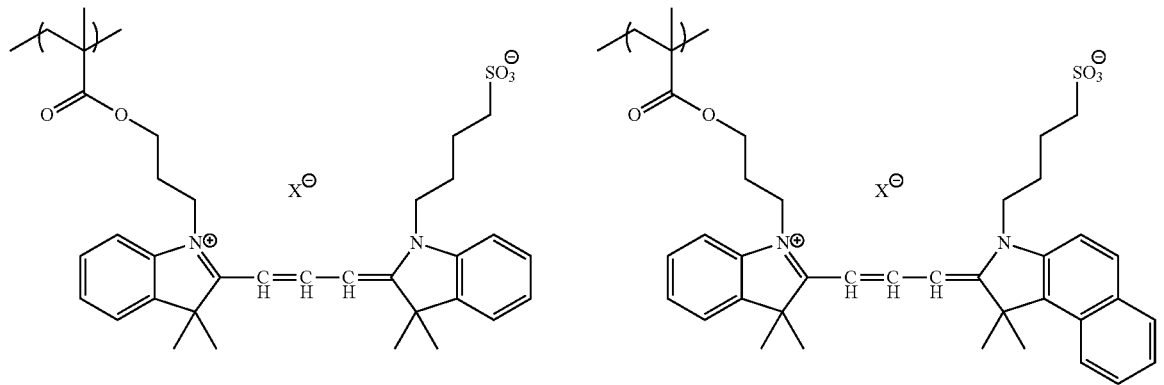
[Chem. 58]
(A-sq-1) (A-sq-2)
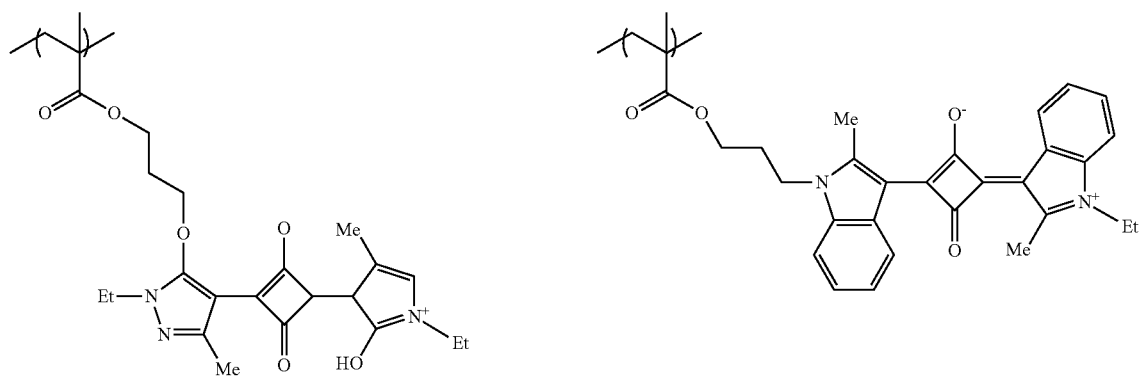

-continued
(A-sq-3)
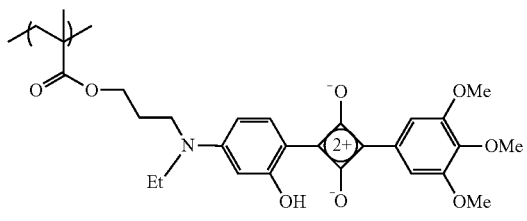
(A-sq-4)
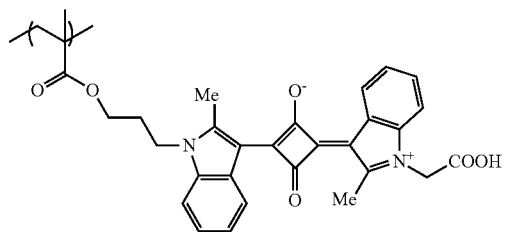
(A-sq-4)
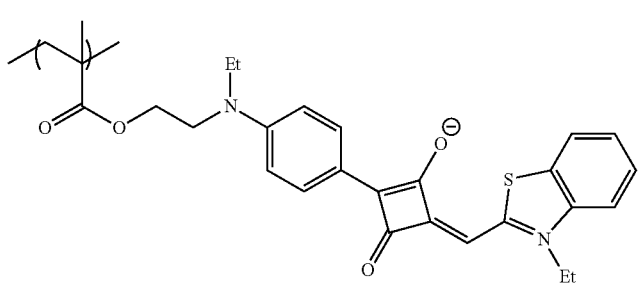
[Chem. 59]
(A-qp-1)
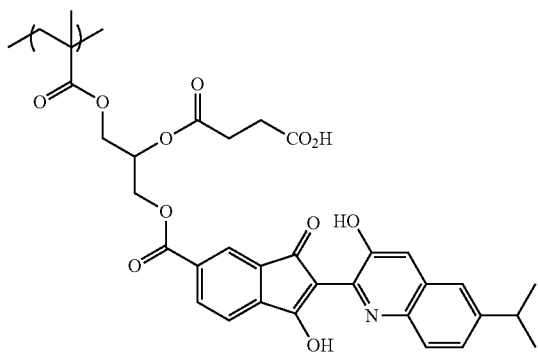
(A-qp-2)
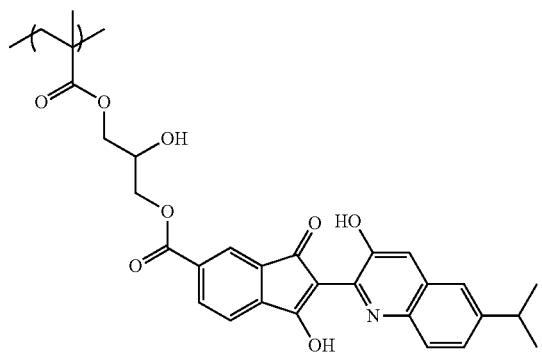
[Chem. 60]
(A-SP-1)
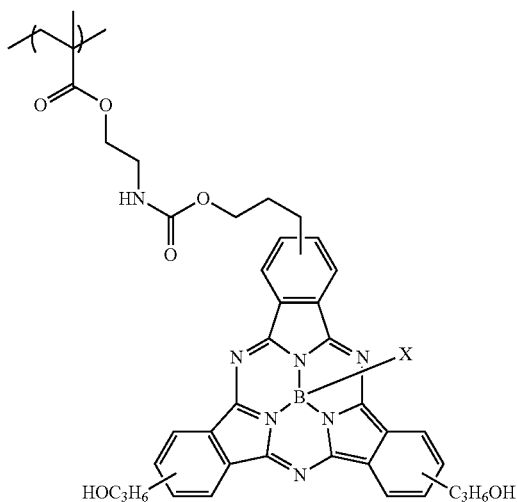
(A-SP-2)
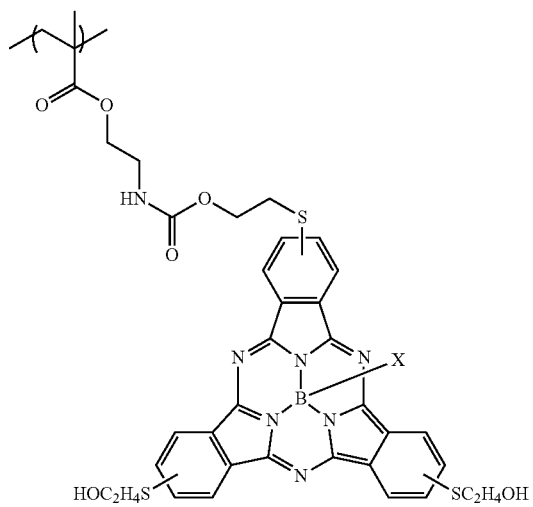

-continued
(A-SP-3)
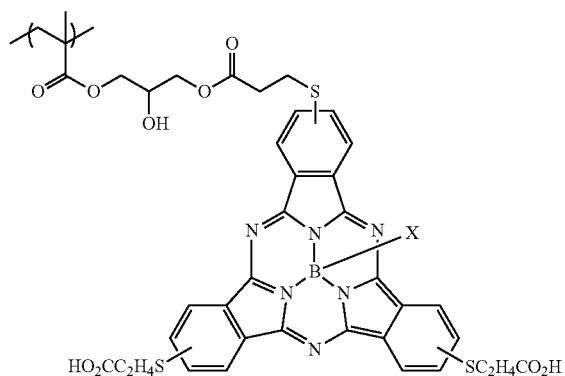
(A-SP-4)
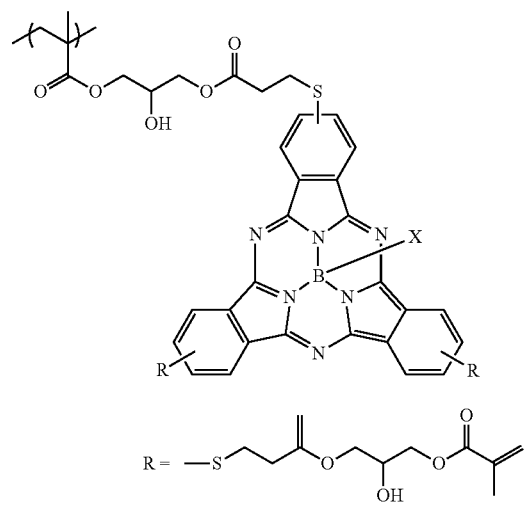
[Chem. 61]
(A-ph-1)
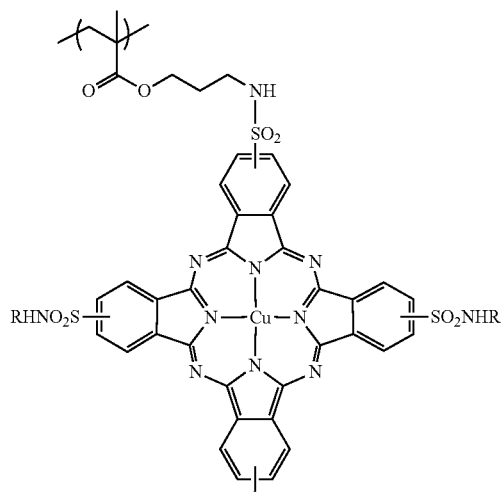
R = CH2CH2CH2OH
(A-ph-2)
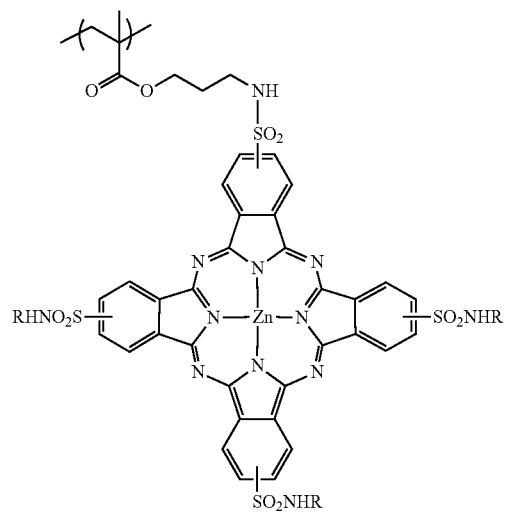
R = CH2CH2CH2OH (A-ph-3)
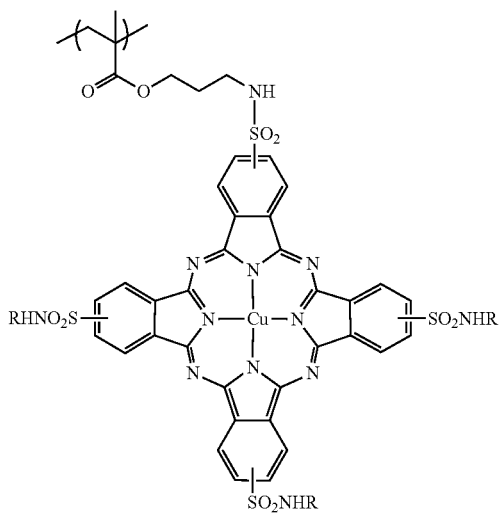
R = 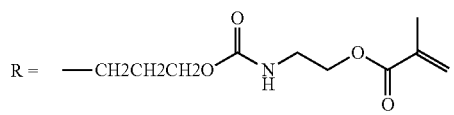
(A-ph-4)
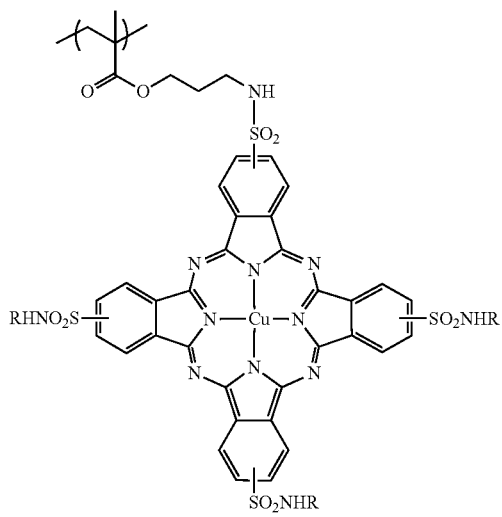
R = —CH2CH2CH2O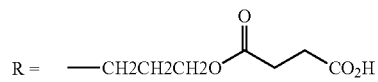CO₂H
[Chem. 62]
(A-st-1)
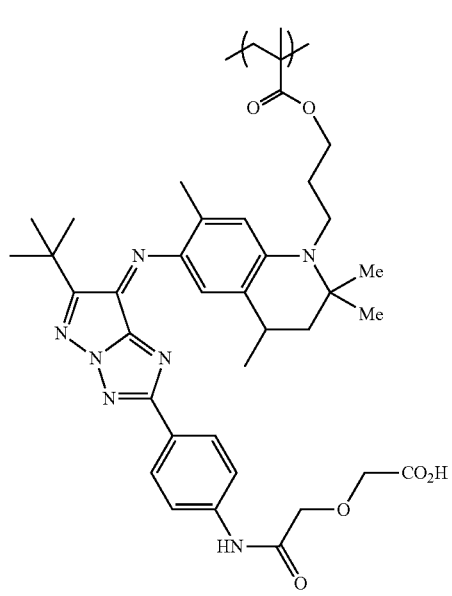
(A-st-2)
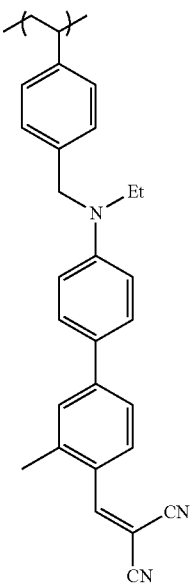

-continued

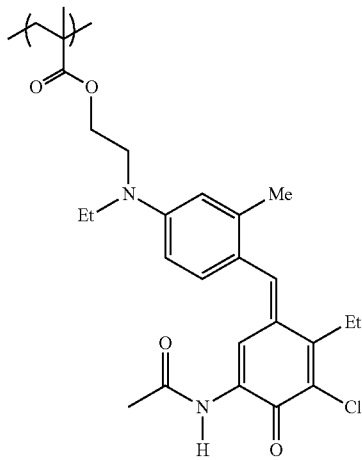
(A-st-3)

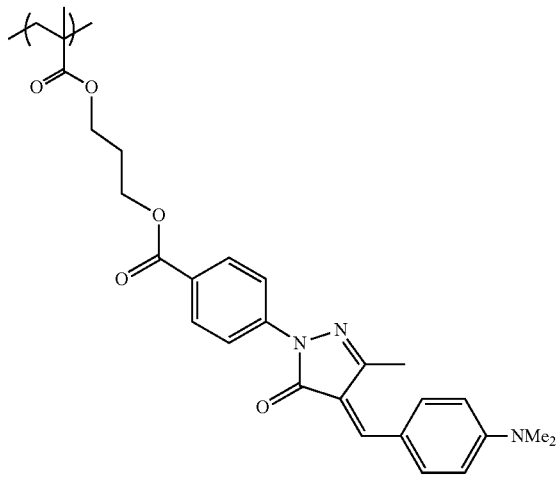
(A-st-4)

<Structural Unit Represented by General Formula (B)>

Next, the structural unit represented by General Formula (B) is described in detail.

[Chem. 63]

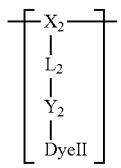

General Formula (B)

In General Formula (B), $X_2$ is the same as $X_1$ in General Formula (A). $L_2$ is the same as $L_1$ in General Formula (A). $Y_2$ represents a group capable of forming an ionic bonding or a covalent bonding with Dye II. Dye II represents a dye structure.

Hereinafter, they will be described in detail.

In General Formula (B), $X_2$ is the same as $X_1$ in General Formula (A) and so are the preferable ranges. $L_2$ is the same as $L_1$ in General Formula (A) and so are the preferable ranges. $Y_2$ is a group capable of forming an ionic bonding or a covalent bonding with Dye II and may be any group between an anionic group or a cationic group. As the anionic group, $COO^-$, $PO_3H^-$, $SO_3^-$, $-SO_3NH^-$, $-SO_3N-CO^-$ or the like may be included, however, $COO^-$, $PO_3H^-$, or $SO_3^-$ is preferable.

As the cationic group, a substituted or unsubstituted onium cation (for example, ammonium, pyridinium, imidazolium, phosphonium and the like) may be included and particularly, an ammonium cation is preferable.

$Y^2$ may be bonded to the anion part ($COO^-$, $SO_3^-$, $O^-$ or the like) or the cation part (the onium cation or a metal cation) contained in Dye II.

Specific examples of the repeating unit of the dye polymer (corresponding to a monomer compound) represented by General Formula (B) are shown below, however, the present invention is not limited to these.

[Chem. 64]

(B-dp-1)

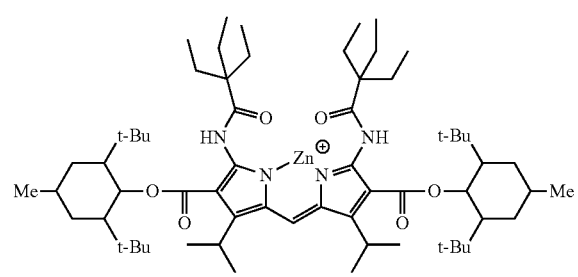

(B-dp-2)

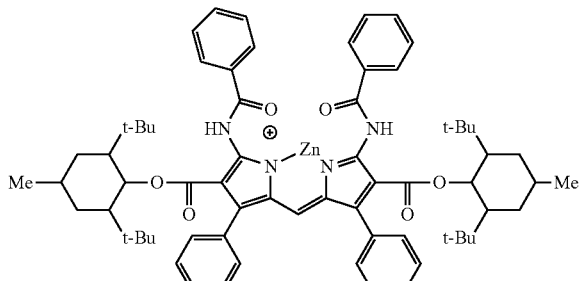

(B-tp-1)

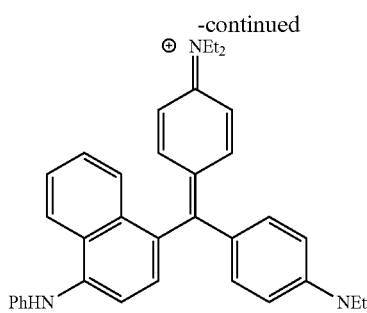

(B-tp-2)

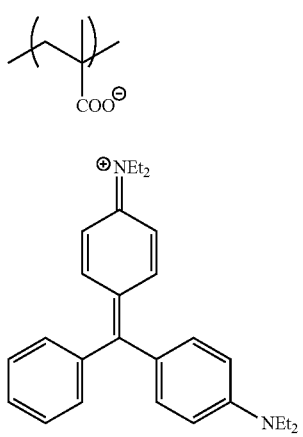

(B-pm-1)

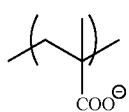

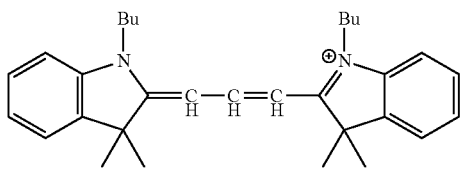

(B-sp-1)

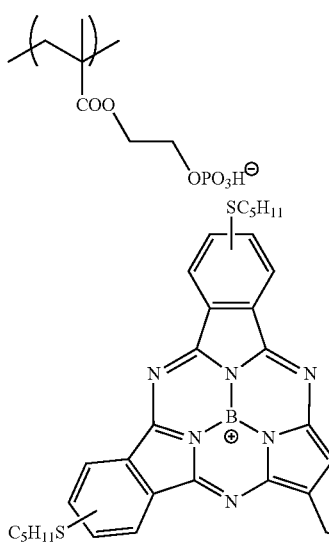

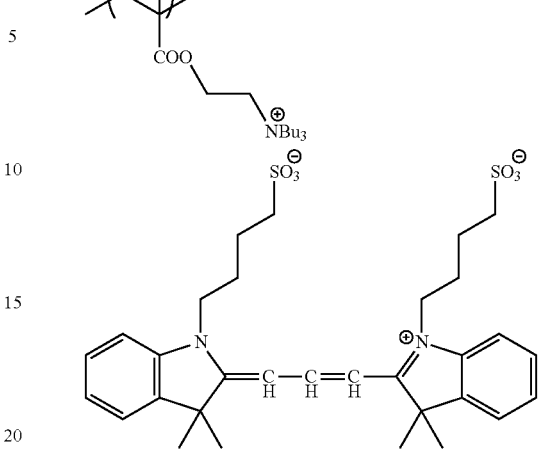

(B-pm-2)

<Structural Unit Represented by General Formula (C)>

[Chem. 65]

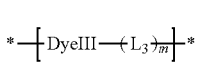

General Formula (C)

In General Formula (C), L₃ represents a single bonding or a divalent linking group. Dye III represents a dye structure. M represents 0 or 1.

Hereinafter, they will be described in detail.

In General Formula (C), as the divalent linking group when represented by $L_3$, a substituted or unsubstituted alkylene group with straight chain, branched chain, or a ring structure having 1 to 30 carbon atoms (for example, a methylene group, an ethylene group, a trimethylene group, a propylene group, a butylene group or the like), a substituted or unsubstituted arylene group having 6 to 30 carbon atoms (for example, a phenylene group, a naphthalene group or the like), a substituted or unsubstituted heterocyclic group, —CH=CH—, —O—, —S—, —NR— (R represents a hydrogen atom, an alkyl group, an aryl group, or a heterocyclic group), —C(=O)—, —SO—, —SO₂— and a linking group formed by linking two or more of these are suitably included. m represents 0 or 1, however, 1 is preferable.

Specific examples of the divalent linking group represented by $L_3$ in General Formula (C) are shown below, however, $L_3$ of the present invention is not limited to these.

[Chem. 66]

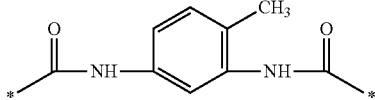

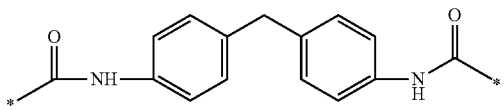

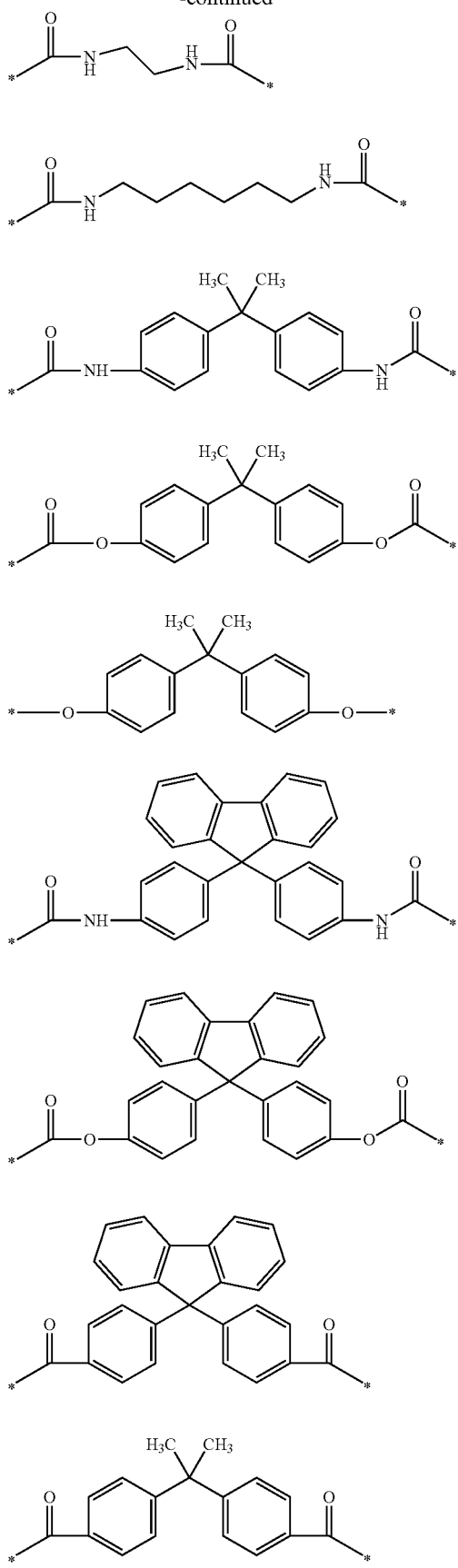

The dye polymer having the repeating unit in General Formula (C) is synthesized by sequential polymerization. The sequential polymerization includes polyaddition (for example, a reaction of a diisocyanate compound with diol, a reaction of a diepoxy compound with dicarboxylic acid, a reaction of tetracarboxylic acid dianhydride with diol or the like) and polycondensation (for example, a reaction of dicarboxylic acid with diol, a reaction of dicarboxylic acid and diamine or the like). Among these, particularly, synthesizing by the polyaddition reaction is preferable since it makes the reaction condition mild and does not degrade the dye structure. As the sequential polymerization, well-known reaction conditions may be applied.

Specific examples of the repeating unit of the dye polymer (corresponding to a monomer compound) represented by General Formula (C) are shown below, however, the present invention is not limited to these.

[Chem. 67]
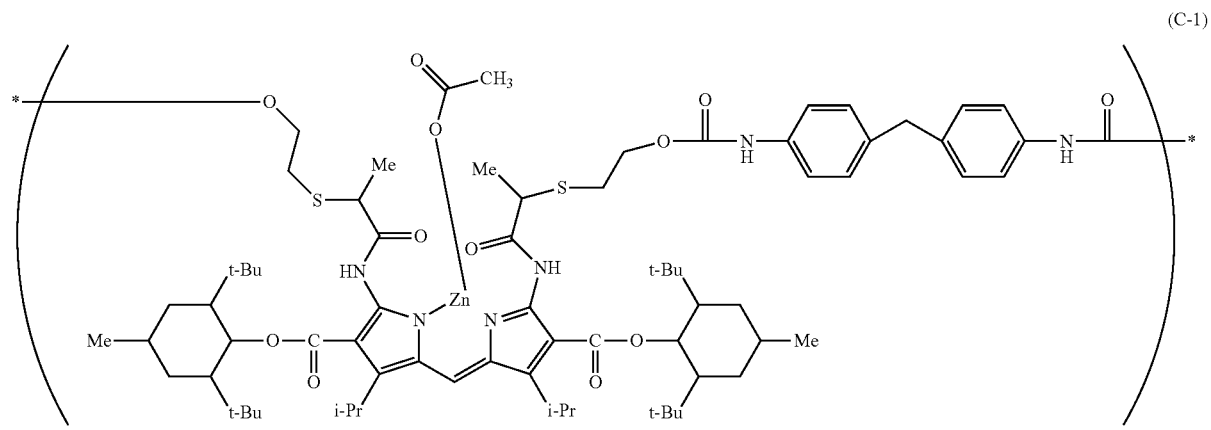
(C-1)
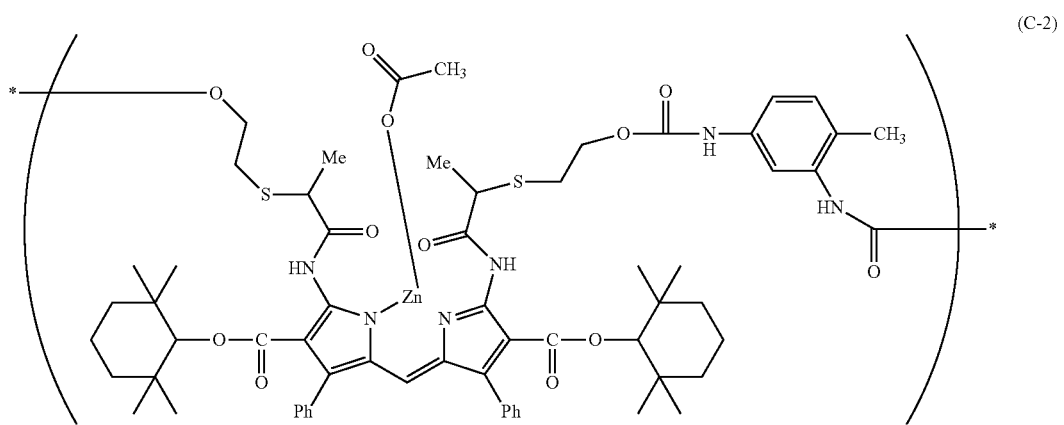
(C-2)
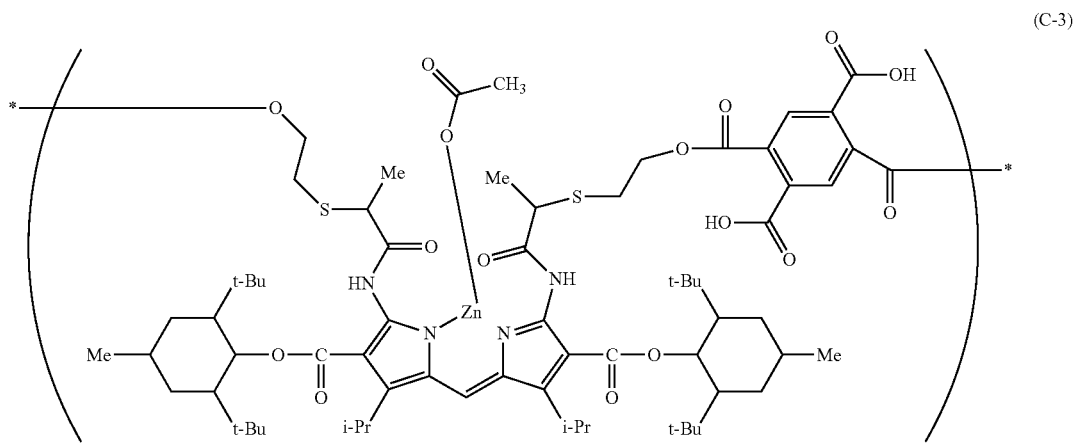
(C-3)

-continued (C-az-1) 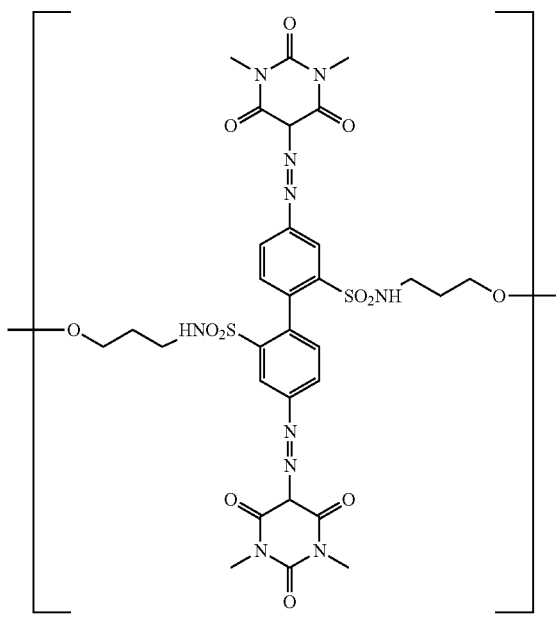

(C-pm-1) 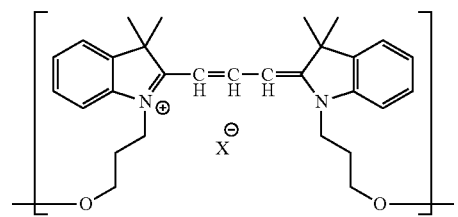

(C-aq-1) 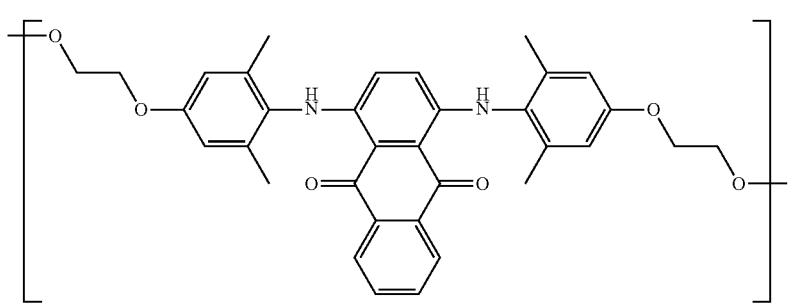

(C-sq-1) 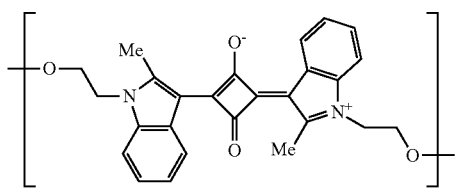

(C-az-2) 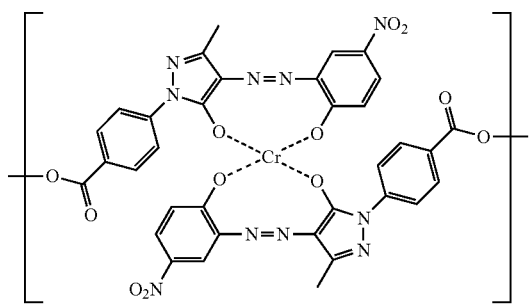

<Dye Polymer Represented by General Formula (D)>

Next, the dye polymer represented by General Formula (D) is described in detail.

[Chem. 69]

$(L_4)\!-\!(DyeIV)_n$  General Formula (D)

(In General Formula (D), $L_4$ represents a linking group with valence number of n. n represents a integer of 2 to 20. When n is 2 or more, the structure of Dye IV may be the same or different from each other. Dye IV represents a dye structure)

In General Formula (D), n is preferably 3 to 15 and particularly preferably 3 to 6.

In General Formula (D), if n is 2, as the divalent linking group represented by $L_4$, a substituted or unsubstituted alkylene group having 1 to 30 carbon atoms (for example, a methylene group, an ethylene group, a trimethylene group, a propylene group, a butylene group or the like), a substituted or unsubstituted arylene group having 6 to 30 carbon atoms (for example, a phenylene group, a naphthalene group or the like), a substituted or unsubstituted heterocyclic group, —CH=CH—, —O—, —S—, —NR— (here, Rs, each independently, represent a hydrogen atom, an alkyl group, an aryl group, or a heterocyclic group), —C(=O)—, —SO—, —SO$_2$— and a linking group formed by linking two or more of these are suitably included.

As the linking group with a valence number of n when n is 3 or more, a linking group formed by substitution of the divalent linking group, with a substituted or unsubstituted arylene group (1,3,5-phenylene group, 1,2,4-phenylene group, 1,4,5,8-naphthalene group), a heterocyclic linking group (for example, 1,3,5-triazine group), an alkylene linking group or the like being a mother nucleus, may be included.

Specific examples of $L_4$ in General Formula (D) are shown below, however, the present invention is not limited to these.

[Chem. 70]

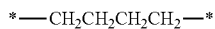
(L4-1)

(L4-2)

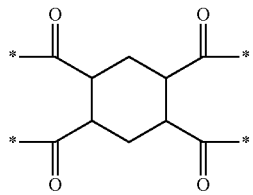
(L4-3)

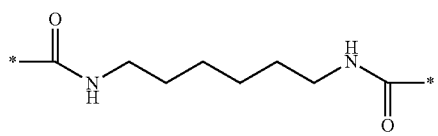
(L4-4)

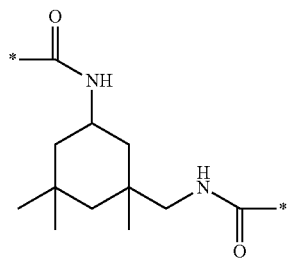
(L4-5)

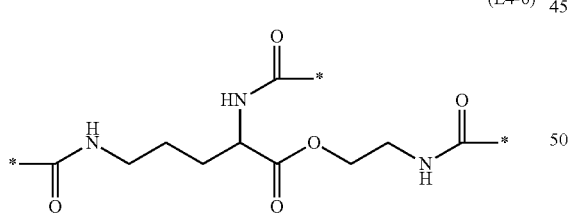
(L4-6)

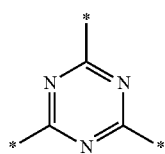
(L4-7)

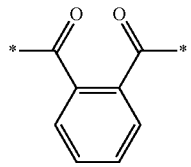
(L4-8)

-continued

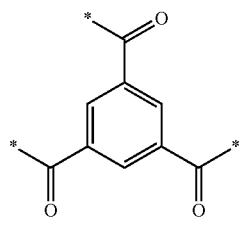
(L4-9)

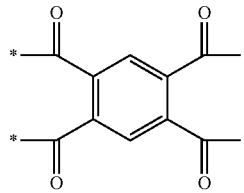
(L4-10)

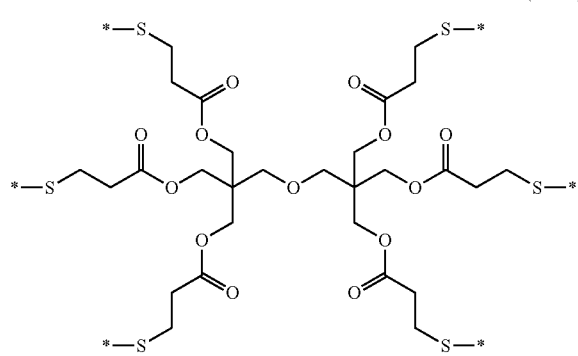
(L4-11)

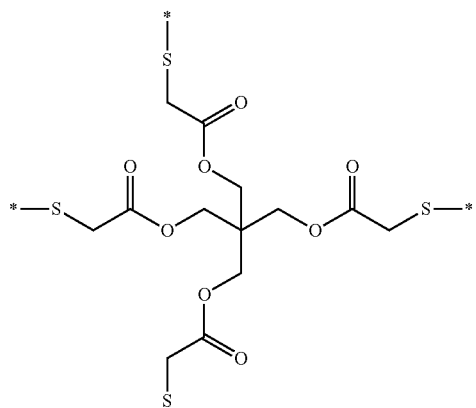
(L4-12)

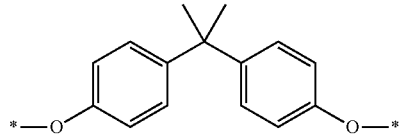
(L4-13)

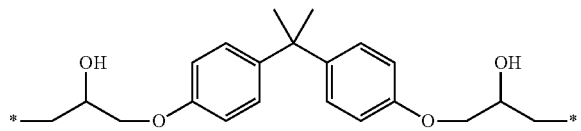
(L4-14)

Specific examples of Dye IV (corresponding to a monomer component) in General Formula (D) are shown below, however, the present invention is not limited to these.

[Chem. 71]

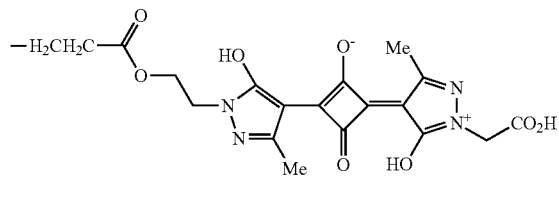
(D-sq-1)

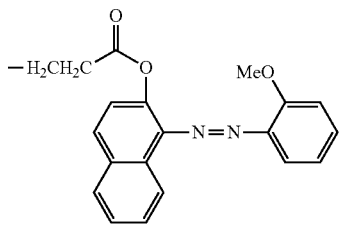
(D-az-1)

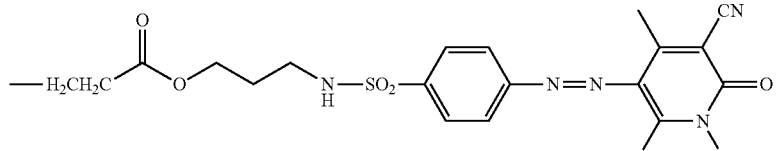
(D-tp-1)

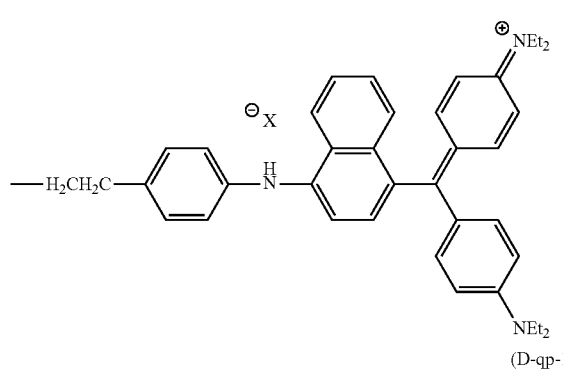
(D-qp-1)

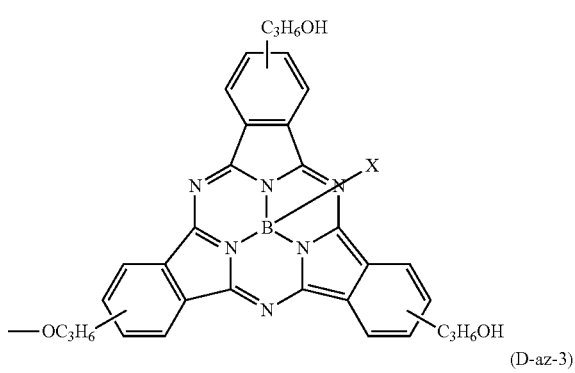
(D-sp-1)

(D-az-2)

(D-az-3)

(D-xt-1)

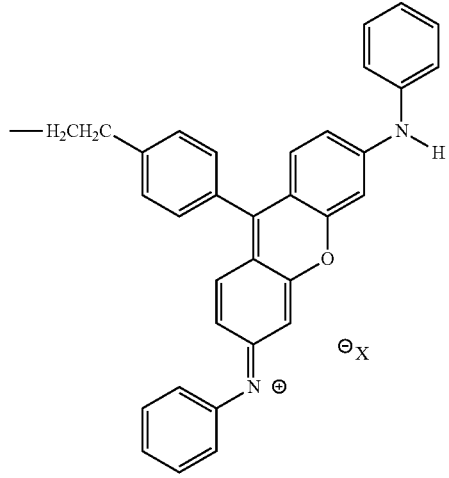

In General Formula (A) to General Formula (D), dye polymers represented by General Formula (A), General Formula (B) and General (D) are preferable since they are bonded by covalent bonding and are effective in suppressing heat resistance and color migration to other patterns, and particularly, the dye polymer represented by General Formula (A) is preferable since controlling the molecular weight of the dye polymer is easy.

<Polymerizable Group Included in (A) Dye Polymer>

(A) The dye polymer of the present invention more preferably includes a polymerizable group. As the polymerizable group, well-known polymerizable groups capable of crosslinking by radical, acid or heat, and for example, ethylenic unsaturated bond, cyclic ether (epoxy, oxetane), methanol or the like may be included, however, particularly, ethylenic unsaturated bond is preferable and (meth)acrylic group is the most preferable.

As introduction methods of the polymerizable group, (1) a method in which the dye polymer is modified to a polymerizable group contained compound and introduced, (2) a method in which a dye monomer and a polymerizable group contained compound is copolymerized and introduced may be used. Hereinafter, they will be described in detail.

<(1) Method in which Dye Polymer is Modified to Polymerizable Group Contained Compound and Introduced>

The method in which the dye polymer is modified to a polymerizable group contained compound and introduced is not particularly limited and well-known methods may be used, however, (a) a method in which a carboxylic acid included in a dye polymer is reacted with an unsaturated bond contained epoxy compound, (b) a method in which a hydroxyl group or a amino group included in a dye polymer is reacted with an unsaturated bond contained isocyanate compound, or (c) a method in which an epoxy compound included in a dye polymer is reacted with an unsaturated bond contained carboxylic acid compound, is preferable from the viewpoint of preparation.

As the unsaturated bond contained epoxy compound in (a) the method in which the carboxylic acid included in the dye polymer is reacted with the unsaturated bond contained epoxy compound, glycidyl methacrylate, glycidyl acrylate, allyl glycidyl ether, 3,4-epoxy-cyclohexylmethyl acrylate, 3,4-epoxy-cyclohexylmethyl methacrylate and the like may be included, however, particularly, glycidyl methacrylate and 3,4-epoxy-cyclohexylmethyl methacrylate are preferable since crosslinking property and storage stability are excellent. For the reaction conditions, well-known conditions may be used.

As the unsaturated bond contained isocyanate compound in (b) the method in which the hydroxyl group or the amino group included in the dye polymer is reacted with the unsaturated bond contained isocyanate compound, 2-isocyanatoethyl methacrylate, 2-isocyanatoethylathacrylate, 1,1-bis(acryloyloxymethyl)ethylisocyanate and the like may be included, however, 2-isocyanatoethyl methacrylate is preferable since crosslinking property and storage stability are excellent. For the reaction conditions, well-known conditions may be used.

The unsaturated bond contained carboxylic acid compound in (c) the method in which the epoxy compound included in the dye polymer is reacted with the unsaturated bond contained carboxylic acid compound is not particularly limited and any carboxylic compound having well-known (meth)acryloyloxy groups may be used, however, methacrylic acid and acrylic acid are preferable, and particularly, methacrylic acid is preferable since crosslinking property and storage stability are excellent. For the reaction conditions, well-known conditions may be used.

<(2) Method in which Dye Monomer and Polymerizable Group Contained Compound is Copolymerized and Introduced>

(2) The method in which the dye monomer and the polymerizable group contained compound is copolymerized and introduced is not particularly limited and well-known methods may be used, however, (d) a method in which a dye monomer capable of radical polymerization is copolymerized with a polymerizable group capable of radical polymerization contained compound, or (e) a method in which a dye monomer capable of polyaddition is copolymerized with a polymerizable group capable of polyaddition contained compound, is preferable.

As the polymerizable group capable of radical polymerization contained compound in (d) the method in which a dye monomer capable of radical polymerization is copolymerized with a polymerizable group capable of radical polymerization contained compound, particularly, an allyl group contained compound (for example, allyl (meth)acrylate and the like), an epoxy group contained compound (for example, glycidyl (meth)acrylate), 3,4-epoxy-cyclohexylmethyl(meth)acrylate and the like), an oxetane group contained compound (for example, 3-methyl-3-oxetanylmethyl (meth)acrylate and the like), and a methylol group contained compound (for example, N-(hydroxymethyl)acrylamide and the like) may be included and particularly, an epoxy compound and an oxetane compound are preferable. For the reaction conditions, well-known conditions may be used.

As the polymerizable group capable of polyaddition contained compound in (e) the method in which a dye monomer capable of polyaddition is copolymerized with a polymerizable group capable of polyaddition contained compound, an unsaturated bond contained diol compound (for example, 2,3-dihydroxypropyl(meth)acrylate and the like) may be included. For the reaction conditions, well-known conditions may be used.

As the method for introducing the polymerizable group, the method in which the carboxylic acid included in the dye polymer is reacted with the unsaturated bond contained epoxy compound is the most preferable.

As the amount of the polymerizable group included in (A) the dye polymer, 0.1 to 2.0 mmol with regard to 1 g of (A) the dye polymer is preferable, 0.2 to 1.5 mmol is more preferable, and 0.3 to 1.0 mmol is the most preferable.

As the composition unit having the polymerizable group, specific examples shown below may be included. However, the present invention is not limited to these.

[Chem. 72]

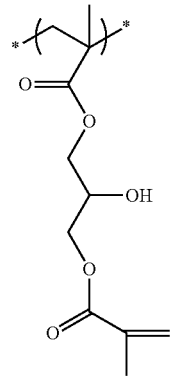

(G-1)

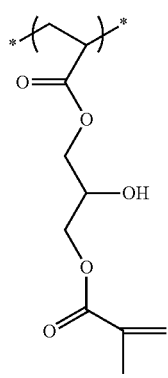
(G-2)
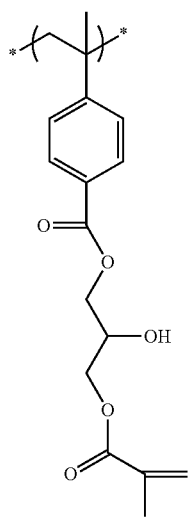
(G-3)
(G-4)
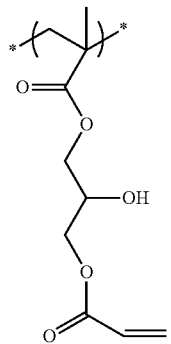
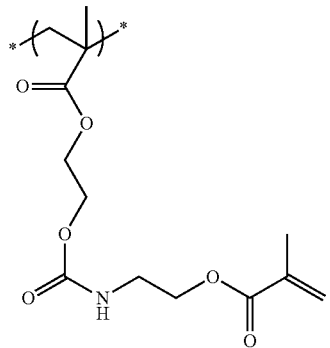
(G-6)
(G-7)
(G-8)
(G-9)
(G-10)

(G-11)
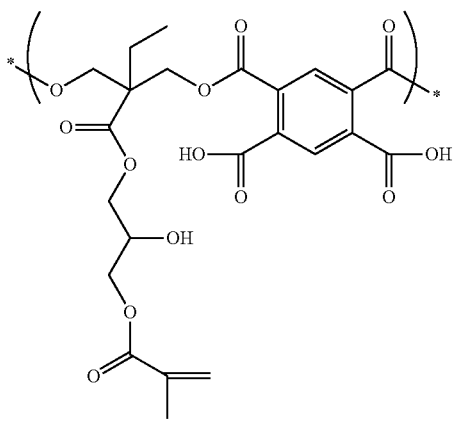

[Chem. 73]

(G-12)
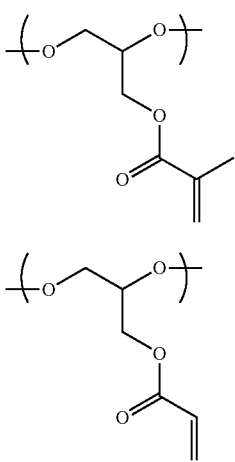

(G-13)

(G-14)

(G-15)
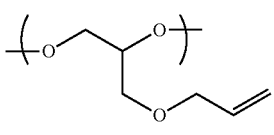

(G-16)
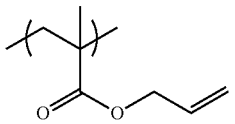

(G-17)
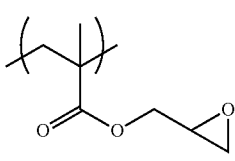

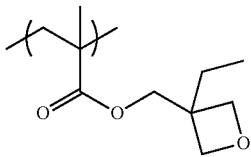

<Other Functional Groups Included in (A) Dye Polymer>

A) The dye polymer of the present invention may have other functional groups. As the other functional groups, an alkali-soluble group such as a carboxylate group, a sulfonate group, a phosphate group, a phenolic hydroxyl group and the like is preferable. As the alkali-soluble group, a carboxylate group is the most preferable.

As a method for introducing the alkali-soluble group to the dye polymer, a method in which the alkali-soluble group is introduced to the dye monomer in advance, and a monomer other than the dye monomer having the alkali-soluble group ((meth)acrylic acid, a caprolactone modified product of acrylic acid, a succinic anhydride modified product of 2-hydroxyethyl (meth)acrylate, a phthalic anhydride modified product of 2-hydroxyethyl (meth)acrylate, a 1,2-cyclohexanedicarboxylic anhydride modified product of 2-hydroxyethyl (meth)acrylate, a carboxylic acid contained monomer such as styrene carboxylic acid, itaconic acid, maleic acid, norbonenecarboxylic acid or the like, a phosphoric acid contained monomer such as acid phosphooxyethyl methacrylate and vinyl phosphonic acid, and a sulfonic acid contained monomer such as vinyl sulfonic acid and 2-acrylamide-2-methylsulfonic acid) are copolymerized is included, however, the use of both methods is the most preferable.

As the amount of the alkali-soluble group included in (A) the dye polymer, 0.3 to 2.0 mmol with regard to 1 g of (A) the dye polymer is preferable, 0.4 to 1.5 mmol is more preferable, and 0.5 to 1.0 mmol is the most preferable.

As the other functional groups included in (A) the dye polymer, a development promoting group such as lactone, an acid anhydride, an amide, —COCH$_2$CO—, or a cyano group, an adjusting group with a hydrophobic property such as an alkyl group with long chain and a ring structure, an aralkyl group, an aryl group, a polyalkylene oxide group, a hydroxyl group, a maleimide group, or an amino group or the like may be included and are appropriately introduced. As the method for introducing, a method in which the other functional groups are introduced to the dye monomer in advance and a method in which the monomer having the functional group is copolymerized.

As the repeating unit having other functional groups included in the dye polymer, specific examples shown below are represented. However, the present invention is not limited to these.

[Chem. 74]

(H-1)
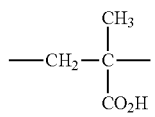

(H-2)
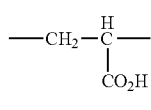

(H-3)
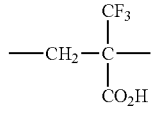

(H-4)
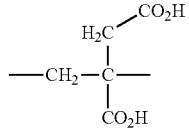

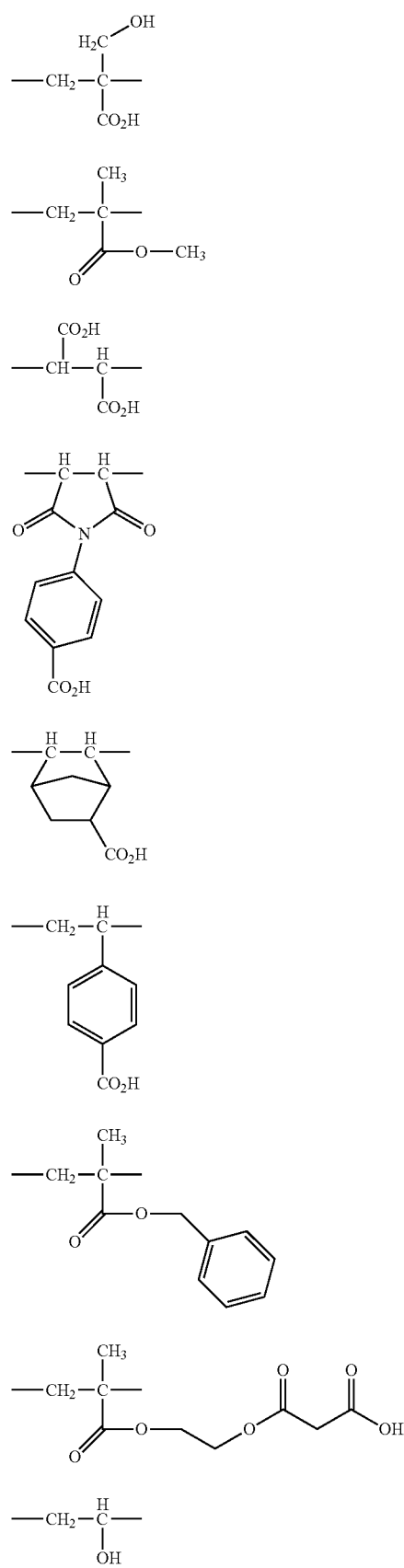
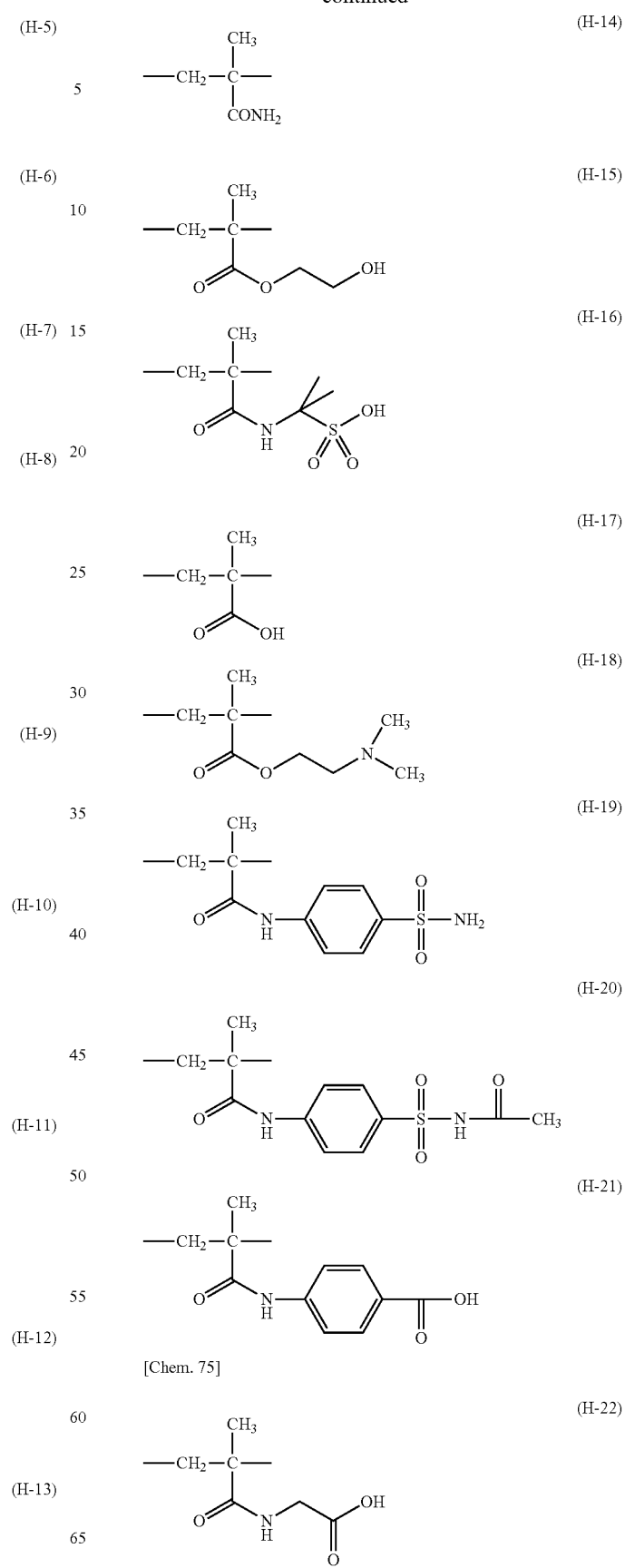

-continued (H-23) 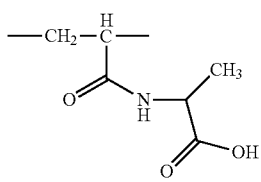

(H-24) 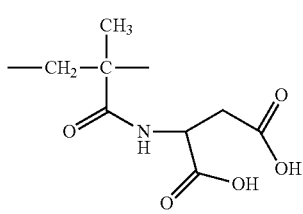

(H-25) 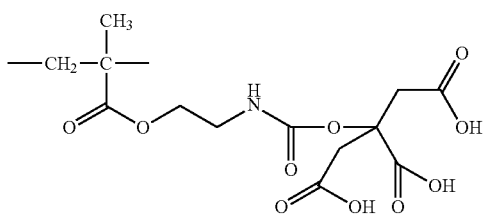

(H-26) 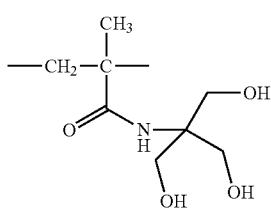

[Chem. 76]

(H-27) 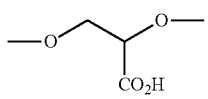

(H-28) 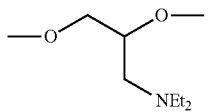

(H-29) 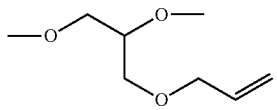

(H-30) 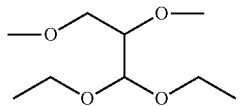

(H-31) 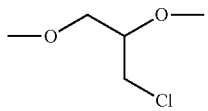

-continued (H-32) 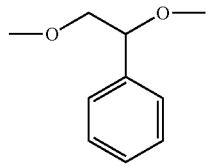

As the weight-average molecular weight of (A) the dye polymer, 2,000 to 20,000 is preferable, 3,000 to 15,000 is more preferable, and 4,000 to 10,000 is the most preferable.

In addition, the ratio of weight-average molecular weight/number-average molecular weight is preferably 1.0 to 3.0, more preferably 1.6 to 2.5 and the most preferably 1.6 to 2.0.

The weight-average molecular weight and a degree of dispersion of (A) the dye polymer (weight-average molecular weight/number-average molecular weight) is defined as the polystyrene conversion value using a GPC measurement. In the present specification, the weight-average molecular weight and the number-average molecular weight are determined using HLC-8020 GPC (manufactured by Tosoh Co., Ltd.), by using TSKgel Multipore HXL-M (manufactured by Tosoh Co., Ltd., 7.8 mm ID×30.0 cm) as a column and by using THF (tetrahydrofuran) as an eluent.

Hereinbefore, (A) the polymer having the dye skeleton (=dye polymer) has been described. As the content of (A) the polymer having the dye skeleton in the coloring composition for a color filter of the present invention, containing 5 mass % to 70 mass % with regard to the total amount of the coloring composition is preferable, containing 10 mass % to 60 mass % is more preferable, containing 20 mass % to 50 mass % is the most preferable. By maintaining the content in this range, as the coloring layer obtained by the coloring composition of the present invention, a coloring layer with high color purity even in a thin layer may be obtained and adhesion to the substrate of the coloring layer is satisfactory.

<(B) Organic Solvent>

The coloring composition for a color filter of the present invention includes (B) an organic solvent.

By including (B) the organic solvent, obtaining a uniform coloring composition is possible since (A) the dye polymer or other components described later is dissolved. As a result, a coating property of the coloring composition of the present invention becomes satisfactory, the coloring composition layer is uniform in film thickness and, in addition, can be formed also as a thin layer.

(B) The organic solvent is basically not particularly limited as long as the solubility of each component included in the coloring composition or the coating property of the coloring composition is satisfactory, however, it is preferable that the organic solvent be selected considering an ultraviolet ray absorbing agent, solubility of a binder, a coating property and safety.

It is also preferable that at least two types of organic solvent be included to prepare the coloring composition of the present invention.

As the organic solvent, as esters, for example, ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, alkyl oxyacetate ((for example: methyl oxyacetate, ethyl oxyacetate, butyl oxyacetate (for example, methyl methoxyacetate, ethyl methoxyacetate, butyl methoxyacetate, methyl ethoxyacetate, ethyl ethoxyacetate and the like)), alkyl 3-oxypropionate ((for example: methyl 3-oxypropionate, ethyl 3-oxypropionate and the like (for example, methyl 3-methoxypropionate, ethyl 3-methoxypropionate, methyl 3-ethoxypropionate, ethyl 3-ethoxypropionate and the like)), alkyl 2-oxypropionate ((for example: methyl 2-oxypropionate, ethyl 2-oxypropionate, propyl 2-oxypropionate and the like (for example, methyl 2-methoxypropionate, ethyl 2-methoxypropionate, propyl 2-methoxypropionate, methyl 2-ethoxypropionate, ethyl 2-ethoxypropionate)), methyl 2-oxy-2-methylpropionate and ethyl 2-oxy-2-methylpropionate (for example, methyl 2-methoxy-2-methylpropionate and ethyl 2-ethoxy-2-methylpropionate and the like), methyl pyruvate, ethyl pyruvate, propyl pyruvate, methyl acetoacetate, ethyl acetoacetate, methyl 2-oxobutanoate, ethyl 2-oxobutanoate and the like, and, as ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol mono-propyl ether acetate, ethyl carbitol acetate, butyl carbitol acetate, and, as ketones, for example, methyl ethyl ketone, cyclohexanone, 2-heptanone, 3-heptanone and the like, and, as aromatic hydrocarbons, for example, toluene, xylene and the like may be suitably included.

This organic solvent is preferably used as a combination of two or more from the viewpoint of improvement of a shape of coated surface. In this case, it is preferable that a mixed solution consisting of two or more types selected from methyl 3-ethoxypropionate, ethyl 3-ethoxypropionate, methyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

As the content of the organic solvent in the coloring composition, from the viewpoint of a coating property, the amount of the total solids concentration of the coloring composition to be 5 to 80 mass % is preferable, 5 to 60 mass % is more preferable, 10 to 50 mass % is particularly preferable.

The coloring composition of the present invention is preferably made to be coloring radiation-sensitive composition by giving the coloring composition a curing property for radiation by containing (C) the polymerizable compound and (D) the polymerization initiator. By making the coloring composition to be the coloring radiation-sensitive composition, the coloring composition layer may be pattern-formed by pattern irradiation of radiation such as ultraviolet rays.

Hereinafter, each composition which may be used in the coloring composition of the present invention such as (C) the polymerizable compound, (D) polymerization initiator and the like will be described, thereby, also, the coloring radiation-sensitive composition will be described.

Also, hereinafter, the coloring composition and the coloring radiation-sensitive composition is collectively termed and are termed appropriately as "coloring composition"

<(C) Polymerizable Compound>

(C) The polymerizable compound is selected from the compound having at least one, preferably two or more terminal ethylenic unsaturated bonds. Among these, the tetra-functional or higher multifunctional polymerizable compound is preferable, and penta-functional or higher is more preferable. In addition, (C) the polymerizable compound does not have a dye skeleton.

This group of compounds is widely known in the related industry sector and these may be used without particular limitation in the present invention. These may be any chemical form of, for example, a monomer, a prepolymer, that is, a dimer, a trimer, and an oligomer, or a mixture thereof and a polymer thereof and the like. The polymerizable compound in the present invention may be used either alone or as a combination of two or more.

More specifically, as examples of the monomer and the prepolymer, unsaturated carboxylic acids (for example, acrylic acid, methacrylic acid, itaconic acid, crotonic acid, isocrotonic acid, maleic acid and the like) or esters thereof, amides thereof, and polymers thereof may be included and preferably, esters of unsaturated carboxylic acids and aliphatic multivalent alcohol compounds and amides of unsaturated carboxylic acids and an aliphatic multivalent amine compounds and polymers thereof are included. Furthermore, polyaddition reaction products of unsaturated carboxylatesor amides having nucleophilic substituents such as a hydroxyl group, an amide group, a mercapto group or the like and monofunctional or multifunctional isocyanates or epoxies, or dehydration condensation reaction products with monofunctional or multifunctional carboxylic acids or the like are suitably used. In addition, polyaddition reaction products of unsaturated carboxylates or amides having electrophilic substituents such as an isocyanate group or an epoxy group or the like and monofunctional or multifunctional alcohols, amines or thiols, or substituted reaction products of unsaturated carboxylates or amides having dissociating substituents such as a halogen group or a tosyloxy group and monofunctional or multifunctional alcohols, amines or thiols are also suitably used. Moreover, as other examples, the use of a compound group substituted with a vinyl benzene derivative such as unsaturated phosphonic acid, styrene or the like, vinyl ether, allyl ether or the like instead of the unsaturated carboxylic acids is possible.

As the specific examples such as these, compounds disclosed in paragraph number 0095 to 0108 of JP2009-288705A may also be suitably used in the present invention.

Furthermore, as the polymerizable compound, a compound having at least one ethylene group capable of polyaddition and having an ethylenic unsaturated group with the boiling point of 100° C. or more under atmospheric pressure is also preferable. As the examples, monofunctional acrylate or methacrylate such as polyethylene glycol mono(meth)acrylate, polypropylene glycol mono(meth)acrylate, phenoxyethyl(meth)acrylate; multifunctional acrylate or methacrylate such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxypropyl) isocyanurate, converted (meth)acrylate after adding ethylene oxide or propylene oxide to polyfunctional alcohols such as glycerin or trimethylolethane, urethane (meth)acrylates such as those disclosed in each of JP1973-41708B (JP-S48-41708B), JP1975-6034B (JP-S50-6034B), and JP1976-37193A (JP-S51-37193A), polyester acrylates such as those disclosed in each of JP1973-64183A (JP-S48-64183A), JP1974-43191B (JP-S49-43191B), and JP1977-30490B (JP-S52-30490B), and epoxyacrylates which are products of epoxy resin and (meth)acrylate and these mixtures may be included. Multifunctional (meth)acrylate obtained from the reaction of a cyclic ether group such as glycidyl (meth)acrylate and a compound having an ethylenic unsaturated group with multifunctional carboxylic acid may also be included.

In addition, as a preferable polymerizable compound, compounds having a fluorene ring and two or more functional groups of ethylenic unsaturated group which are disclosed in specification of JP2010-160418A, JP2010-129825A, JP4364216B, and the like or cardo resin may also be used.

Also as the compound having an ethylenic unsaturated group with the boiling point of 100° C. or more under atmospheric pressure and having at least one ethylene group capable of polyaddition, compounds disclosed in paragraph numbers 0254 to 0257 of JP2008-292970A are also suitable.

In addition to the above, radical polymerizable monomers represented by following General Formulae (MO-1) to (MO-5) is also suitably used. Also, in the Formula, when T is an oxyalkylene group, the end of the carbon atom side is bonded to R.

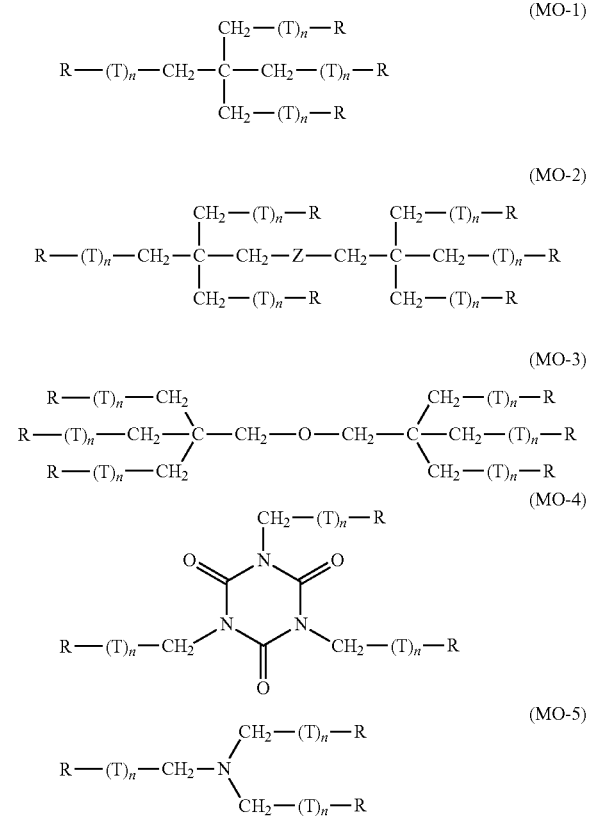

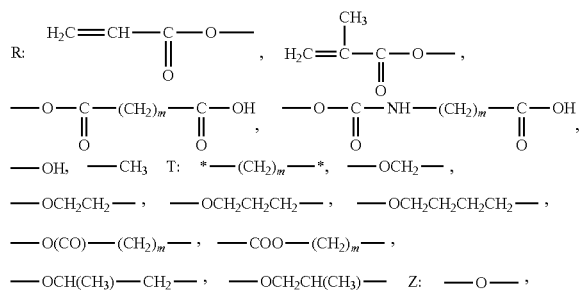

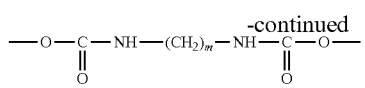

In the above General Formula, n is 0 to 14 and m is 1 to 8. R and T which are present in plural numbers within one molecule may be the same as or different from each other, respectively.

In each of the polymerizable compounds represented by following General Formulae (MO-1) to (MO-5), at least one of the Rs present in plural numbers represents a group represented by —OC(=O)CH=CH$_2$ or —OC(=O)C(CH$_3$)=CH$_2$.

As specific examples of the polymerizable compounds represented by following General Formulae (MO-1) to (MO-5), compounds disclosed in paragraph number 0248 to paragraph number 0251 of JP2007-269779A may be suitably used in the present invention.

In addition, the converted (meth)acrylate compound after adding ethylene oxide or propylene oxide to the polyfunctional alcohols disclosed as General Formulae (1) and (2) with specific examples in JP1998-62986A (JP-H10-62986A) may also be used as the polymerizable compound.

Among these, as the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd.), and a structure in which these (meth)acryloyl group is through an ethylene glycol or a propylene glycol remaining group are preferable. Oligomer types of these may be used. Hereinafter, the preferable aspects of the polymerizable compounds are shown.

The polymerization compound may have an acidic group such as a carboxyl group, a sulfonate group, or a phosphate group as a multifunctional monomer. If the ethylenic compound has an unreacted carboxyl group as in the case of the mixture as above, this may be used as it is, however, as necessary, an acidic group may be introduced by reacting a non-aromatic carboxylic anhydride with a hydroxyl group of the ethylenic compound described above. In this case, as specific examples of the non-aromatic carboxylic anhydride used, tetrahydrophthalic anhydride, alkylated tetrahydrophthalic anhydride, hexahydrophthalic anhydride, alkylated hexahydrophthalic anhydride, succinic anhydride, maleic anhydride and the like may be included.

In the present invention, the monomer having an acidic group is an ester of aliphatic polyhydroxy compound with unsaturated carboxylic acid and a multifunctional monomer made to have an acidic group by reacting an unreacted hydroxyl group of aliphatic polyhydroxy compound with an aliphatic carboxylic anhydride is preferable.

In this ester, the aliphatic polyhydroxy compound being pentaerythritol and/or dipentaerythritol is particularly preferable. As commercially available products, for example, M-510 and M-520 as polybasic modified acryl oligomers manufactured by Toagosei Co., Ltd. may be included.

As the coloring radiation-sensitive composition in the present invention, this polymerizable compound may be used alone, however, may be used as a combination of two or more if obtaining a single compound is different in preparation of the polymerizable compound.

In addition, if necessary, a multifunctional monomer which does not have an acidic group and a multifunctional monomer which has an acidic group maybe used together as the polymerizable compound.

The acid value of the multifunctional monomer which has an acidic group is preferably 0.1 to 40 mg-KOH/g and particularly preferably 5 to 30 mg-KOH/g. If the acid value of the multifunctional monomer is too low, developing dissolution characteristics becomes worse and if too high, preparation or handling becomes difficult, therefore photopolymerization performance gets becomes low and a curing property such as surface smoothness of the pixel becomes inferior. Therefore, when two or more multifunctional monomers of different acid groups are used together, or when the multifunctional monomer which does not have an acidic group is used together, it is preferable that the acid value as the total multifunctional monomer be adjusted to be within the ranges described above.

As the polymerizable compound, containing a multifunctional monomer having a caprolactone structure is also a preferable aspect.

The polymerizable compound having a caprolactone structure is not particularly limited as long as a caprolactone structure is included within the molecule, however, ε-caprolactone modified multifunctional (meth)acrylate obtained from esterification of a multivalent alcohol such as trimethylolethane, trimethylolethane, trimethylolpropane, ditrimethylolpropane, and pentaerythritol, dipentaerythritol, tripentaerythritol, glycerine, diglycerol, trimethylolmelamine or the like with (meth)acrylic acid and ε-caprolactone may be included. Among these, a multifunctional monomer having a caprolactone structure represented by following General Formula (Z-1) is preferable.

[Chem. 79]

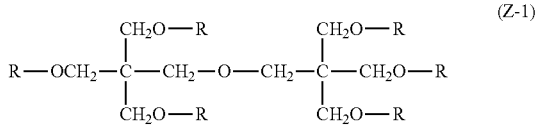

In General Formula (Z-1), all of six Rs are groups represented by following General Formula (Z-2), or 1 to 5 of six Rs are groups represented by following General Formula (Z-2) and the remainder is a group represented by following General Formula (Z-3).

[Chem. 80]

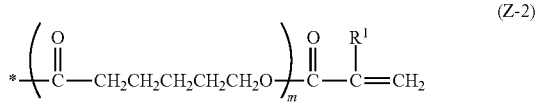

In General Formula (Z-2), $R^1$ represents a hydrogen atom or a methyl group, m represents a number of 1 or 2, and "*" represents a linking arm.

[Chem. 81]

In General Formula (Z-3), $R^1$ represents a hydrogen atom or a methyl group and "*" represents a linking arm.

As this multifunctional monomer having a caprolactone structure, for example, DPCA-20 (a compound in Formula (1) to (3) in which m=1, the number of groups represented by Formula (2)=2, and $R^1$s are all hydrogen atoms), DPCA-30 (a compound in the same Formula in which m=1, the number of groups represented by Formula (2)=3, and $R^1$s are all hydrogen atoms), DPCA-60 (a compound in the same Formula in which m=1, the number of groups represented by Formula (2)=6, and $R^1$s are all hydrogen atoms), and DPCA-120 (a compound in the same Formula in which m=2, the number of groups represented by Formula (2)=6, and $R^1$s are all hydrogen atoms), all of which are commercially available products as KAYARAD DPCA series from Nippon Kayaku Co., Ltd. and the like may be included.

In the present invention, the multifunctional monomer having a caprolactone structure may be used either alone or as a combination or two or more.

As the polymerizable compound in the present invention, a polymerizable compound which contains an alkylene oxy group with 2 carbon atoms or more (an ethylene oxy group, a propylene oxy group, a butylene oxy group and the like) is preferable.

Among the polymerizable compound which contains an alkylene oxy group with 2 carbon atoms or more, at least one type selected from the group of compounds represented by following General Formula (i) or (ii) is particularly preferable.

[Chem. 82]

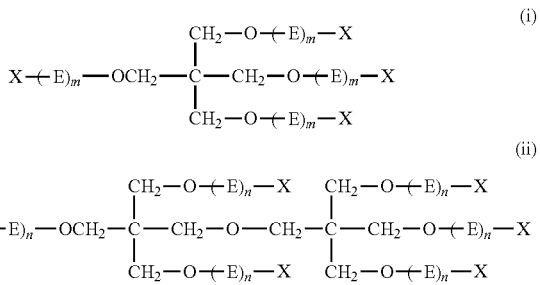

In General Formula (i) or (ii), Es, each independently, represent $-((CH_2)_yCH_2O)-$ or $-((CH_2)_yCH(CH_3)O)-$, ys, each independently, represent an integer of 0 to 10, Xs, each independently, represent an acryloyl group, a methacryloyl group, a hydrogen atom or a carboxyl group.

In General Formula (i), the sum of the acryloyl group and the methacryloyl group represented by X is 3 or 4, ms, each independently, represent an integer of 0 to 10, and the sum or each m is an integer of 0 to 40. However, if the sum of each m is 0, any one of X is a carboxyl group.

In General Formula (ii), the sum of the acryloyl group and the methacryloyl group represented by X is 5 or 6, ns, each independently, represent an integer of 0 to 10, and the sum or each n is an integer of 0 to 60. However, if the sum of each m is 0, any one of X is a carboxyl group.

In General Formula (i), m is preferably an integer of 0 to 6 and more preferably an integer of 0 to 4. Also, the sum of each m is preferably an integer of 2 to 40, more preferably an integer of 2 to 16, and particularly preferably an integer of 4 to 8.

In General Formula (ii), n is preferably an integer of 0 to 6 and more preferably an integer of 0 to 4. Also, the sum of each n is preferably an integer of 3 to 60, more preferably an integer of 3 to 24, and particularly preferably an integer of 6 to 12.

Furthermore, in —(($CH_2$)$_y$$CH_2$O)— or —(($CH_2$)$_y$CH($CH_3$)O)— in General Formula (i) or (ii), a form in which the end of the oxygen atom side is bonded to X is preferable.

The compounds represented by General Formula (i) or (ii) may be used either alone or as a combination of two or more. Particularly, in General Formula (ii), it is preferable that all of 6 Xs are acryloyl group.

The compounds represented by General Formula (i) or (ii) may be synthesized from a step in which a ring-opening skeleton is bonded by a ring-opening addition of ethylene oxide or propylene oxide to pentaerythritol or dipentaerythritol and a step in which a (meth)acryloyl group is introduced at the hydroxyl group which is the end of the ring-opening skeleton by, for example, reacting with (meth) acryloyl chloride, all of which are conventionally well-known steps. Each step is a well-known step and those skilled in the related art may easily synthesize the compounds represented by General Formula (i) or (ii).

Among the compounds represented by General Formula (i) or (ii), a pentaerythritol derivative and/or a dipentaerythritol derivative is more preferable.

Specifically, the compounds represented by following Formulae (a) to (f) (hereinafter, also referred to as "Example Compounds (a) to (f)") may be included, and among these, Example Compounds (a), (b), (e), and (f) are preferable.

Particularly, as the polymerizable compounds, Example Compound (b) is effective and may significantly improve the effects of the present invention.

[Chem. 83]

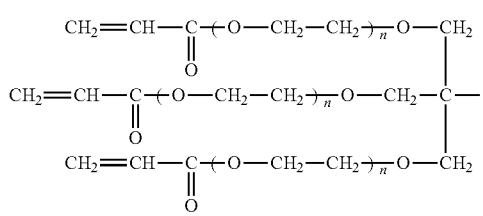 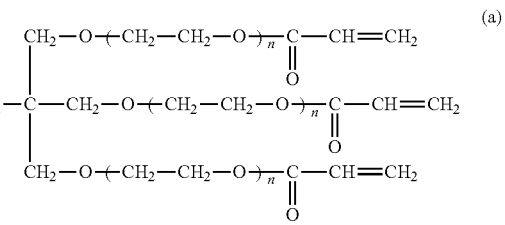

(a)

(Total sum of each n is 6)

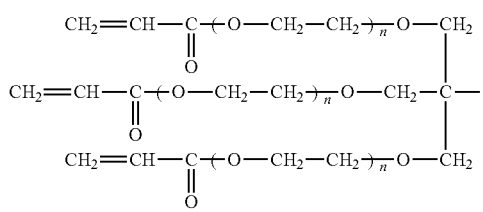 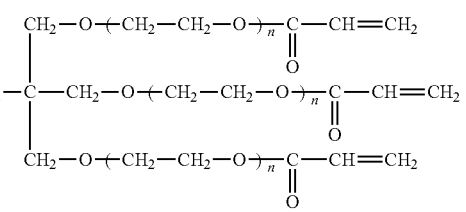

(b)

(Total sum of each n is 12)

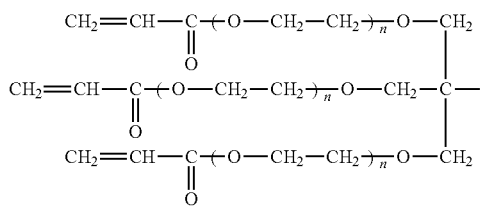 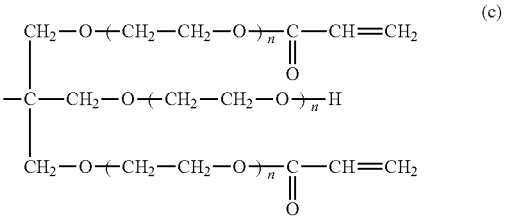

(c)

(Total sum of each n is 12)

[Chem. 84]

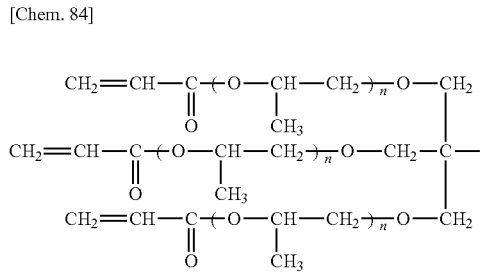 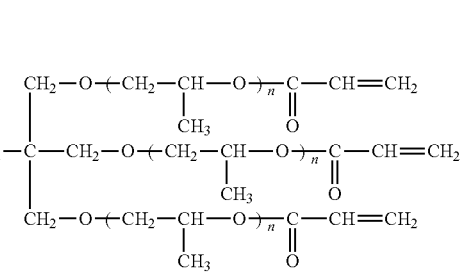

(d)

(Total sum of each n is 6)

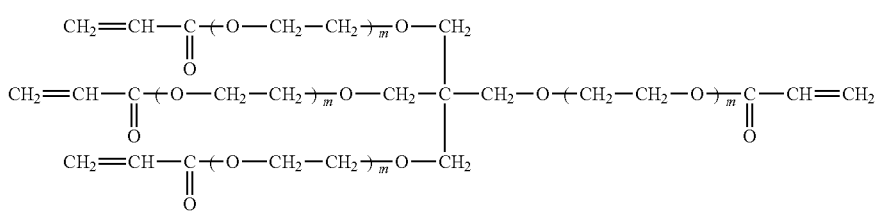

(Total sum of each m is 4)

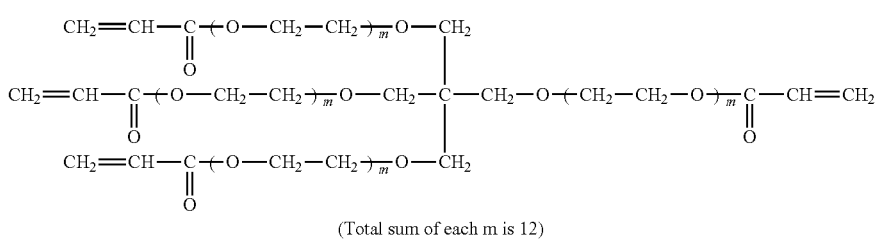

(Total sum of each m is 12)

As commercially available products of the polymerizable compounds represented by General Formula (i) or (ii), SR-494 which is a tetra-functional acrylate having four ethylene oxy chains manufactured by Sartomer Company, Inc., DPCA-60 which is a hexa-functional acrylate having six pentylene oxy chains manufactured by Nippon Kayaku Co., Ltd., and TPA-330 which is a tri-functional acrylate having three isobutylene oxy chains and the like may be included.

As the polymerizable compound, those introduced as light curable monomers and oligomers in Journal of the Adhesion Society of Japan, Vol. 20, No. 7 (Pages 300 to 308) may also be used.

As the content of the polymerizable compound in the coloring composition, 2 to 50 mass % with regard to the total solids of the composition is preferable, 2 to 30 mass % is more preferable, and 2 to 25 mass % is even more preferable.

<(D) Polymerization Initiator>

The coloring composition of the present invention is preferably made to be coloring radiation-sensitive composition by giving the coloring composition a curing property for radiation by containing (C) the polymerizable compound and (D) the polymerization initiator.

As the polymerization initiator, those known as photopolymerization initiators described below may be used.

The polymerization initiator is not particularly limited as long as it has ability to initiate the polymerization of the polymerizable compound and may be appropriately selected among well-known photopolymerization initiators. For example, having a radiation-sensitivity for visible light from the ultraviolet region is preferable. In addition, an activating agent which generates active radicals from a certain action with a photoexcited sensitizer may be used or an initiator such as that which initiates a cation polymerization depending on the type of monomer may be used.

It is also preferable that the photopolymerization initiator contain at least one type of compound which has a molecular extinction coefficient of at least approximately 50 within the range of approximately 300 nm to 800 nm (330 nm to 500 nm is more preferable).

As the polymerization initiator, for example, a halogenated hydrocarbon derivative (for example, those having a triazine skeleton, those having an oxadiazole skeleton, or the like), an acylphosphine compound such as acylphosphine oxide, hexaarylbiimidazole, an oxime compound such as an oxime derivative, organic peroxide, a thio compound, a ketone compound, an aromatic onium salt, keto oxime ether, an aminoacetophenone compound, hydroxyacetophenone or the like may be included. Among these, an oxime compound is preferable.

As the halogenated hydrocarbon derivative having the triazine skeleton, for example, compounds disclosed in Wakabayashi et al., Bull. Chem. Soc. Japan, 42, 2924 (1969), compounds disclosed in GB1388492B, compounds disclosed in JP1978-133428A (JP-S53-133428A), compounds disclosed in DE3337024B, compounds disclosed in F. C Schaefer et al., J. Org. Chem.; 29, 1527 (1964), compounds disclosed in JP1987-58241A (JP-S62-58241A), compounds disclosed in JP1993-281728A (JP-H05-281728A), compounds disclosed in JP1993-34920A (JP-H05-34920A), compounds disclosed in U.S. Pat. No. 4,212,976A or the like may be included.

As the compounds disclosed in U.S. Pat. No. 4,212,976A, for example, a compound having an oxadiazole skeleton (for example, 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole; 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloro-methyl-5-(1-naphthyl)-1,3,4-oxadiazole, 2-trichloromethyl-5-(4-n-butoxystyryl)-1,3,4-oxadiazole, 2-tribromomethyl-5-styryl-1,3,4-oxadiazole and the like) or the like may be included.

Also, as the polymerization initiator in addition to the above, an acridine derivative (for example, 9-phenylacridine, 1,7-bis(9,9'-acridinyl)heptane and the like), N-phenylglycine and the like, a polyhalogen compound (for example, carbon tetrabromide, phenyl tribromomethylsulfone, phenyl trichloromethylketone and the like), coumarins (for example, 3-(2-benzofuranoyl)-7-diethylamino coumarin, 3-(2-benzofuranoyl)-7-(1-pyrrolidinyl) coumarin, 3-benzoyl-7-diethylamino coumarin, 3-(2-methoxybenzoyl)-7-diethylamino coumarin, 3-(4-dimethylaminobenzoyl)-7-diethylamino coumarin, 3,3'-carbonylbis(5,7-di-n-propoxy coumarin), 3,3'-carbonylbis (7-diethylamino coumarin), 3-benzoyl-7-methoxy coumarin, 3-(2-furoyl)-7-diethylamino coumarin, 3-(4-diethylaminocinnamoyl)-7-diethylamino coumarin, 7-methoxy-3-(3-pyridylcarbonyl) coumarin, 3-benzoyl-5,7-dipropoxy coumarin, 7-benzotriazol-2-yl coumarin, also, coumarin compounds disclosed in JP1993-19475A (JP-H05-19475A), JP1995-271028A (JP-H07-271028A), JP2002-363206A, JP2002-363207A, JP2002-363208A, JP2002-363209A, or the like, and the like), acyl phosphine oxides (for example, bis (2,4,6-trimethylbenzoyl)-phenylphosphine oxide, bis(2,6-dimethoxybenzoyl)-2,4,4-trimethylpentylphenylphosphine oxide, Lucirin TPO and the like), metallocenes (for example, bis(η5-2,4-cyclopentadien-1-yl)-bis(2,6-difluoro-3-(1H-pyrrol-1-yl)-phenyl) titanium, η5-cyclopentadienyl-η6-cumenyl-iron(+)-hexafluoro phosphate(1−) and the like), or compounds disclosed in JP1978-133428A (JP-S53-133428A), JP1982-1819A (JP-S57-1819A), JP1982-6096A (JP-S57-6096A), or U.S. Pat. No. 3,615,455A may be included.

As the ketone compounds, for example, benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acid or tetramethyl ester thereof, or 4,4'-bis(dialkylamino)benzophenones (for example, 4,4'-bis(dimethylamino)benzophenone, 4,4'-bisdicyclohexylamino)benzophenone, 4,4'-bis(diethylamino) benzophenone, 4,4'-bis(dihydroxyethylamino)benzophenone, 4-methoxy-4'-dimethylamino benzophenone, 4,4'-dimethoxybenzophenone, 4-dimethylaminobenzophenone, 4-dimethylaminoacetophenone, benzyl anthraquinone, 2-t-butyl anthraquinone, 2-methyl anthraquinone, phenanthraquinone, xanthone, thioxanthone, 2-chlorothioxanthone, 2,4-diethylthioxanthone, fluorenone, 2-benzyl-dimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomer, benzoin, benzoin ethers (for example, benzoin methyl ether, benzoin ethyl ether, benzoin propyl ether, benzoin isopropyl ether, benzoin phenyl ether, benzyl dimethyl ketal), acridone, chloroacridone, N-methylacridone, N-butylacridone, N-butylchloroacridone or the like may be included.

As the polymerization initiator, a hydroxyacetophenone compound, an aminoacetophenone compound and an acyl phosphine compound may also be suitably used. More specifically, aminoacetophenone-based initiators disclosed in JP1998-291969 (JP-H10-291969) and acyl phosphine oxide based initiators disclosed in JP4225898B may be used.

As the hydroxyacetophenone-based initiator, IRGACURE-184, DAROCUR-1173, IRGACURE-500, IRGACURE-2959, and IRGACURE-127 (trade names: all manufactured by BASF Group) may be used. As the aminoacetophenone-based initiator, IRGACURE-907, IRGACURE-369, and IRGACURE-379 (trade names: all manufactured by BASF Group), all of which are commercially available products, may be used. Compounds disclosed in JP2009-191179A of which absorption wavelength is matched to a long wave light source such as 405 nm or 365 nm may also be used. Also, as the acyl phosphine-based initiator, IRGACURE-819 or DAROCUR-TPO (trade names: all manufactured by BASF Group), all of which are commercially available products, may be used.

As the polymerization initiator, the oxime compound may more preferably be included. As specific examples of the oxime compound, compounds disclosed in JP2001-233842A, compounds disclosed in JP2000-80068A, or compounds disclosed in JP2006-342166A may be used.

As the oxime compound such as an oxime derivative suitably used as the polymerization initiator in the present invention, for example, 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenensulfonyloxy)iminobutan-2-one, 2-ethoxycarbonyloxyimino-1-phenylpropan-1-one and the like may be included.

As the oxime compound, compounds disclosed in J. C. S. Perkin II (1979) pp 1653 to 1660, J. C. S. Perkin II (1979) pp. 156 to 162, Journal of Photopolymer Science and Technology (1995) pp 202 to 232, or JP2000-66385A, compounds disclosed in each of JP2000-80068A, JP2004-534797A and JP2006-342166A, or the like may be included.

Among the commercially available products, IRGACURE OXE-01 (manufactured by BASF Group) or IRGACURE OXE-02 (manufactured by BASF Group) is also suitably used.

Furthermore, as the oxime compound in addition to the above, compounds disclosed in JP2009-519904A in which the oxime is bonded to N position of the carbozole, compounds disclosed in U.S. Pat. No. 7,626,957B in which a heterosubstituent is introduced to the benzophenone portion, the compound disclosed in JP2010-15025A and US2009/292039A in which a nitro group is introduced to the dye portion, a ketooxime-based compound disclosed in WO2009/131189A, compounds disclosed in U.S. Pat. No. 7,556,910B in which a triazine skeleton and an oxime skeleton are included within the same molecule, the compound disclosed in JP2009-221114A having a maximum absorption at 405 nm and a satisfactory sensitivity for g-ray light source or the like may be included.

Preferably, also, a cyclic oxime compound disclosed in JP2007-231000A and JP2007-322744A may be suitably used. Among the cyclic oxime compounds, particularly, cyclic oxime compounds condensed to carbazole dyes disclosed in JP2010-32985A and JP2010-185072A are preferable from the viewpoint of high sensitivity due to high light-absorbance.

Furthermore, compounds disclosed in JP2009-242469A having unsaturated bonds at specific sites of the oxime compound may achieve high sensitivity by generating active radicals from polymerization inert radicals and may also be suitably used.

The most preferably, oxime compounds having specific substituents disclosed in JP2007-269779A or oxime compounds having thioaryl groups disclosed in JP2009-191061A may be included.

Specifically, as the oxime compounds, compounds represented by following General Formula (OX-1) are preferable. Furthermore, an N—O bond of the oxime compound may be an (E) isomer of the oxime compound, (Z) isomer of the oxime compound, or a mixture of (E) isomer and (Z) isomer.

[Chem. 85]

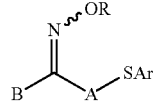

(OX-1)

In General Formula (OX-1), R and B, each independently, represent a monovalent substituent, A represents a divalent organic group and Ar represents an aryl group.

In General Formula (OX-1), as the monovalent substituent represented by R, a monovalent non-metallic atomic group is preferable.

As the monovalent non-metallic atomic group, an alkyl group, an aryl group, an acyl group, an alkoxycarbonyl group, an aryloxycarbonyl group, a heterocyclic group, an alkyl thiocarbonyl group, an aryl thiocarbonyl group or the like may be included. These groups may also have one or more substituents. The substituents described above may also be substituted with other substituents.

As the substituent, a halogen atom, an aryloxy group, an alkoxycarbonyl group or an aryloxycarbonyl group, an acyloxy group, an acyl group, an alkyl group, aryl group, or the like may be included.

As the alkyl group which may have substituents, an alkyl group with 1 to 30 carbon atoms is preferable and specifically, a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, 2-naphthoylmethyl group, a 4-methylsulfanylphenacyl group, a 4-phenylsulfanylphenacyl group, the 4-dimethylaminophenacyl group, 4-cyanophenacyl group, 4-methylphenacyl group, 2-methylphenacyl group, 3-fluorophenacyl group, 3-trifluoromethylphenacyl group, and 3-nitrophenacyl group may be exemplified.

As the aryl group which may have substituents, an aryl group with 6 to 30 carbon atoms is preferable and specifically, a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, a m-tolyl group, a p-tolyl group, a xylyl group, o-cumenyl group, a m-cumenyl group and a p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraperylenyl group, a hexaphenyl group, a hexacenyl group, a rubycenyl group, a coronenyl group, a trinaphthalenyl group, a heptaphenyl group, a heptacenyl group, a pyranthrenyl group, an ovalenyl group may be exemplified.

As the acyl group which may have substituents, an acyl group with 2 to 20 carbon atoms is preferable and specifically, an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group may be exemplified.

As the alkoxycarbonyl group which may have substituents, an alkoxycarbonyl group with 2 to 20 carbon atoms is preferable and specifically, a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group may be exemplified.

As the aryloxycarbonyl group which may have substituents, specifically, a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, 4-fluorophenyloxycarbonyl group, a 4-cyanophenyloxycarbonyl group, and 4-methoxyphenyloxycarbonyl group may be exemplified.

As the heterocyclic group which may have substituents, an aromatic or aliphatic heterocyclic ring including a nitrogen atom, an oxygen atom, a sulfur atom, or a phosphorous atom is preferable.

Specifically, a thienyl group, a benzo[b]thienyl group, a naphtho[2,3-b]thienyl group, a thianthrenyl group, a furyl group, a pyranyl group, an isobenzofuranyl group, a chromanyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, an 3H-indolyl group, an indolyl group, an 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4H-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthyl group may be exemplified.

As the alkylthiocarbonyl group which may have substituents, specifically, a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group may be exemplified.

As the arylthiocarbonyl group which may have substituents, specifically, a 1-naphthylthiocarbonyl group, a 2-naphthylthiocarbonyl group, a 4-methylsulfanylphenylthiocarbonyl group, a 4-phenylsulfanyl phenylthiocarbonyl group, 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and 4-methoxyphenylthiocarbonyl group may be included.

In General Formula (OX-1), as the monovalent group represented by B, an aryl group, a heterocyclic group, an arylcarbonyl group, or a heterocyclic carbonyl group may be represented. These monovalents may also have one or more substituents. As the substituents, substituents described above may be exemplified. The substituents described above may also be substituted with other substituents.

Among these, the structure shown below is particularly preferable.

In the structure below, Y, X and n are the same as Y, X, and n in General Formula (OX-2) described later, respectively, and so are the preferable examples.

[Chem. 86]

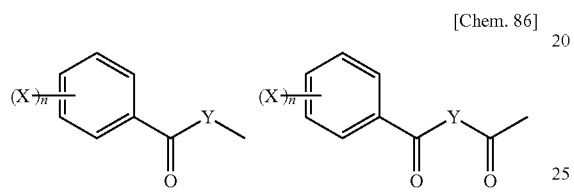

In General Formula (OX-1), as the divalent organic group represented by A, an alkylene group with 1 to 12 carbon atoms, a cycloalkylene group, or an alkynylene group may be included. These groups may also have one or more substituents. As the substituents, substituents described above may be exemplified. The substituents described above may also be substituted with other substituents.

Among these, as A in Formula (OX-1), an unsubstituted alkylene group, an alkylene group substituted with an alkyl group (for example, a methyl group, an ethyl group, a tert-butyl group, or a dodecyl group), an alkylene group substituted with an alkenyl group (for example, a vinyl group or an allyl group), and an alkylene group substituted with an aryl group (for example, a phenyl group, a p-tolyl group, a xylyl group a cumenyl group, a naphthyl group, an anthryl group, a phenanthryl group, or a styryl group) are preferable from the viewpoint of suppressing coloring due to an overtime heating by increasing sensitivity.

In General Formula (OX-1), as the aryl group represented by Ar, an aryl group with 6 to 30 carbon atoms is preferable, and also, the aryl group may have substituents. As the substituents, the same substituents introduced to the substituted aryl group described above in specific examples of the aryl groups which may have substituents may be exemplified.

Among these, a substituted or unsubstituted phenyl group is preferable from the viewpoint of suppressing coloring due to an overtime heating by increasing sensitivity.

In General Formula (OX-1), the "SAr" structure, formed by Ar in General Formula (OX-1) with S which is adjacent thereto, is preferably a structure shown below from the viewpoint of sensitivity. Also, Me represents a methyl group and Et represents an ethyl group.

[Chem. 87]

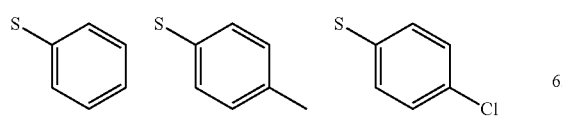

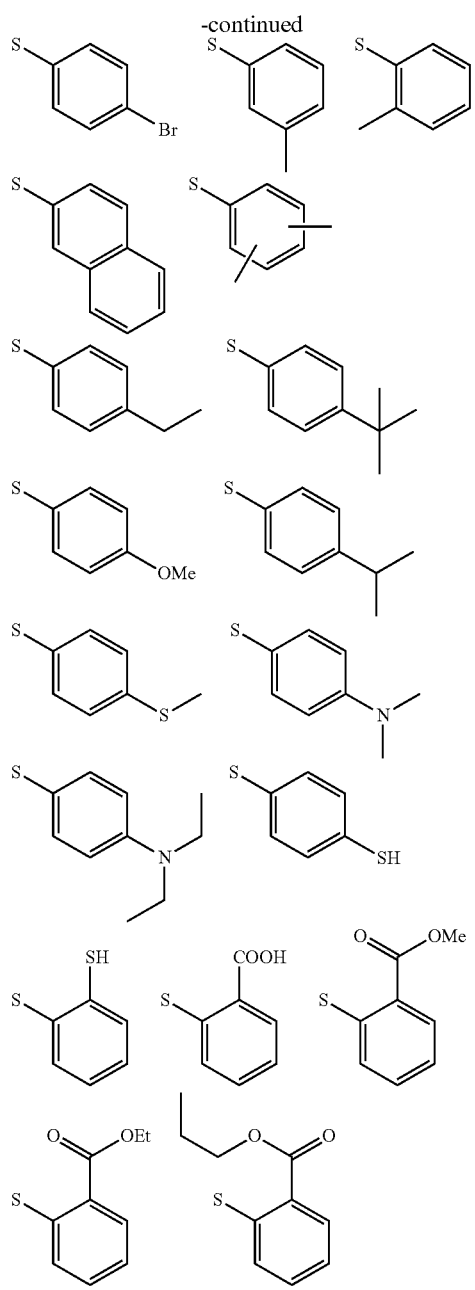

The oxime compound is preferably a compound represented by following General Formula (OX-2).

[Chem. 88]

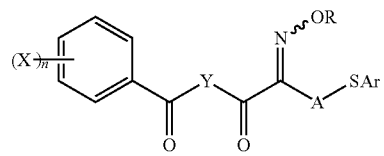

(In General Formula (OX-2), R and X, each independently, represent a monovalent substituent, A and Y, each independently, represent a divalent organic group, Ar represents an aryl group, and n is an integer of 0 to 5.)

R, A and Ar in General Formula (OX-2) are the same as R, A and Ar in General Formula (OX-1), respectively, and so are the preferable examples.

In General Formula (OX-2), as the monovalent group represented by X, an alkyl group, an aryl group, an alkoxy group, an aryloxy group, an acyloxy group, an acyl group, an alkoxycarbonyl group, an amino group, a heterocyclic group, or a halogen atom may be included. Furthermore, these monovalents may have one or more substituents. As the substituents, substituents described above may be exemplified. The substituents described above may also be substituted with other substituents.

Among these, as X in General Formula (OX-2), an alkyl group is preferable from the viewpoint of solvent solubility and absorption efficiency improvement in a long wavelength region.

Furthermore, n in General Formula (OX-2) represents an integer of 0 to 5, and an integer of 0 to 2 is preferable.

In General Formula (OX-2), as the divalent organic group represented by Y, a structure shown below may be included. Also, in the group shown below, "*" represents, in General Formula (OX-2), a bonding site with the carbon atom which is adjacent to Y.

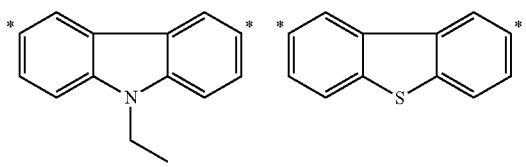

Also, the oxime compound is preferably a compound represented by following General Formula (OX-3).

[Chem. 91]

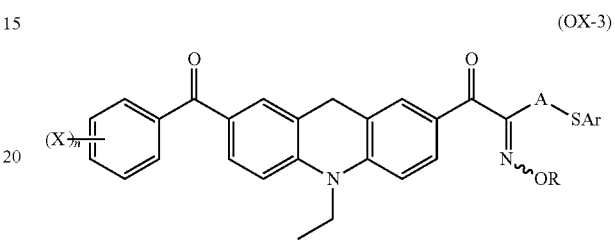

(OX-3)

(In General Formula (OX-3), R and X, each independently, represent a monovalent substituent, A represents a divalent organic group, Ar represents an aryl group, and n is an integer of 0 to 5.)

R, X, A, Ar and n in General Formula (OX-3) are the same as R, X, A, Ar and n in General Formula (OX-2), respectively, and so are the preferable examples.

Specific examples of the oxime compounds suitably used are shown below, however, the present invention is not limited to these.

[Chem. 92]

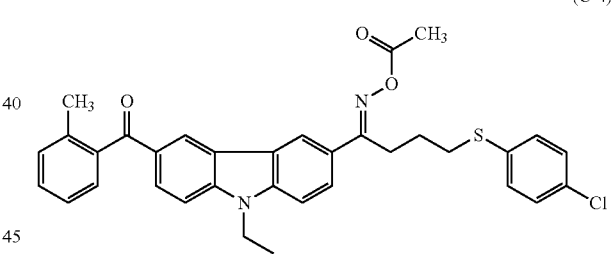

(C-4)

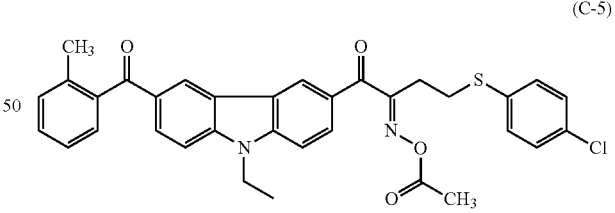

(C-5)

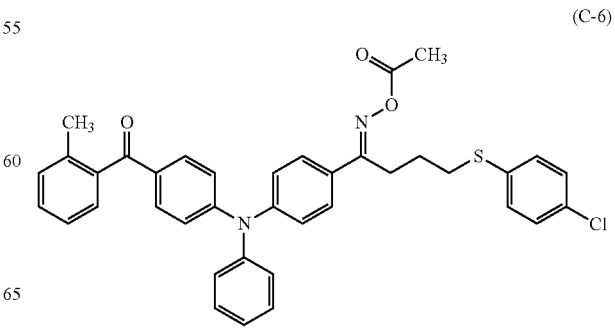

(C-6)

[Chem. 89]

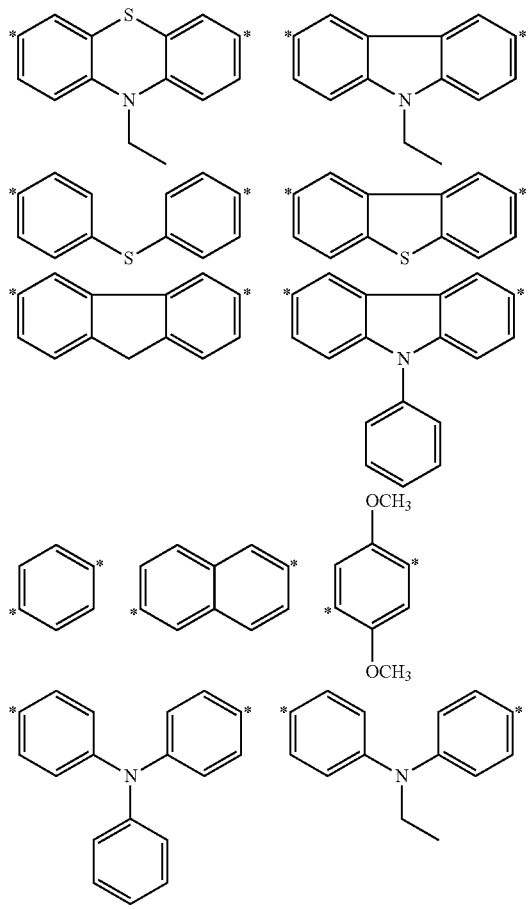

Among these, the polymerization initiator preferably has a structure shown below from the viewpoint of high sensitivity.

(C-7)

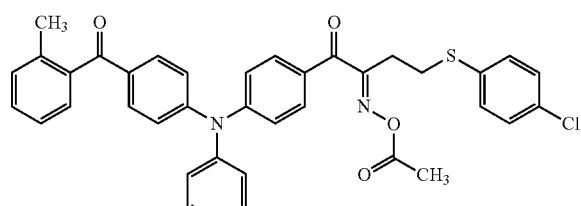

(C-8)

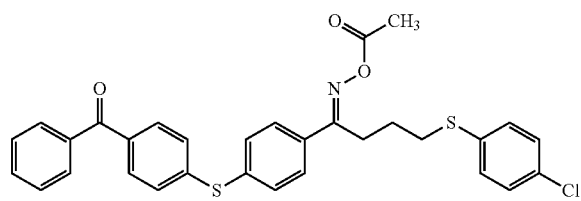

(C-9)

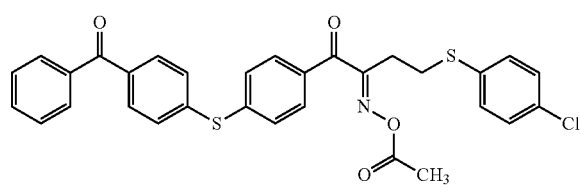

[Chem. 93]

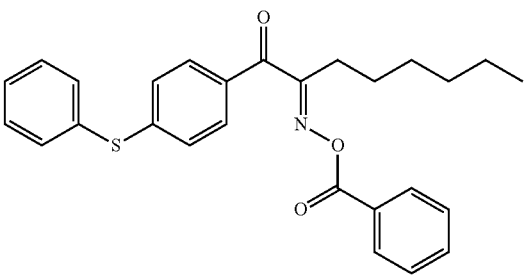

(C-10)

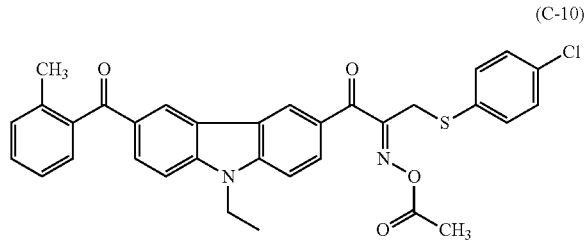

(C-11)

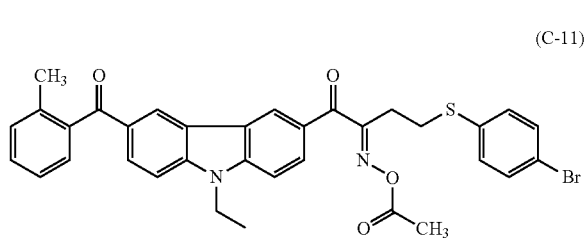

(C-12)

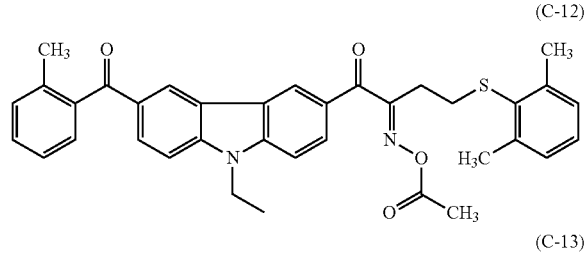

(C-13)

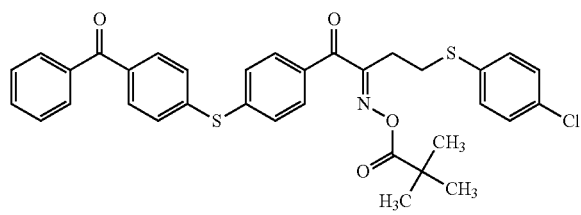

The oxime compound has a maximum absorption wavelength in the wavelength range of 350 nm to 500 nm, the compound having the maximum absorption wavelength in the wavelength range of 360 nm to 480 nm is preferable, and the compound having high absorbance at 365 nm and 455 nm is particularly preferable.

The molar extinction coefficient of the oxime compound at 365 nm and 405 nm is preferably 1,000 to 300,000, more preferably 2,000 to 300,000, and particularly preferably 5,000 to 200,000 from the viewpoint of sensitivity.

The molar extinction coefficient of the compound may be measured by well-known methods, however, specifically, measuring with, for example, an ultraviolet-visible spectrophotometer (Cary-5 spectrophotometer manufactured by Varian Medical Systems, Inc.) using ethyl acetate solvent at a concentration of 0.01 g/L is preferable.

The polymerization initiator in the present invention may be used as a combination of two or more as necessary.

As the polymerization initiator, a compound selected from the group consisting of a trihalomethyltriazine compound, a benzyldimethylketal compound, an α-hydroxyketone compound, an α-aminoketone compound, an acyl phosphine compound, a phosphine oxide compound, a metallocene compound, an oxime compound, a triallylimidazole dimer, an onium compound, a benzothiazole compound, a benzophenone compound, an acetophenone compound and a derivative thereof, a cyclopentadiene-benzene-iron complex and a salt thereof, a halomethyloxadiazole compound, a 3-aryl substituted coumarin compound is preferable from the viewpoint of exposure sensitivity.

A trihalomethyltriazine compound, an α-aminoketone compound, an acyl phosphine compound, a phosphine oxide compound, an oxime compound, a triallylimidazole dimer, an onium compound, a benzophenone compound, an acetophenone compound is more preferable and at least one type of compound selected from the group consisting of a trihalomethyltriazine compound, an α-aminoketone compound, an oxime compound, a triallylimidazole dimer, a benzophenone compound is the most preferable.

In particular, in the production of the color filter of the present invention, being developed without residues in the unexposed area as well as a curing property is important since a fine pattern needs to be formed in a sharp shape. From this point of view, using an oxime compound as the polymerization initiator is particularly preferable. Particularly, when a fine pattern is formed in a solid-state imaging device, exposure by a stepper exposure device is used for curing exposure, however, this exposure device is sometimes damaged by halogen, and addition amount of the polymerization initiator needs to be suppressed to be low, therefore, considering this, when a fine pattern is formed such as a solid-state imaging device, using an oxime compound is the most preferable.

The content of (D) the polymerization initiator contained in the coloring composition is preferably greater than or equal to 0.1 mass % and less than or equal to 50 mass % with regard to the total solids of the coloring composition, more preferably greater than or equal to 0.5 mass % and less than or equal to 20 mass %, and even more preferably greater than or equal to 1 mass % and less than or equal to 15 mass %. In this range, satisfactory sensitivity and pattern forming property may be obtained.

Furthermore, in the coloring composition of the present invention, other components such as a sensitizing agent, a chain transfer agent, an alkali-soluble resin, a polymerization inhibitor, an adhesive agent for substrate, a surfactant or the like may be used as necessary.

<Sensitizing Agent>

The coloring composition of the present invention may have a sensitizing agent for the purpose of occurrence efficiency improvement of the initiating species of the polymerization initiator or making a photosensitive wavelength longer. As the sensitizing agent, a sensitizing agent having an absorption wavelength in the wavelength region of 300 to 450 nm may be included.

As the sensitizing agent, polynuclear aromatics such as phenanthrene, anthracene, pyrene, perylene, triphenylene or 9,10-dialkoxy anthracene, xanthenes such as fluorescein, eosin, erythrosine, rhodamine B or rose bengal, thioxanthones, cyanines, merocyanines, phthalocyanines, thiazines such as thionine, methylene blue or toluidine blue, acridines, anthraquinones, squariums, coumarins, phenothiazines, phenazines, styrylbenzenes, azo compounds, diphenylmethane, triphenylmethane, distyrylbenzenes, carbazoles, porphyrin, spiro compounds, quinacridone, indigo, styryl, pyrylium compounds, pyrromethene compounds, pyrazolotriazole compound, benzothiazole compound, barbituric acid derivatives, thiobarbituric acid derivatives, aromatic ketone compounds such as acetophenone, benzophenone or Michler's ketone, heterocyclic compounds such as N-aryloxazolidinone, or the like may be included.

<Chain Transfer Agent>

In the coloring composition of the present invention, it is preferable that a chain transfer agent be added depending on the photopolymerization initiator used. As the chain transfer agent, alkyl N,N-dialkylaminobenzoateor a thiol-based compound may be included and as the thiol-based compound, 2-mercaptobenzothiazole, 2-mercapto-1-phenyl benzimidazole, 3-mercaptopropionic acid may be used either alone or as a combination of two or more.

<Alkali-Soluble Resin>

The coloring composition of the present invention preferably further contains an alkali-soluble resin. A developability•pattern forming property is improved by containing the alkali-soluble resin.

The alkali-soluble resin may be a linear organic high molecular weight polymer or may be appropriately selected from alkali-soluble resins having at least one group facilitating an alkali-soluble property in the molecule (preferably, a molecule having an acrylic-based copolymer or a styrene-based copolymer as the main chain).

The alkali-soluble resin is described.

As the alkali-soluble resin, a polyhydroxystyrene-based resin, a polysiloxane-based resin, an acrylic-based resin, an acrylamide-based resin, or an acrylic/acrylamide copolymer resin is preferable from the viewpoint of heat resistance, and an acrylic-based resin, an acrylamide-based resin, or an acrylic/acrylamide copolymer resin is preferable from the viewpoint of a developability control.

As the group facilitating an alkali-soluble property (hereinafter, also referred to as an acid group), for example, a carboxyl group, a phosphate group, a sulfonate group, a phenolic hydroxyl group may be included, those which can be developed by a weak alkali aqueous solution soluble in organic solvent are preferable, and (meth)acrylic acid may be included as a particularly preferable group. These acid groups may be just one type, or two or more types.

As the monomer capable of imparting the acid group after the polymerization, for example, a monomer having a hydroxyl group such as 2-hydroxyethyl(meth)acrylate, a monomer having an epoxy group such as glycidyl(meth)acrylate, a monomer having an isocyanate group such as 2-isocyanatoethyl(meth)acrylate or the like may be included. The monomer to introduce these acid groups may be just one type, or two or more types. In order to introduce an acid group to an alkali-soluble binder, for example, a monomer having an acid group and/or a monomer capable of imparting an acid group after the polymerization (hereinafter, sometimes referred to as a monomer to introduce an acid group) may be polymerized as a monomer component. Furthermore, when the monomer capable of imparting an acid group after the polymerization is used as a monomer component and the acid group is introduced, a process to impart the acid group after the polymerization as described later is necessary.

For the preparation of the alkali-soluble resin, methods by, for example, well-known radical polymerization methods may be applied. Polymerization conditions such as temperature, pressure, types of radical initiator and the amount thereof, or types of solvent when the alkali-soluble resin is prepared by the radical polymerization method may be set easily by those skilled in the related art and the conditions may be set experimentally.

As the alkali-soluble resin, a polymer having carboxylic acid in a side chain is preferable, and those in which an acidic anhydride is added to a methacrylic acid copolymer, an acrylic acid copolymer, an itaconic acid copolymer, a crotonic acid copolymer, a maleic acid copolymer, a partially esterified maleic acid copolymer, an alkali-soluble phenol resin such as a novolac type resin or the like, and an acidic cellulose derivative having carboxylic acid in a side chain, a polymer having a hydroxyl group may be included. Particularly, a copolymer of (meth)acrylic acid and other monomer copolymerizable with (meth)acrylic acid is suitable as the alkali-soluble resin. As the other monomer copolymerizable with (meth)acrylic acid, an alkyl (meth)acrylate, an aryl (meth)acrylate, a vinyl compound and the like may be included. As the alkyl (meth)acrylate and the aryl (meth)acrylate, methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate or the like, as the vinyl compound, styrene, α-methyl styrene, vinyl toluene, glycidyl methacrylate, acrylonitrile, vinyl acetate, N-vinyl pyrrolidone, tetrahydrofurfuryl methacrylate, polystyrene macromonomer, poly methyl methacrylate macromonomer or the like, and as the N-substituted maleimide monomer disclosed in JP1998-300922A (JP-H10-300922A), N-phenyl maleimide, N-cyclohexylmaleimide or the like may be included. Also, this other monomer copolymerizable with (meth)acrylic acid may be just one type, or two or more types.

The alkali-soluble phenol resin may be suitably used when the coloring radiation-sensitive composition is a positive-type composition. As the alkali-soluble phenol resin, for example, a novolak resin, a vinyl polymer or the like may be used.

As the novolak resin, for example, those obtained from condensation of phenols with aldehydes in the presence of an acid catalyst may be included. As the phenols, for example, phenol, cresol, ethylphenol, butylphenol, xylenol, phenylphenol, catechol, resorcinol, pyrogallol, naphthol, bisphenol A or the like may be included.

As the aldehydes, for example, formaldehyde, paraformaldehyde, acetaldehyde, or propionaldehyde, benzaldehyde or the like may be included.

The phenols and aldehydes may be used either alone or as a combination of two or more.

As specific examples of the novolak resin, for example, metacresol, paracresol or a condensation product of this mixture and formalin may be included.

The molecular weight distribution of the novolak resin may be adjusted using means such as fractionation. Furthermore, a low molecular weight component having a phenol-based hydroxyl group such as bisphenol C, bisphenol A or the like may be mixed with the novolak resin.

In order to improve the cross-linking efficiency of the coloring composition of the present invention, an alkali-soluble resin having the polymerizable group may also be used. As the alkali-soluble resin having the polymerizable group, an alkali-soluble resin including an allyl group, a (meth)acrylic group, an allyloxy alkyl group or the like in a side chain and the like is useful. As examples of the polymer including the polymerizable group described above, Dianal NR series (manufactured by Mitsubishi Rayon Co., Ltd.), Photomer 6173 (COOH contained polyurethane acrylic oligomer, manufactured by Diamond Shamrock Co., Ltd.), Viscoat R-264, KS resist 106 (all manufactured by Osaka Organic Chemical Industry Ltd.), Cyclomer P series, Placcel CF 200 series (all manufactured by Daicel Chemical Ind., Ltd.), Ebecryl 3800 (manufactured by Daicel-UCB Co., Ltd.) and the like may be included.

As the alkali-soluble resin having these polymerizable groups, a urethane modified polymerizable double bond contained acrylic resin obtained by reacting an isocyanate group with a OH group in advance, leaving one unreacted isocyanate group, and also reacting a compound including a (meth)acryloyl group with an acrylic resin including a carboxyl group, an unsaturated group contained acrylic resin obtained by reacting an acrylic resin including a carboxyl group with a compound having both an epoxy group and a polymerizable double bond within the molecule, an acid pendant type epoxyacrylate resin, a polymerizable double bond contained acrylic resin in which an acrylic resin including a OH group and a dibasic acid anhydride having a polymerizable double bond are reacted, a resin in which an acrylic resin including a OH group, isocyanate, and a compound having a polymerizable double bond are reacted, a resin obtained by base treating the resin having an ester group which has a dissociating group such as a halogen atom or a sulfonate group at an or α-position or a β-position in a side chain disclosed in JP2002-229207A and JP2003-335814A, or the like is preferable.

As the alkali-soluble resin, particularly, a benzyl (meth) acrylatel(meth)acrylic acid copolymer or a multicomponent copolymer consisting of benzyl (meth)acrylate/(meth) acrylic acid/other monomer is suitable. In addition, a copolymer in which 2-hydroxyethylmetacrylate is copolymerized, or a 2-hydroxypropyl (meth)acrylate/polystyrene macromonomer/benzyl methacrylate/methacrylic acid copolymer, a 2-hydroxy-3-phenoxy propyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer or the like disclosed in JP1995-140654A (JP-H07-140654A) may be included.

The alkali-soluble resin preferably contains a Polymer (a) formed by polymerizing the monomer component which is required to have compounds represented by following General Formula (ED) (hereinafter, also appropriately referred to as "ether dimer").

By using Polymer (a), in the coloring composition of the present invention, a cured coating film with extremely excellent not only heat resistance but also transparency may be formed.

[Chem. 94]

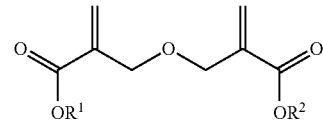

(ED)

In General Formula (ED), $R^1$ and $R^2$, each independently, represent a hydrogen atom or a hydrocarbon group with 1 to 25 carbon atoms which may have substituents.

In General Formula (ED), the hydrocarbon group with 1 to 25 carbon atoms which may have substituents represented by $R^1$ and $R^2$ is not particularly limited, however, for example, a straight or branched alkyl group such as methyl, ethyl, n-propyl, isopropyl, n-butyl, isobutyl, t-butyl, t-amyl, stearyl, lauryl, or 2-ethylhexyl; an aryl group such as phenyl; an alicyclic group such as cyclohexyl, t-butylcyclohexyl, dicyclopentadienyl, tricyclodecanyl, isobornyl, adamantyl or 2-methyl-2-adamantyl; an alkyl group substituted with an alkoxy group such as 1-methoxyethyl, 1-ethoxyethyl; an alkyl group substituted with an aryl group such as benzyl; or the like may be included. Among these, a substituent of primary or secondary carbon such as methyl, ethyl, cyclohexyl, or benzyl which is difficult to be dissociated by acid or heat is preferable from the viewpoint of heat resistance.

Specific examples of the ether dimer, for example, dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di (n-butyl)-2,2'-[oxybis(methyl ene)]bis-2-propenoate, di(isobutyl)-2,2'-[oxybis(methylene)]bis-2-propenoate, di(t-butyl)-2,2'-[oxybis(methylene)]bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-cyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2- propenoate, di(2-methyl-2-adamantyl)-2,2'-[oxybis (methylene)]bis-2-propenoate or the like may be included. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, or dibenzyl-2,2'-[oxybis(methylene)]bis-2-propenoate, is preferable. These ether dimers may be just one type, or two or more types.

The ratio of the ether dimer in the monomer to obtain Polymer (a) is not particularly limited, however, from the viewpoint of transparency and heat resistance of the coated film formed by the coloring composition, is preferably 2 to 60 mass % in the total monomer components, more preferably 5 to 55 mass %, and even more preferably 5 to 50 mass %.

Polymer (a) may be a copolymer in which other monomer is copolymerized, together with the ether dimer.

As the other dimer copolymerizable with the ether dimer, for example, a monomer to introduce an acid group, a monomer to introduce a radical polymerizable double bond, a monomer to introduce an epoxy group, and other monomers capable of copolymerization in addition to these may be included. The monomer such as this may be used either as just one type, or as two or more types.

As the monomer to introduce the acid group, for example, a monomer having a carboxyl group such as (meth)acrylic acid or itaconic acid, a monomer having a phenolic hydroxyl group such as N-hydroxyphenylmaleimide, a monomer having a carboxylic acid anhydride such as maleic anhydride or itaconic anhydride or the like may be included. Among these, (meth)acrylic acid is particularly preferable.

The monomer to introduce the acid group may also be a monomer capable of imparting the acid group after the polymerization, for example, a monomer having a hydroxyl group such as 2-hydroxyethyl (meth)acrylate, a monomer having an epoxy group such as glycidyl (meth)acrylate, a monomer having an isocyanate group such as 2-isocyanatoethyl (meth)acrylate or the like may be included. When the monomer to introduce the acid group is used, a process in which the acid group is imparted needs to be performed after polymerization. The process in which the acid group is imparted is different depending on the types of monomer and, for example, the following processes may be included. If a monomer having a hydroxyl group is used, for example, a process in which an acid anhydride such as succinic anhydride, tetrahydrophthalic anhydride, or maleic anhydride is added may be included. If a monomer having an epoxy group is used, for example, a process in which a compound having an amino group such as N-methylaminobenzoic acid or N-methylaminophenol and an acid group is added or, for example, a process in which an acid anhydride such as succinic anhydride, tetrahydrophthalic anhydride, or maleic anhydride is added to a hydroxyl group formed after adding an acid such as (meth)acrylic acid may be included. If a monomer having an isocyanate group is used, for example, a process in which a compound having a hydroxyl group such as 2-hydroxybutyric acid and an acid group is added may be included.

When the monomer used to obtain Polymer (a) includes the monomer to introduce the acid group, the content ratio is not particularly limited, however, is preferably 5 to 70 mass % in the total monomer components and more preferably 10 to 60 mass %.

As the monomer to introduce the radical polymerizable double bond, for example, a monomer having a carboxylic group such as (meth)acrylic acid or itaconic acid; a monomer having a carboxylic acid anhydride such as maleic anhydride or itaconic anhydride; a monomer having an epoxy group such as glycidyl (meth)acrylate, 3,4-epoxycycolhexylmethyl (meth)acrylate, or o-(or m-, or p-)vinylbenzyl glycidyl ether, or the like may be included. When the monomer to introduce the radical polymerizable double bond is used, a process in which the radical polymerizable double bond is imparted needs to be performed after polymerization. The process in which the radical polymerizable double bond is imparted is different depending on the types of monomer and, for example, the following processes may be included. If the monomer having a carboxylic group such as (meth)acrylic acid or itaconic acid is used, a process in which a compound having a radical polymerizable double bond with an epoxy group such as glycidyl (meth)acrylate, 3,4-epoxycycolhexylmethyl (meth)acrylate, or o-(or m-, or p-)vinylbenzyl glycidyl ether is added may be included. If the monomer having a carboxylic acid anhydride such as maleic anhydride or itaconic anhydride is used, a process in which a compound having a radical polymerizable double bond with a hydroxyl group such as 2-hydroxyethyl (meth) acrylate is added may be included. If the monomoer having an epoxy group such as glycidyl (meth)acrylate, 3,4-epoxycycolhexylmethyl (meth)acrylate, or o-(or m-, or p-)vinylbenzyl glycidyl ether is used, a process in which a compound having a radical polymerizable double bond with an acid group such as (meth)acrylic acid is added may be included.

When the monomer used to obtain Polymer (a) includes the monomer to introduce the radical polymerizable double bond, the content ratio is not particularly limited, however, is preferably 5 to 70 mass % in the total monomer components and more preferably 10 to 60 mass %.

As the monomer to introduce the epoxy group, for example, glycidyl (meth)acrylate, 3,4-epoxycycolhexylmethyl (meth)acrylate, o-(or m-, or p-)vinylbenzyl glycidyl ether or the like may be included.

When the monomer used to obtain Polymer (a) includes the monomer to introduce the epoxy group, the content ratio is not particularly limited, however, is preferably 5 to 70 mass % in the total monomer components and more preferably 10 to 60 mass %.

As other monomers capable of copolymerization, for example, (meth)acrylates such as methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, 2-ethylhexyl methyl (meth)acrylate, cyclohexyl (meth)acrylate, benzyl (meth)acrylate, or 2-hydroxyethyl (meth)acrylate; aromatic vinyl compounds such as styrene, vinyltoluene, or o-methylstyrene; N-substituted maleimides such as N-phenylmaleimide or N-cyclohexylmaleimide; butadiene or substituted butadiene compounds such as butadiene or isoprene; ethylene or ethylene substituted compounds such as ethylene, propylene, vinyl chloride or acrylonitrile; vinyl esters such as vinyl acetate; or the like may be included. Among these, methyl (meth) acrylate, cyclohexyl (meth)acrylate, benzyl (meth)acrylate, or styrene is preferable from the viewpoint of difficult impairment of heat resistance due to satisfactory transparency.

When the monomer used to obtain Polymer (a) includes other monomers capable of copolymerization, the content ratio is not particularly limited, however, is preferably 95 mass % or less and more preferably 85 mass % or less.

Weight-average molecular weight of Polymer (a) is not particularly limited, however, from the viewpoint of viscosity of the coloring composition and heat resistance of the coated film formed by the composition, is preferably 2,000 to 200,000, more preferably 5,000 to 100,000, and even more preferably 5,000 to 20,000.

Also, when Polymer (a) has an acid group, the acid value is preferably 30 to 500 mgKOH/g and more preferably 50 to 400 mgKOH/g.

Polymer (a), at least, may be easily obtained by polymerizing the monomer which is required to have the ether dimer. At the time, a tetrahydrofuran ring structure is formed by a cyclization reaction of the ether dimer simultaneously with polymerization.

The polymerization methods applied to the synthesis of Polymer (a) is not particularly limited and various well-known polymerization methods may be employed, however, particularly, a solution polymerization method is preferable. In detail, Polymer (a) may be synthesized, for example, in accordance with the synthesis methods of Polymer (a) disclosed in JP2004-300204A.

Exemplary compounds of Polymer (a) are shown below, however, the present invention is not limited to these. The composition ratio of the exemplary compounds shown below is mol %.

[Chem. 95]

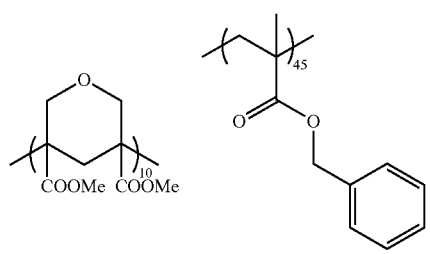

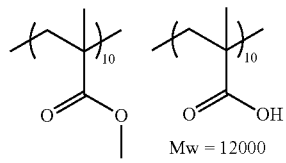

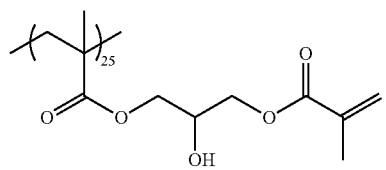

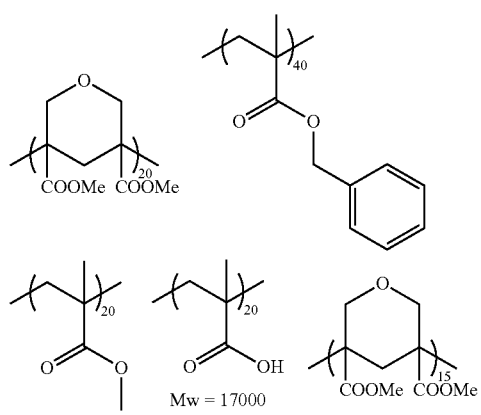

-continued

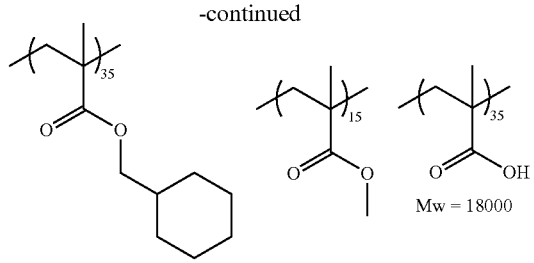

[Chem. 96]

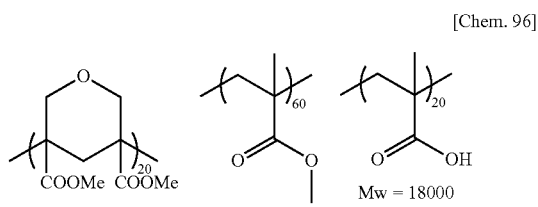

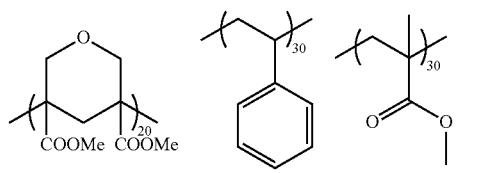

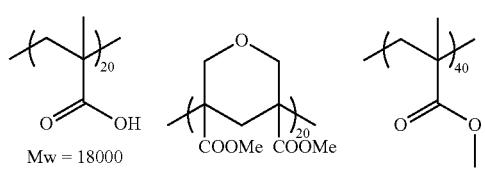

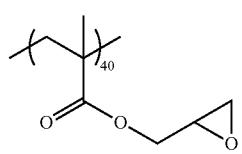

As the alkali-soluble resin, particularly, a benzyl (meth)acrylate/(meth)acrylic acid copolymer or a multicomponent copolymer consisting of benzyl (meth)acrylate/(meth)acrylic acid/other monomer is suitable. In addition, a copolymer in which 2-hydroxyethylmetacrylate is copolymerized, or a 2-hydroxypropyl (meth)acrylate/polystyrene macromonomer/benzyl methacrylate/methacrylic acid copolymer, a 2-hydroxy-3-phenoxy propyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrate/methacrylic acid copolymer or the like disclosed in JP1995-140654A (JP-H07-140654A) may be included.

In order to improve the cross-linking efficiency of the coloring composition of the present invention, an alkali-soluble resin having the polymerizable group may also be used.

As the alkali-soluble resin having the polymerizable group, an alkali-soluble resin including an allyl group, a (meth)acrylic group, an allyloxy alkyl group or the like in a side chain and the like is useful. As the alkali-soluble resin having these polymerizable groups, a urethane modified polymerizable double bond contained acrylic resin obtained by reacting an isocyanate group with a OH group in advance, leaving one unreacted isocyanate group, and also reacting a compound including a (meth)acryloyl group with an acrylic resin including a carboxyl group, an unsaturated group contained acrylic resin obtained by reacting an acrylic resin including a carboxyl group with a compound having both an epoxy group and a polymerizable double bond within the molecule, an acid pendant type epoxyacrylate resin, a polymerizable double bond contained acrylic resin in which an acrylic resin including a OH group and a dibasic acid anhydride having a polymerizable double bond are reacted, a resin in which an acrylic resin including a OH group, isocyanate, and a compound having a polymerizable double bond are reacted, a resin obtained by base treating the resin having an ester group which has a dissociating group such as a halogen atom or a sulfonate group at an α-position or a β-position in a side chain disclosed in JP2002-229207A and JP2003-335814A, or the like is preferable.

The acid value of the alkali-soluble resin is preferably 30 to 200 mgKOH/g, more preferably 50 to 150 mgKOH/g, and the most preferably 70 to 120 mgKOH/g.

Also, weight-average molecular weight (Mw) of the alkali-soluble resin is preferably 2,000 to 50,000, more preferably 5,000 to 30,000, and the most preferably 7,000 to 20,000.

As the content of the alkali-soluble resin in the coloring composition, 1 to 15 mass % with regard to the total solids of the composition is preferable, 2 to 12 mass % is more preferable, and 3 to 10 mass % is even more preferable.

<Polymerization Inhibitor>

In the coloring composition of the present invention, it is preferable that a small amount of a polymerization inhibitor be added in order to prevent unnecessary thermal polymerization of the polymerizable compound while the coloring composition is prepared or stored.

As the polymerization inhibitor which can be used in the present invention, hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), cerium(I) salt of N-nitroso phenylhydroxylamine, or the like may be included. Among these, p-methoxyphenol is preferable.

An addition amount of the polymerization inhibitor is preferably approximately 0.01 mass % to approximately 5 mass % with regard to the mass of the coloring composition.

<Adhesive Agent for Substrate>

In the present invention, an adhesive agent for substrate which can improve adhesiveness for substrate may be added.

As the adhesive agent for substrate, using a silane-based coupling agent, a titanate-based coupling agent, or an aluminum-based coupling agent is preferable. As the silane-based coupling agent, for example, γ-methacryloxypropyltrimethoxysilane, γ-methacryloxypropyltriethoxysilane, γ-acryloxypropyltrimethoxysilane, γ-acryloxypropyltriethoxysilanesilane, γ-mercaptopropyltrimethoxysilane, γ-aminopropyltriethoxysilane, phenyltrimethoxysilane or the like may be used. Among these, γ-methacryloxypropyltrimethoxysilane is preferable as the adhesive agent for substrate.

The content of the adhesive agent for substrate is preferably greater than or equal to 0.1 mass % and less than or equal to 30 mass % with regard to the total solids of the coloring composition, more preferably greater than or equal to 0.5 mass % and less than or equal to 20 mass %, and even more preferably greater than or equal to 1 mass % and less than or equal to 10 mass % from the viewpoint of leaving no residues in the light unexposed area when the coloring composition is exposed and developed.

<Surfactant>

Various surfactants may be added to the coloring composition from the viewpoint of further improving coating properties. As the surfactant, various surfactants such as fluorine-based surfactants, nonionic surfactants, cationic surfactants, anionic surfactants, or silicone-based surfactants may be used.

Particularly, in the coloring composition, by containing the fluorine-based surfactant, uniformity of the coating thickness or a liquid saving property may be further improved since the property of liquid (liquidity, in particular) is further improved when prepared as a coating liquid.

In other words, when the film is formed using a coating liquid in which the coloring composition containing the fluorine-based surfactant is applied, a wetting property to the coated surface is improved since interfacial tension between the coated surface and the coating liquid is lowered, thereby a coating property to the coated surface is improved. As a result, it is effective in that the film of uniform thickness with small thickness variation is suitably formed even when the thin film of several μm is formed using a small amount of liquid amount.

As fluorine content in the fluorine-based surfactant, 3 mass % to 40 mass % is suitable, 5 mass % to 30 mass % is more preferable, and 7 mass % to 25 mass % is particularly preferable. The fluorine-based surfactant with the fluorine content within this range is effective in terms of uniformity of the thickness of coated film or a liquid saving property and solubility in the coloring composition is also satisfactory.

As the fluorine-based surfactant, for example, Megafac F171, the same F172, the same F173, the same F176, the same F177, the same F141, the same F142, the same F143, the same F144, the same R30, the same F437, the same F475, the same F479, the same F482, the same F554, the same F780, or the same F781 (hereinbefore, manufactured by DIC Corporation), Fluorad FC430, the same FC431, or the same FC171 (hereinbefore, manufactured by Sumitomo 3M Limited), Surflon S-382, the same SC-101, the same SC-103, the same SC-104, the same SC-105, the same SC1068, the same SC-381, the same SC-383, the same S393, or the same KH-40 (hereinbefore, manufactured by Asahi Glass, Co., Ltd.), or the like may be included.

As the nonionic surfactant, specifically, glycerol, trimethylolpropane, trimethylolethane, and ethoxylates and propoxylates thereof (for example, glycerol propoxylate, glycerin ethoxylate, and the like.), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, or sorbitan fatty acid esters (BASF Group manufacturing Pluronic L10, L31, L61, L62, 10 R5, 17R5, 25 R2, Tetronic 304, 701, 704, 901, 904, 150R1), Solsperse 20000 (manufactured by Lubrizol Japan Limited) or the like may be included.

As the cationic surfactant, specifically, a phthalocyanine derivative (trade name: EFKA-745, manufactured by Morishita Co., Ltd.), an organosiloxane polymer KP341 (manufactured by Shin-Etsu Chemical Co., Ltd.), a (meth)acrylic acid-based (all) copolymer Polyflow. No. 75, No. 90, or No. 95 (manufactured by Kyoeisha Chemical Co., Ltd.), W001 (manufactured by Yusho Co. Ltd.) or the like may be included.

As the anionic surfactant, specifically, W004, W005, or W017 (manufactured by Yusho Co. Ltd.) or the like may be included.

As the silicone-based surfactant, for example, Toray Silicone DC3PA, Toray Silicone SH7PA, Toray Silicone DC11PA, Toray Silicone SH21PA, Toray Silicone SH28PA, Toray Silicone SH29PA, Toray Silicone SH30PA, or Toray Silicone SH8400 (hereinbefore, manufactured by Dow Corning Toray Co., Ltd.), TSF-4440, TSF-4300, TSF-4445, TSF-4460, or TSF-4452 (hereinbefore, manufactured by Momentive Performance Materials, Inc.), KP341, KF6001, or KF6002 (hereinbefore, manufactured by Shin-Etsu Silicone Co., Ltd.) BYK307, BYK323 or BYK330 ((hereinbefore, manufactured by BYK-Chemie GmbH) or the like may be included.

The surfactant may either use alone or as a combination of two or more.

An addition amount of the surfactant is preferably 0.001 mass % to 2.0 mass %, more preferably 0.005 mass % to 1.0 mass % with regard to the total mass of the coloring composition.

<Others>

The coloring composition of the present invention may contain various additives such as a chain transfer agent such as N,N-dialkylamino alkyl benzoate or 2-mercaptobenzothiazole, a thermal polymerization initiator such as an azo-based compound or a peroxide-based compound, multifunctional thiol or an epoxy compound for the purpose of enhancing thermal polymerization components, film strength, or sensitivity, an ultraviolet ray absorbing agent such as alkoxybenzophenone, a plasticizer such as dioctylphthalate, developability improving agent such as low molecular weight organic carboxylic acid, other filling agents, polymer compounds in addition to the alkali-soluble resin, an antioxidant, or an aggregation inhibitor.

A heat curing agent may also be added in order to increase the degree of curing of the film by heating after the development. As the heat curing agent, a thermal polymerization initiator such as an azo-based compound or a peroxide-based compound, a novolak resin, a resole resin, an epoxy compound, and a styrene compound may be included.

The coloring composition of the present invention is stir-mixed together with each component such as the dye polymer, the organic solvent, the polymerizable compound, the polymerization initiator, and as necessary, the alkali-soluble resin and the surfactant, and filtration is carried out as follows as necessary, and a coloring composition of red, green, and blue may be prepared.

The coloring composition of the present invention is preferably filtered using a filter for the purpose of removing foreign substances or reducing defects. Anything which has been used for filtering may be used without a particular limitation. For example, a filter by a fluorine resin such as PTFE (polytetrafluoroethylene), a polyamide-based resin such as nylon-6 or nylon 6,6, a polyolefin resin such as polyethylene or polypropylene (including high-density or ultra-high-molecular weight) or the like may be included. Among these materials, polypropylene (including high-density polyprolylene) is preferable.

As diameter of the filter pore, approximately 0.01 to 7.0 µm is suitable, approximately 0.01 to 2.5 µm is preferable, and approximately 0.01 to 2.0 µm is more preferable. By maintaining the diameter within this range, fine foreign substances which inhibit the preparation of uniform and smooth coloring composition in a follow-up processes can be reliably removed.

The filter may be combined with other filters when used. In that case, filtering in a first filter may be carried out just once, or twice or more.

The first filter with different pore diameter may also be combined with within the range described above. Here, the pore diameter may refer to the nominal value of the filter manufacturer. The commercially available filters may be selected among various filters provided by, for example, Pall Corporation, Advantec Toyo Kaisha, Ltd., Nihon Entegris K.K. (former Mykrolis Corporation), Kitz Microfilter Corporation or the like.

As a second filter, a filter formed with the same material of the first filter described above may be used.

For example, the filtering in the first filter may be carried out only with dispersion liquid and the second filtering may be carried out after other components are mixed.

[Production of Color Filter by Coloring Radiation-Sensitive Composition] Next, a color filter of the present invention and a production method thereof will be described using the coloring radiation-sensitive composition of the present invention.

The color filter of the present invention includes a coloring area (coloring pattern) formed by using the coloring radiation-sensitive composition described above on the substrate.

Hereinafter, the color filter of the present invention will be described in detail through the production method thereof (a production method of the color filter of the present invention).

The production method of the color filter of the present invention includes a step in which the coloring radiation-sensitive composition is applied on a substrate and then a coloring radiation-sensitive composition layer (coloring layer) is formed (a coloring layer forming step), a step in which the coloring radiation-sensitive composition layer is exposed in a pattern shape (an exposing step), and a step in which the coloring radiation-sensitive composition layer after the exposure is developed and a coloring pattern is formed (a developing step).

The pattern formation method of the present invention also includes a step in which the coloring radiation-sensitive composition is applied on a substrate and then a coloring radiation-sensitive composition layer (coloring layer) is formed (a coloring layer forming step), a step in which the coloring radiation-sensitive composition layer is exposed in a pattern shape (an exposing step), and a step in which the coloring radiation-sensitive composition layer after the exposure is developed and a coloring pattern is formed (a developing step).

<Coloring Layer Forming Step>

In the coloring layer forming step, the coloring composition layer (coloring radiation-sensitive layer) consisting of the coloring radiation-sensitive composition is formed by coating the coloring radiation-sensitive composition on the substrate.

As the substrate which may be used in this step, for example, a photoelectric conversion element substrate in CCD, CMOS, and organic CMOS used in a solid-state imaging device, a silicon substrate or the like, or alkali-free glass used in liquid crystal display, soda glass, Pyres (registered trademark), quartz glass, and those in which a transparent conductive film is attached to these or the like may be included. In some cases, a black matrix which isolates each pixel may be formed on these substrates.

Furthermore, on these substrates, as necessary, an undercoat layer may be prepared in order to improve adhesion with the upper layer, to prevent the substance spread, or to flatten the substrate surface.

As the method for coating the coloring radiation-sensitive composition of the present invention on the substrate, various coating methods such as slit coating, ink-jet method, spin coating, cast coating, roll coating, a screen printing method or the like may be applied.

Drying of the coloring layer (the coloring radiation-sensitive composition layer) coated on the substrate (pre-bake) may be carried out at 50° C. to 140° C. for 10 seconds to 300 seconds using a hot plate, an oven or the like.

Film thickness of the coloring layer after post-bake is preferably greater than or equal to 0.05 μm and less than 1.0 μm, more preferably greater than or equal to 0.1 μm and less than or equal to 0.9 μm, and particularly preferably greater than or equal to 0.2 μm and less than or equal to 0.9 μm from the viewpoint of securing color concentration or reducing problems such that light in oblique direction does not reach a light receiving unit and also the light concentration rate difference at the corner and center of the device is significant.

<Exposing Step>

In the exposing step, the coloring layer (the coloring radiation-sensitive composition layer) formed in the coloring layer forming step is exposed in a pattern shape.

The exposure of the coloring layer in the exposure of this step is preferably carried out by exposing through a predetermined mask pattern and then curing the coated film as much area as the light is irradiated. As the radiation which can be used in exposure, particularly, radiation such as g line, h line or i line is preferably used, and i line is particularly preferable. The dose of irradiation is preferably 30 mJ/cm$^2$ to 1,500 mJ/cm$^2$, more preferably is 50 mJ/cm$^2$ to 1,000 mJ/cm$^2$, the most preferably 80 mJ/cm$^2$ to 500 mJ/cm$^2$.

<Developing Step>

Following on the exposing step, by carrying out a developing process using alkali (a developing step), the uncured area after the exposure is eluted to developing liquid and the light cured area is made to remain. By this developing step, a pattern shape film consisting of pixels of each color may be formed.

Developing methods may be any of a DIP method, a shower method, a spray method, a paddle method or the like and a swing method, a spin method, an ultrasonic method or the like may be combined to these.

Before touching the developing liquid, the developed surface is moisten with water or the like in advance and an uneven development may be prevented.

As the developing liquid, an organic alkali developing liquid which causes no damage to underlying circuits and the like is preferable. The developing temperature is normally 20° C. to 30° C., and the developing time is 20 to 90 seconds.

As the alkali agent included in the developing liquid, for example, an organic alkali compound such as aqueous ammonia, ethylamine, diethylamine, dimethylethanolamine, tetramethylammonium hydroxide, tetraethylammonium hydroxide, choline, pyrrole, piperidine or 1,8-diazabicyclo-[5,4,0]-7-undecene, an inorganic alkali compound such as sodium hydroxide, potassium hydroxide, sodium hydrogen carbonate or potassium hydrogen carbonate, or the like may be included.

As the developing liquid, an alkaline aqueous solution diluted with pure water so that concentration of the alkali agent is to be 0.001 mass % to 10 mass % and preferably to be 0.01 mass % to 1 mass %. Also, when the developing liquid made of these alkaline aqueous solutions is used, after the development in general, the excess developing liquid is removed by cleaning by washing (rinsing) with pure water and drying is carried out.

The production method of the present invention may also include a curing step in which the coloring pattern formed is cured by post heating (post-bake) or post exposure after the coloring layer forming step, the exposing step, and the developing step described above are performed. The post-bake is a heating process after the development in order to complete the curing, and normally a heat curing process of 100° C. to 270° C. is performed.

In a case in which light is used, g line, h line, i line, excimer laser such as KrF or ArF, electron beam, X-ray or the like may be used, however, carrying out at a low temperature of approximately 20 to 50° C. using an existing high-pressure mercury lamp is preferable and the irradiation time is 10 seconds to 180 seconds, preferably 30 seconds to 60 seconds. When the post exposure and the post heating are used in combination, carrying out the post exposure first is preferable.

As described hereinbefore, the color filter consisting of target colors is produced by repeating the coloring layer forming step, the exposing step, and the developing step (also, the curing step as necessary) by the number of target colors.

In the color filter of the present invention, the cured composition in the exposed area has excellent adhesiveness to the substrate and developability resistance, the adhesiveness of the coloring pattern with the substrate is high, and also, the pattern which gives a desired cross-sectional shape has fine colored pixels.

The coloring radiation-sensitive composition of the present invention may be easily removed by cleaning using well-known cleaning liquids even when the composition is adhered to, for example, a nozzle of discharge unit of coating device, a pipe unit of coating device, within a coating device or the like. In this case, in order to carry out more efficient removal by cleaning, organic solvents described above as the organic solvent included in the coloring composition are preferably used as the cleaning liquid.

Furthermore, cleaning liquids disclosed in JP1995-128867A (JP-H07-128867A), JP1995-146562A (JP-H07-146562A), JP1996-278637A (JP-H08-278637A), JP2000-273370A, JP2006-85140A, JP2006-291191A, JP2007-2101A, JP2007-2102A, or JP2007-281523A may also be suitably used as the cleaning liquid for removal by cleaning of the coloring radiation-sensitive composition of the present invention.

As the cleaning liquid, using alkylene glycol monoalkyl ether carboxylate or alkylene glycol monoalkyl ether is preferable.

These organic solvents which can be used as the cleaning liquid may be used either alone or as a combination of two or more.

When two or more organic solvents are mixed, a mixed solvent made by mixing an organic solvent having a hydroxyl group and an organic solvent having no hydroxyl group is preferable. The mass ratio of the organic solvent having a hydroxyl group and the organic solvent having no hydroxyl group is 1/99 to 99/1, preferably 10/90 to 90/10, and more preferably 20/80 to 80/20. As the mixed solvent, a mixed solvent of propylene glycol monomethyl ether acetate (PGMEA) and propylene glycol monomethyl ether (PGME) with the ratio of 60/40 is particularly preferable.

Surfactants described above as the surfactants contained in the coloring radiation-sensitive composition may also be added to the cleaning liquid in order to enhance the penetrating property of the cleaning liquid to the coloring radiation-sensitive composition.

The color filter of the present invention produced by the production method of the color filter of the present invention may also be suitably used for a solid-state imaging device such as a CCD sensor, a CMOS sensor, an organic CMOS sensor or the like, and also is suitably used for an image display device such as electronic paper or organic EL, a liquid crystal device, or the like. Particularly, the color filter of the present invention is suitable for a solid-state imaging device of high resolution CCD sensor with more than one million pixels, CMOS sensor or organic CMOS sensor. The color filter of the present invention may be used, for example, as a color filter disposed between a light receiving unit of each pixel consisting CCD element and a micro-lens for light concentration.

[Solid Imaging Device]

A solid imaging device of the present invention includes the color filter of the present invention. The configuration of the solid imaging device of the present invention is a configuration equipped with the color filter for the solid imaging device of the present invention and is not particularly limited as long as the configuration functions as the solid imaging device, however, for example, the configuration such as below may be included.

In the solid imaging device, a transfer electrode made of a plurality of photodiodes configuring a light receiving area of the solid-state imaging device (a CCD sensor, a CMOS sensor, an organic CMOS sensor or the like) and polysilicon and the like is on the substrate, a light-shielding film made of a tungsten and the like in which only a light receiving unit of the photodiode is opened is on the photodiode and the transfer electrode, the device protective film made of silicon nitride and the like formed so as to cover the entire surface of the light-shielding film and the light receiving unit of the photodiode is on the light-shielding film, and the color filter for the solid-state imaging device of the present invention is on the device protective film.

In addition, a configuration having a light concentrating means (for example, a micro-lens or the like, hereinafter the same) below the color filter (the side closer to the substrate) on the device protective layer, or a configuration having the light concentrating means on the color filter may also be included.

The organic CMOS sensor is also configured to include a thin film of panchromatic light-sensitive organic photoelectric conversion film as a photoelectric conversion layer and a CMOS signal read-out substrate, is a hybrid structure of two-tier configuration where an organic material plays a role to capture light and convert it to an electrical signal, and an inorganic material plays a role to extract the electrical signal outside, and in principle, the aperture ratio with regard to incident light may be made to be 100%. The organic photoelectric conversion film is a continuous film of structure free and may be laid on the CMOS signal read-out substrate, therefore, a high-priced micro-fabrication process is not necessary and is suitable for pixel miniaturization.

EXAMPLES

Hereinafter, the present invention is described in detail using examples. However, the present invention is not limited to these examples as long as it does not depart from the spirit of the present invention. In addition, "parts" and "%" are by mass unless otherwise specified.

(1) Synthesis of Polymer (I)

Compound A (the following structure) was synthesized with reference to Liebigs Annalen der Chemie, 1990, No. 8 p. 741 to 744.

Compound A (30.6 g), glycidyl methacrylate (14.2 g), p-methoxyphenol (1.24 g), and tetrabutylammonium bromide (3.22 g) were add to 200 g of N-methylpyrrolidone (hereinafter, referred to as NMP) and the mixture was heated and stirred at 100° C. for 5 hours. Next, 1 L of ethyl acetate and 1L of 1N aqueous hydrochloric acid solution were added and after stirring, the organic layer was separated, and after that, 35 g of Intermediate Product B (the following structure) was obtained after concentration.

[Chem. 97]

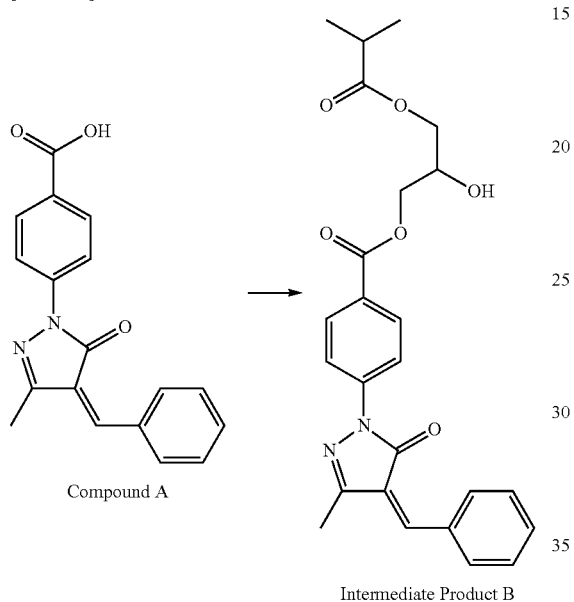

Compound A

Intermediate Product B

The solution obtained by dissolving 10 g of Intermediate Product B, 1.53 g of methacrylic acid, 2.00 g of 1-dodecanethiol, and 0.92 g of 2,2-azobis(2-methylproponic acid) dimethyl ("V-601" manufactured by Wako Pure Chemical Industries, Ltd.) in 20.55 g of propylene glycol methyl ether acetate (hereinafter, referred to as PGMEA) was added dropwise to 10 g of PGMEA of 85° C. over 3 hours under a nitrogen atmosphere. After that, the stirring was continued for 2 more hours at 85° C. After that, the reaction solution was added dropwise with stirring to a mixed solution of 200 ml of methanol and 10 ml of water warmed to a re-precipitation temperature shown in Table 1. After that, the mixture was stirred for 2 hours at room temperature. The powders precipitated were filtered, the powders obtained were dried under reduced pressure and Polymer I which is an azo-based dye polymer (the following structure: Mw: 4000, with the composition ratio of methacrylic acid component being 13 mass %) was obtained in 70% yield.

[Chem. 98]

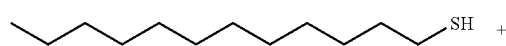

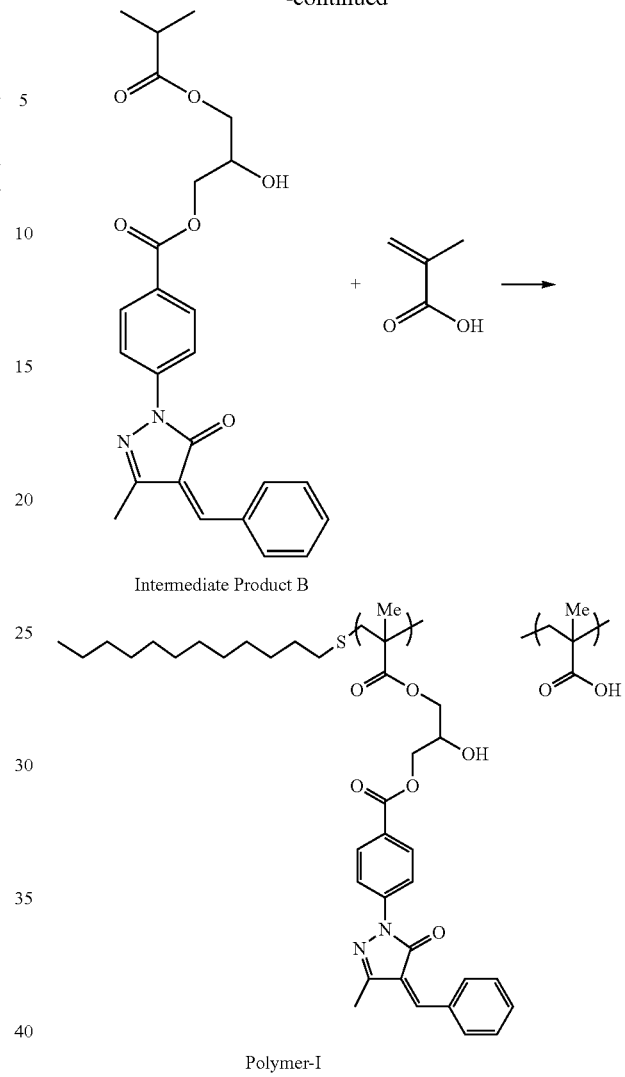

Intermediate Product B

Polymer-I

<Synthesis of Polymer II which is Dye Polymer>

10.0 g of M-53 (the following structure), 0.74 g of methacrylic acid, and 0.36 g of 1-dodecanethiol were dissolved in 19.95 g (35 mass %) of cyclohexanone. The solution was divided into two, the one half was placed in a flask and was heated to 80° C. The solution obtained by adding 0.82 g dimethyl2,2'-azobis(2-methylpropionate) and dissolving in a solution of the other half was added dropwise, under a nitrogen atmosphere, to the solution of one half heated to 80° C. The mixture was stirred for 3 hours from the completion of the dropwise addition. The reaction solution in which 2.75 g of isopropanol was added to the reaction solution obtained was added dropwise to 716 ml of acetonitrile stirred at a re-precipitation temperature shown in Table 1. The mixture was stirred for 1 hour, and then the stirring was carried out for 2 hours at room temperature. The crystals precipitated was filtered, the crystals obtained were dried under reduced pressure and Polymer II which is a dye polymer (the following structure: Mw: 6000, with the composition ratio of methacrylic acid component being 7 mass %) was obtained in 80% yield.

[Chem. 99]

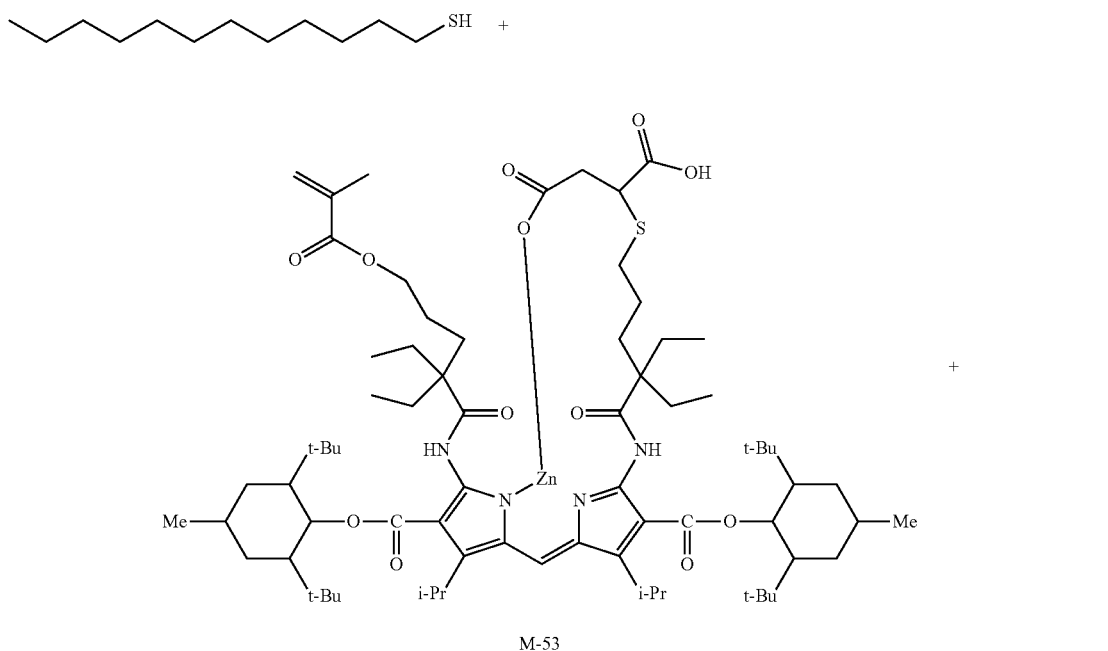

M-53

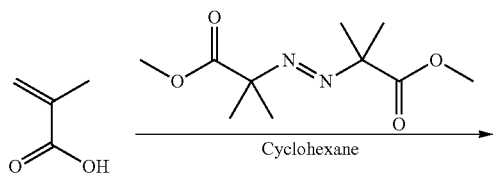

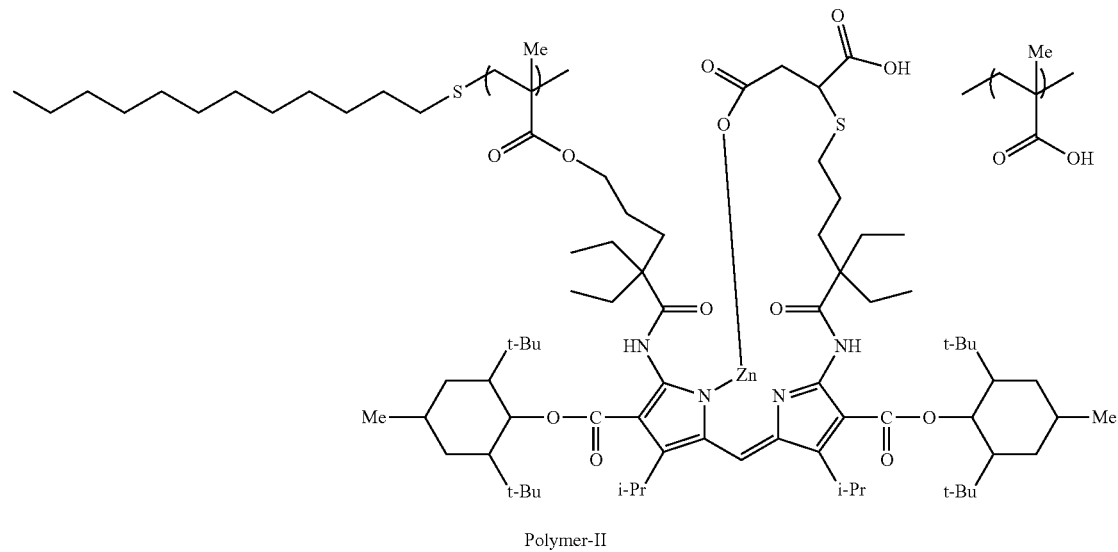

Polymer-II

<Synthesis of Polymer III which is Dye Polymer>

The solution dissolving 5.0 g of the polymer II obtained, 0.58 g of glycidyl methacrylate, 5.6 mg of p-methoxyphenol and 0.10 g of tetrabutylammonium bromide in 31.6 g of PGMEA was heated and stirred at 105° C. for 10 hours. Next, this reaction solution was added dropwise to 350 ml of acetonitrile over 2 hours while the acetonitrile was heated and stirred at 30° C. The crystals precipitated was filtered, the crystals obtained were dried under reduced pressure and 5.0 g of Polymer III which is a dye polymer (the following structure) was obtained. The content of methacrylic acid derived components of the Polymer II used was 13.3 mass %.

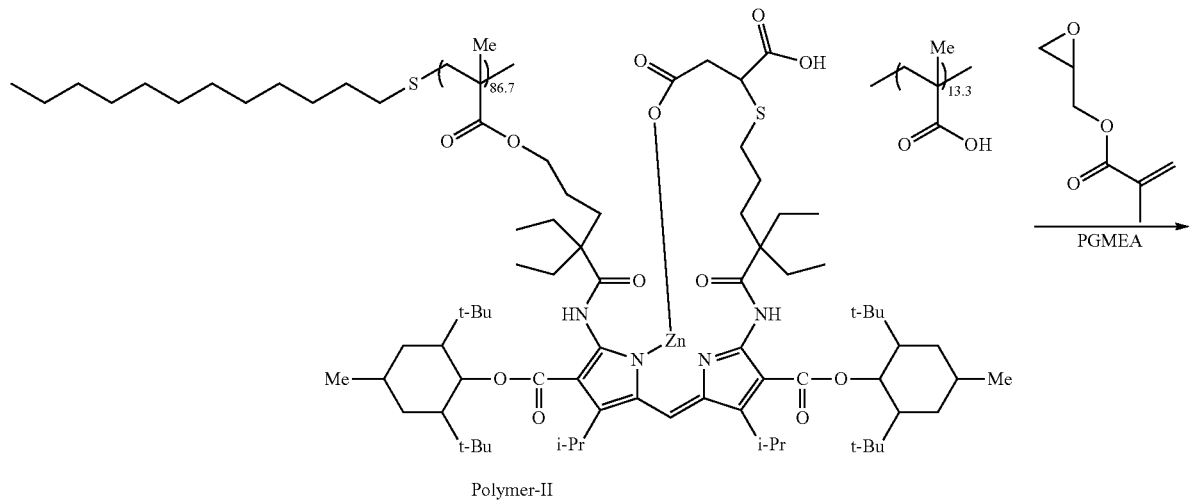

Polymer-II

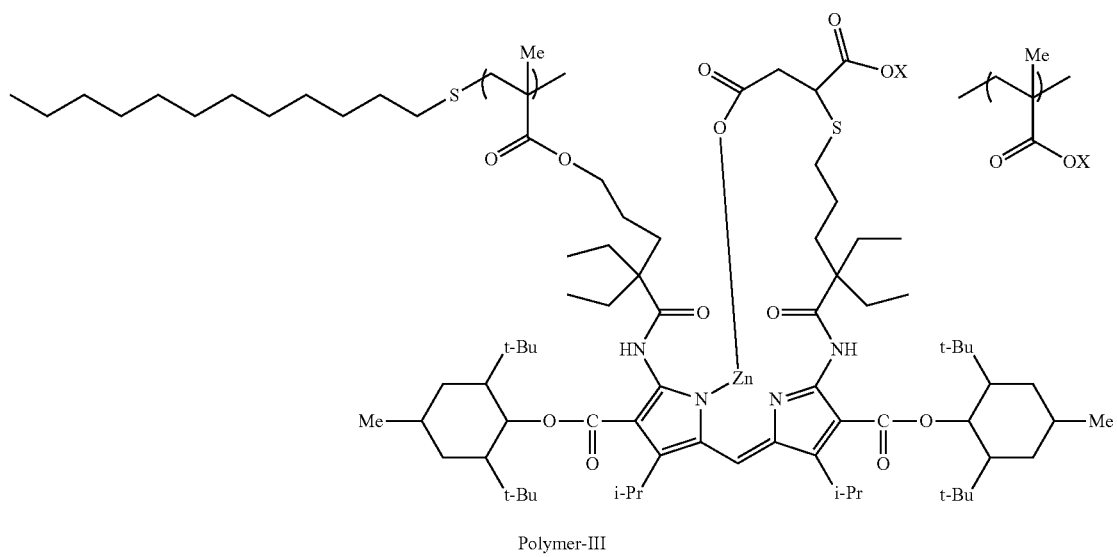

Polymer-III

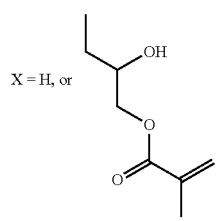

X = H, or

<Synthesis of Polymer IV which is Dye Polymer>

10.0 g of Monomer IV (the following structure), 1.48 g of methacrylic acid, and 0.36 g of 1-dodecanethiol were dissolved in 21.3 g (35 wt %) of cyclohexanone. The solution was divided into two, the one half was placed in a flask and was heated to 80° C. The solution obtained by adding 0.82 g dimethyl2,2'-azobis(2-methylpropionate) and dissolving in a solution of the other half was added dropwise, under a nitrogen atmosphere, to the solution of one half heated to 80° C. The mixture was stirred for 3 hours from the completion of the dropwise addition. The reaction solution in which 2.75 g of isopropanol was added to the reaction solution obtained was added dropwise to a mixed solution of 650 ml of methanol and 20 ml of water stirred at a re-precipitation temperature shown in Table 1. The mixture was stirred for 1 hour, and then the stirring was carried out for 2 hours at room temperature. The crystals precipitated was filtered, the crystals obtained were dried under reduced pressure and Polymer IV which is a dye polymer (the following structure: Mw: 4600, with the composition ratio of methacrylic acid component being 13 mass %) was obtained in 70% yield.

<Synthesis of Polymer V which is Dye Polymer>

10.0 g of Monomer V (the following structure), 1.48 g of methacrylic acid, and 0.36 g of 1-dodecanethiol were dissolved in 21.3 g (35 wt %) of cyclohexanone. The solution was divided into two, the one half was placed in a flask and was heated to 80° C. The solution obtained by adding 0.82 g dimethyl2,2'-azobis(2-methylpropionate) and dissolving in a solution of the other half was added dropwise, under a nitrogen atmosphere, to the solution of one half heated to 80° C. The mixture was stirred for 3 hours from the completion of the dropwise addition. The reaction solution in which 2.75 g of isopropanol was added to the reaction solution obtained was added dropwise to a mixed solution of 650 ml of methanol and 20 ml of water heated at a re-precipitation temperature shown in Table 1. The mixture was stirred for 1 hour, and then the stirring was carried out for 2 hours at room temperature. The crystals precipitated was filtered, the crystals obtained were dried under reduced pressure and Polymer V which is a dye polymer (the following structure: Mw: 5200, with the composition ratio of methacrylic acid component being 13 mass %) was obtained in 73% yield.

<Synthesis of Polymer VI which is Dye Polymer>

10.0 g of Monomer VI (the following structure), 1.48 g of methacrylic acid, and 0.36 g of 1-dodecanethiol were dissolved in 21.3 g (35 wt %) of cyclohexanone. The solution was divided into two, the one half was placed in a flask and was heated to 80° C. The solution obtained by adding 0.82 g dimethyl2,2'-azobis(2-methylpropionate) and dissolving in a solution of the other half was added dropwise, under a nitrogen atmosphere, to the solution of one half heated to 80° C. The mixture was stirred for 3 hours from the completion of the dropwise addition. The reaction solution in which 2.75 g of isopropanol was added to the reaction solution obtained was added dropwise to a mixed solution of 650 ml of methanol and 20 ml of water stirred at a re-precipitation temperature shown in Table 1. The mixture was stirred for 1 hour, and then the stirring was carried out for 2 hours at room temperature. The crystals precipitated was filtered, the crystals obtained were dried under reduced pressure and Polymer VI which is a dye polymer (the following structure: Mw: 5000, with the composition ratio of methacrylic acid component being 13 mass %) was obtained in 75% yield.

<Synthesis of Polymer VII which is Dye Polymer>

10.0 g of Monomer VII (the following structure), 1.48 g of methacrylic acid, and 0.36 g of 1-dodecanethiol were dissolved in 21.3 g (35 wt %) of cyclohexanone. The solution was divided into two, the one half was placed in a flask and was heated to 80° C. The solution obtained by adding 0.82 g dimethyl2,2'-azobis(2-methylpropionate) and dissolving in a solution of the other half was added dropwise, under a nitrogen atmosphere, to the solution of one half heated to 80° C. The mixture was stirred for 3 hours from the completion of the dropwise addition. The reaction solution in which 2.75 g of isopropanol was added to the reaction solution obtained was added dropwise to a mixed solution of 650 ml of methanol and 20 ml of water stirred at a re-precipitation temperature shown in Table 1. The mixture was stirred for 1 hour, and then the stirring was carried out for 2 hours at room temperature. The crystals precipitated was filtered, the crystals obtained were dried under reduced pressure and Polymer VII which is a dye polymer (the following structure: Mw: 6200, with the composition ratio of methacrylic acid component being 13 mass %) was obtained in 80% yield.

<Synthesis of Polymer VIII which is Dye Polymer>

10.0 g of Monomer VIII (the following structure), 1.48 g of methacrylic acid, and 0.36 g of 1-dodecanethiol were dissolved in 21.3 g (35 wt %) of cyclohexanone. The solution was divided into two, the one half was placed in a flask and was heated to 80° C. The solution obtained by adding 0.82 g dimethyl2,2'-azobis(2-methylpropionate) and dissolving in a solution of the other half was added dropwise, under a nitrogen atmosphere, to the solution of one half heated to 80° C. The mixture was stirred for 3 hours from the completion of the dropwise addition. The reaction solution in which 2.75 g of isopropanol was added to the reaction solution obtained was added dropwise to a mixed solution of 650 ml of methanol and 20 ml of water stirred at a re-precipitation temperature shown in Table 1. The mixture was stirred for 1 hour, and then the stirring was carried out for 2 hours at room temperature. The crystals precipitated was filtered, the crystals obtained were dried under reduced pressure and Polymer VIII which is a dye polymer (the following structure: Mw: 7000, with the composition ratio of methacrylic acid component being 13 mass %) was obtained in 82% yield.

Polymerization concentration of each polymer, dropwise addition time of the polymer polymerization solution, temperature condition of re-precipitation, and the content of monomer components remaining in the polymer obtained are shown in Table 1.

In addition, structures of Polymer IV to VIII and the structures of monomer components are shown below. Furthermore, in polymer and monomer structures, Me represents a methyl group, Et, an ethyl group, and OAc, an acetyl group, respectively.

[Chem. 101]

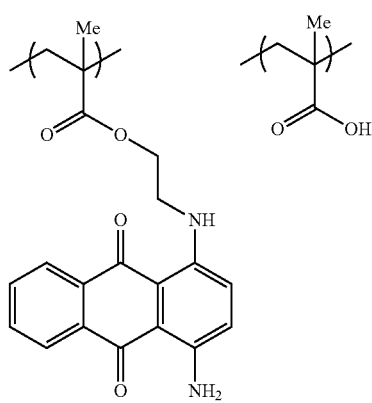

Polymer-IV

-continued
Polymer-V
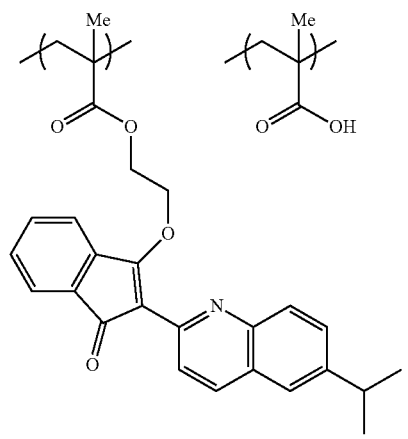
Polymer-VI
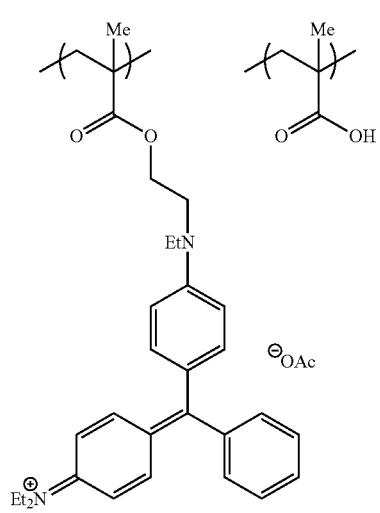
Polymer-VII
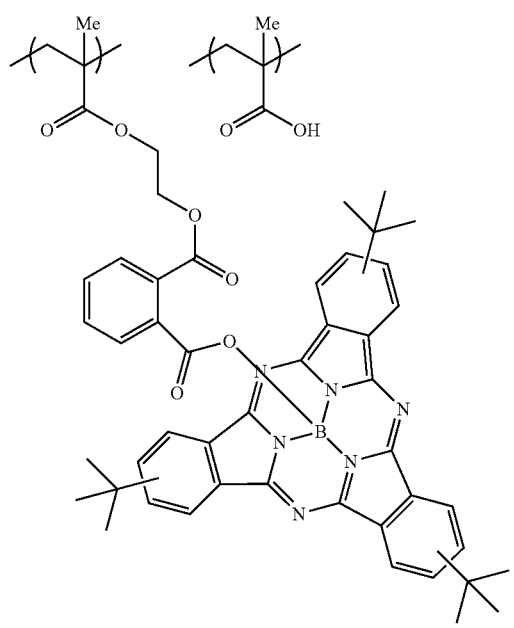
-continued
Polymer-VIII
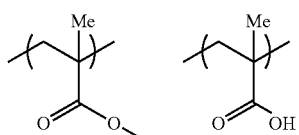
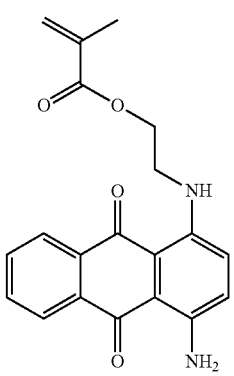
[Chem. 102]
Polymer-IV
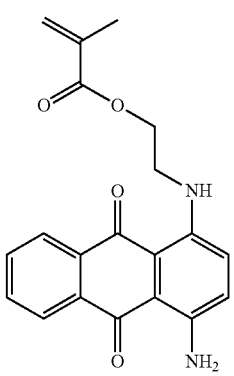
Polymer-V
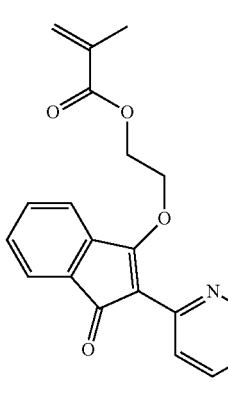

Polymer-VI

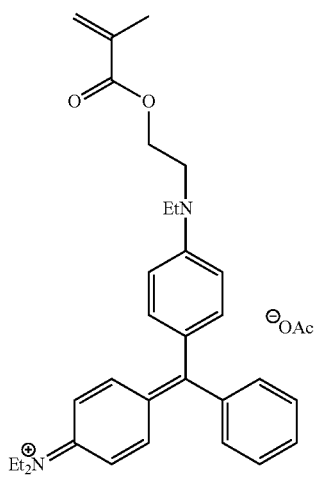

Polymer-VII

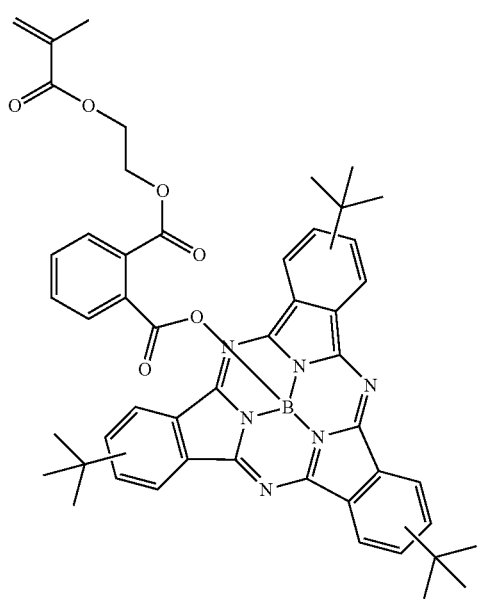

Polymer-VIII

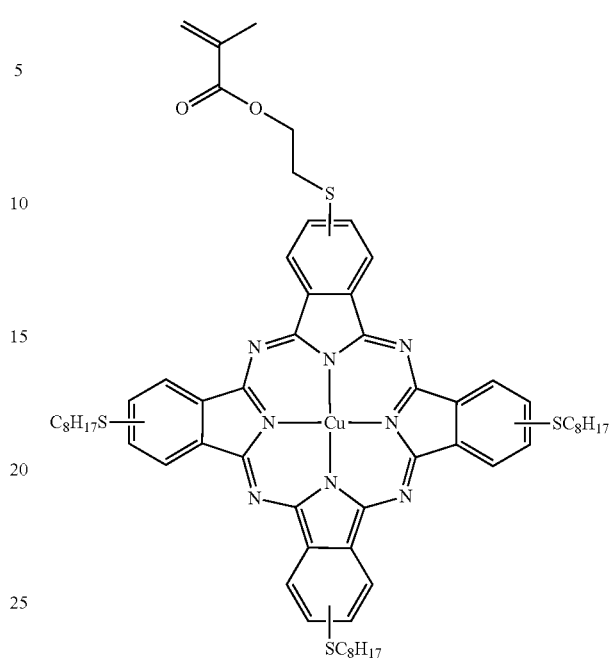

(4) Preparation of Coloring Radiation-Sensitive Composition

First of all, preparation of the coloring radiation-sensitive composition for forming the color filter is described with examples.

Example 1

Coloring radiation-sensitive composition 1 was prepared with the following formulation.

| | |
|---|---|
| (A) Dye polymer: polymer which is a dye polymer (I) | 100 parts |
| (B) Organic solvent: cyclohexanone | 300 parts |
| (C) Polymerizable compound: dipentaerythritol penta/hexa-acrylate | 100 parts |
| (D) Polymerization initiator: 1-phenyl-1,2-propanedione-2-(O-ethoxycarbonyl)oxime | 35 parts |

A resist liquid for undercoat layer was prepared by mixing and dissolving the components of the following composition.

<Composition of the Resist Liquid for Undercoat Layer>

| | |
|---|---|
| Organic Solvent: PGMEA | 19.20 parts |
| Organic Solvent: ethyl lactate | 36.67 parts |
| Resin: benzyl methacrylate/methacrylic acid/2-hydroxyethylmethacrylate copolymer 30% PGMEA solution with (molar ratio = 70/22/8) | 30.51 parts |
| Polymerizable compound: dipentaerythritol hexaacrylate | 12.20 parts |
| Polymerization inhibitor: p-methoxyphenol | 0.0061 parts |
| Flourine-based surfactant (F-475, manufactured by DIC Corporation) | 1.0 parts |
| Polymerization initiator (trihalomethyltriazine-based polymerization initiator) (TAZ-107, manufactured by Midori Kagaku Co. Ltd.) | 0.586 parts |

[Preparation of Silicon Substrate with Undercoat Layer Attached]

A 6 inch silicon wafer was heat-treated in an oven at 200° C. for 30 minutes. Then, the resist liquid for undercoat layer was coated on the silicon wafer in order for the dried film thickness to be 1.5 μm, the coat layer was formed by heat-drying in an oven at 220° C. for 1 hour again, and the silicon wafer substrate with the undercoat layer attached was obtained.

—Formation of Coloring Pattern for Solid-State Imaging Device—

On the undercoat layer of the silicon wafer substrate with the undercoat layer obtained as above, the coloring radiation-sensitive composition 1 was coated in order for the dried film thickness of the coloring layer to be 0.7 μm under the following conditions using Act-8, a coater/developer having the function of spin coating manufactured by Tokyo Electron Ltd.

Then, after heat-treating (pre-bake) the coated substrate provided with this coat layer for 120 seconds using a hot plate at 100° C., the coated substrate was exposed with an exposure dose of 500 mJ/cm$^2$ through an island pattern mask of 1.5 μm square at a wavelength of 365 nm using FPA-3000i5+, an i-line stepper exposure device (manufactured by Canon, Inc.). After that, the silicon wafer on which the coloring layer was formed after the exposure was mounted on a horizontal rotary table of a spin-shower developing device (DW-30 type, manufactured by Chemitronics Co., Ltd.), and after paddle development was carried out at 23° C. for 60 seconds using CD-200 (manufactured by FUJIFILM Electronics Materials Co., Ltd.), the silicon wafer was fixed to the horizontal rotary table by a vacuum chucking method, and while the silicon wafer was rotated with a rev count of 50 r.p.m. using a rotating device, a rinsing process was performed by supplying pure water from a jet nozzle in the form of a shower from above the rotation center, and the wafer substrate with colored pixels was obtained after spray drying.

(5) Evaluation of Radiation-Sensitive Composition (5-1) Evaluation of Residues on Substrate (Developability)

The presence of residues in the area where the exposure light was not irradiated in the exposing step described above (the unexposed area) was observed by SEM, and the residues on the substrate were evaluated. Evaluation grades were as follows.

—Evaluation Grades—

A: No residues were observed in the unexposed area.

B: Residues were observed to a slight extent in the unexposed area, however, it was at a level such that there was no problem in practical use.

C: Residues were observed to a significant extent in the unexposed area.

(5-2) Evaluation of Residues on Green Pixels (Developability)

A green coloring pattern was formed on the substrate in the same manner using a radiation-sensitive composition for green Q and after that, from the above, the coloring radiation-sensitive composition 1 was coated and developed, the presence of residues due to the coloring radiation-sensitive composition 1 on the green pixels was observed by SEM, and was evaluated. Evaluation grades were as follows.

—Evaluation Grades—

A: No residues were observed on the green pixels.

B: Residues were observed to a slight extent on the green pixels, however, it was at a level such that there was no problem in practical use.

C: Residues were observed to a significant extent on the green pixels.

The radiation-sensitive composition for green G was prepared as follows.

A mixed solution made of 32 parts of Pigment Green 36, and 8 parts of Pigment Yellow 150 as pigments, 50 parts of Disperbyk-161 (30% solution, manufactured by BYK-Chemie GmbH) as a dispersing agent, and 110 parts of propylene glycol monomethyl ether as a solvent was mixed and dispersed for 15 hours by a beads mill and pigment dispersion liquid was prepared.

The radiation-sensitive composition for green G was prepared by stir-mixing following the composition ratio below using the pigment dispersion liquid.

| | |
|---|---|
| Coloring agent (pigment dispersion liquid) | 350 parts |
| Polymerization initiator (oxime-based photopolymerization initiator, CGI-124, manufactured by BASF Group) | 35 parts |
| TO-1382 (manufactured by Toagosei Co., Ltd.) (Polymerizable compound, carboxyl group contained penta-functional acrylate manufactured by Toagosei Chemical Industry Co., Ltd.) | 20 parts |
| Dipentaerythritol hexaacrylate (KAYARAD DPHA: manufactured by Nippon Kayaku Co., Ltd.) | 30 parts |
| Solvent (PGMEA) | 200 parts |
| Adhesive reagent for substrate (3-methacryloxypropyltrimethoxysilane) | 1 part |

(5-3) Heat Resistance

After the substrate in which the coloring radiation-sensitive composition 1 was coated on a glass substrate was heated by a hot plate, $\Delta E^*ab$ value which is a color difference before and after the heat-resistance test was measured using a colorimeter (trade name: MCPD-1000, Otsuka Electronics Co., Ltd.) and was evaluated according to the following grades. A smaller $\Delta E^*ab$ value indicates satisfactory heat resistance.

The heat resistance test was performed at 230° C. for 3 minutes.

<Evaluation Grades>

A: $\Delta E^*ab$ value<5

B: $5 \leq \Delta E^*ab$ value$\leq 10$

C: $10 < \Delta E^*ab$ value

<Method for Quantitating Residual Monomers>

First, a calibration curve of a monomer component relative to an internal standard substance (propyl benzoate) was created in high performance liquid chromatography (HPLC type manufactured by Waters Corporation: WATERS2695).

After that, 0.3 g of the sample and 0.025 g of the internal standard substance (propyl benzoate) were weighed into a 50 ml of volumetric flask and diluted with tetrahydrofuran. The diluted solution was analyzed with high performance liquid chromatography and the content of the monomer component was evaluated.

TABLE 1

| | Basic Structure of Polymer | Polymerization Concentration of Polymer (%) | Dropwise Addtion Time of Polymer Polymerization Solution (Hours) | Temperature Condition of Re-precipitation | Content of Monomer Component remaining (mass %) |
|---|---|---|---|---|---|
| Example 1 | I | 30 | 2 | 30° C. | 0.9 |
| Example 2 | I | 30 | 2 | 40° C. | 0.5 |
| Example 3 | I | 30 | 2 | 60° C. | 0.3 |

TABLE 1-continued

|  | Basic Structure of Polymer | Polymerization Concentration of Polymer (%) | Dropwise Addtion Time of Polymer Polymerization Solution (Hours) | Temperature Condition of Re-precipitation | Content of Monomer Component remaining (mass %) |
|---|---|---|---|---|---|
| Example 4 | I | 35 | 2 | 60° C. | 0.2 |
| Example 5 | I | 35 | 1 | 60° C. | 0.1 |
| Example 6 | I | 35 | 3 | 60° C. | 0.5 |
| Example 7 | II | 35 | 1 | 60° C. | 0.3 |
| Example 8 | III | 35 | — | — | 0.2 |
| Example 9 | IV | 35 | 1 | 60° C. | 0.2 |
| Example 10 | V | 35 | 1 | 60° C. | 0.3 |
| Example 11 | VI | 35 | 1 | 60° C. | 0.4 |
| Example 12 | VII | 35 | 1 | 60° C. | 0.4 |
| Example 13 | VIII | 35 | 1 | 60° C. | 0.4 |
| Comparative Example 1 | I | 30 | 2 | No Re-precipitation | 5.0 |
| Comparative Example 2 | I | 20 | 2 | 25° C. | 2.0 |
| Comparative Example 3 | I | 30 | 2 | 25° C. | 1.3 |
| Comparative Example 4 | I | 30 | 5 | 25° C. | 1.3 |

<Production of Color Filter>

A mixed solution made of 40 parts of the following pigment, 50 parts of Disperbyk-161 (30% solution, manufactured by BYK-Chemie GmbH) as a dispersing agent, and 110 parts of propylene glycol monomethyl ether as a solvent was mixed and dispersed for 15 hours by a beads mill and pigment dispersion liquid (P-2) was prepared.

Pigment used as P-2: Pigment Red 254:Pigment Red 177=8:2 (mass ratio)

The radiation-sensitive composition for red R was prepared by stirring and mixing the componets of the following composition using the pigment dispersion liquid (P-2).

| Coloring agent (pigment dispersion liquid (P-2)) | 350 parts |
|---|---|
| Polymerization initiator (oxime-based photopolymerization initiator, CGI-124, manufactured by BASF Group) | 35 parts |
| TO-1382 (manufactured by Toagosei Co., Ltd.) (Polymerizable compound, carboxyl group contained penta-functional acrylate manufactured by Toagosei Chemical Industry Co., Ltd.) | 20 parts |
| Dipentaerythritol hexaacrylate (KAYARAD DPHA: manufactured by Nippon Kayaku Co., Ltd.) | 30 parts |
| Solvent (PGMEA) | 200 parts |
| Adhesive reagent for substrate (3-methacryloxypropyltrimethoxysilane) | 1 part |

On the wafer, a red (R) coloring pattern of 1.6×1.6 μm was formed using the radiation-sensitive composition R for red (R). Also in the same manner, a green (G) of 1.6×1.6 μm was formed using the radiation-sensitive composition G for green (G) and a blue (B) chromatic coloring pattern was formed using the coloring radiation-sensitive composition 1 obtained in Example 1 sequentially, and the color filter for the solid-state imaging device was produced.

In preparation of the coloring radiation-sensitive composition 1, each radiation-sensitive composition of Examples 7 to 13 was obtained in the same manner as the preparation of the coloring radiation-sensitive composition 1 of Example 1 except that the types of polymers were changed to Polymers I to VIII shown in Table 1.

Also, by changing the polymerization concentration, the dropwise addition time of the polymerization solution and the temperature of the re-precipitation in the synthesis of Polymer I to those shown in Table 1, each polymer having Polymer I as the basic skeleton in which the monomer component remaining in each polymer was controlled was obtained, and each radiation-sensitive composition of Examples 2 to 6 and Comparative Examples 1 to 4 was obtained in the same manner as the preparation of the coloring radiation-sensitive composition 1 of Example 1 except that each polymer obtained instead of Polymer I of Example 1 was used.

Evaluation was carried out in the same manner as that in Example 1 using each radiation-sensitive composition obtained. The evaluation results are shown in Table 2.

TABLE 2

|  | Residues on Substrate | Residues on Green Pixels | Heat Resistance |
|---|---|---|---|
| Example 1 | B | B | A |
| Example 2 | A | B | A |
| Example 3 | A | B | A |
| Example 4 | A | A | A |
| Example 5 | A | A | A |
| Example 6 | A | B | A |
| Example 7 | A | A | A |
| Example 8 | A | A | A |
| Example 9 | A | B | A |
| Example 10 | A | B | A |
| Example 11 | A | B | A |
| Example 12 | A | B | A |
| Example 13 | A | A | A |
| Comparative Example 1 | C | C | C |
| Comparative Example 2 | C | C | C |
| Comparative Example 3 | B | C | B |
| Comparative Example 4 | B | C | B |

From Table 2, it was revealed that the coloring composition of the present invention has high developability, satisfactory heat resistance and no residues are present on the substrate. It was also found that the coloring composition of the present invention had no residues on the pixels of other colors and the coloring radiation-sensitive composition which provides the color filter with high color purity may be provided.

It was also confirmed that when the color filters obtained in Examples 1 to 13 of full colors were installed to the solid-state imaging devices, each solid-state imaging device had high resolution and was excellent in color separation.

What is claimed is:

1. A coloring composition for a color filter comprising:
(A) a polymer having a dye skeleton and (B) an organic solvent,
wherein the content of an unreacted monomer component having the dye skeleton which is capable of forming (A) the polymer having the dye skeleton is less than or equal to 1 mass % with regard to (A) the polymer having the dye skeleton,
wherein the dye skeleton is derived from xanthene dyes represented by the following General Formula (J):

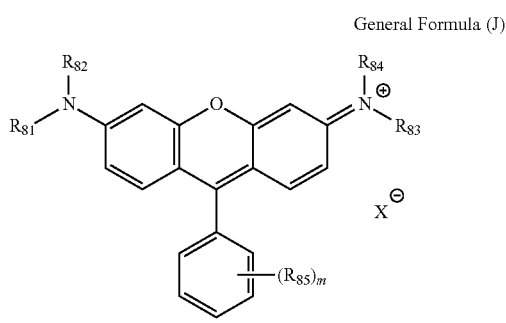

General Formula (J)

in General Formula (J),
$R_{81}$, $R_{82}$, $R_{83}$, and $R_{84}$, each independently, represents a hydrogen atom or a monovalent substituent,
$R_{85}$s, each independently, represent a monovalent substituent,
m represents an integer of 0 to 5, and
$X^-$ represents an anion, and
the polymer having the dye skeleton includes an ethylenic unsaturated bond after polymerization.

2. A coloring radiation-sensitive composition for a color filter comprising: the coloring composition according to claim 1; (C) a polymerizable compound; and (D) a polymerization initiator.

3. A pattern forming method comprising:
a step in which the coloring radiation-sensitive composition according to claim 2 is applied on a substrate and a coloring radiation-sensitive composition layer is formed;
a step in which the coloring radiation-sensitive composition layer is exposed in a pattern shape; and
a step in which the coloring radiation-sensitive composition layer after the exposure is developed.

4. A color filter comprising:
a colored film formed using the coloring radiation-sensitive composition according to claim 2.

5. A solid-state imaging device comprising: the color filter according to claim 4.

6. A production method of a color filter comprising:
a step in which the coloring radiation-sensitive composition according to claim 2 is applied on a substrate and a coloring radiation-sensitive composition layer is formed;
a step in which the coloring radiation-sensitive composition layer is exposed in a pattern shape; and
a step in which the coloring radiation-sensitive composition layer after the exposure is developed and a coloring pattern is formed.

7. The coloring radiation-sensitive composition for a color filter according to claim 2,
wherein (D) the polymerization initiator is an oxime compound.

8. A production method of a polymer,
wherein (A) the polymer having the dye skeleton according to claim 1 is prepared by carrying out heat re-precipitation after polymerization.

9. The production method of a polymer according to claim 8, wherein the heat re-precipitation is performed at 40° C. to 60° C.

10. A production method of a polymer,
wherein (A) the polymer having the dye skeleton according to claim 1 is prepared by adjusting the polymerization concentration to greater than or equal to 30 mass % in the polymerization.

11. The coloring composition for a color filter according to claim 1, wherein
$R_{82}$ and $R_{83}$ each represents a hydrogen atom, and
$R_{81}$ and $R_{84}$ each represents a substituted or unsubstituted phenyl group.

12. A coloring composition for a color filter comprising:
(A) a polymer having a dye skeleton and (B) an organic solvent,
wherein the content of an unreacted monomer component having the dye skeleton which is capable of forming (A) the polymer having the dye skeleton is less than or equal to 1 mass % with regard to (A) the polymer having the dye skeleton, and
wherein the dye skeleton is derived from xanthene dyes represented by the following General Formula (J):

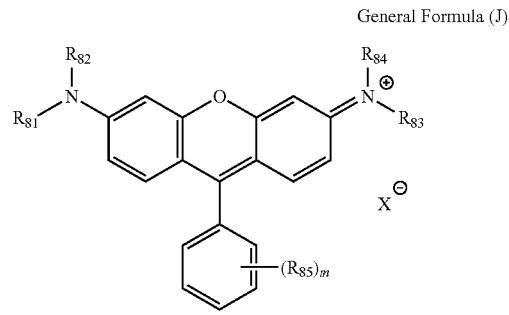

General Formula (J)

in General Formula (J),
$R_{81}$, $R_{82}$, $R_{83}$, and $R_{84}$, each independently, represents a hydrogen atom or a monovalent substituent,
$R_{85}$s, each independently, represent a monovalent substituent,
m represents an integer of 0 to 5, and
$X^-$ represents an anion.

13. A coloring radiation-sensitive composition for a color filter comprising: the coloring composition according to claim 12; (C) a polymerizable compound; and (D) a polymerization initiator.

14. A pattern forming method comprising:
a step in which the coloring radiation-sensitive composition according to claim 13 is applied on a substrate and a coloring radiation-sensitive composition layer is formed;
a step in which the coloring radiation-sensitive composition layer is exposed in a pattern shape; and
a step in which the coloring radiation-sensitive composition layer after the exposure is developed.

15. A color filter comprising:
a colored film formed using the coloring radiation-sensitive composition according to claim 13.

16. A solid-state imaging device comprising: the color filter according to claim 15.

17. A production method of a color filter comprising:
a step in which the coloring radiation-sensitive composition according to claim 13 is applied on a substrate and a coloring radiation-sensitive composition layer is formed;
a step in which the coloring radiation-sensitive composition layer is exposed in a pattern shape; and
a step in which the coloring radiation-sensitive composition layer after the exposure is developed and a coloring pattern is formed.

18. The coloring radiation-sensitive composition for a color filter according to claim 13,
wherein (D) the polymerization initiator is an oxime compound.

19. A production method of a polymer,
wherein (A) the polymer having the dye skeleton according to claim 12 is prepared by carrying out heat re-precipitation after polymerization.

20. The production method of a polymer according to claim 19, wherein the heat re-precipitation is performed at 40° C. to 60° C.

21. A production method of a polymer,
wherein (A) the polymer having the dye skeleton according to claim 12 is prepared by adjusting the polymerization concentration to greater than or equal to 30 mass % in the polymerization.

22. The coloring composition for a color filter according to claim 12, wherein
$R_{82}$ and $R_{83}$ each represents a hydrogen atom, and
$R_{81}$ and $R_{84}$ each represents a substituted or unsubstituted phenyl group.

* * * * *